United States Patent
Lupino et al.

(10) Patent No.: US 11,228,315 B2
(45) Date of Patent: Jan. 18, 2022

(54) THREE-DIMENSIONAL LOGIC CIRCUIT

(71) Applicant: Tacho Holdings, LLC, Cheyenne, WY (US)

(72) Inventors: James John Lupino, St. Louis Park, MN (US); Tommy Allen Agan, Maple Grove, MN (US)

(73) Assignee: TACHO HOLDINGS, LLC, Cheyenne, WY (US)

( * ) Notice: Subject to any disclaimer, the term of this patent is extended or adjusted under 35 U.S.C. 154(b) by 0 days.

(21) Appl. No.: 16/947,042

(22) Filed: Jul. 15, 2020

(65) Prior Publication Data

US 2021/0006250 A1 Jan. 7, 2021

Related U.S. Application Data

(63) Continuation-in-part of application No. 16/681,666, filed on Nov. 12, 2019, now Pat. No. 10,727,835,
(Continued)

(51) Int. Cl.
*H03K 19/00* (2006.01)
*H03K 19/20* (2006.01)
(Continued)

(52) U.S. Cl.
CPC ..... *H03K 19/0944* (2013.01); *H01L 23/5226* (2013.01); *H01L 27/0688* (2013.01);
(Continued)

(58) Field of Classification Search
CPC .............. H03K 19/0944; H03K 19/20; H03K 19/0948; H01L 27/0688; H01L 27/0629;
(Continued)

(56) References Cited

U.S. PATENT DOCUMENTS 4,100,430 A 7/1978 Lesser
4,316,106 A 2/1982 Young et al.
(Continued)

FOREIGN PATENT DOCUMENTS

JP 2017041635 A 2/2017
WO 2016183687 A1 11/2016

OTHER PUBLICATIONS

Karmakar et al., Unipolar Logic Gates Based on Spatial Wave-Function Switched FETs—IEEE Transactions On Very Large Scale Integration (VLSI) Systems, vol. 23, No. 4, Apr. 2015 (Year: 2015).*

(Continued)

*Primary Examiner* — Vibol Tan
(74) *Attorney, Agent, or Firm* — Kinney & Lange, P.A.

(57) ABSTRACT

Apparatus and associated methods related to a three-dimensional integrated logic circuit that includes a columnar active region. Within the columnar active region resides an interdigitated plurality of semiconductor columns and conductive columns. A plurality of transistors is vertically arranged along each semiconductor column, which extends from a bottom surface of the columnar logic region to a top surface of the columnar logic region. The plurality of transistors are electrically interconnected so as to perform a logic function and to generate a logic output signal at a logic output port in response to a logic input signal received at a logic input port. Each of the plurality of conductive columns is adjacent to at least one of the plurality of semiconductor columns and extends along a columnar axis to one or more interconnection layers at the top and/or bottom surfaces of the columnar active layer.

20 Claims, 106 Drawing Sheets

VERTICAL STRUCTURE OF UNIPOLAR PRECHARGED NAND GATE (FIG. 1A)

UNIPOLAR PRECHARGED NAND GATE

Related U.S. Application Data which is a continuation-in-part of application No. 15/915,733, filed on Mar. 8, 2018, now Pat. No. 10,505,540, which is a continuation-in-part of application No. 15/729,470, filed on Oct. 10, 2017, now Pat. No. 10,079,602.

(51) Int. Cl.

| | | |
|---|---|---|
| *H01L 23/52* | (2006.01) | |
| *H01L 27/092* | (2006.01) | |
| *H03K 19/0944* | (2006.01) | |
| *H01L 27/06* | (2006.01) | |
| *H03K 19/003* | (2006.01) | |
| *H01L 23/522* | (2006.01) | |

(52) U.S. Cl.
CPC ......... *H01L 27/092* (2013.01); *H03K 19/003* (2013.01); *H03K 19/20* (2013.01)

(58) Field of Classification Search
CPC ..... H01L 21/823487; H01L 21/823475; H01L 27/088; H01L 27/092; H01L 21/823885; H01L 21/823871; H01L 23/5226; H01L 27/286; H01L 51/0558; H01L 27/283; H01L 23/528; H01L 29/7827; H01L 27/281; H01L 29/78693; H01L 51/0048
See application file for complete search history.

(56) References Cited

U.S. PATENT DOCUMENTS

| | | |
|---|---|---|
| 6,801,056 B2 | 10/2004 | Forbes |
| 10,079,602 B1 * | 9/2018 | Agan .................... H03K 19/20 |
| 10,963,191 B1 * | 3/2021 | Gu ....................... G11C 11/5642 |
| 2017/0084754 A1 | 3/2017 | Shionoiri et al. |
| 2017/0111046 A1 | 4/2017 | Sun et al. |

OTHER PUBLICATIONS

Li et al., CMOS-Like Logic Circuits With Unipolar Thin-Film Transistors on Flexible Substrate—IEEE Transactions On Electron Devices, vol. 67, No. 2, Feb. 2020 (Year: 2020).*

International Search Report dated Apr. 10, 2019, received for PCT Application No. PCT/US2019/021359, 4 pages.

* cited by examiner

UNIPOLAR PRECHARGED NAND GATE

UNIPOLAR PRECHARGED NOR GATE

UNIPOLAR PRECHARGED NOR GATE – LOW POWER CIRCUIT

UNIPOLAR CLOCKED NAND GATE – LOW POWER CIRCUIT
SINGLE CLK PER GATE

UNIPOLAR CLOCKED NOR GATE – LOW POWER CIRCUIT
SINGLE CLK PER GATE

UNIPOLAR CLOCKED INVERTER GATE – LOW POWER CIRCUIT SINGLE CLK PER GATE

UNIPOLAR CLOCKED BUFFER GATE – LOW POWER CIRCUIT
SINGLE CLK PER GATE

UNIPOLAR CLOCKED NOR GATE – LOW POWER CIRCUIT
SINGLE CLK PER GATE

UNIPOLAR CLOCKED INVERTER GATE – LOW POWER CIRCUIT
SINGLE CLK PER GATE

UNIPOLAR CLOCKED INVERTER GATE – LOW POWER CIRCUIT
SINGLE CLK PER GATE

SEQUENTIAL UNIPOLAR PRECHARGED NAND GATES

VERTICAL STRUCTURE OF UNIPOLAR PRECHARGED NAND GATE (FIG. 1A)

VERTICAL STRUCTURE OF UNIPOLAR PRECHARGED NAND GATE (FIG. 1A)

VERTICAL STRUCTURE OF UNIPOLAR PRECHARGED NOR GATE (FIG. 1C)

VERTICAL UNIPOLAR PRECHARGED GATE –
EITHER NAND GATE (FIG 1A) OR NOR GATE (FIG 1C)

TOP CONNECTIONS

BOTTOM CONNECTIONS

76+ PRECHARGED NAND and/or NOR GATES
APPROXIMATELY 20F² AVG. CELL SIZE PER GATE VERTICAL STRUCTURE OF UNIPOLAR PRECHARGED NAND GATE – LOW POWER CIRCUIT (FIG. 1B)

VERTICAL STRUCTURE OF UNIPOLAR PRECHARGED NAND GATE – LOW POWER CIRCUIT (FIG. 1B)

VERTICAL STRUCTURE OF UNIPOLAR PRECHARGED NOR GATE – LOW POWER CIRCUIT (FIG. 1D)

VERTICAL UNIPOLAR PRECHARGED NAND and NOR GATE – LOW POWER CIRCUITS (FIG. 1B and FIG. 1D)

TOP CONNECTIONS

BOTTOM CONNECTIONS

62 PRECHARGED NAND and/or NOR GATES LOW POWER CIRCUITS - APPROXIMATELY 22F² AVG. CELL SIZE PER GATE

VERTICAL STRUCTURE OF UNIPOLAR CLOCKED NAND GATE – LOW POWER CIRCUIT – SINGLE CLK PER GATE (FIG. 1E)

VERTICAL STRUCTURE OF UNIPOLAR CLOCKED NAND GATE – LOW POWER CIRCUIT – SINGLE CLK PER GATE (FIG. 1E)

VERTICAL STRUCTURE OF UNIPOLAR CLOCKED NOR GATE – LOW POWER CIRCUIT – SINGLE CLK PER GATE (FIG. 1F)

VERTICAL STRUCTURE OF UNIPOLAR CLOCKED NOR GATE – LOW POWER CIRCUIT – SINGLE CLK PER GATE (FIG. 1F)

VERTICAL UNIPOLAR CLOCKED NAND and NOR GATE – LOW POWER CIRCUITS, SINGLE CLK PER GATE (FIG. 1E, 1F, 1I and 1J)

TOP CONNECTIONS

BOTTOM CONNECTIONS

62 NAND and/or NOR CLOCKED GATES LOW POWER CIRCUITS,
ONE CLK PER GATE APPROXIMATELY 22F$^2$ AVG. CELL SIZE PER GATE

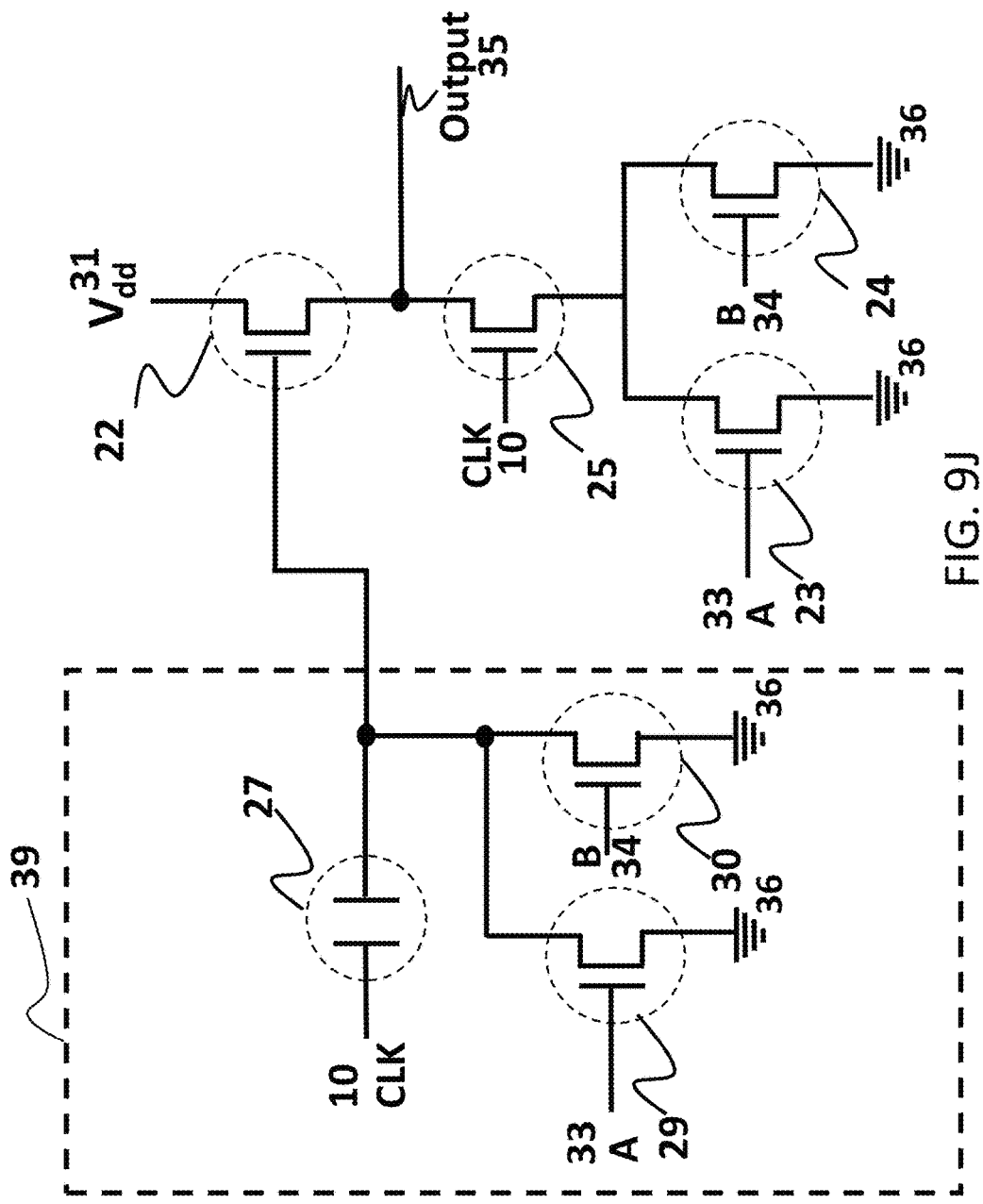

COLUMNAR NAND GATE WITH BODY BIAS AND MULTIPLE LANES ADJACENT TO GATE FOR ROUTING INPUT OR OUTPUT SIGNALS

UNIPOLAR LATCHED NOR GATE (N-type)

COLUMNAR UNIPOLAR LATCHED N-type NOR GATE CONNECTIONS
TOP CONNECTIONS (N-type)
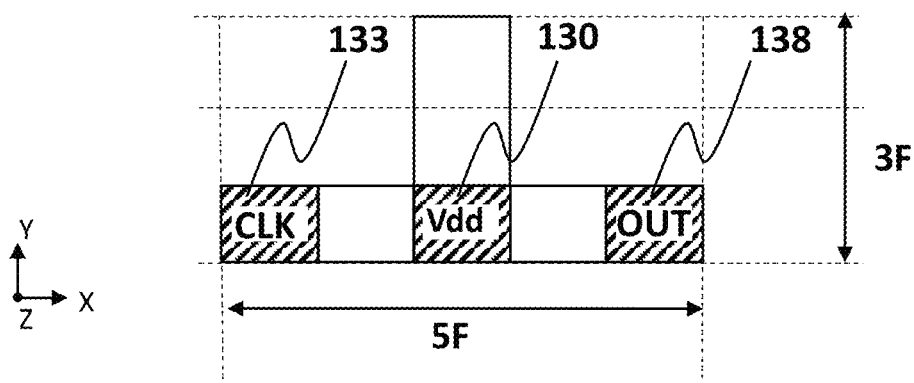
BOTTOM CONNECTIONS (N-type)
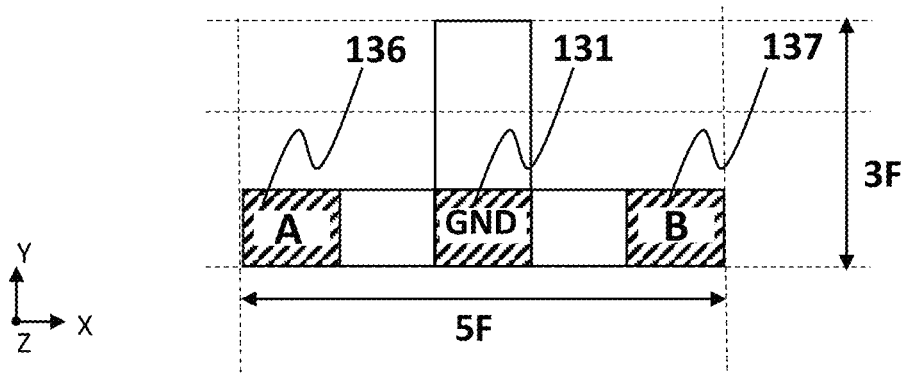
FIG. 27D

COLUMNAR UNIPOLAR LATCHED
P-type NOR GATE CONNECTIONS
TOP CONNECTIONS (P-type)
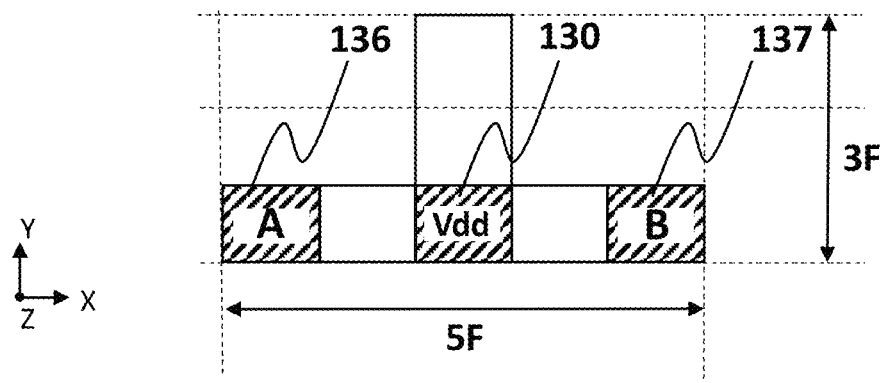
BOTTOM CONNECTIONS (P-type)
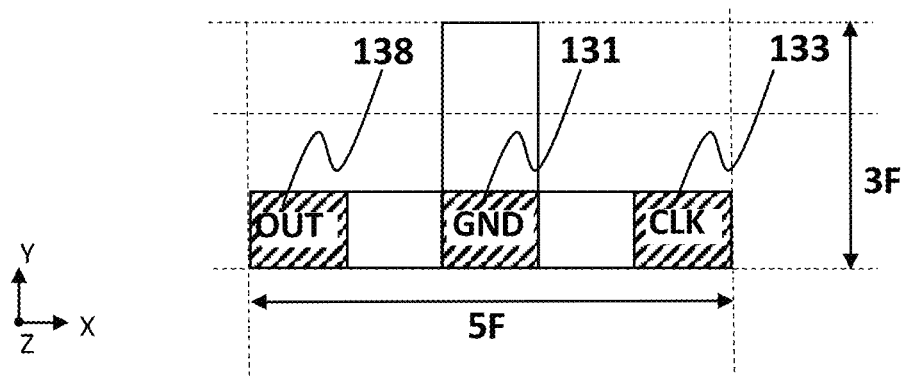
FIG. 27H

ARRAY OF COLUMNAR UNIPOLAR LATCHED NOR GATES (N or P type)

~72 COLUMNAR LOGIC GATES – APPROXIMATELY 17 $F^2$ AVG. CELL SIZE PER GATE
(Including 21 routing channels between top and bottom of gate layer)

COLUMNAR UNIPOLAR LATCHED N-type NOR GATE with Body Bias CONNECTIONS
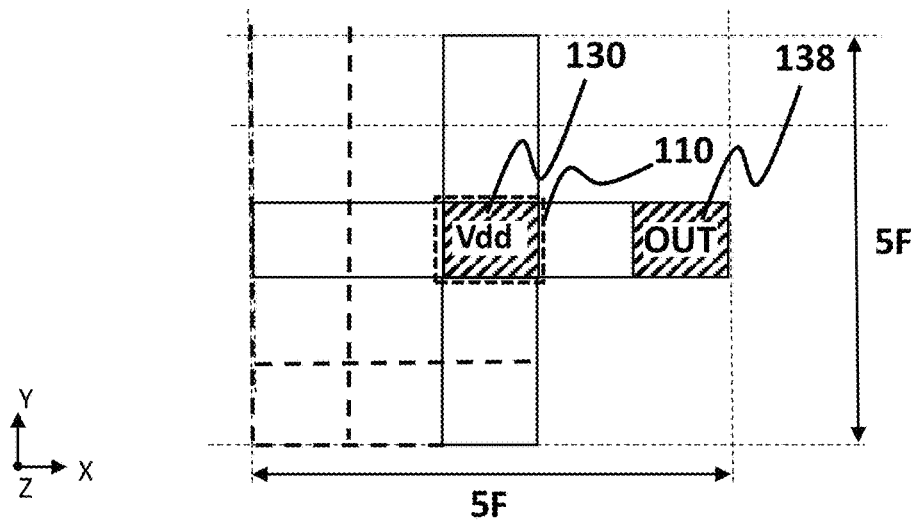
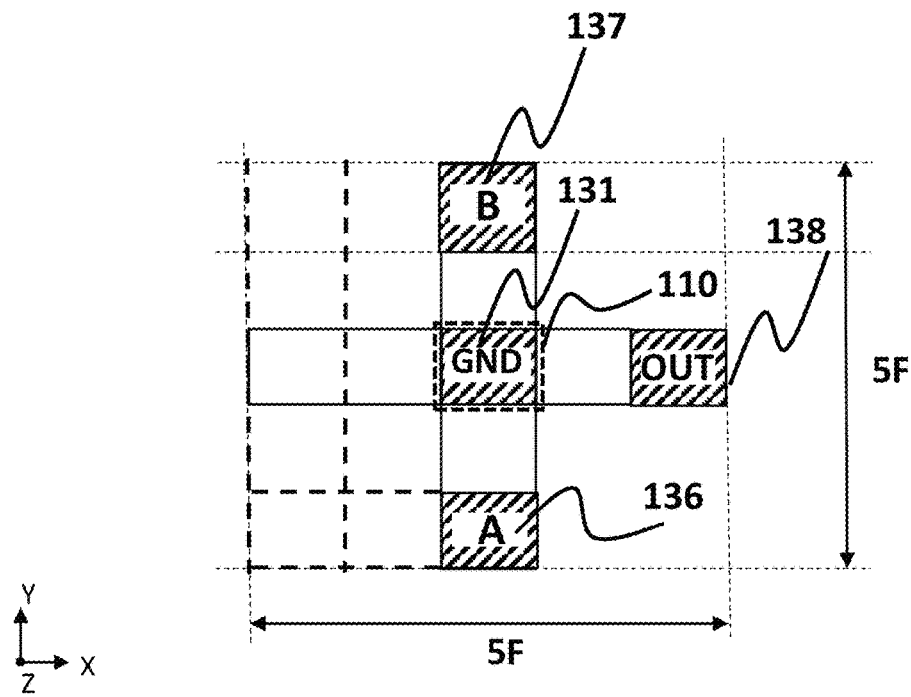
FIG. 29E

MULTIPLE LEVELS OF COLUMNAR LOGIC GATES OR STACKED COLUMNAR LOGIC GATES AND INTERCONNECTION LAYERS

THREE-DIMENSIONAL LOGIC CIRCUIT

CROSS-REFERENCE TO RELATED APPLICATION(S)

This application is a continuation in part of U.S. patent application Ser. No. 16/681,666, filed Nov. 12, 2019, for "Three-Dimensional Logic Circuit" by Tommy Allen Agan and James John Lupino, which was a continuation in part of U.S. patent application Ser. No. 15/915,733, filed Mar. 8, 2018, for "Unipolar Logic Circuits" by Tommy Allen Agan and James John Lupino, now issued as U.S. Pat. No. 10,505,540, which is a continuation in part of U.S. Non-Provisional application Ser. No. 15/729,470 filed Oct. 10, 2017, for "Unipolar Latched Logic Circuits" by Tommy Allen Agan and James John Lupino, now issued as U.S. Pat. No. 10,079,602. The entire disclosures of these above-referenced applications are hereby incorporated by reference.

BACKGROUND

Conventional CMOS logic integrated circuits employ both PMOS and NMOS transistors for high performance and low power. Unipolar logic may be employed—using only NMOS transistors or only PMOS transistors—to reduce the cost of manufacturing, however, high stand-by power of such methods to-date have prohibited unipolar logic to be utilized on a large scale. The continued advancement in the semiconductor and flat panel display industries has yielded new types of transistor materials to be considered for integrated circuits. Some materials such as thin film amorphous metal oxides are low cost and may be fabricated monolithically in 3D structures thereby enabling true monolithic 3D integrated circuits. Furthermore, compound semiconductors such as InAs, InGaAs and GaAs exhibit electron mobility much higher than silicon and therefore are promising candidates to replace silicon. However, these thin film and compound semiconductor transistors are mainly implemented in only NMOS or PMOS type, but not both. A new circuit design is therefore required to enable low stand-by power unipolar logic in order for such new transistor materials to reach a large scale in the electronics industry.

SUMMARY

Novel unipolar circuits and vertical structures are described which exhibit low stand-by power, high speed performance, and higher density compared to conventional silicon CMOS circuitry. In one embodiment, capacitors are employed to enable a precharge state. In another embodiment, capacitors are employed in a bootstrap fashion to maintain the integrity of the high voltage gate output. In yet another embodiment, a clocked gate design utilizes a clock at each gate to bootstrap the voltage so there's no loss due to threshold voltage drop. Further embodiments include novel designs of vertical unipolar logic gates which provides for high density. Ultra-short transistor channel lengths in vertical unipolar logic gates are fabricated with a deposition process—in lieu of a lithography process—thereby providing for high speed operation and low cost manufacturing.

2.5D and 3D integrated circuits is an area with much ongoing development in methods to improve performance, increase density and reduce die size (cost). The conventional method to achieve improved performance in integrated circuits was to port the circuit design to a smaller feature size (F) or technology node—for example, from 130 nm to 90 nm to 65 nm and so forth. The industry wide Moore's Law was known for the principle that the speed and capability of computers can be expected to double every two years, as a result of increases in the number of transistors a microchip can contain by virtue of smaller feature sizes enabled by improved lithography equipment and processes. The principle has held true for many years with expected cost reduction per transistor with the reduction in feature size. However, as feature sizes reached 20 nm and lower, the cost per transistor has increased due to the high costs of implementing such small feature sizes. Many industry experts feel Moore's Law has reached the physical limit at 5 nm and hence, other methods—beyond improved lithography—are needed to enable continued density and performance improvements in integrated circuits at reasonable costs. Industry developments and proposals for three dimensional (3D) circuits have mainly focused on stacking of multiple die rather than monolithic fabrication of 3D circuits as disclosed herein. The industry has been tied to the crystalline silicon substrate. The invention disclosed herein is not restricted to a particular substrate and therefore enables an innovative approach to true monolithic 3D integrated circuits.

Conventional integrated circuits are designed in a planar layout configuration due to the fact the crystalline silicon substrate is electrically coupled to the integrated circuit. Planar layouts of logic gates—such as CMOS NAND or NOR gates—may occupy upwards of 150 $F^2$ in die area. Free from the anchor of electrically coupling the substrate to the circuit, monolithic 3D semiconductor columns may be fabricated which allows for logic gates occupying less than 20% of the planar silicon counterparts, or even close to 10% of the area.

DEFINITION OF DRAWING NUMERALS

10—CLK, Unipolar Clocked NAND or NOR Gate, Low Power Circuit Single CLK per Gate 21—NMOS Transistors, Unipolar Precharged NAND or NOR Gate 22, 23, 24 and 25—NMOS Transistors, Unipolar Precharged or Clocked NAND or NOR Gate 26—Capacitor, Unipolar Precharged NAND or NOR Gate 27—Capacitor, Unipolar Precharged or Clocked NAND or NOR Gate, Low Power Circuit 28, 29 and 30—NMOS Transistors, Unipolar Precharged or Clocked NAND or NOR Gate, Low Power Circuit 31—Vdd 32—CLK, Unipolar Precharged NAND or NOR Gate 33—A input to NAND or NOR Gate 34—B input to NAND or NOR Gate 35—Output of NAND or NOR Gate 36—Ground 38—Low power circuitry of Unipolar Precharged or Clocked NAND Gate 39—Low power circuitry of Unipolar Precharged or Clocked NOR, Inverter or Buffer Gate 41—R interconnect line of Unipolar Bootstrapped NAND Gate 42—T interconnect line of Unipolar Bootstrapped NAND Gate 43—U interconnect line of Unipolar Bootstrapped NAND Gate 47—Capacitor, Unipolar Clocked Buffer Gate, Low Power Circuit

61, 62, 63, 64, 65, 66, 67, 68, 69, 70, and 71—NMOS Transistors, Unipolar Bootstrapped NAND Gate
72 and 73—Capacitors, Unipolar Bootstrapped NAND Gate
92—$\overline{CLK}$, Unipolar Precharged NAND or NOR Gate
93—$\overline{A}$ input to Unipolar Bootstrapped NAND Gate
94—$\overline{B}$ input to Unipolar Bootstrapped NAND Gate
95—$\overline{Output}$, Unipolar Bootstrapped NAND Gate
101—First Unipolar Precharged NAND Gate
110—Semiconductor column (transistor stack of one or more columnar logic gates)
111—First NMOS transistor in semiconductor column
112—Second NMOS transistor in semiconductor column
113—Pullup transistor in semiconductor column
113-1—First pullup transistor in semiconductor column
113-2—Second pullup transistor in semiconductor column
114—Unified semiconductor region in semiconductor column
115—Unified metal region in semiconductor column
116—First PMOS transistor in semiconductor column
117—Second PMOS transistor in semiconductor column
118—Pulldown transistor in semiconductor column
119—Routing pin for inputs and outputs of columnar logic gates
120—Pitch between routing pins of input and output signals to the semiconductor column of a columnar logic gate
121—First conductive column of columnar logic gate
121-2—First conductive column of columnar logic gate at the second layer of stacked columnar logic gates
121-3—First conductive column of columnar logic gate at the third layer of stacked columnar logic gates
122—Second conductive column of columnar logic gate
122-2—Second conductive column of columnar logic gate at the second layer of stacked columnar logic gates
122-3—Second conductive column of columnar logic gate at the third layer of stacked columnar logic gates
123—Third conductive column of columnar logic gate
124—Unified Vdd region in semiconductor column shared for two columnar logic gates
125—Unified Gnd region in semiconductor column shared for two columnar logic gates
126—Common input electrodes to the columnar logic gate
127—Transistor gate contact
128—Interconnection layer above the columnar logic gate
129—Interconnection layer below the columnar logic gate
130—Vdd common electrode of columnar logic gate
131—Ground (Vss) common electrode of columnar logic gate
133—Clock (CLK) common input to columnar logic gate
134—Common body bias electrode for voltage Vp applied to p-channel body
135—Common body bias electrode for voltage Vn applied to n-channel body
136—A input to columnar logic gate
136-2—A Input to columnar logic gate at the second layer of stacked columnar logic gates
136-3—A Input to columnar logic gate at the third layer of stacked columnar logic gates
137—B input to columnar logic gate
137-2—B Input to columnar logic gate at the second layer of stacked columnar logic gates
137-3—B Input to columnar logic gate at the third layer of stacked columnar logic gates
138—Output of columnar logic gate
138-2—Output of columnar logic gate at the second layer of stacked columnar logic gates
138-3—Output of columnar logic gate at the third layer of stacked columnar logic gates
139—Contact interface region of body bias and semiconductor channel material
140—Routing lanes for common electrodes (Vdd, Gnd, Clk, Vn, Vp) and optional inter-gate routing of Input or Output signals
140-3—Routing lanes for common electrodes (Vdd, Gnd, Clk, Vn, Vp) and optional inter-gate routing of Input or Output signals at the third layer of stacked columnar logic gates
141—First columnar logic gate in stack of multiple columnar logic gates
142—Second columnar logic gate in stack of multiple columnar logic gates
143—Third columnar logic gate in stack of multiple columnar logic gates
144—Fourth columnar logic gate in stack of multiple columnar logic gates
145—Routing electrodes for neighboring gate outputs
146—Routing electrodes for neighboring gate inputs
147—Conductive column
148—Array of columnar logic gates
149-1—Routing lane options for an output of a columnar logic gate to nearby logic gates without requirement for routing to an interconnection layer above or below the columnar logic region
149-2—Routing lane options, via the common routing lane (140, 140-3), for an output of a columnar logic gate to nearby logic gates without requirement for routing to an interconnection layer above or below the columnar logic region
150—Pitch between routing pins of input and output signals of adjacent columnar logic gates
151—First columnar logic gate in array of columnar logic gates
152—Second columnar logic gate in array of columnar logic gates
154—Fourth conductive column of columnar logic gate
161—Capacitor
162—Dielectric layer between capacitor plates
163—First NMOS transistor, unipolar latched NOR gate
164—Second NMOS transistor, unipolar latched NOR gate
165—Pulldown transistor, unipolar latched NOR gate
166—Anode of capacitor
167—Cathode of capacitor
168—Fifth conductive column, Intragate routing electrode, unipolar latched NOR gate
173—First PMOS transistor, unipolar latched NOR gate
174—Second PMOS transistor, unipolar latched NOR gate
175—Pullup transistor, unipolar latched NOR gate
180—One of multiple interconnection layers in a 3D circuit
181—One of multiple CLG or S-CLG layers in a 3D circuit
201—Second Unipolar Precharged NAND Gate
301—Third Unipolar Precharged NAND Gate
313—Intermediate routing line in Z-direction for Vdd (31)

331—Intermediate routing line in X-direction for A input (33)

332—Intermediate routing line in Y-direction for A input (33)

333—Intermediate routing line in Z-direction for A input (33)

351—Intermediate routing line in X-direction for Output (35)

353—Intermediate routing line in Z-direction for Output (35)

951—Intermediate routing line in X-direction for $\overline{\text{Output}}$ (95)

953—Intermediate routing line in Z-direction for $\overline{\text{Output}}$ (95)

BEOL—Back End of Line
CLG—Columnar logic gate
CNT—Carbon Nanotube
F—Minimum feature size as limited by lithography process or design rule for layout
GND—Ground (Vss)
IL—Interconnection layer(s)
IGZO—Indium Gallium Zinc Oxide
Out—Output of logic gate
RR-1—Routing region 1
RR-2—Routing region 2
S-CLG—Stacked Columnar logic gates
TFT—Thin Film Transistor

BRIEF DESCRIPTION OF THE DRAWINGS

FIG. 27D is a top plan view of the routing pins (top and bottom connections) of a columnar unipolar latched NOR gate (N-type) according to an embodiment of the present invention.

FIG. 27H is a top plan view of the routing pins (top and bottom connections) of a columnar unipolar latched NOR gate (P-type) according to an embodiment of the present invention.

FIG. 29E is a top plan view of the routing pins (top and bottom connections) of a columnar unipolar latched NOR gate (N-type) with body bias according to an embodiment of the present invention.

Figure 1A:
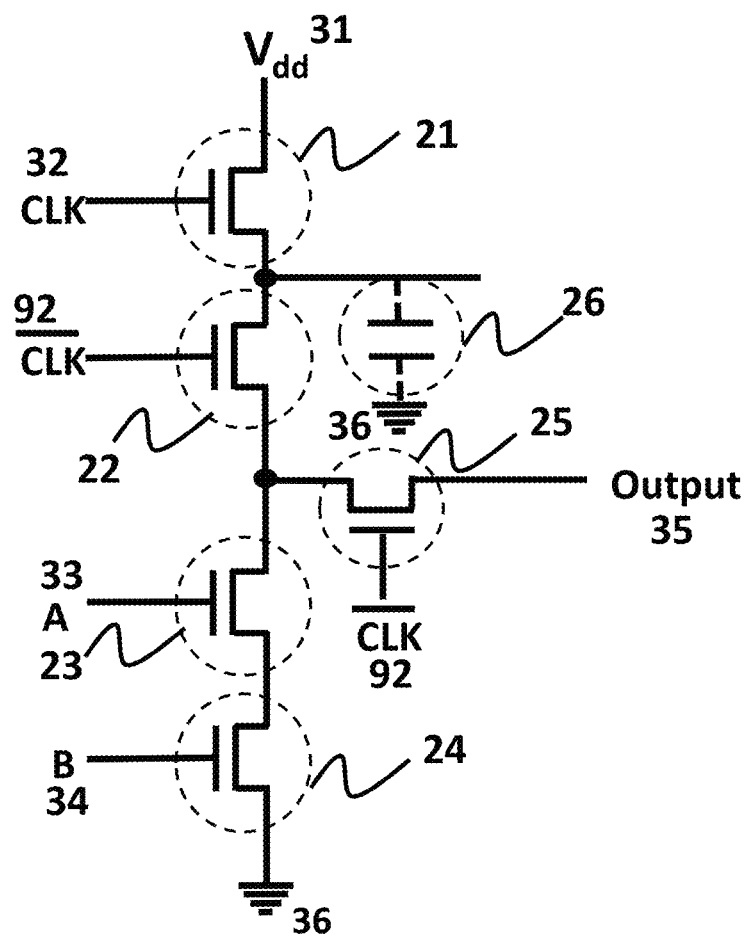
FIG. 1A—Unipolar Precharged NAND Gate Circuit according to an embodiment of the present invention FIG. 1B—Unipolar Precharged NAND Gate Low Power Circuit according to an embodiment of the present invention FIG. 1C—Unipolar Precharged NOR Gate Circuit according to an embodiment of the present invention FIG. 1D—Unipolar Precharged NOR Gate Low Power Circuit according to an embodiment of the present invention FIG. 1E—Unipolar Clocked NAND Gate Low Power Circuit Single Clock per Gate according to an embodiment of the present invention FIG. 1F—Unipolar Clocked NOR Gate Low Power Circuit Single Clock per Gate according to an embodiment of the present invention FIG. 1G—Unipolar Clocked Inverter Gate Low Power Circuit Single Clock per Gate according to an embodiment of the present invention FIG. 1H—Unipolar Clocked Buffer Gate Low Power Circuit Single Clock per Gate according to an embodiment of the present invention FIG. 1I—Unipolar Clocked NAND Gate Low Power Circuit Single Clock per Gate according to an embodiment of the present invention FIG. 1J—Unipolar Clocked NOR Gate Low Power Circuit Single Clock per Gate according to an embodiment of the present invention FIG. 1K—Unipolar Clocked Inverter Gate Low Power Circuit Single Clock per Gate according to an embodiment of the present invention FIG. 1L—Unipolar Clocked Inverter Gate Low Power Circuit Single Clock per Gate according to an embodiment of the present invention FIG. 2—Sequential Precharged NAND Gate Circuits according to an embodiment of the present invention FIG. 3—CLK and $\overline{\text{CLK}}$ signals for Precharged Logic Circuits according to an embodiment of the present invention FIG. 4—Logic blocks according to the prior art FIG. 5—Clocked Logic Blocks according to an embodiment of the present invention FIG. 6A—Cross-section view of a Vertical Structure of a Unipolar Precharged NAND Gate according to an embodiment of the present invention FIG. 6B—Cross-section view of a Vertical Structure of a Unipolar Precharged NAND Gate according to an embodiment of the present invention FIG. 6C—Cross-section view of a Vertical Structure of a Unipolar Precharged NOR Gate according to an embodiment of the present invention FIG. 6D—Cross-section view of a Vertical Structure of a Unipolar Precharged NOR Gate according to an embodiment of the present invention FIG. 6E—Top view of the Top Layer Connections of a Vertical Unipolar Precharged NAND or NOR Gate according to an embodiment of the present invention FIG. 6F—Top view of the Bottom Layer Connections of a Vertical Unipolar Precharged NAND or NOR Gate according to an embodiment of the present invention FIG. 6G—An illustration of an array of Vertical Unipolar Precharged NAND or NOR Gates with an average cell size approximately equal to 20 $F^2$ according to an embodiment of the present invention FIG. 6H—Cross-section view of a Vertical Structure of a Unipolar Precharged NAND Gate Low Power Circuit according to an embodiment of the present invention FIG. 6I—Cross-section view of a Vertical Structure of a Unipolar Precharged NAND Gate Low Power Circuit according to an embodiment of the present invention FIG. 6J—Cross-section view of a Vertical Structure of a Unipolar Precharged NOR Gate Low Power Circuit according to an embodiment of the present invention FIG. 6K—Cross-section view of a Vertical Structure of a Unipolar Precharged NOR Gate Low Power Circuit according to an embodiment of the present invention FIG. 6L—Top view of the Top Layer Connections of a Vertical Unipolar Precharged NAND Gate Low Power Circuit or NOR Gate Low Power Circuit according to an embodiment of the present invention FIG. 6M—Top view of the Bottom Layer Connections of a Vertical Unipolar Precharged NAND Gate Low Power Circuit or NOR Gate Low Power Circuit according to an embodiment of the present invention FIG. 6N—An illustration of an array of Vertical Unipolar Precharged NAND or NOR Gates Low Power Circuits with an average cell size approximately equal to 24 $F^2$ according to an embodiment of the present invention FIG. 6O—Cross-section view of a Vertical Structure of a Unipolar Clocked NAND Gate Low Power Circuit Single CLK Per Gate according to an embodiment of the present invention FIG. 6P—Cross-section view of a Vertical Structure of a Unipolar Clocked NAND Gate Low Power Circuit Single CLK Per Gate according to an embodiment of the present invention FIG. 6Q—Cross-section view of a Vertical Structure of a Unipolar Clocked NOR Gate Low Power Circuit Single CLK Per Gate according to an embodiment of the present invention FIG. 6R—Cross-section view of a Vertical Structure of a Unipolar Clocked NOR Gate Low Power Circuit Single CLK Per Gate according to an embodiment of the present invention FIG. 6S—Top view of the Top Layer Connections of a Vertical Unipolar Clocked NAND Gate Low Power Circuit or NOR Gate Low Power Circuit, Single CLK Per Gate, according to an embodiment of the present invention FIG. 6T—Top view of the Bottom Layer Connections of a Vertical Unipolar Clocked NAND Gate Low Power Circuit or NOR Gate Low Power Circuit, Single CLK Per Gate, according to an embodiment of the present invention FIG. 6U—An illustration of an array of Vertical Unipolar Clocked NAND or NOR Gates Low Power Circuits, Single CLK Per Gate, with an average cell size approximately equal to 22 $F^2$ according to an embodiment of the present invention FIG. 6V—Cross-section view of a Vertical Structure of a Unipolar Clocked NAND Gate Low Power Circuit Single CLK Per Gate according to an embodiment of the present invention FIG. 6W—Cross-section view of a Vertical Structure of a Unipolar Clocked NAND Gate Low Power Circuit Single CLK Per Gate according to an embodiment of the present invention FIG. 6X—Cross-section view of a Vertical Structure of a Unipolar Clocked NOR Gate Low Power Circuit Single CLK Per Gate according to an embodiment of the present invention FIG. 6Y—Cross-section view of a Vertical Structure of a Unipolar Clocked NOR Gate Low Power Circuit Single CLK Per Gate according to an embodiment of the present invention FIG. 7—A Unipolar Bootstrap NAND Gate Circuit according to an embodiment of the present invention FIG. 8A—Cross section view of a Vertical Structure of a Unipolar Bootstrapped NAND Gate according to an embodiment of the present invention FIG. 8B—Cross section view of a Vertical Structure of a Unipolar Bootstrapped NAND Gate according to an embodiment of the present invention FIG. 8C—Top view of the Top Layer Connections of a Vertical Unipolar Bootstrapped NAND Gate according to an embodiment of the present invention FIG. 8D—Top view of the Bottom Layer Connections of a Vertical Unipolar Bootstrapped NAND Gate according to an embodiment of the present invention FIG. 8E—Illustrations of arrays of Vertical Unipolar Bootstrapped NAND Gates with average cell sizes ranging from approximately 34 $F^2$ to 36 $F^2$ according to an embodiment of the present invention FIG. 9A—Unipolar Precharged NAND Gate Circuit according to an embodiment of the present invention FIG. 9B—Unipolar Precharged NAND Gate Low Power Circuit according to an embodiment of the present invention FIG. 9C—Unipolar Precharged NOR Gate Circuit according to an embodiment of the present invention FIG. 9D—Unipolar Precharged NOR Gate Low Power Circuit according to an embodiment of the present invention FIG. 9E—Unipolar Clocked NAND Gate Low Power Circuit Single Clock per Gate according to an embodiment of the present invention FIG. 9F—Unipolar Clocked NOR Gate Low Power Circuit Single Clock per Gate according to an embodiment of the present invention FIG. 9G—Unipolar Clocked Inverter Gate Low Power Circuit Single Clock per Gate according to an embodiment of the present invention FIG. 9H—Unipolar Clocked Buffer Gate Low Power Circuit Single Clock per Gate according to an embodiment of the present invention FIG. 9I—Unipolar Clocked NAND Gate Low Power Circuit Single Clock per Gate according to an embodiment of the present invention FIG. 9J—Unipolar Clocked NOR Gate Low Power Circuit Single Clock per Gate according to an embodiment of the present invention FIG. 9K—Unipolar Clocked Inverter Gate Low Power Circuit Single Clock per Gate according to an embodiment of the present invention FIG. 9L—Unipolar Clocked Inverter Gate Low Power Circuit Single Clock per Gate according to an embodiment of the present invention FIG. 10—Sequential Precharged NAND Gate Circuits according to an embodiment of the present invention FIG. 11a—Unipolar Clocked Inverter Circuit FIG. 11b—Unipolar Clocked Inverter Circuit—Simulation FIG. 12a—Unipolar Clocked Buffer Circuit FIG. 12b—Unipolar Clocked Buffer Circuit Simulation FIG. 13a—Unipolar Clocked NAND Circuit FIG. 13b—Unipolar Clocked NAND Circuit Simulation FIG. 14a—Unipolar Clocked 3 NAND Circuit FIG. 14b—Unipolar Clocked 3 NAND Circuit Simulation

DETAILED DESCRIPTION 2.5D and 3D integrated circuits is an area with much ongoing development in methods to improve performance, increase density and reduce die size (cost). The conventional method to achieve improved performance in integrated circuits was to port the circuit design to a smaller feature size (F) or technology node—for example, from 130 nm to 90 nm to 65 nm and so forth. The industry wide Moore's Law was known for the principle that the speed and capability of computers can be expected to double every two years, as a result of increases in the number of transistors a microchip can contain by virtue of smaller feature sizes enabled by improved lithography equipment and processes. The principle has held true for many years with expected cost reduction per transistor with the reduction in feature size. However, as feature sizes reached 20 nm and lower, the cost per transistor has increased due to the high costs of implementing such small feature sizes. Many industry experts feel Moore's Law has reached the physical limit at 5 nm and hence, other methods—beyond improved lithography—are needed to enable continued density and performance improvements in integrated circuits at reasonable costs. Industry developments and proposals for three dimensional (3D) circuits have mainly focused on stacking of multiple die rather than monolithic fabrication of 3D circuits as disclosed herein. The industry has been tied to the crystalline silicon substrate. The invention disclosed herein is not restricted to a particular substrate and therefore enables an innovative approach to true monolithic 3D integrated circuits.

Conventional integrated circuits are designed in a planar layout configuration due to the fact the crystalline silicon substrate is electrically coupled to the integrated circuit. Planar layouts of logic gates—such as CMOS NAND or NOR gates—may occupy upwards of 150 $F^2$ in die area. Free from the anchor of electrically coupling the substrate to the circuit, monolithic 3D semiconductor columns may be fabricated which allows for logic gates occupying less than 20% of the planar silicon counterparts, or even close to 10% of the area.

The present disclosure is related to monolithic 3D integrated circuits comprised of columnar logic gates (CLGs) constructed in a vertical fashion and comprising a semiconductor column and conductive columns which may be equidistant from the semiconductor column for routing the inputs and outputs whereby the inputs and outputs are accessible for connection from either above or below the columnar logic gate or both. The pin connections at interconnection layers above or below the columnar logic gate may be minimally spaced from the semiconductor column and from pins of adjacent columnar logic gates at a distance of 1 F thereby enabling much higher density circuitry compared to conventional planar circuit designs and related routing. Pins at the interconnection layers are only for input (e.g., A, B, Clock, Vdd, Gnd, Vp, Vn) and output signals. Intra-gate routing and transistor gate contacts are all positioned within the vertical (z-axis) distance of the semiconductor column and not at an interconnection layer. Employing TFTs enables low cost manufacturing and high density circuits by enabling multiple stacks of columnar logic gates and interconnection layers.

The columnar logic gates are preferably constructed with a core vertical stack of source, body and drain layers—or semiconductor column. Such a construction is analogous to the methods employed in fabrication of 3D NAND flash devices which allows for low cost manufacturing through reduction in masks and processing steps. The fabrication of the transistors via sequential deposition of source, body, and drain layers allows for very thin (short) transistor channel lengths without the need for lithography equipment capable of such channel lengths. For example, a semiconductor fab may be used to construct columnar logic gates which have transistor channel lengths of 10 nm or even less regardless of the minimum feature size of the lithography equipment employed at the facility which could be greater than 100 nm.

The semiconductor column is preferably made with thin film transistors (TFTs) which may be fabricated at back end of line (BEOL) temperatures of less than 450 F, thereby allowing for low cost manufacturing and high density by enabling multiple stacks of CLGs and interconnection layers.

The high density CLGs described herein enable circuit devices with high density, low power and high speed due to drastically reduced interconnect distances which may be fabricated at reduced costs compared to current methods employed in the semiconductor field.

FIG. 1A is a schematic diagram of a unipolar precharged NAND gate circuit according to an embodiment of the present invention. When CLK (32) is driven high, A (33) and B (34) can change, transistor (21) turns on and capacitor (26) is charged to Vdd. Further, when CLK (32) is driven high, $\overline{CLK}$ (92) is driven low and there is no other path for Vdd other than charging capacitor (26). When CLK (32) is driven low, A (33) and B (34) cannot change, $\overline{CLK}$ (92) is driven high and the charge on capacitor (26) is available to drive the Output (35) high provided either A (33) or B (34) are low. The only manner for a low output is when A (33) and B (34) are both high. Transistor (25) does not allow any changes of A (33) or B (34) to propagate to Output (35) when $\overline{CLK}$ (92) is not asserted (driven low). Every clock cycle of which the output is to be pulled low, the charge from capacitor (26) is pulled to ground through transistors (22, 23 and 24). Additional logic circuitry, FIG. 1B (38), may be employed to keep the capacitor (26) from discharging to ground when A (33) and B (34) are both high; this would provide for lower power circuitry.

Figure 1B:
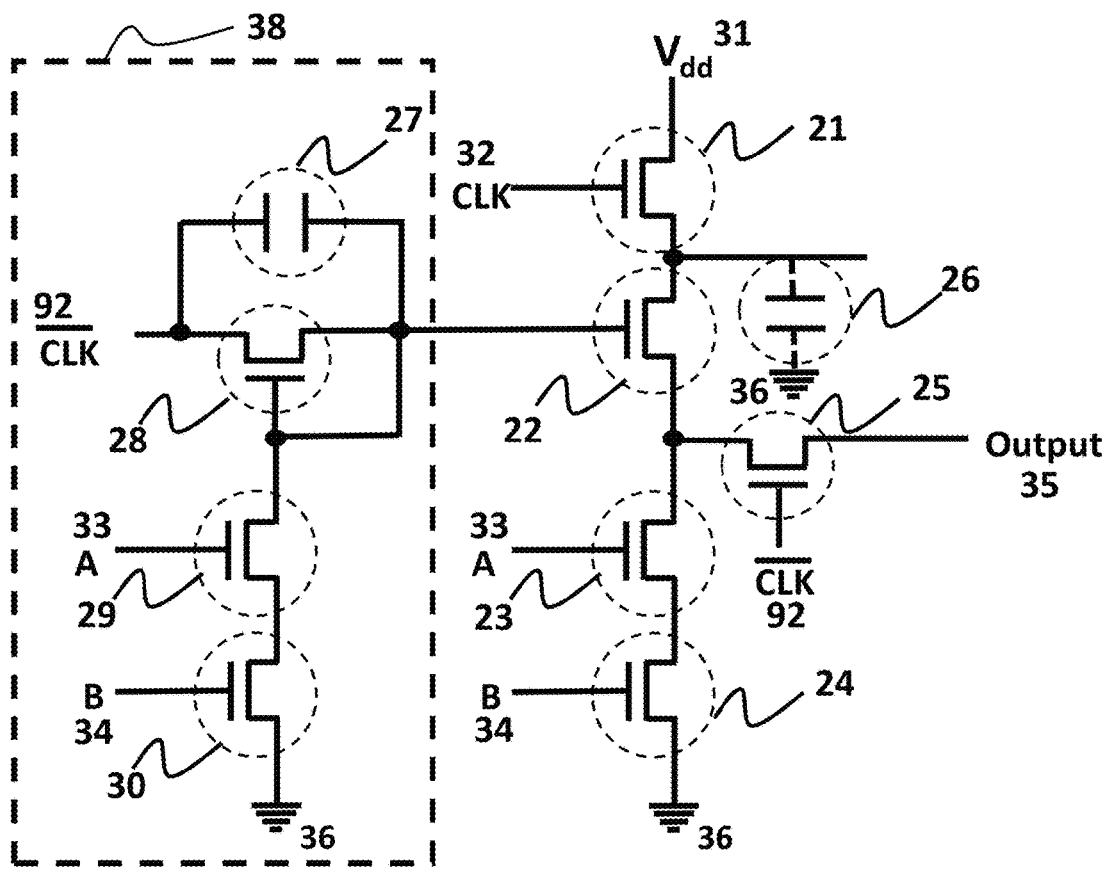

FIG. 1B is such an example of a unipolar precharged NAND gate low power circuit according to an embodiment of the present invention. When A (33) and B (34) are on (high) the Output (35) is to be pulled low, but it is desirable to not discharge capacitor (26). The point of the additional circuitry is to turn off transistor (22) when both A (33) and B (34) are on (high). When A (33) and B (34) are on, transistors (28) and (22) are turned off (low), thereby not providing a path for capacitor (26) to discharge to ground. In order for transistor (22) to turn on (high), either A (33) or B (34) is off (low), thereby not providing a path for the gate of transistor (22) to ground. Further, when either A (33) or B (34) is off (low), it is desirable that $\overline{CLK}$ (92) drives the gate of transistor (22). When $\overline{CLK}$ (92) is driven high, capacitor (27) will bump up the voltage of the gate of transistor (22) and the gate of transistor (28). When the gate of transistor (28) reaches its threshold voltage, transistor (28) turns on allowing the voltage of $\overline{CLK}$ (92) to propagate to the gate of transistor (22). This allows the charge on capacitor (26) to propagate to the Output (35).

Figure 1C:
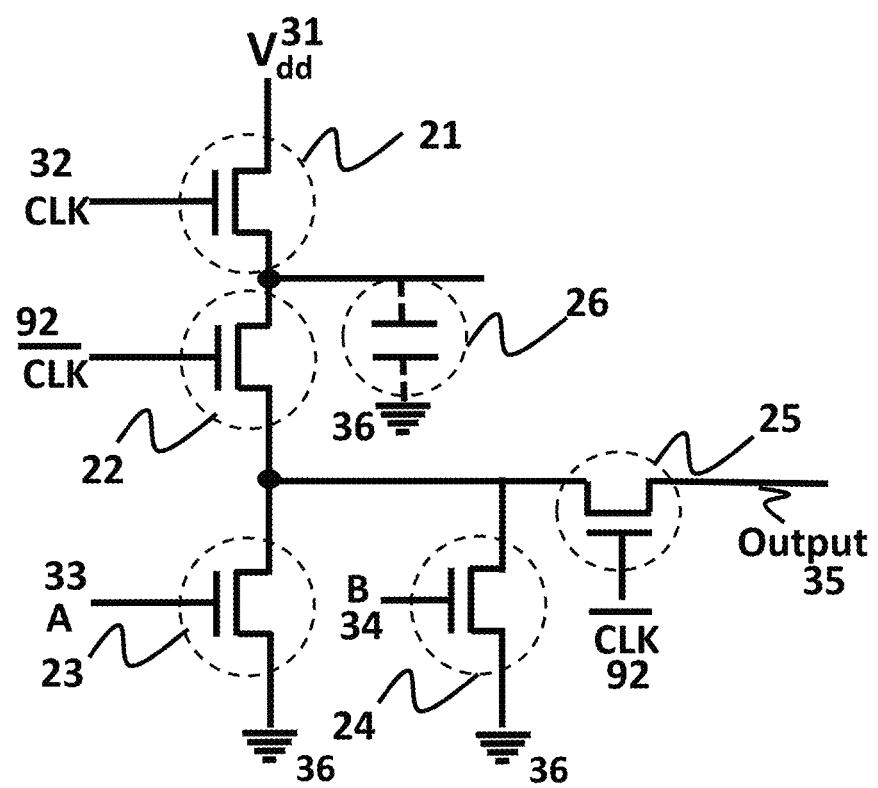

FIG. 1C is a schematic diagram of a unipolar precharged NOR gate circuit according to an embodiment of the present invention. When CLK (32) is driven high, A (33) and B (34) can change, transistor (21) turns on and capacitor (26) is charged to Vdd. Further, when CLK (32) is driven high, $\overline{CLK}$ (92) is driven low and there is no other path for Vdd other than charging capacitor (26). When CLK (32) is driven low, A (33) and B (34) cannot change, $\overline{CLK}$ (92) is driven high and the charge on capacitor (26) is available to drive the Output (35) high provided both A (33) and B (34) are low. The only manner for a low output is when A (33) or B (34) are both high. Transistor (25) does not allow any changes of A (33) or B (34) to propagate to Output (35) when $\overline{CLK}$ (92) is not asserted. Every clock cycle, of which the output is to be pulled low, the charge from capacitor (26) is pulled to ground through transistors (22 and 23 or 22 and 24). Additional logic circuitry, FIG. 1D (39), may be employed to keep the capacitor (26) from discharging to ground when A (33) or B (34) is high; this would provide for lower power circuitry.

Figure 1D:
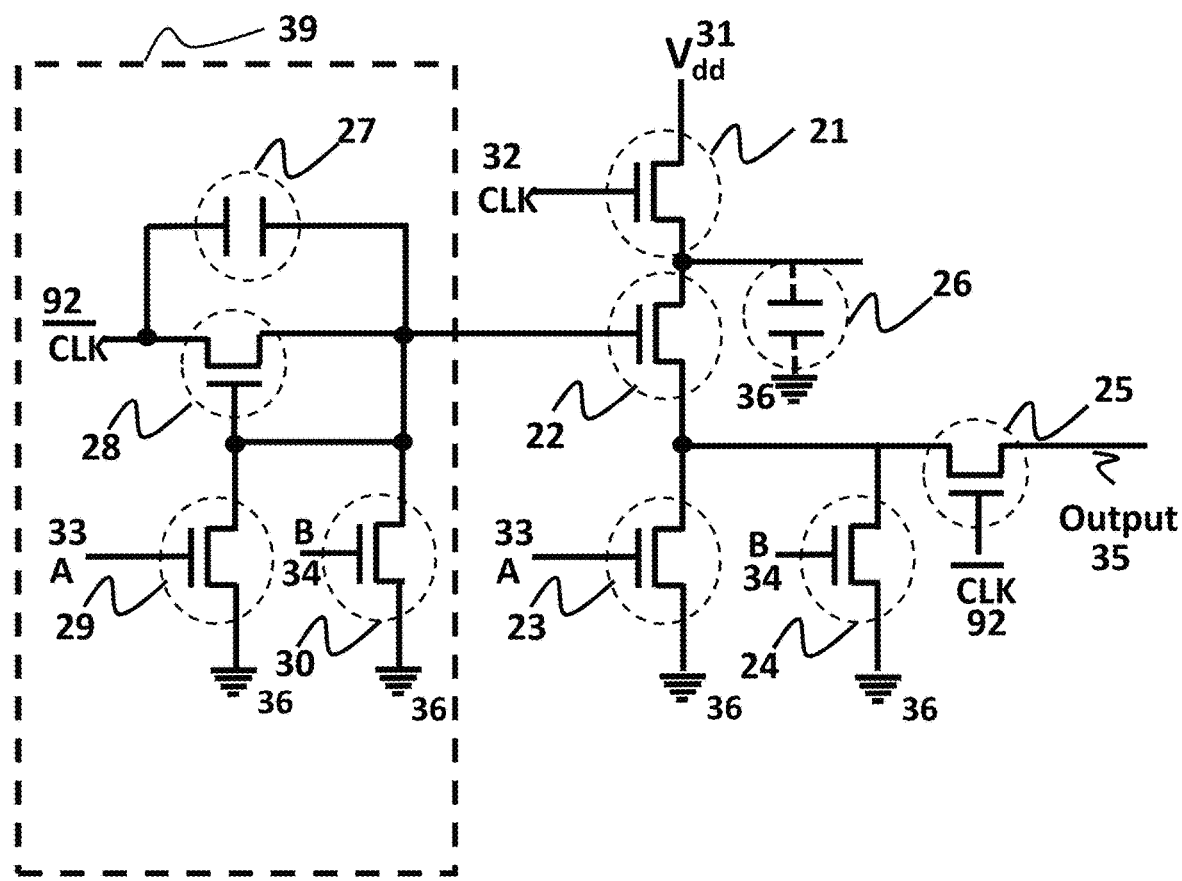

FIG. 1D is such an example of a unipolar precharged NOR gate low power circuit according to an embodiment of the present invention. When A (33) or B (34) is on (high) the Output (35) is to be pulled low, but it is desirable to not discharge capacitor (26). The point of the additional circuitry is to turn off transistor (22) when either A (33) or B (34) is on (high). When A (33) or B (34) is on, transistors (28 and 22) are turned off (low), thereby not providing a path for capacitor (26) to discharge to ground. In order for transistor (22) to turn on (high), both A (33) and B (34) must be off (low), thereby not providing a path for the gate of transistor (22) to ground. Further, when both A (33) and B (34) are off (low), it is desirable that $\overline{CLK}$ (92) drives the gate of transistor (22). When $\overline{CLK}$ (92) is driven high, capacitor (27) will bump up the voltage of the gate of transistor (22) and the gate of transistor (28). When the gate of transistor (28) reaches its threshold voltage, transistor (28) turns on allowing the voltage of $\overline{CLK}$ (92) to propagate to the gate of transistor (22). This allows the charge on capacitor (26) to propagate to the output.

There are numerous reasons for implementing unipolar logic. Unipolar logic is not often used because of the drawbacks of implementing unipolar logic. For example, NMOS logic utilizes a resistor to pull the voltages high. These resistors draw current too much of the time resulting in high power consumption. If the resistors are higher valued to reduce to power consumption, the speed suffers (i.e., speed is reduced). Other methods known in the art require too many transistors and tend to be slow speed compared to conventional CMOS. As known in the art, system speed has been increasing for some time and as of late the increases in speed has slowed. Historically there have been two methods to increase the speed. One method is the reduction in gate length which increases transistor speed and increases density which decreases parasitic losses due to capacitance, inductance and resistance. The other method is to reduce the path length from latch to latch.

Figure 1E:
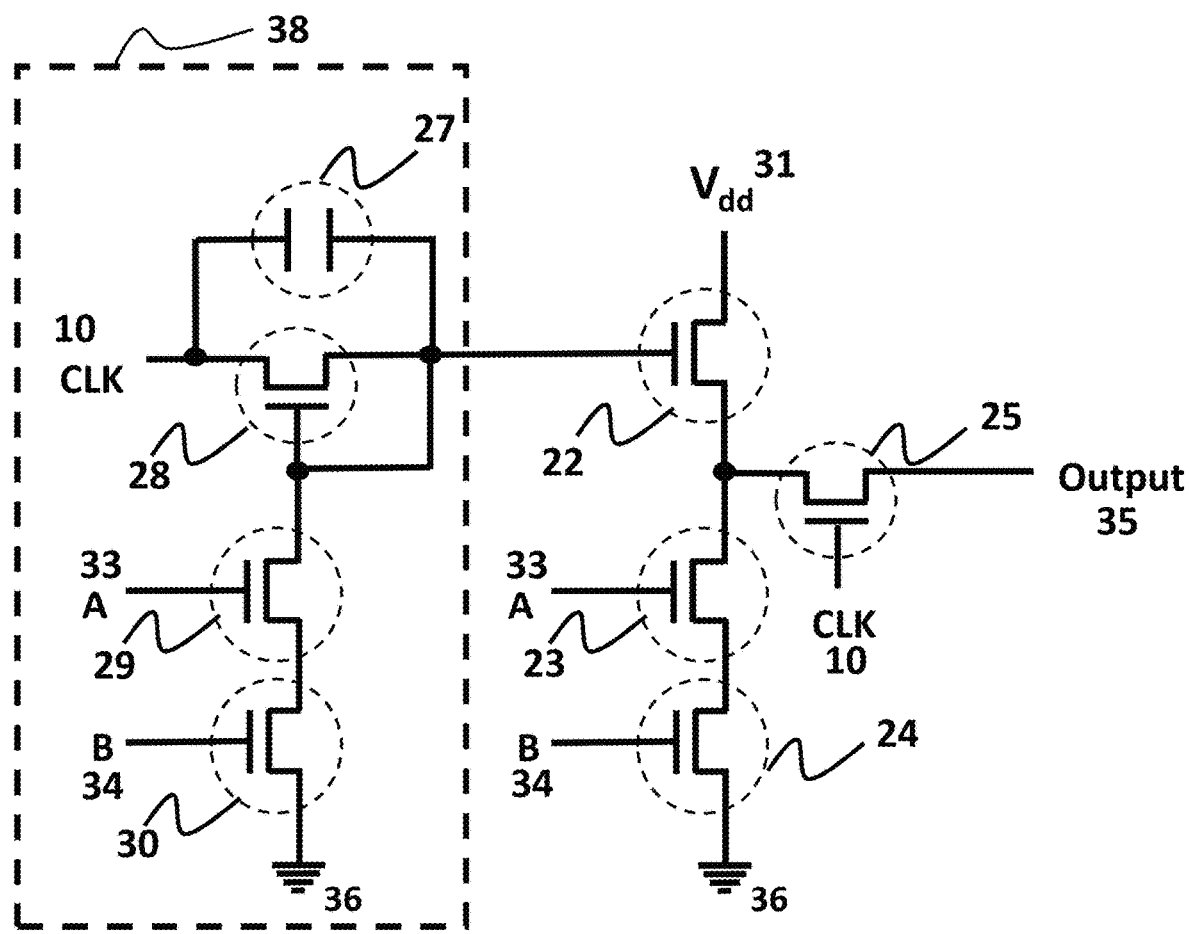
Figure 1F:
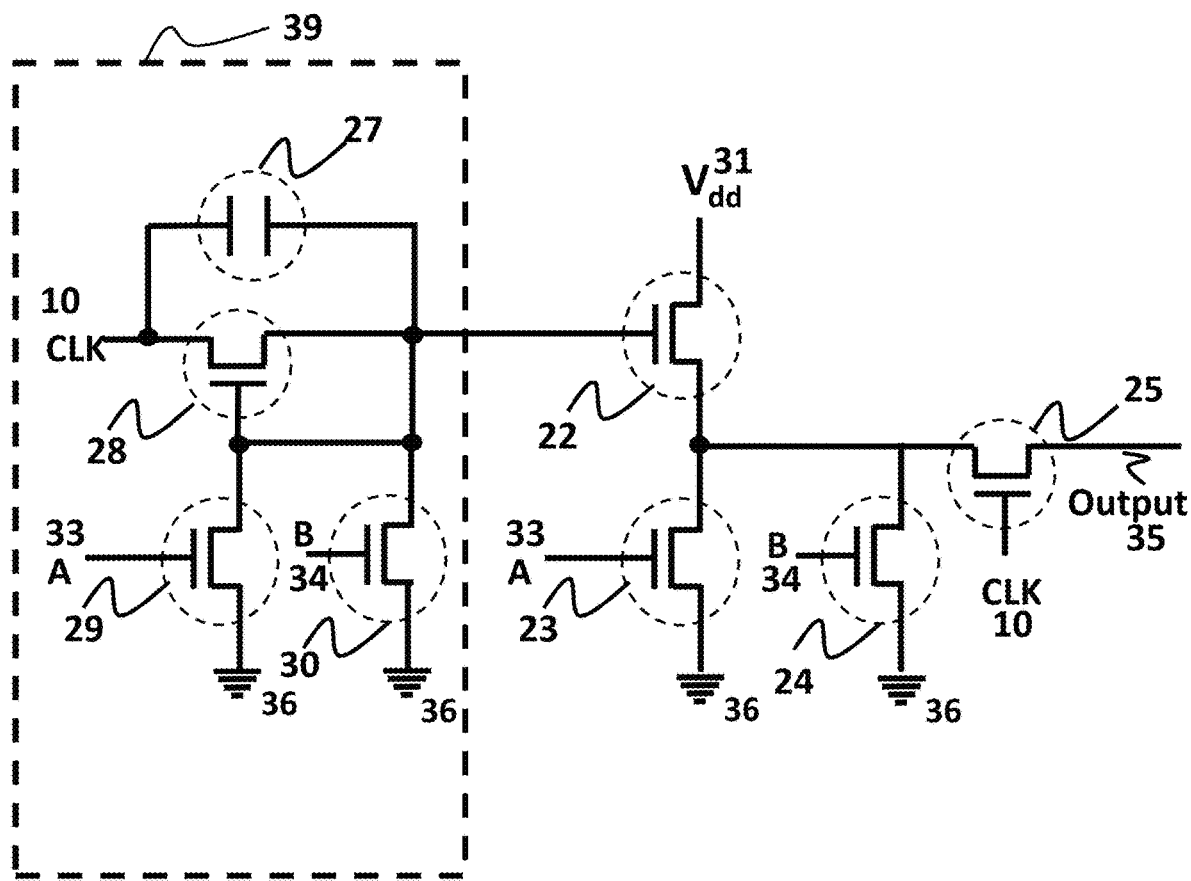

The methods outlined below, related to FIG. 1E and FIG. 1F, improve the clock speed by reducing the logic path between gates to a minimum. Effectively, every gate is clocked providing for a maximum of clock speed. Clocking each gate in conventional CMOS logic is not often done due to the increase in number of latches that would be required. With approximately 8 transistors per latch, that would be not feasible. In FIGS. 1E, 1F, 1G, 1H, 1I, 1J, 1K and 1L we have created a methodology in circuitry which enables unipolar logic at very high speed clocking at each gate. It utilizes a clock at each gate to bootstrap the voltage so there's no loss due to threshold voltage drop. We refer to this methodology as Unipolar Clocked Logic.

FIG. 1E is an example of an improved unipolar Clocked NAND gate low power circuit single clock according to an embodiment of the present invention. When A (33) and B (34) are on (high) the Output (35) is to be pulled low when CLK (10) is asserted. The Output (35) can only change and only be driven when the CLK (10) is asserted. For the Output (35) to be asserted low, transistors (25, 23 and 24) are on and transistor (22) is off. In order for transistor (22) to be off, transistors (29 and 30) are on. For the Output (35) to be asserted high, transistors (25, 22, and 28) are on and transistors (23 or 24) are off. In order for transistor (22) to be on, CLK (10) increases in voltage causing an increase in voltage on gate of transistor (22) through capacitor (27). This increase in voltage will be reduced if transistors (29 and 30) are on. If either (29 or 30) are off, transistors (28 and 22) will turn on. When CLK (10) is not asserted the Output (35) node is floating and the parasitic capacitance will maintain the state for some period of time. When A (33) and B (34) are not both high (on), it is desirable with NAND gate logic to pull the Output (35) high. In order for the Output (35) to go high, the gate of transistor (22) needs to be high. Transistor (22) gate goes high when either A (33) or B (34) are off and CLK (10) is high. When the gate of transistor (25) gate goes high, the Output (35) is enabled. The requirements on the voltage of the Output (35) is that it must exceed the threshold voltage of the unipolar (e.g., NMOS) transistor.

FIG. 1F is an example of an improved unipolar Clocked NOR gate low power circuit single clock according to an embodiment of the present invention. When A (33) or B (34) are on (high) the Output (35) is to be pulled low when CLK (10) is asserted. The Output (35) can only change and only be driven when the CLK (10) is asserted. For the Output (35) to be asserted low, transistors (25 and 23 or 25 and 24) are on and transistor (22) is off. In order for transistor (22) to be off, transistors (29 or 30) are on. For the Output (35) to be asserted high, transistors (25, 22, and 28) are on and transistors (23 and 24) are off. In order for transistor (22) to be on, CLK (10) increases in voltage causing an increase in voltage on gate of transistor (22) through capacitor (27). This increase in voltage will be reduced if transistors (29 or 30) are on. If both (29 and 30) are off, transistors (28 and 22) will turn on. When CLK (10) is not asserted the Output (35) node is floating and the parasitic capacitance will maintain the state for some period of time. When A (33) and B (34) are not both high (on), it is desirable with NOR gate logic to pull the Output (35) high. In order for the Output (35) to go high, the gate of transistor (22) needs to be high. Transistor (22) gate goes high when both A (33) and B (34) are off and CLK (10) is high. When the gate of transistor (25) gate goes high, the Output (35) is enabled. The requirements on the voltage of the Output (35) is that it must exceed the threshold voltage of the unipolar (e.g., NMOS) transistor.

Figure 1G:
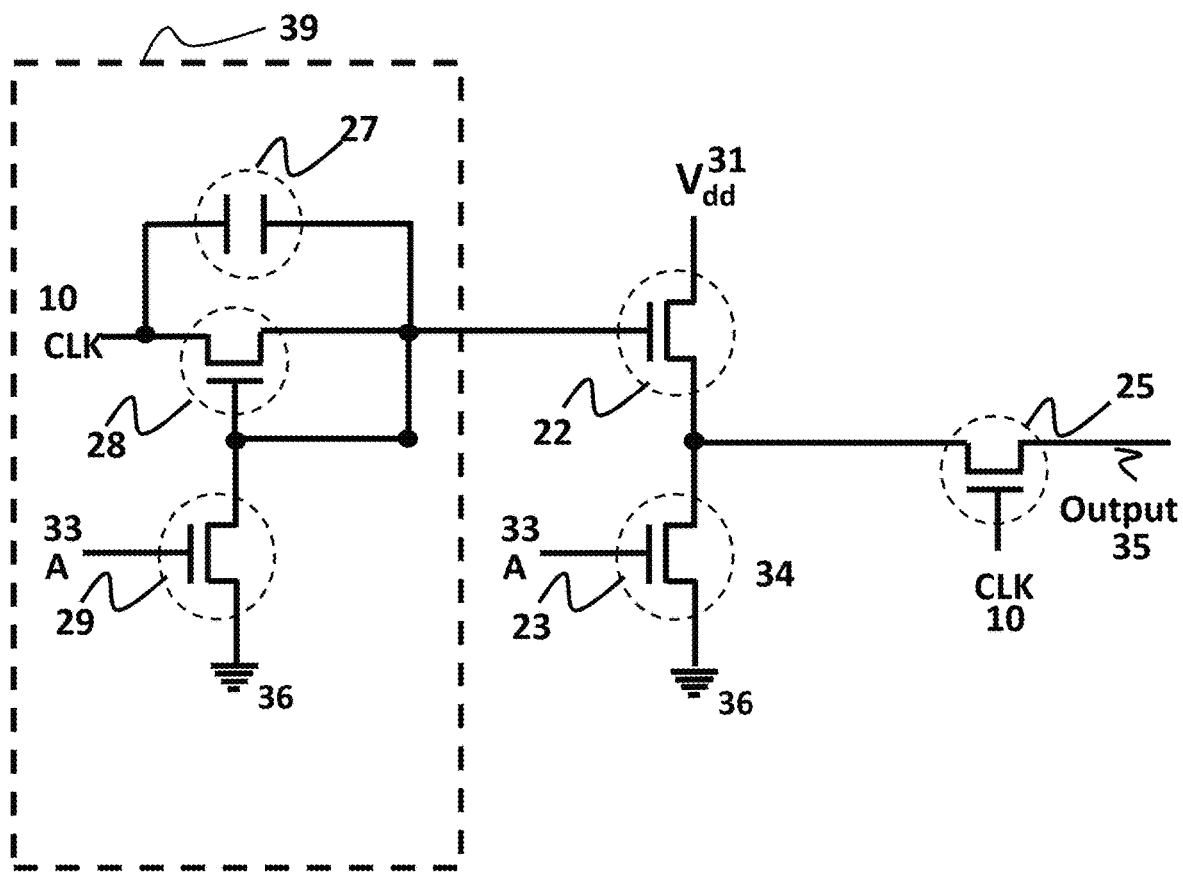
Figure 1H:
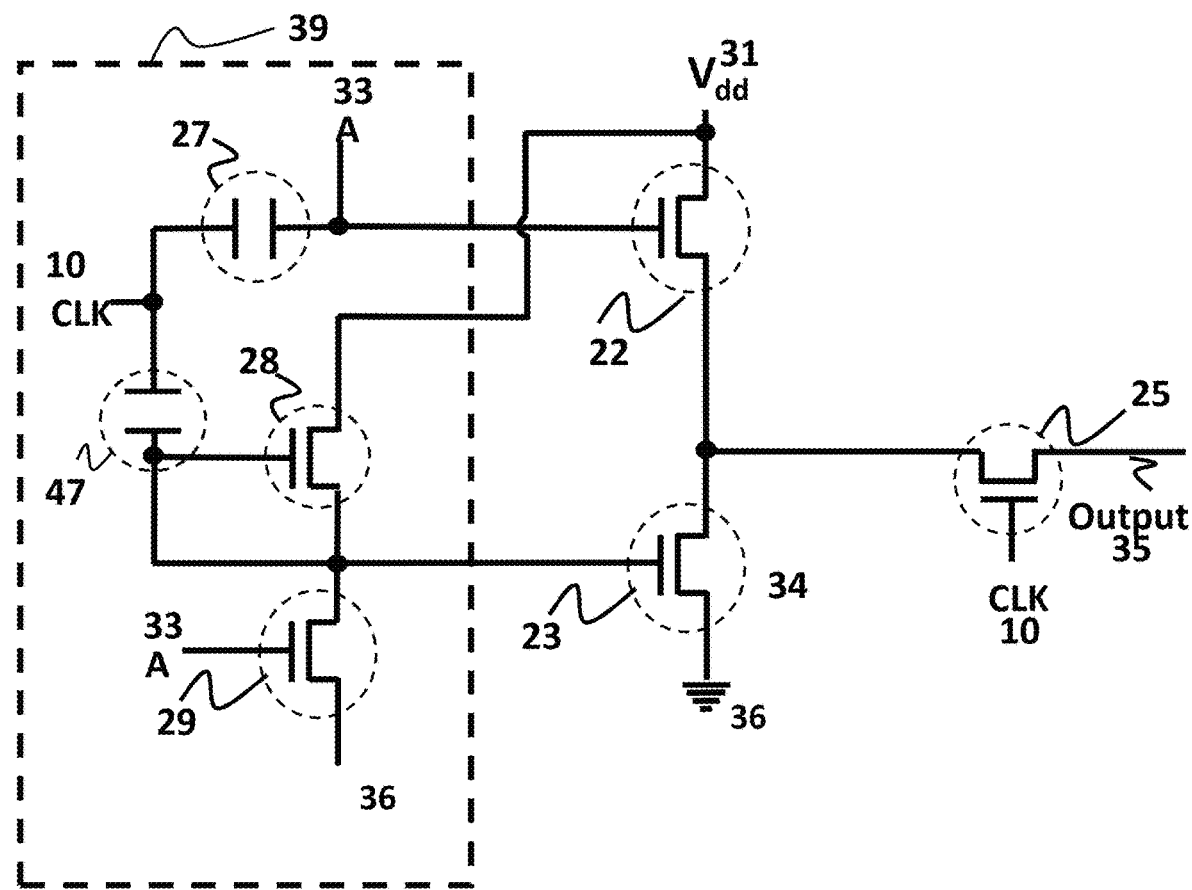
Figure 1I:
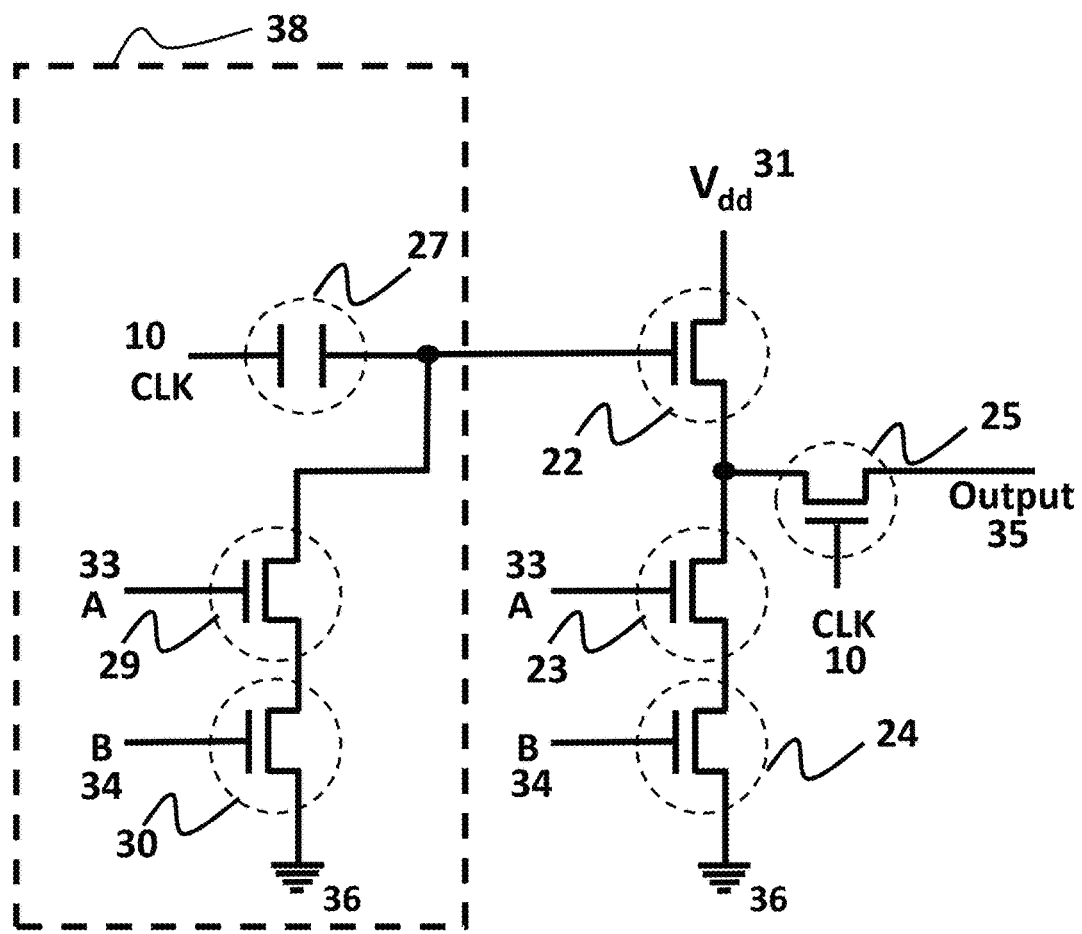
Figure 1J:
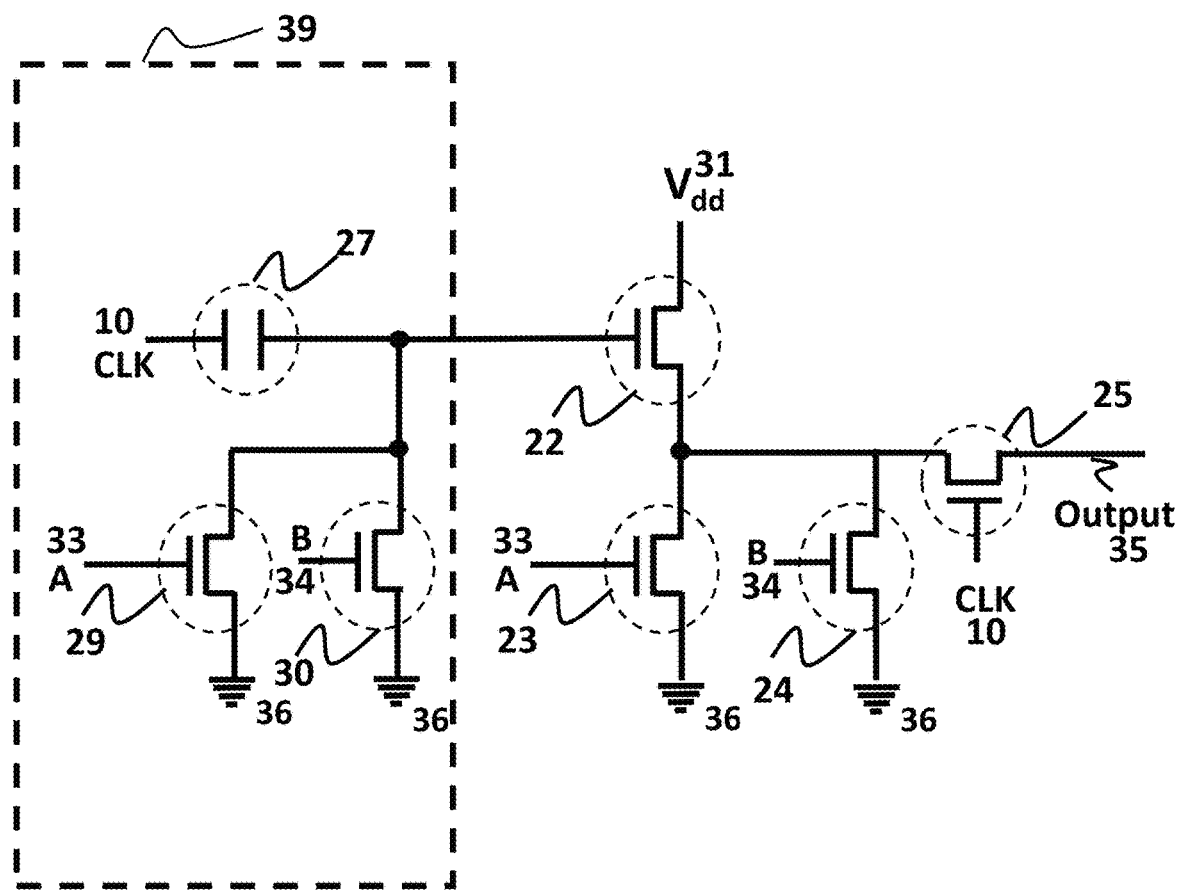
Figure 1K:
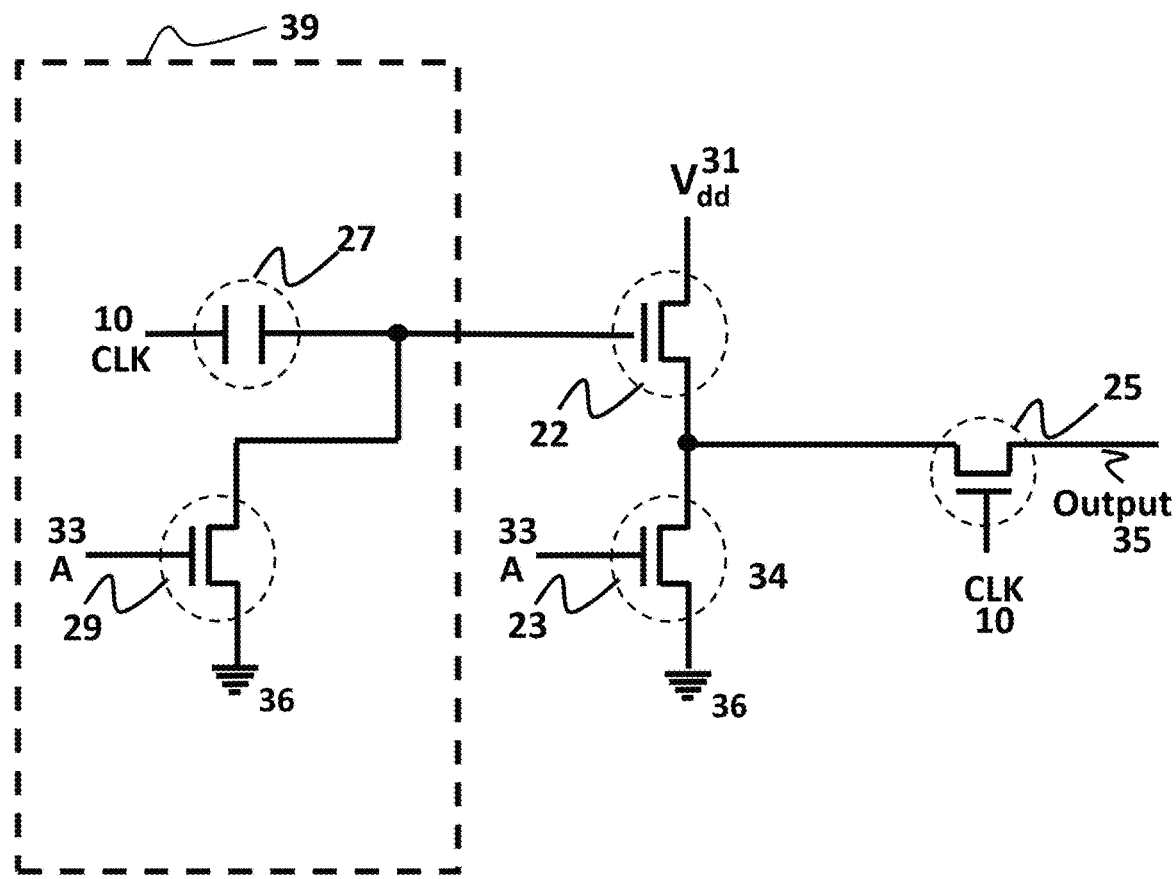
Figure 1L:
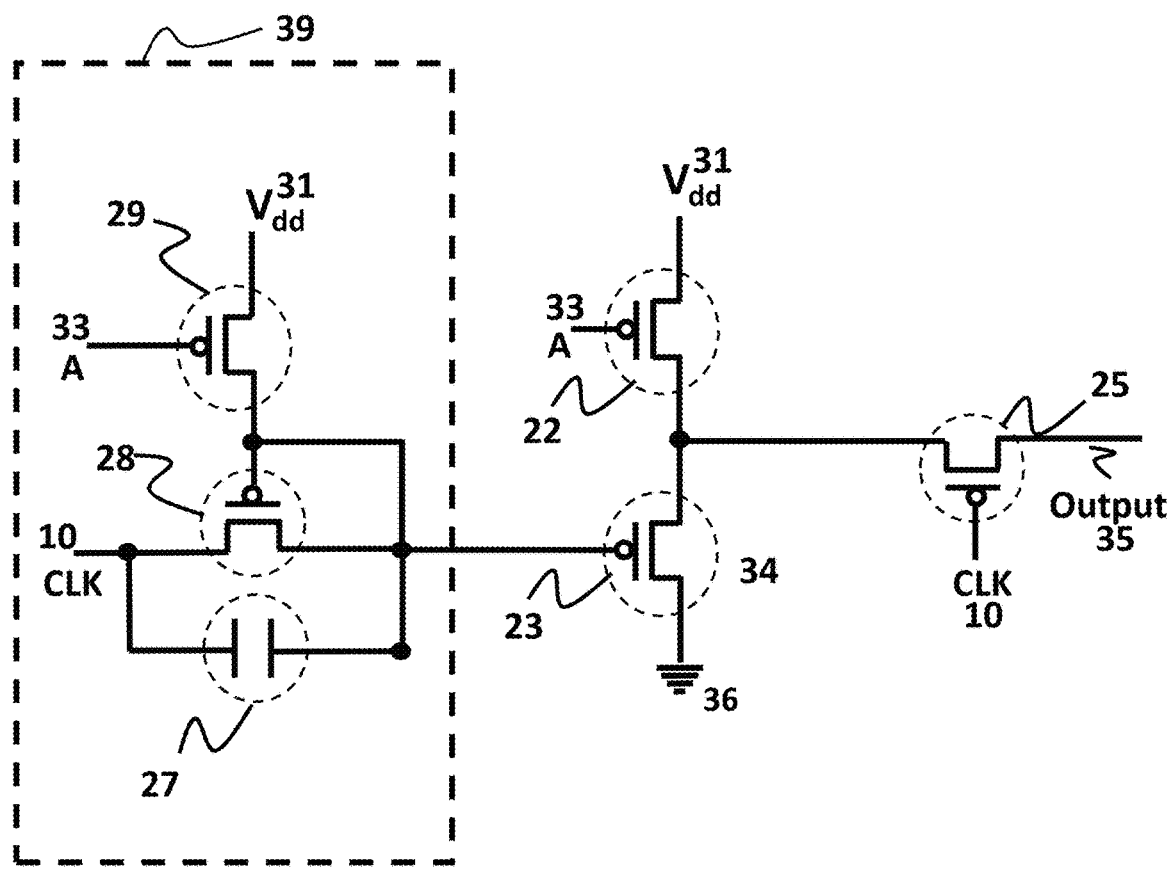

Other examples of Unipolar Clocked Logic circuits include an inverter gate, FIG. 1G or FIG. 1L—Unipolar Clocked Inverter Gate Low Power Circuit Single Clock per Gate and a buffer gate, FIG. 1H—Unipolar Clocked Buffer Gate Low Power Circuit Single Clock per Gate.

Simplified circuitry employing Unipolar Clocked Logic may be possible by removing transistor (28) in FIGS. 1E, 1F, 1G and 1L due to the edge rate of the clock and the value of the capacitor (27) will cause the gate voltage on transistor (22) to be sufficient without requiring transistor (28). FIG. 1I, 1J and IK illustrate such simplified circuits for unipolar clocked logic NAND, NOR and Inverter gates respectively.

Figure 2:
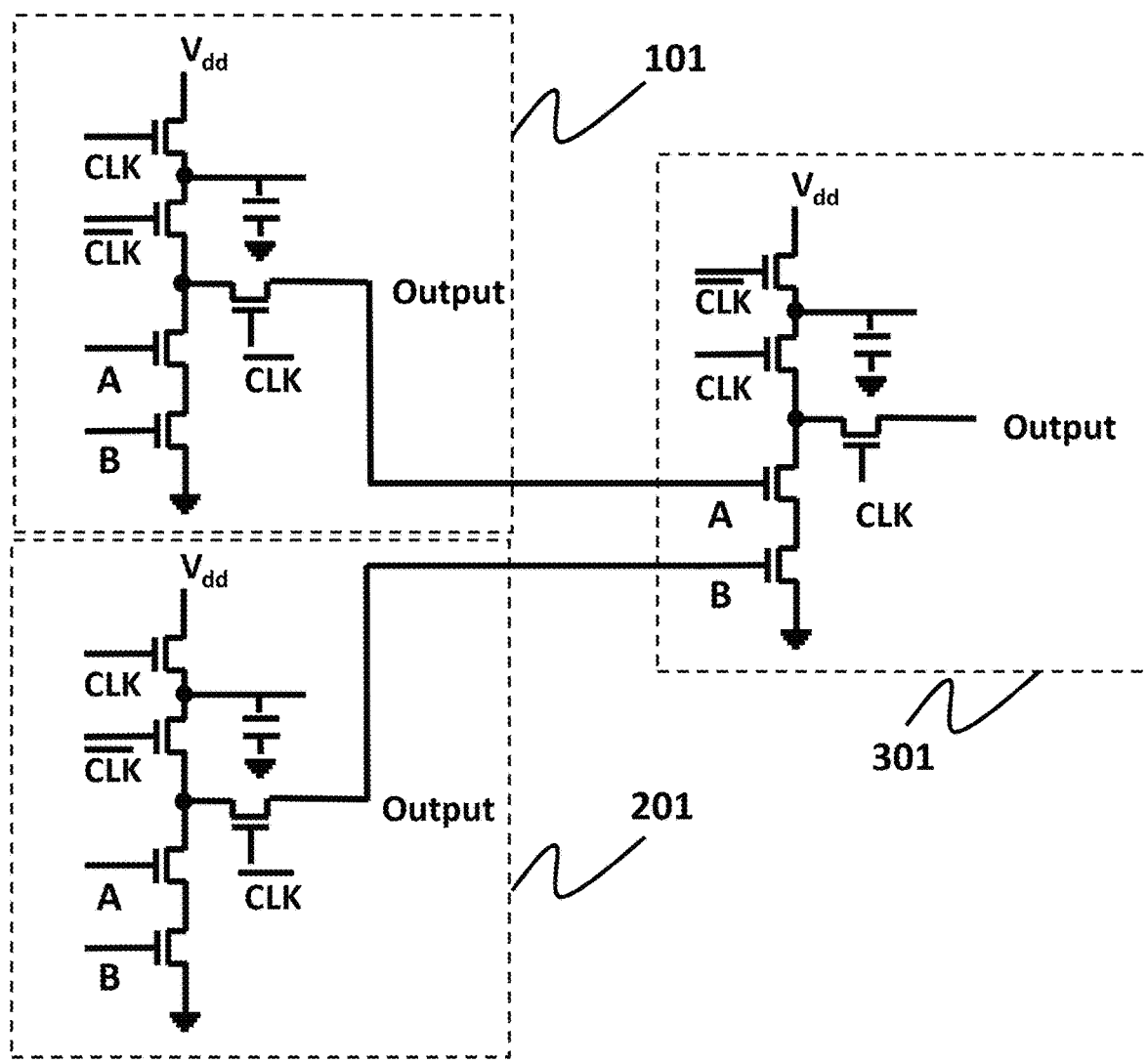

FIG. 2 is a schematic diagram of sequential precharged NAND gate circuits according to an embodiment of the present invention. A first unipolar precharged NAND gate (101) and a second unipolar precharged NAND gate (201) operate in parallel and the outputs are propagated on $\overline{CLK}$ (92). The outputs of NAND gate (101) and NAND gate (201) are inputs to a third unipolar precharged NAND gate (301). NAND gate (301) output is propagated on CLK (32) and not on $\overline{CLK}$ (92). Alternating the clock phase of serially connected logic gates prevents signals from propagating through more than one gate at a time or shooting through clock cycles. Such a clock phase arrangement can prevent crowbar currents while input voltages are undergoing transient behavior.

Figure 3:
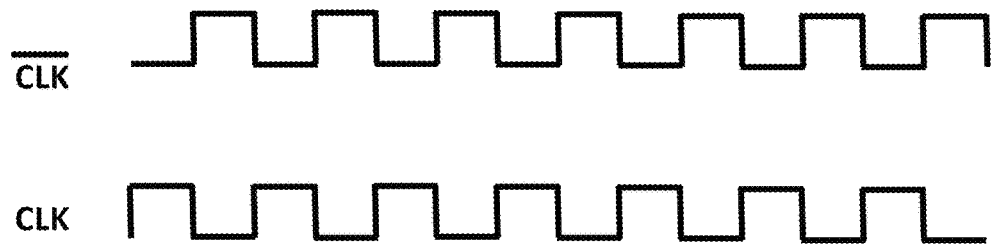

FIG. 3 is a schematic diagram of the CLK and $\overline{CLK}$ signals for Precharged Logic Circuits according to an embodiment of the present invention. The CLK and $\overline{CLK}$ signals are asymmetrical to each other and no time interval between the rise of one and the fall of the other is required. Such a complementary clocking scheme can be used because of the alternating clock phases of serially connected logic gates. Such clock phasing minimizes stringent timing requirements of clocking edges.

Figure 4:
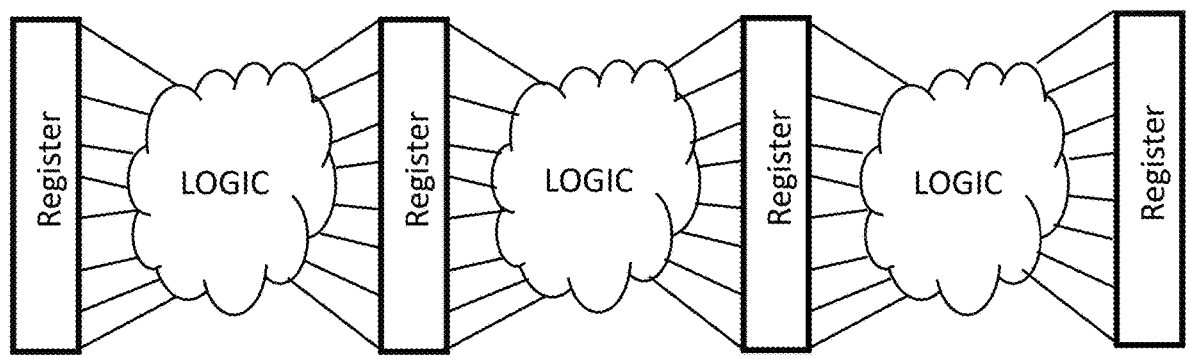

FIG. 4 is a diagram illustrating logic blocks according to the prior art. Conventional circuit designs can employ registers interposed between blocks of logic. Such interposed registers can be called pipeline design of logic. In such pipeline designs, a maximum clock speed can be limited by the setup and hold time of the register plus the delay time of the blocks of logic.

Figure 5:
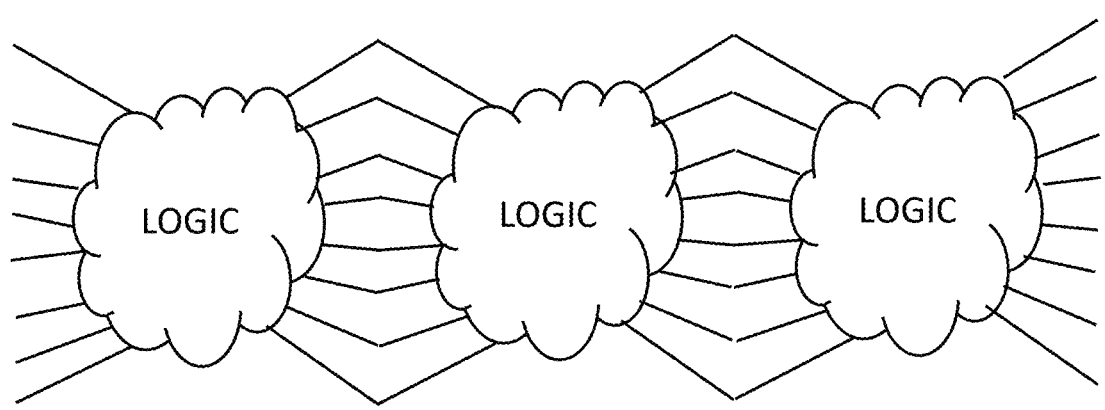

All of the unipolar logic circuits described herein are clocked logic blocks including the precharged logic (FIGS. 1A-1D), clocked logic (FIGS. 1E-1H) and bootstrapped logic (FIG. 2). FIG. 5 is a diagram illustrating clocked logic blocks according to an embodiment of the present invention. In contrast to FIG. 4, separate registers are not needed for logic blocks because each gate acts as its own register. Further, the load capacitance acts as a storage element to store the output state. Such clocking schemes provide a dynamic register capability to the logic block. The clock speed for such clocked logic cells can be determined by the time is takes to charge the load capacitance. Therefore, the clock speed of the present inventions can be much higher than that required by standard logic such as FIG. 4

Figure 6A:
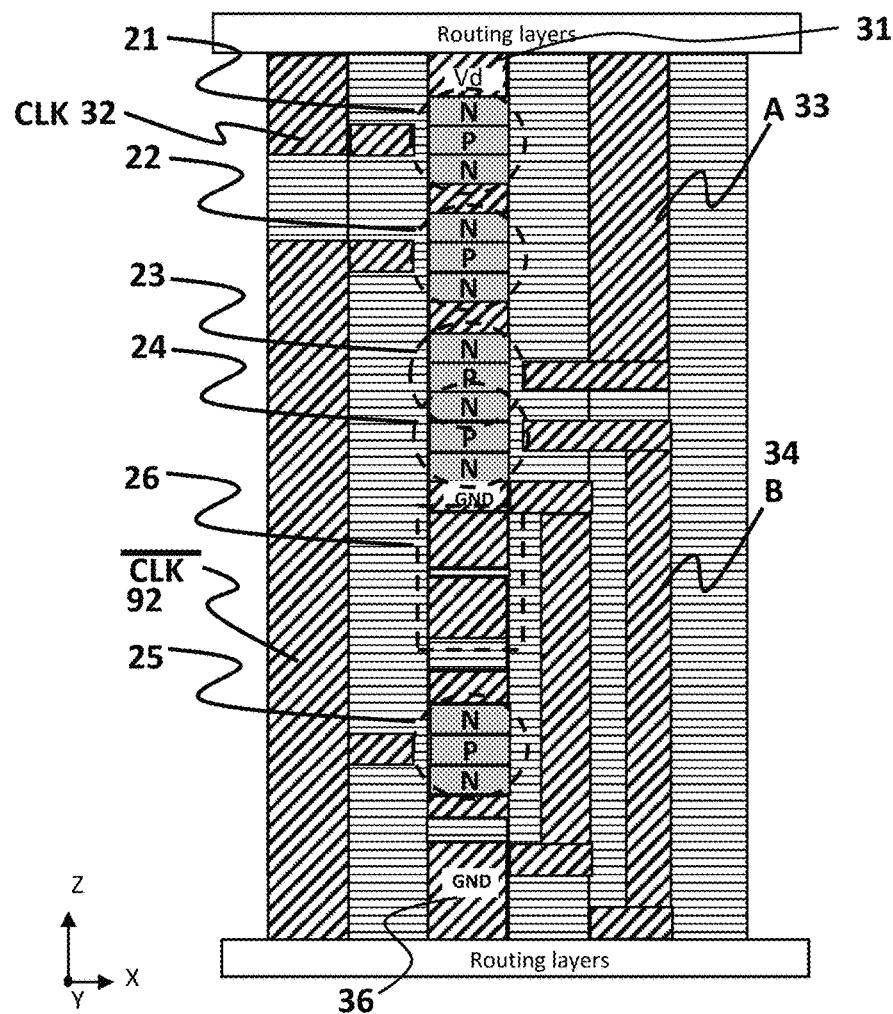
Figure 6B:
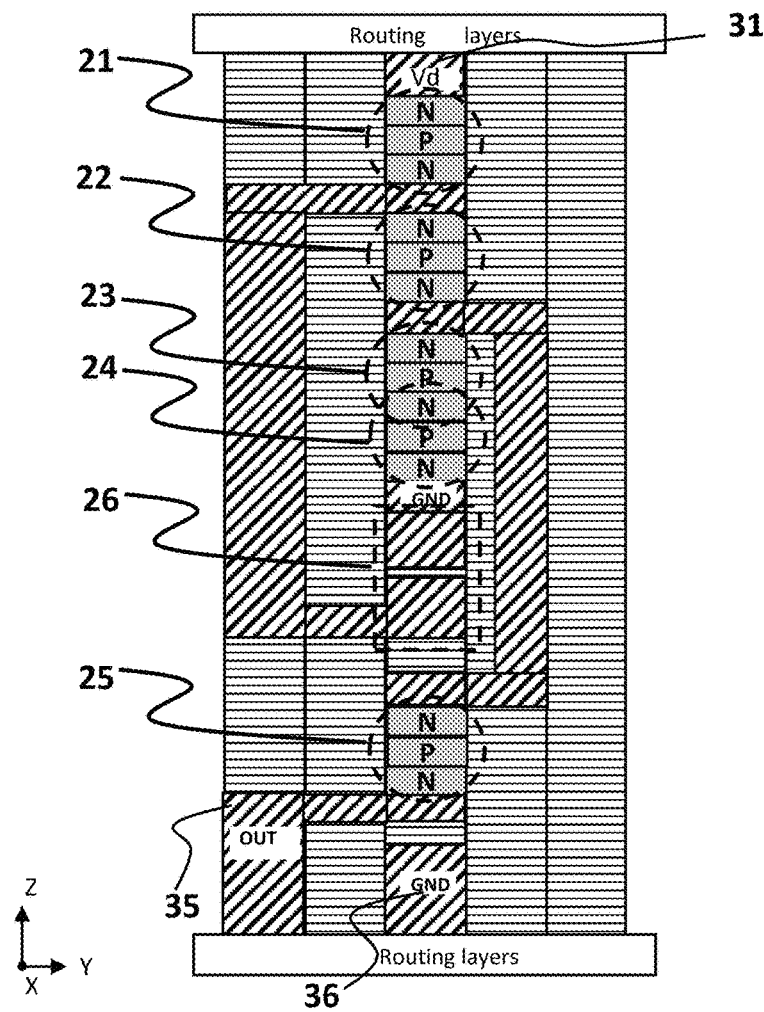

FIG. 6A and FIG. 6B are cross-sectional views of a vertical structure of a unipolar precharged NAND gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6A and 6B are cross-sectioned in quadrature planes (planes whose normal vectors are orthogonal to one another). Both FIGS. 6A and 6B section through an active column (e.g., a column of semiconductor material in which active devices can be fabricated). The semiconductor layers of transistors (21, 22, 23, 24 and 25) of FIG. 1A are all fabricated in a single stack. The transistor channel lengths are determined by deposition and not by lithography. This allows very high density circuitry and very high speed. The manufacturing methodology for fabricating the structure shown in FIG. 6A and FIG. 6B can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors; alternatively, one may separate the transistors and connect them with a metal interconnect.

Figure 6C:
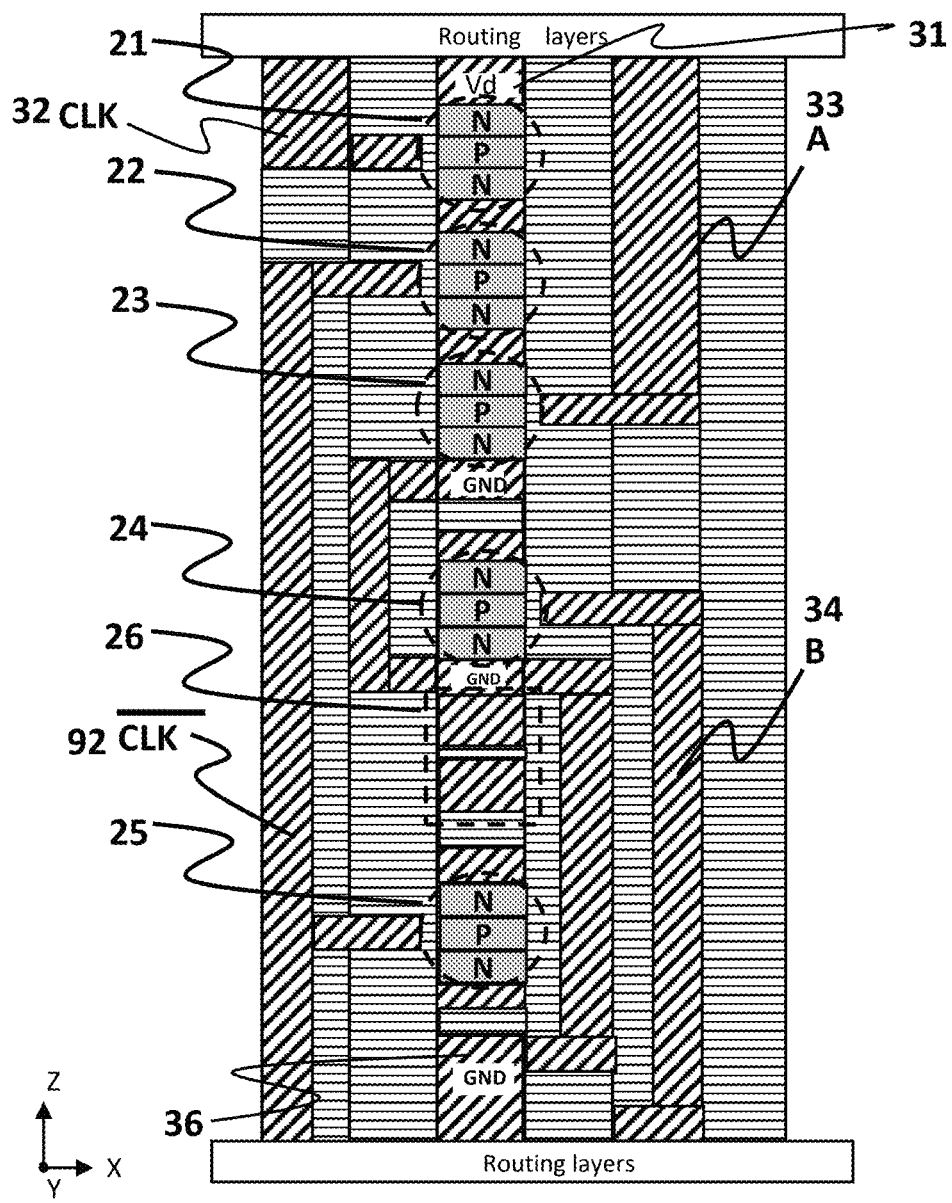
Figure 6D:
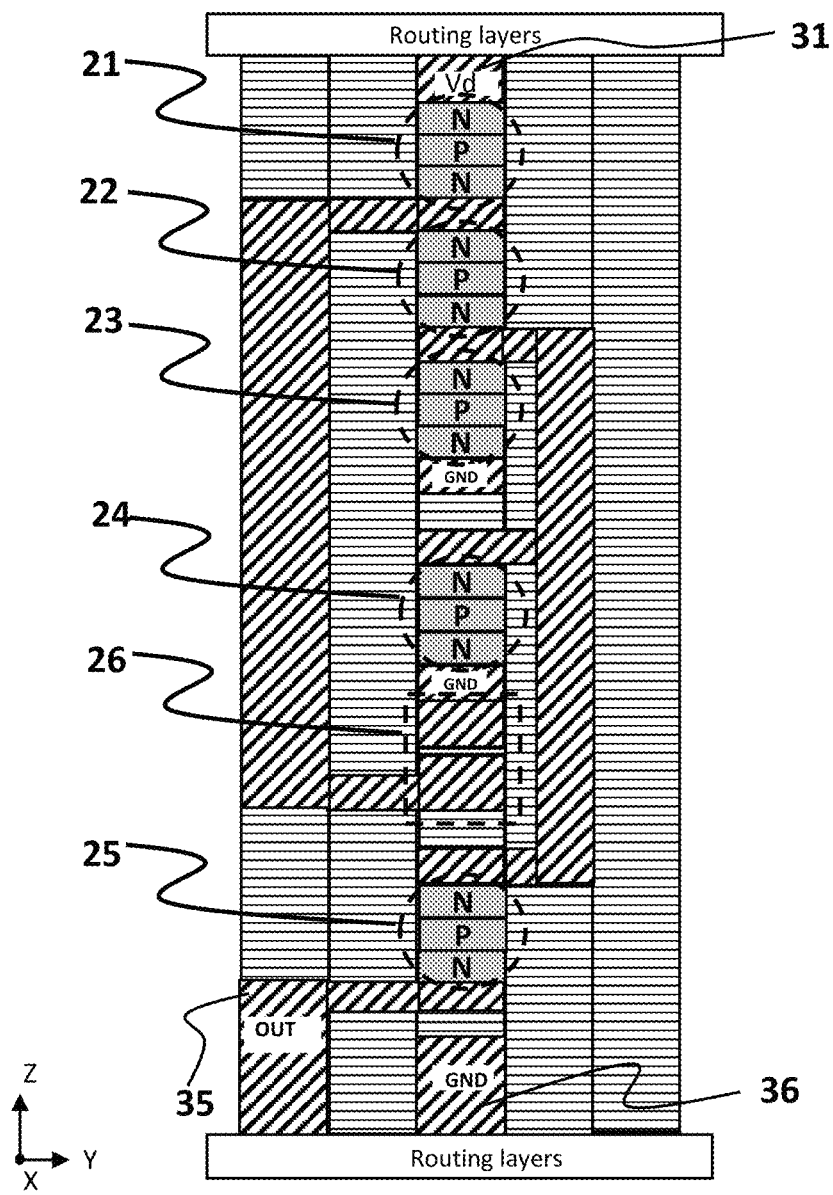

FIG. 6C and FIG. 6D are cross-sectional views of a vertical structure of a unipolar precharged NOR gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6C and 6D are cross-sectioned in quadrature planes (planes whose normal vectors are orthogonal to one another). Both FIGS. 6C and 6D section through an active column (e.g., a column of semiconductor material in which active devices can be fabricated). The semiconductor layers of transistors (21, 22, 23, 24 and 25) of FIG. 1C are all fabricated in a single stack. The transistor channel lengths are determined by deposition and not by lithography. This allows very high density circuitry and very high speed. The manufacturing methodology for fabricating the structure shown in FIG. 6C and FIG. 6D can be similar to methods employed by the flash memory industry for making 3D NAND and other 3D non-volatile memory devices. The gates of the transistors may be of the surrounding gate type thereby permitting better performance.

Figure 6E:
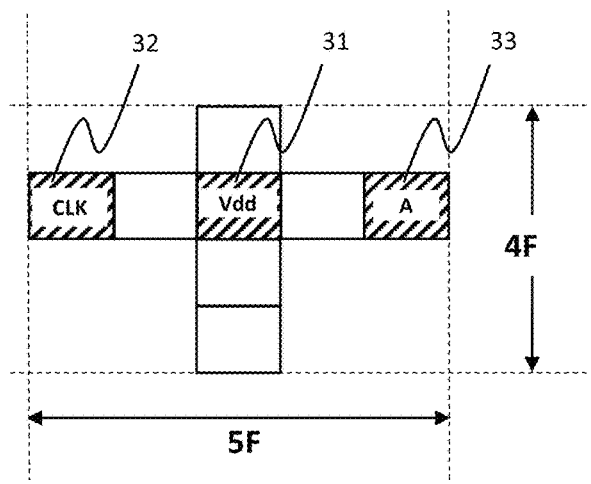
Figure 6F:
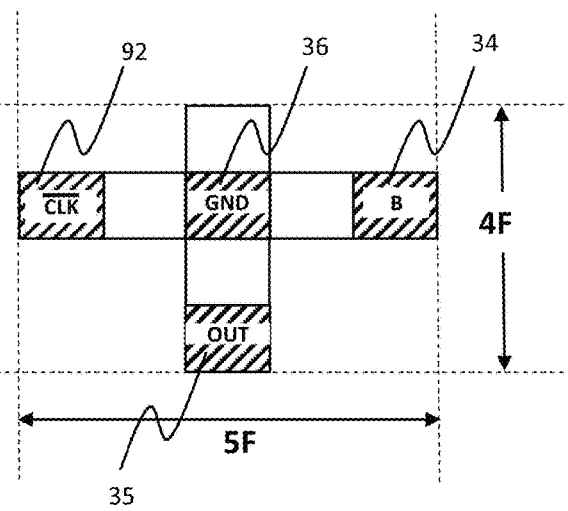
Figure 6G:
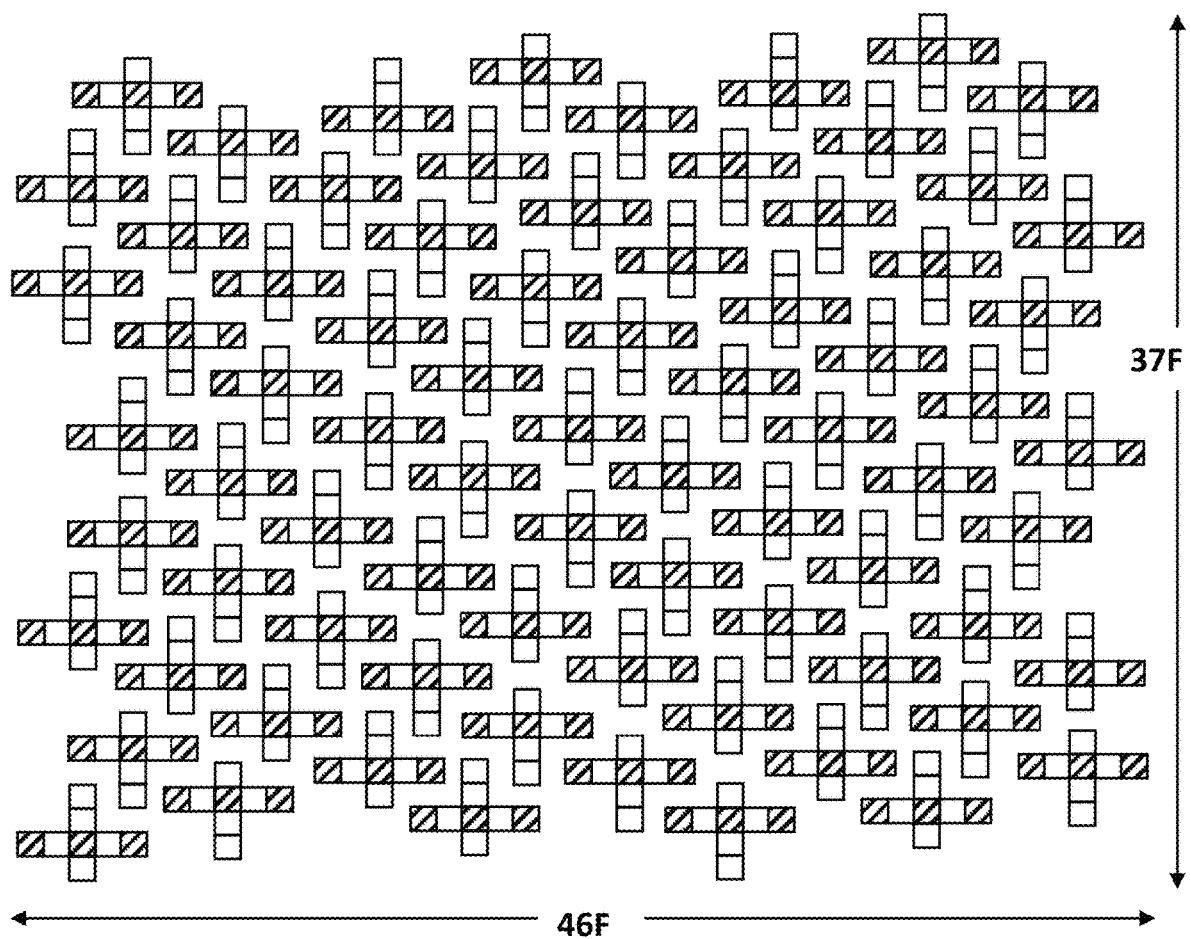

FIG. 6E is a top view of the top layer connections of a vertical unipolar precharged NAND or NOR gate according to an embodiment of the present invention and FIG. 6F is a top view of the bottom layer connections of a vertical unipolar precharged NAND or NOR gate according to an embodiment of the present invention. FIGS. 6E and 6F depict the top and bottom views, respectively, of the vertical structure of a unipolar precharged NAND or NOR gate depicted in FIGS. 6A-6B or FIGS. 6C-6D respectively. Connections for gate routing may be made to the vertical gates either from above or below the structure. To maximize density, the output (35) is made from the bottom only in FIG. 6F. Alternatively, output (35) may be routed to the top (not shown), however, that may increase the gate cell area. Other arrangements of connections may also be made without departing from the spirit of the invention. FIG. 6G is an illustration of one method of creating an array of Vertical Unipolar Precharged NAND and/or NOR Gates with an average cell size approximately equal to 20 $F^2$ according to an embodiment of the present invention. Other orientations than shown in FIG. 6G may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation.

Figure 6H:
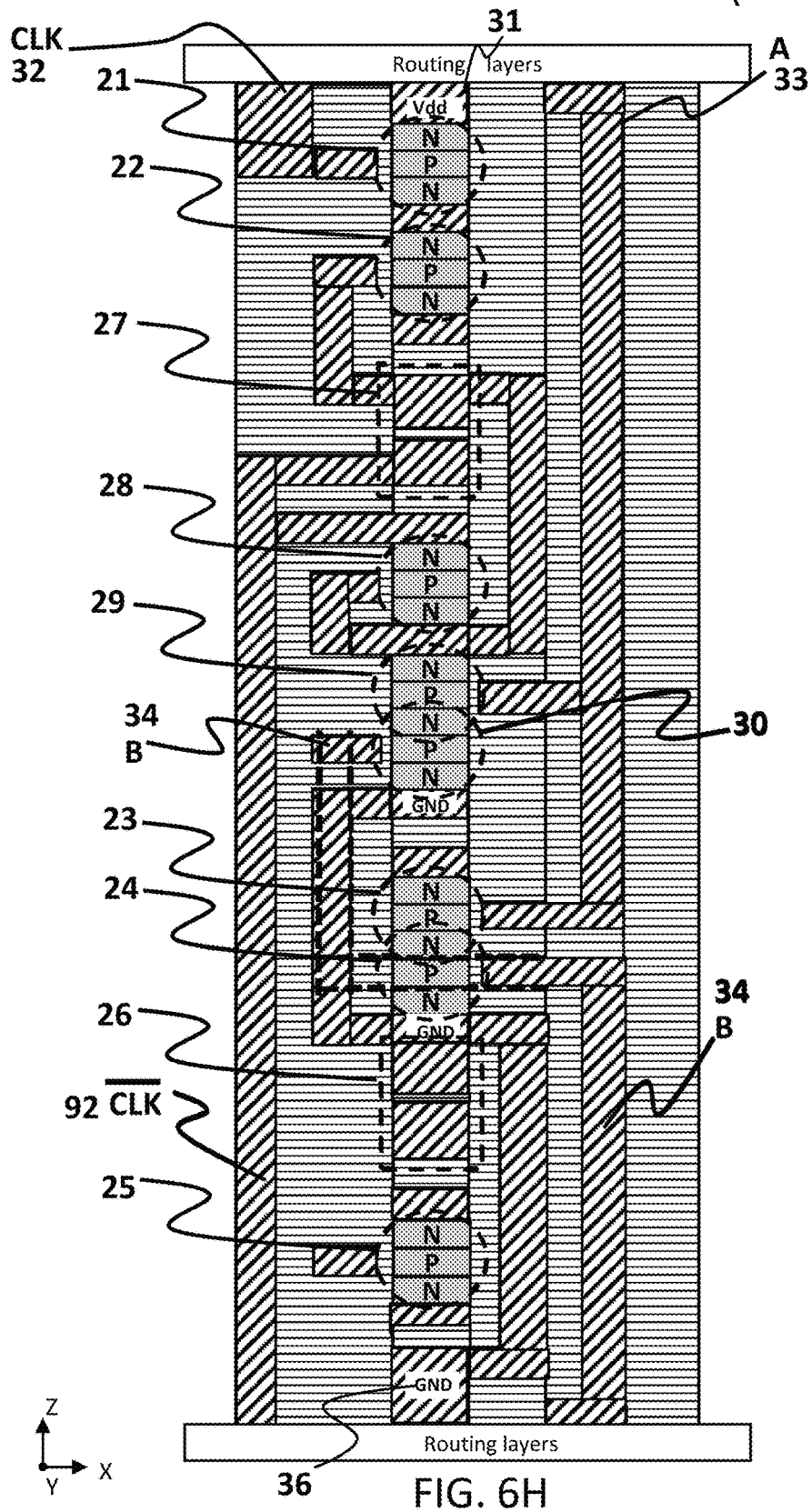
Figure 6I:
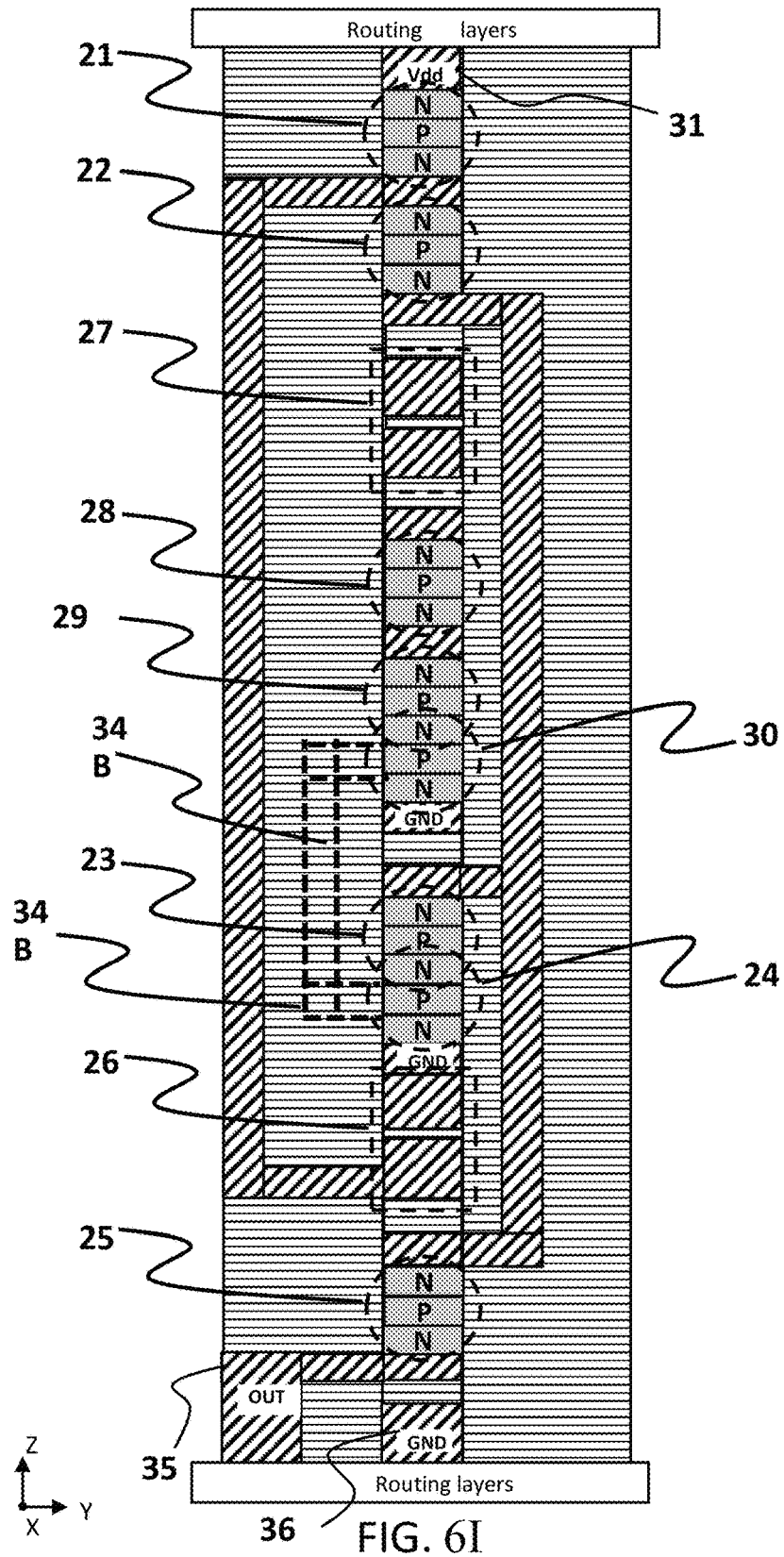

FIG. 6H and FIG. 6I are cross-sectional views of a vertical structure of a unipolar precharged NAND gate low power circuit according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6H and 6I are cross-sectioned in quadrature planes (planes whose normal vectors are orthogonal to one another). Both FIGS. 6H and 6I section through an active column (e.g., a column of semiconductor material in which active devices can be fabricated). The semiconductor layers of transistors (21, 22, 23, 24, 25, 28, 29 and 30) of FIG. 1B and capacitor (27) are all fabricated in a single stack. The transistor channel lengths are determined by deposition and not by lithography. This allows very high density circuitry and very high speed. The manufacturing methodology for fabricating the structure shown in FIG. 6H and FIG. 6I can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors as are transistors (29) and (30); alternatively, one may separate the transistors and connect them with a metal interconnect.

Figure 6J:
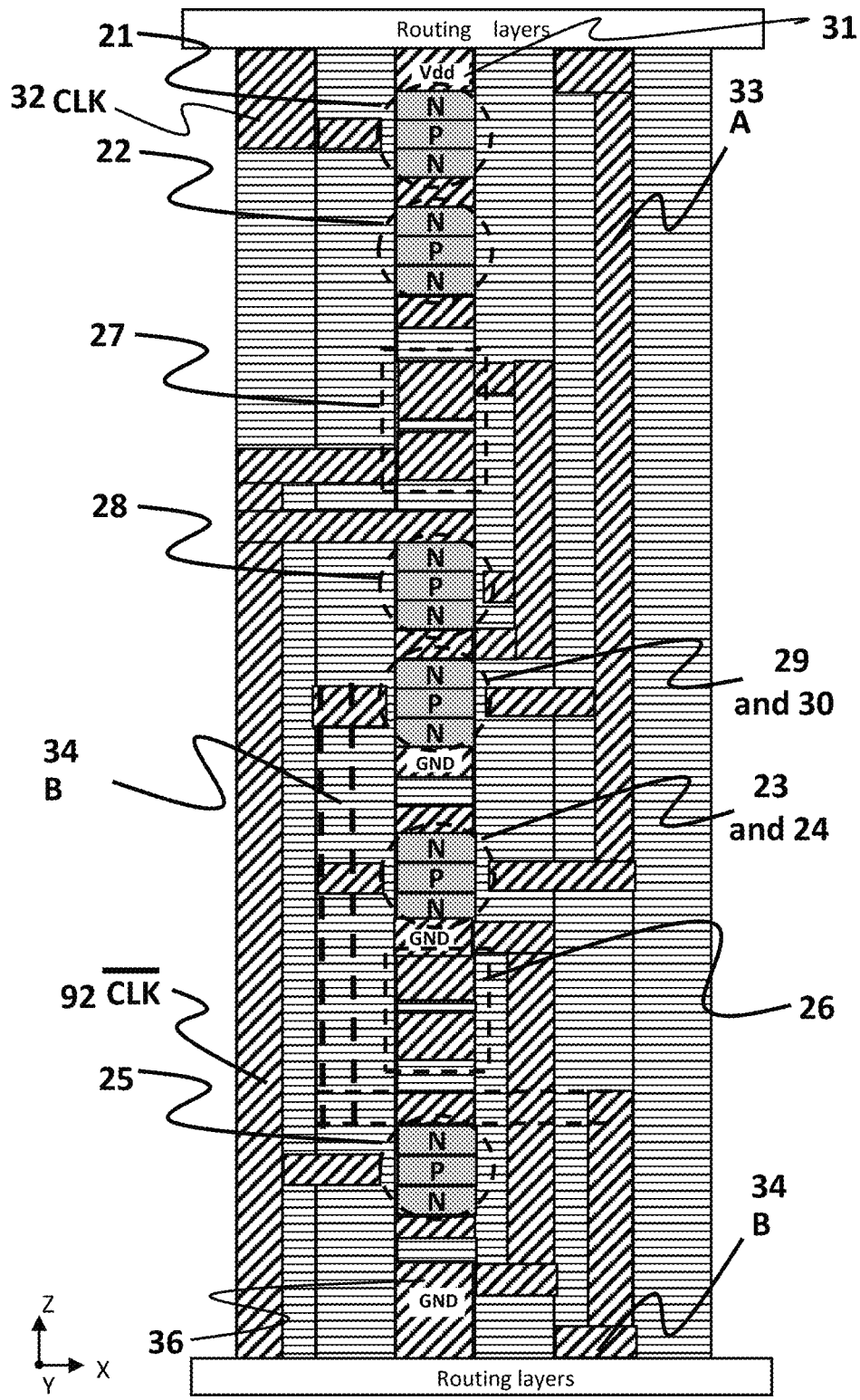
Figure 6K:
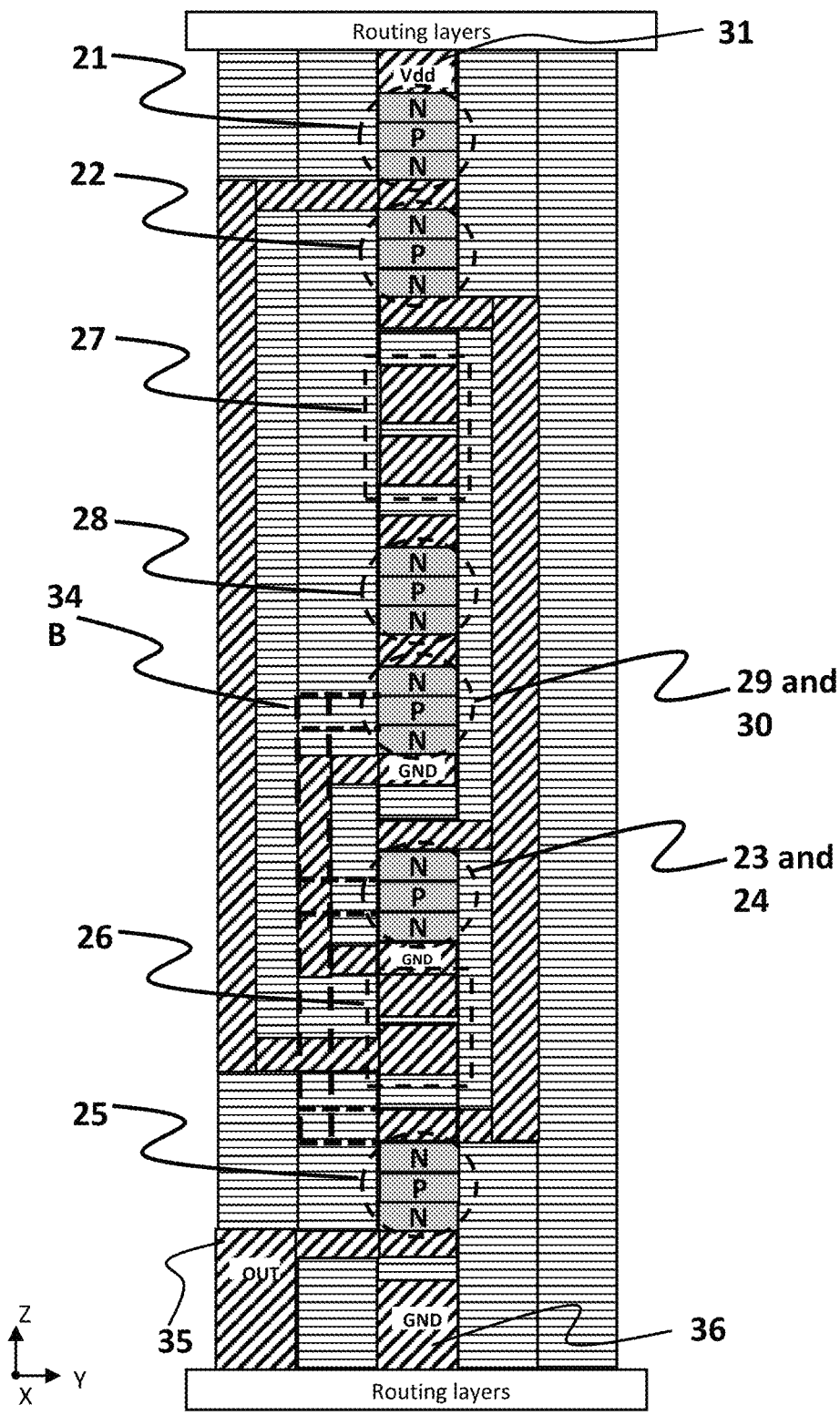

FIG. 6J and FIG. 6K are cross-sectional views of a vertical structure of a unipolar precharged NOR gate low power circuit according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6J and 6K are cross-sectioned in quadrature planes (planes whose normal vectors are orthogonal to one another). Both FIGS. 6J and 6K section through an active column (e.g., a column of semiconductor material in which active devices can be fabricated). The semiconductor layers of transistors (21, 22, 23, 24, 25, 28, 29, and 30) and capacitor (27) of FIG. 1D are all fabricated in a single stack. The transistor channel lengths are determined by deposition and not by lithography. This allows very high density circuitry and very high speed. The manufacturing methodology for fabricating the structure shown in FIG. 6J and FIG. 6K can be similar to methods employed by the flash memory industry for making 3D NAND and other 3D non-volatile memory devices. The gates of the transistors may be of the surrounding gate type thereby permitting better performance.

Figure 6L:
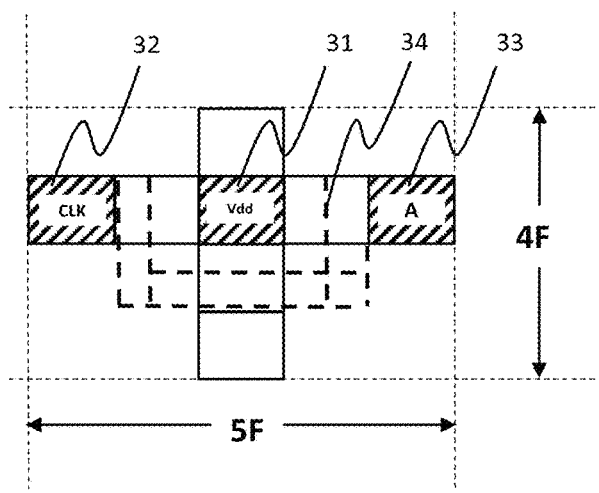
Figure 6M:
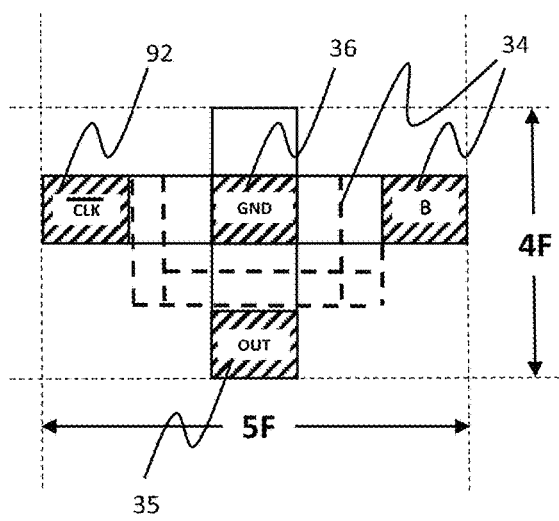
Figure 6N:
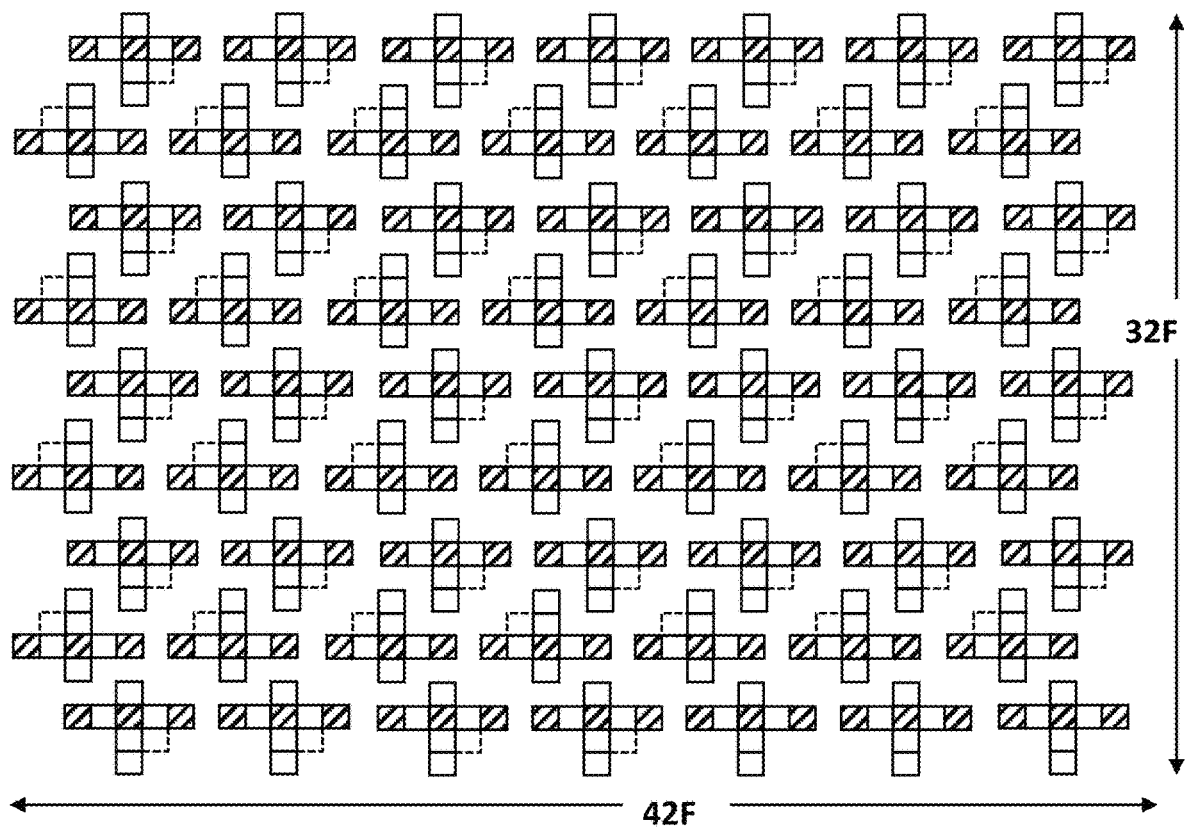
Figure 60:
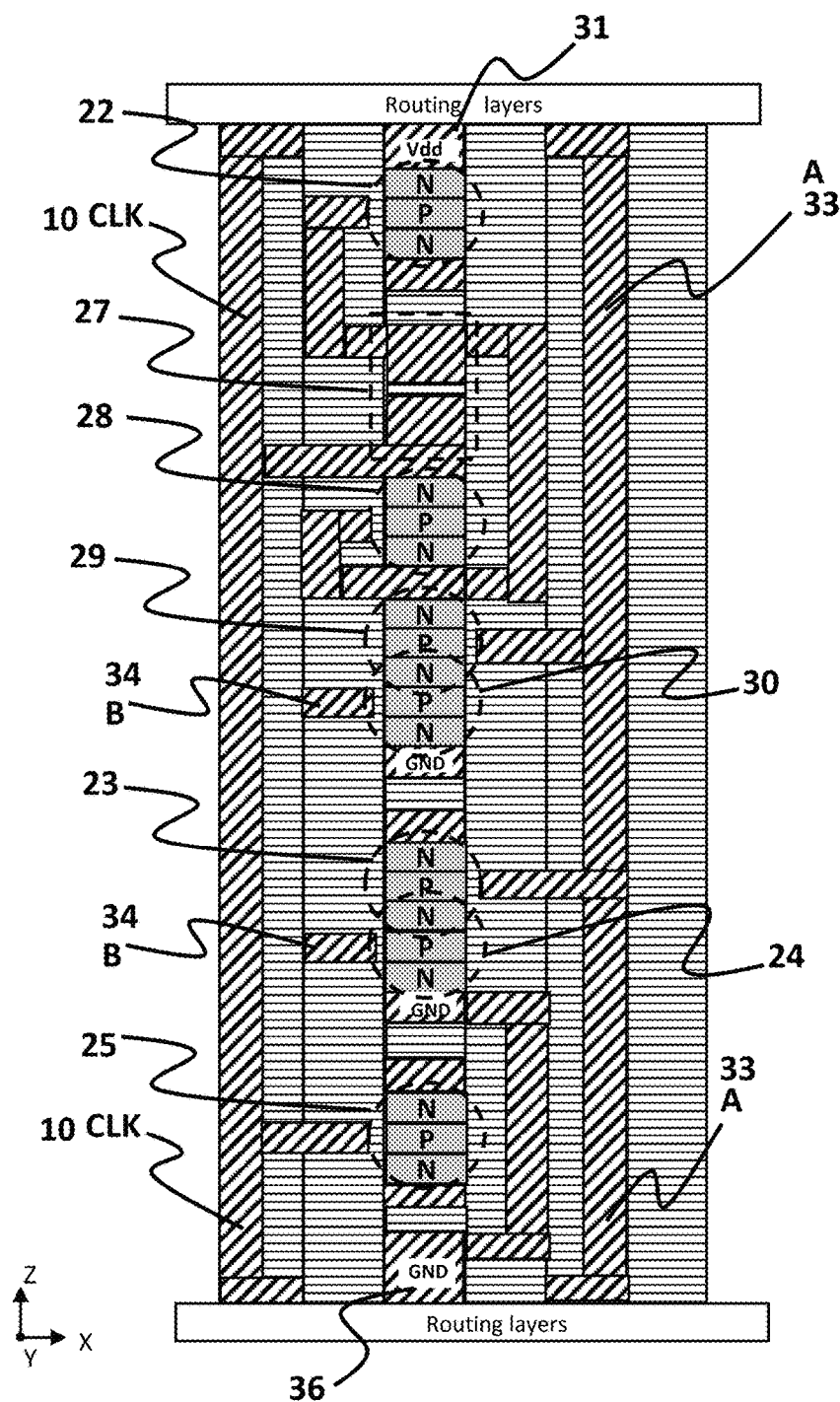

FIG. 6L is a top view of the top layer connections of a vertical unipolar precharged NAND or NOR gate low power circuits according to an embodiment of the present invention and FIG. 6M is a top view of the bottom layer connections of a vertical unipolar precharged NAND or NOR gate low power circuits according to an embodiment of the present invention. FIGS. 6L and 6M depict the top and bottom views, respectively, of the vertical structure of a unipolar precharged NAND or NOR gate low power circuits depicted in FIGS. 6H-6I or FIGS. 6J-6K respectively. Connections for gate routing may be made to the vertical gates either from above or below the structure. To maximize density, the output (35) is made from the bottom only in FIG. 6M. Alternatively, output (35) may be routed to the top (not shown), however, that may increase the gate cell area. Other arrangements of connections may also be made without departing from the spirit of the invention. FIG. 6N is an illustration of one method of creating an array of Vertical Unipolar Precharged NAND and/or NOR Gates low power circuits with an average cell size approximately equal to 24 $F^2$ according to an embodiment of the present invention. Other orientations than shown in FIG. 6N may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation. The average cell size area of the low power unipolar precharged NAND and NOR gate circuits shown in FIGS. 6H, 6I, 6J, 6K, 6L and 6M is only slightly larger (about 1-2 $F^2$) compared to the unipolar precharged NAND and NOR gate circuits shown in FIGS. 6A, 6B, 6C, 6D, 6E and 6F that do not have the additional low power circuitry employed.

Figure 6P:
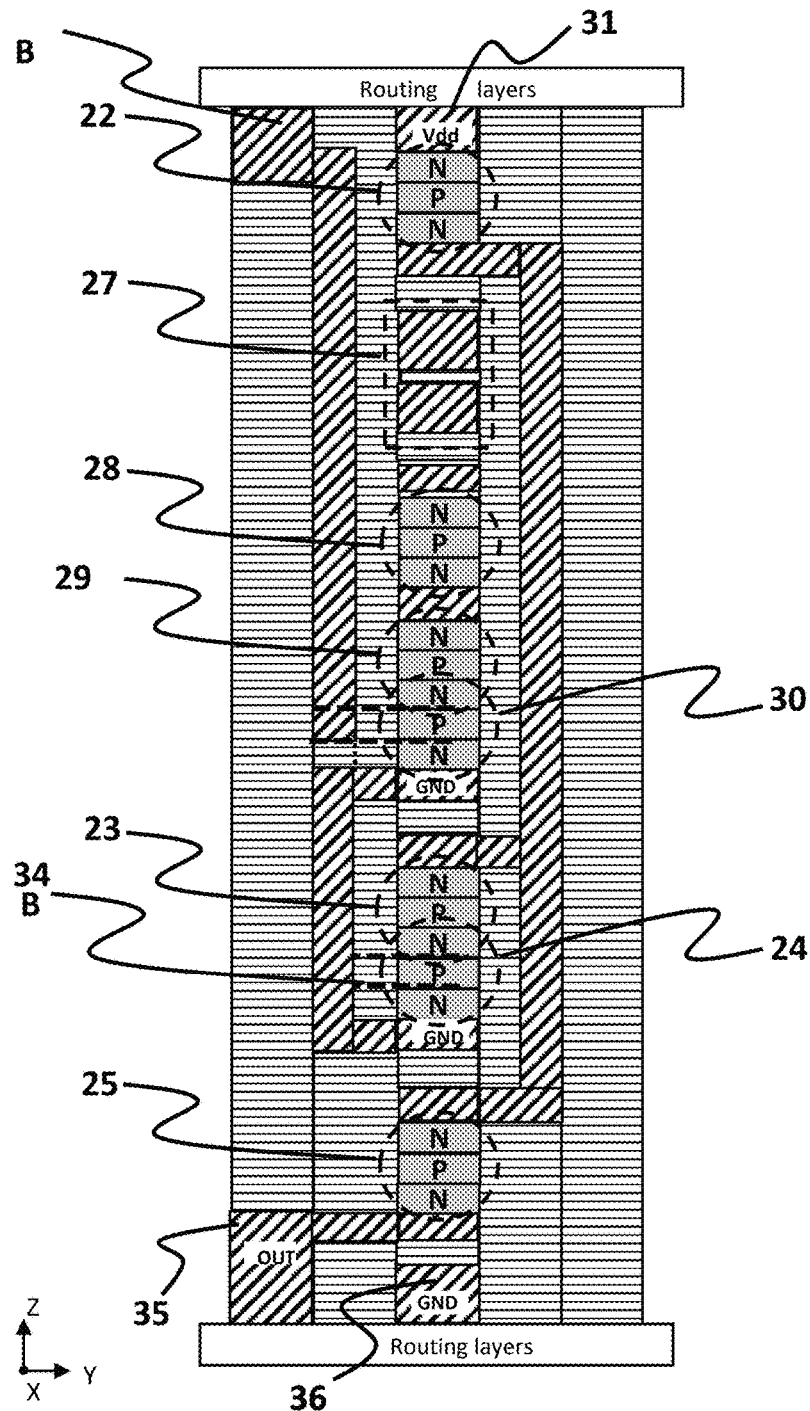

FIG. 6O and FIG. 6P are cross-section views of a vertical structure of a unipolar clocked NAND gate low power circuit single CLK per gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6O and 6P are cross-sectioned in quadrature planes (planes whose normal vectors are orthogonal to one another). Both FIGS. 6O and 6P section through an active column (e.g., a column of semiconductor material in which active devices can be fabricated). The semiconductor layers of transistors (22, 23, 24, 25, 28, 29 and 30) of FIG. 1E and capacitor (27) are all fabricated in a single stack. The transistor channel lengths are determined by deposition and not by lithography. This allows very high density circuitry and very high speed. The manufacturing methodology for fabricating the structure shown in FIG. 6O and FIG. 6P can be similar to methods employed by the flash memory industry for making 3D NAND and other 3D non-volatile memory devices. The gates of the transistors may be of the surrounding gate type thereby permitting better performance. Transistors (23) and (24) are shown to have a common N-type layer in between the transistors as are transistors (29) and (30); alternatively, one may separate the transistors and connect them with a metal interconnect.

Figure 6Q:
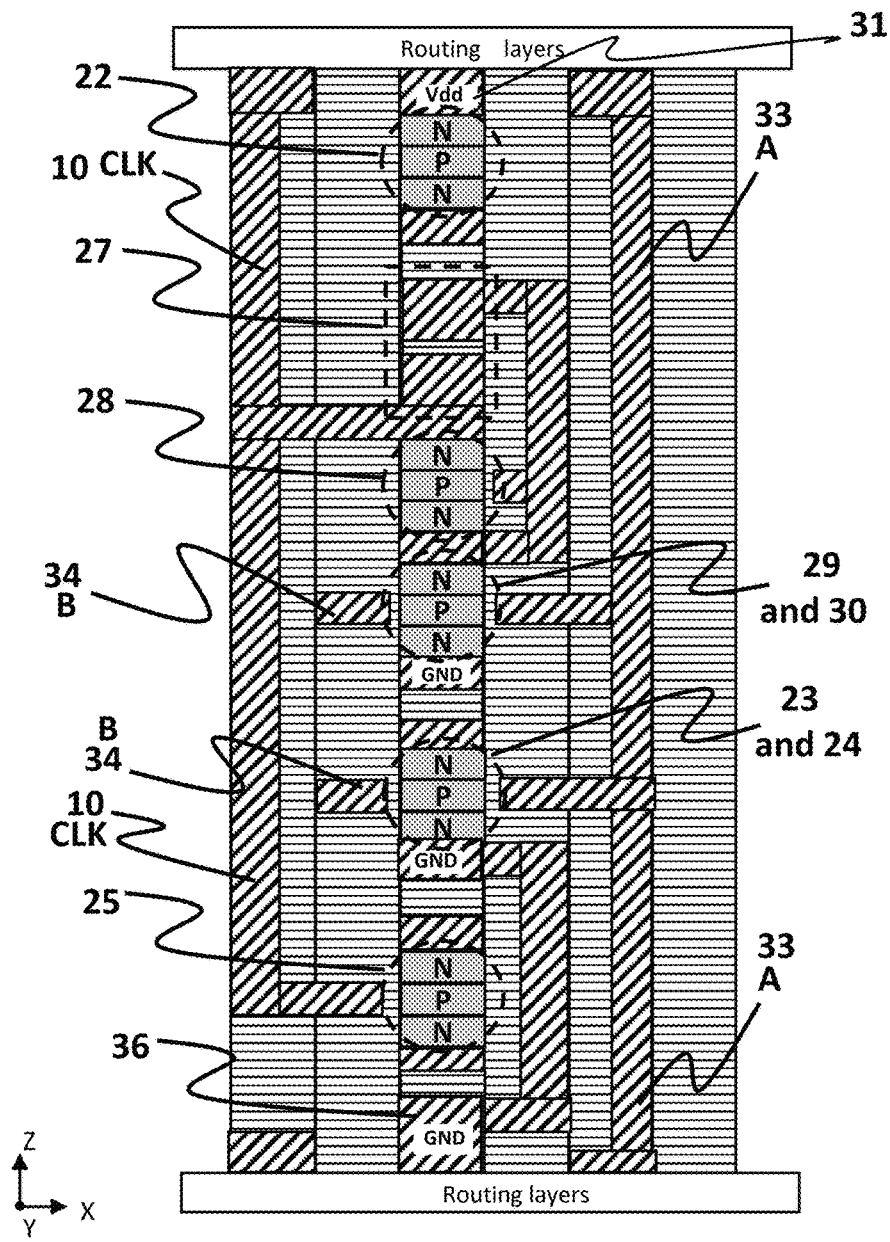
Figure 6R:
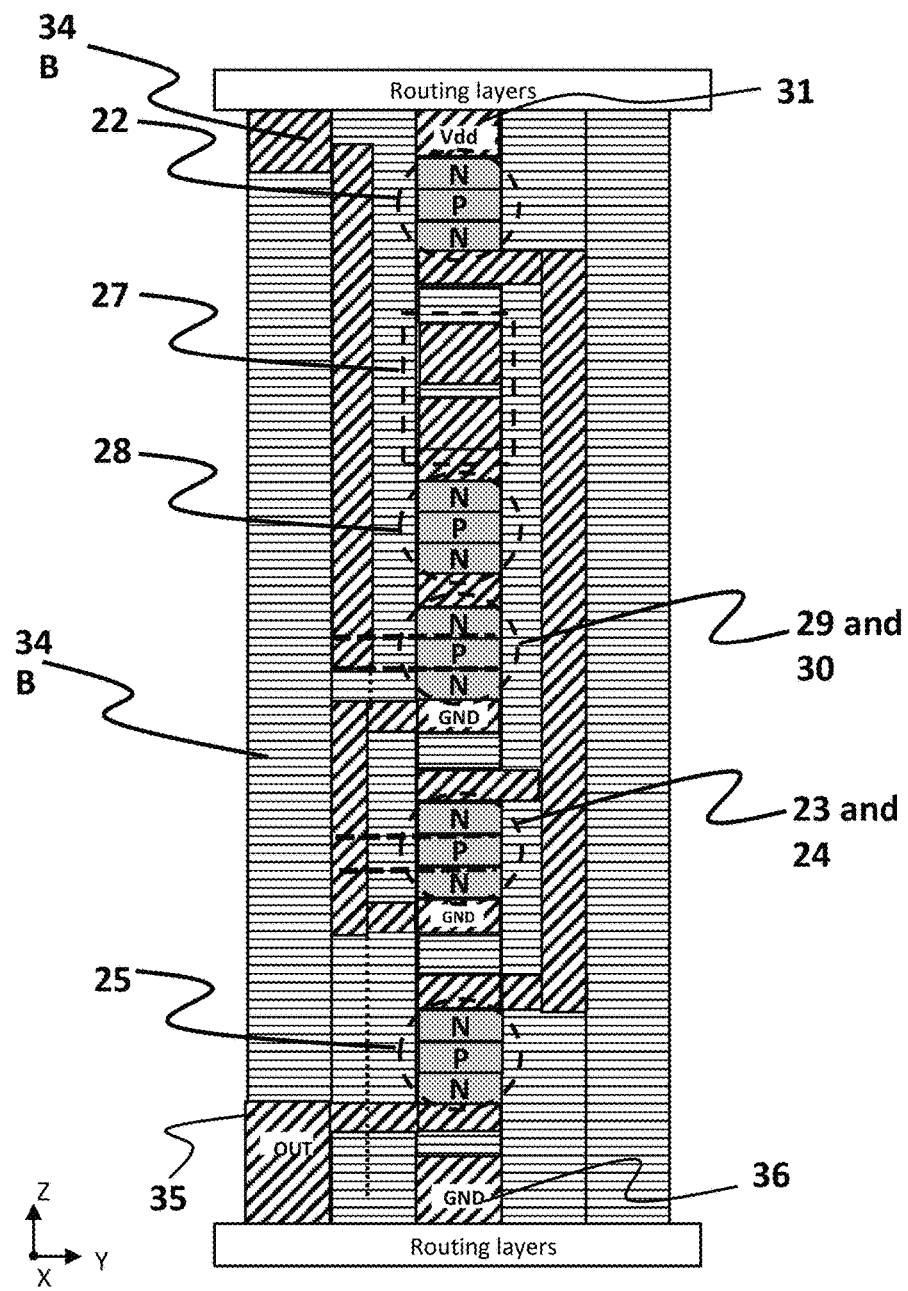
Figure 6S:
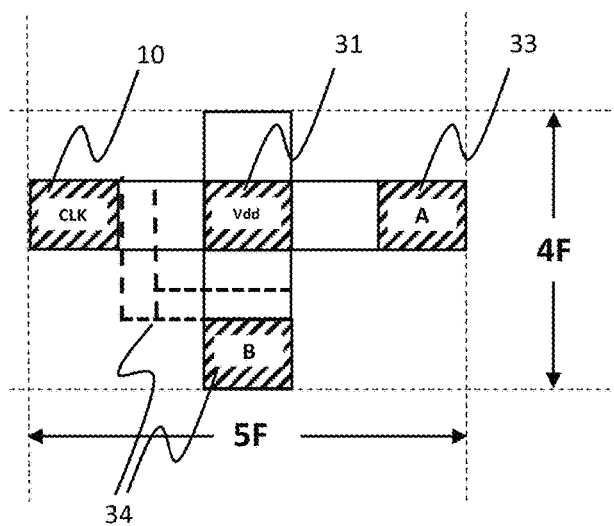
Figure 6T:
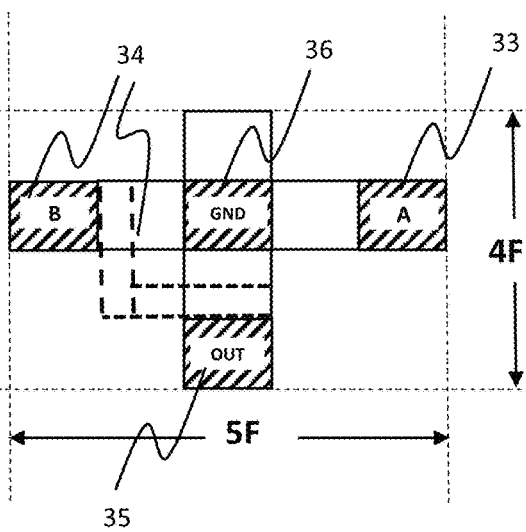
Figure 6U:
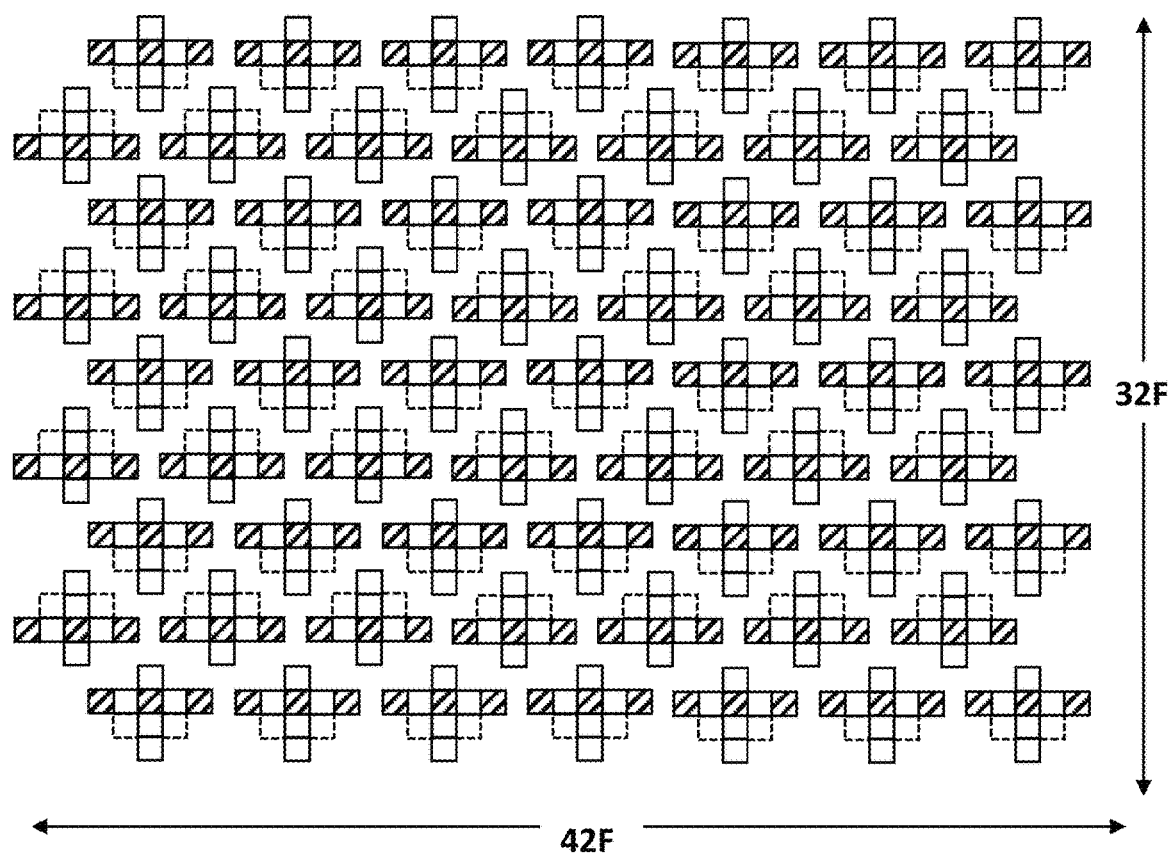
Figure 6V:
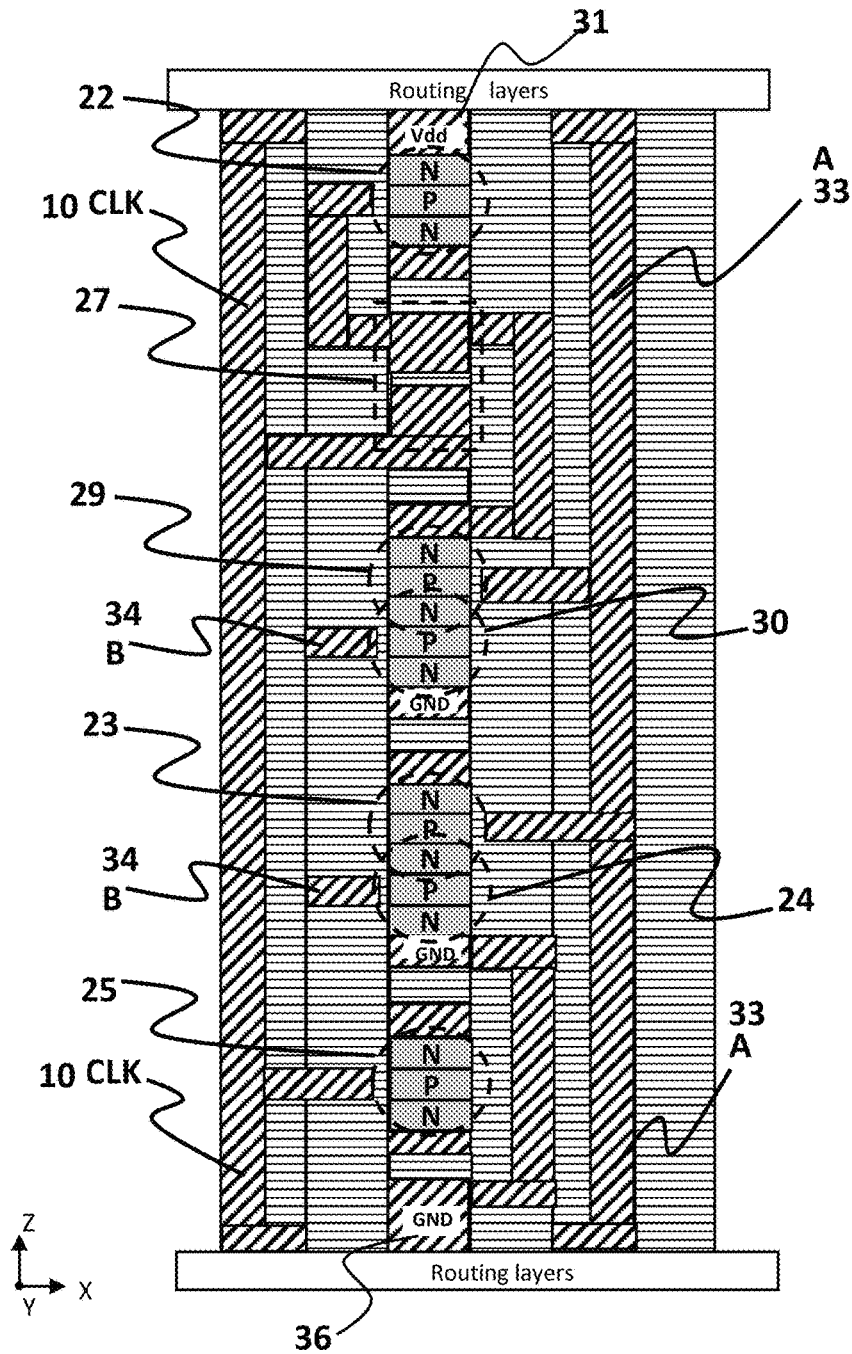
Figure 6W:
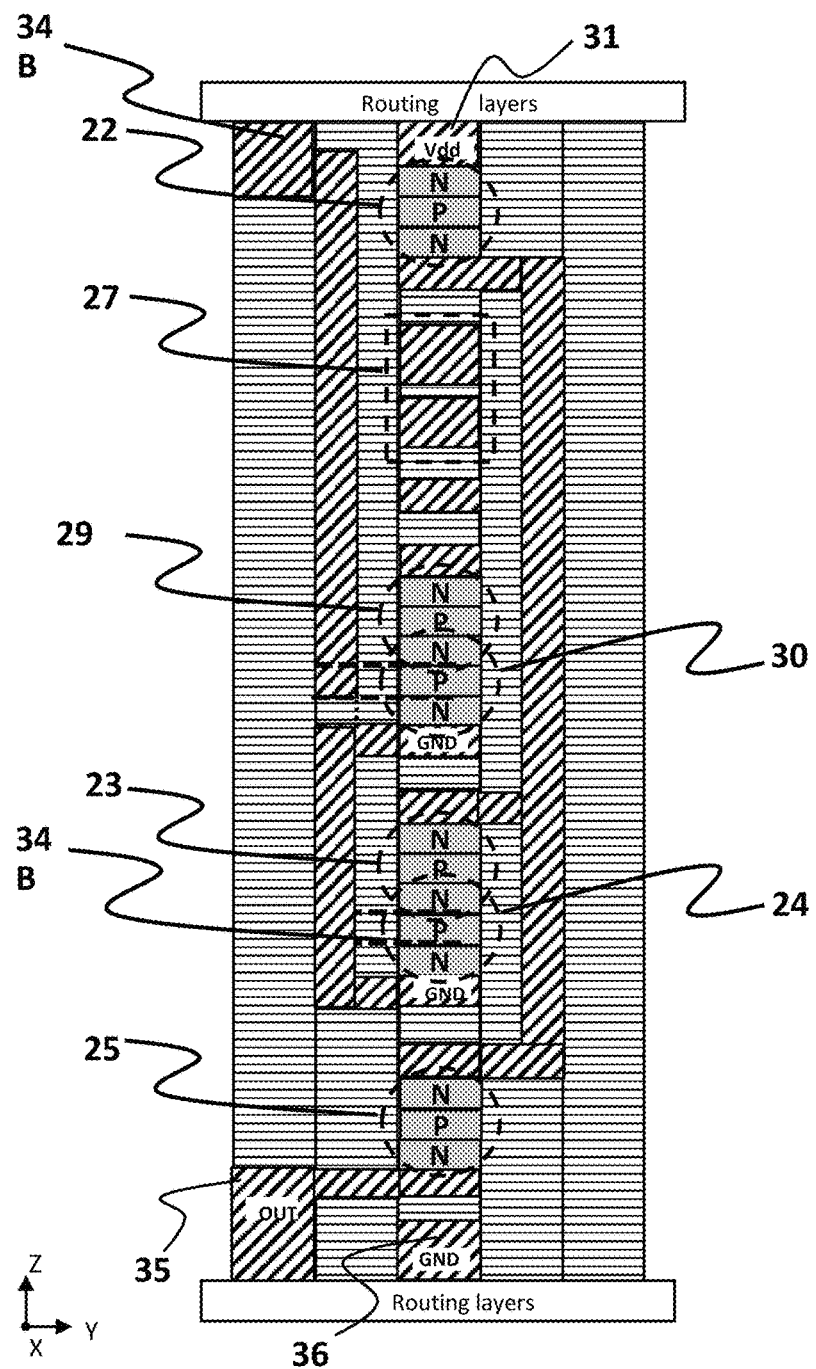

FIG. 6V and FIG. 6W are cross-section views of a vertical structure of a unipolar clocked NAND gate low power circuit single CLK per gate according to an embodiment of the present invention. This structure is a simplified NAND gate whereby transistor (28) is eliminated due to the edge rate of the clock and the value of the capacitor (27) will cause the gate voltage on transistor (22) to be sufficient without requiring transistor (28). This structure, representing the circuit shown in FIG. 1I, reduces the number of layers compared to FIG. 6O and FIG. 6P, which represents the circuit in FIG. 1E, and hence, would lower the cost of fabrication.

FIG. 6Q and FIG. 6R are cross-section views of a vertical structure of a unipolar clocked NOR gate low power circuit single CLK per gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 6Q and 6R are cross-sectioned in quadrature planes (planes whose normal vectors are orthogonal to one another). Both FIGS. 6Q and 6R section through an active column (e.g., a column of semiconductor material in which active devices can be fabricated). The semiconductor layers of transistors (22, 23, 24, 25, 28, 29, and 30) and capacitor (27) of FIG. 1F are all fabricated in a single stack. The transistor channel lengths are determined by deposition and not by lithography. This allows very high density circuitry and very high speed. The manufacturing methodology for fabricating the structure shown in FIG. 6Q and FIG. 6R can be similar to methods employed by the flash memory industry for making 3D NAND and other 3D non-volatile memory devices. The gates of the transistors may be of the surrounding gate type thereby permitting better performance.

Figure 6X:
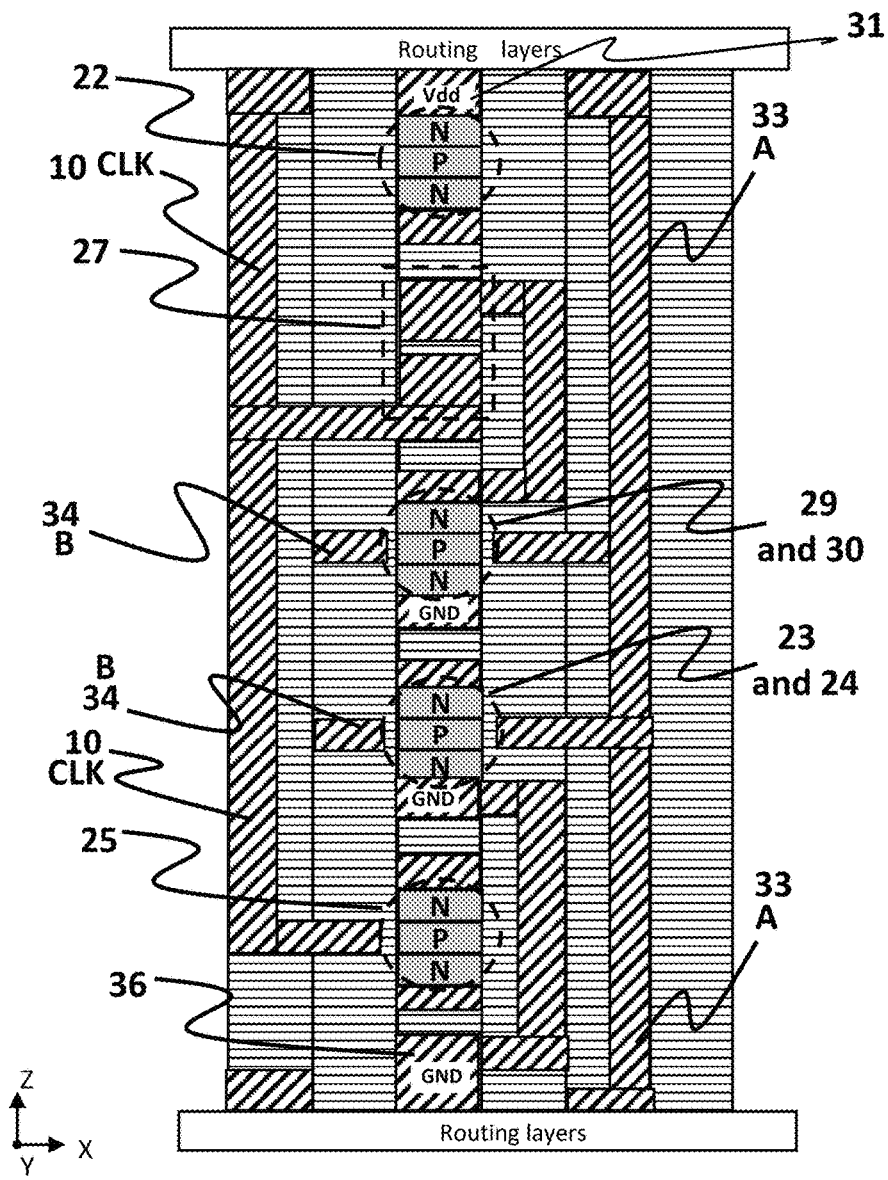
Figure 6Y:
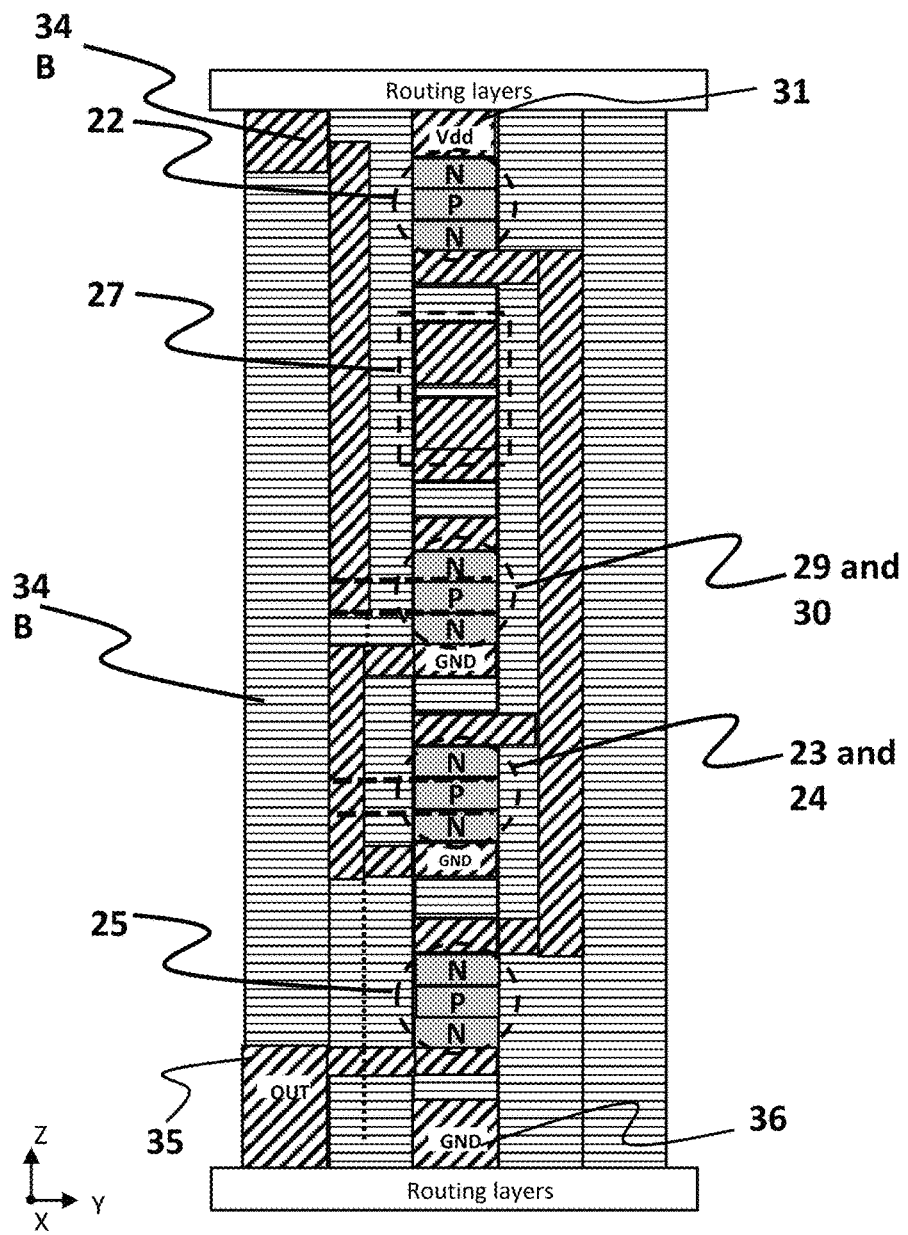

FIG. 6X and FIG. 6Y are cross-section views of a vertical structure of a unipolar clocked NOR gate low power circuit single CLK per gate according to an embodiment of the present invention. This structure is a simplified NOR gate whereby transistor (28) is eliminated due to the edge rate of the clock and the value of the capacitor (27) will cause the gate voltage on transistor (22) to be sufficient without requiring transistor (28). This structure, representing the circuit shown in FIG. 1J, reduces the number of layers compared to FIG. 6Q and FIG. 6R, which represents the circuit in FIG. 1F, and hence, would lower the cost of fabrication.

FIG. 6S is a top view of the top layer connections of a vertical unipolar clocked NAND or NOR gate low power circuits, one CLK per gate, according to an embodiment of the present invention and FIG. 6T is a top view of the bottom layer connections of a vertical unipolar clocked NAND or NOR gate low power circuits, one CLK per gate, according to an embodiment of the present invention. FIGS. 6S and 6T depict the top and bottom views, respectively, of the vertical structure of a unipolar clocked NAND or NOR gate low power circuits, one CLK per gate, depicted in FIGS. 1E and 6O-6P, FIGS. 1F and 6Q-6R, FIGS. 1I and 6V-6W, or FIGS. 1J and 6X-6Y. Connections for gate routing may be made to the vertical gates either from above or below the structure. To maximize density, the output (35) is made from the bottom only in FIG. 6T. Alternatively, output (35) may be routed to the top (not shown), however, that may increase the gate cell area. Other arrangements of connections may also be made without departing from the spirit of the invention. FIG. 6U is an illustration of one method of creating an array of Vertical Unipolar Clocked NAND and/or NOR Gates low power circuits, one CLK per gate, with an average cell size approximately equal to 24 $F^2$ according to an embodiment of the present invention. Other orientations than shown in FIG. 6U may be designed including flipping a portion or all of the gates in the X, Y, or Z direction. This is a factor of about 5 times smaller compared to conventional planar CMOS logic. In addition to a large increase in density, the short interconnect between logic gates provides for much faster speed of operation. The average cell size area of the low power clocked NAND and NOR gate circuits, one CLK per gate, shown in FIGS. 6O, 6P, 6Q, 6R, 6S, 6T, 6V, 6W, 6X and 6Y is only slightly larger (about 1-2 $F^2$) compared to the NAND and NOR gate circuits shown in FIGS. 6A, 6B, 6C, 6D, 6E and 6F that do not have the additional low power circuitry employed. A further advantage of the unipolar clocked gate circuits shown in FIGS. 6O, 6P, 6Q, 6R, 6S, 6T, 6V, 6W, 6X and 6Y is that both inputs A (33) and B (34) are accessible for connection from either the top (above) or bottom (below) of the gate structure. This provides great flexibility in design and minimizes the probability of circuit designs from being routing limited as opposed to gate limited.

In FIGS. 6A-6Y, various architectures for three dimensional integrated logic circuit that includes a columnar active region. Within the columnar active region resides an inter-digitated plurality of semiconductor columns and conductive columns. A plurality of transistors is vertically arranged along each semiconductor column, which extends from a bottom surface of the columnar logic region to a top surface of the columnar logic region. The plurality of transistors are electrically interconnected so as to perform a logic function and to generate a logic output signal at a logic output port in response to a logic input signal received at a logic input port. Each of the plurality of conductive columns is adjacent to at least one of the plurality of semiconductor columns and extends along a columnar axis to the top surface and/or the bottom surface of the columnar active layer.

In FIGS. 6A and 6B, for example, the columnar active region (or columnar active layer) is shown between top and bottom routing layers. The columnar active region includes a semiconductor column and various conductive columns. The semiconductor column includes transistors 21-25. The columnar active region also includes conductive columns 33, 34, and 35, as well as conductive columns 32 and 92. The logic function realized in FIGS. 6A and 6B is a precharged NAND gate (as schematically depicted in FIG. 1A, but various other logic functions can be created in such a columnar fashion. The precharged NAND gate depicted in FIGS. 6A and 6B has four input ports—CLK 32, $\overline{\text{CLK}}$ 92, A 33, and B 34, and one output port—OUT 35.

The semiconductor column and each of the conductive columns have columnar axes which are parallel to one another. Each of the conductive columns is conductively coupled to either an input port or an output port of the semiconductor column so as to configure the columnar logic gate as a precharged NAND gate. The semiconductor column extends from a bottom surface of the columnar active region to a top surface. Each of the conductive columns extend to the top surface and/or the bottom surface of the columnar active region. The top and bottom routing layers can be used to provide interconnection between these conductive columns and those of other columnar logic gates so as to realize a logic operation for the three-dimensional logic circuit.

In FIGS. 6E and 6F, the top and bottom surfaces, respectively, of the columnar logic region for the precharged NAND gate depicted in FIGS. 6A and 6B are shown. In FIG. 6E, the top connections of CLK 32, Vdd 31 and A 33 are shown extending to the top surface of the columnar logic region. In FIG. 6F, the top connections of $\overline{\text{CLK}}$ 92, GND 36, B 34, and OUT 35 are shown extending to the bottom surface of the columnar logic region. The top and bottom interconnection layers can be used to route signals to and from these ports to port of other columnar logic gates. In some embodiments, all of the input and output ports are conducted to one or both of the top and bottom surfaces of the columnar logic region. In such an embodiment, only one of top and bottom interconnection layers can conductively interconnect the logic ports of a plurality of columnar logic gates. In some embodiments, a plurality of conductive columns, which are not conductively coupled to input or output ports of columnar logic gates can be interspersed amongst the columnar logic gates so as to provide conductive paths between the top and bottom interconnection layers.

In FIG. 6G, a view of the top surface of the columnar logic region of a two-dimensional array of columnar logic gates is depicted. The FIG. 6G view shows the various conductive columns that extend to the top surface of the columnar logic region. These conductive columns can then be interconnected via the top interconnection layer, thereby creating a logic operation for the three-dimensional logic circuit. The distance between each of the semiconductor columns and the conductive columns that are nearest thereto is less than the distance between each of the semiconductor columns and other semiconductor columns nearest thereto. Thus configuration depicts semiconductor columns and conductive columns that are interdigitated. Such a configuration permits lateral conductivity between the input and output ports of a semiconductor column with the adjacent conductive columns. Such lateral conductivity occurs between the top and bottom surfaces of the columnar logic region.

In some embodiments, the semiconductor column of each of the columnar logic gates can include devices of only one unipolar variety. For example, all transistors of the semiconductor columns can be N-type (or conversely P-type). In other embodiments, bipolar types of transistors can be included in each semiconductor column. In some embodiments, an metallization layer can be between the top and bottom surfaces of the columnar active region so as to conductively couple commonly biased nodes of the plurality of semiconductor columns. For example, a metallization layer can be used to provide biasing of VDD, VSS, or body biases of field-effect transistors (FETs). In some embodiments, every columnar logic gate is of the same variety. For example, every logic gate could be a two-input NAND gate (or, alternatively, a three-input NOR gate, for example). In other embodiments, each columnar logic gate can be independently formed as a specific type of logic gate, so as to more efficiently create the logic operation of the three-dimensional logic circuit.

Figure 7:
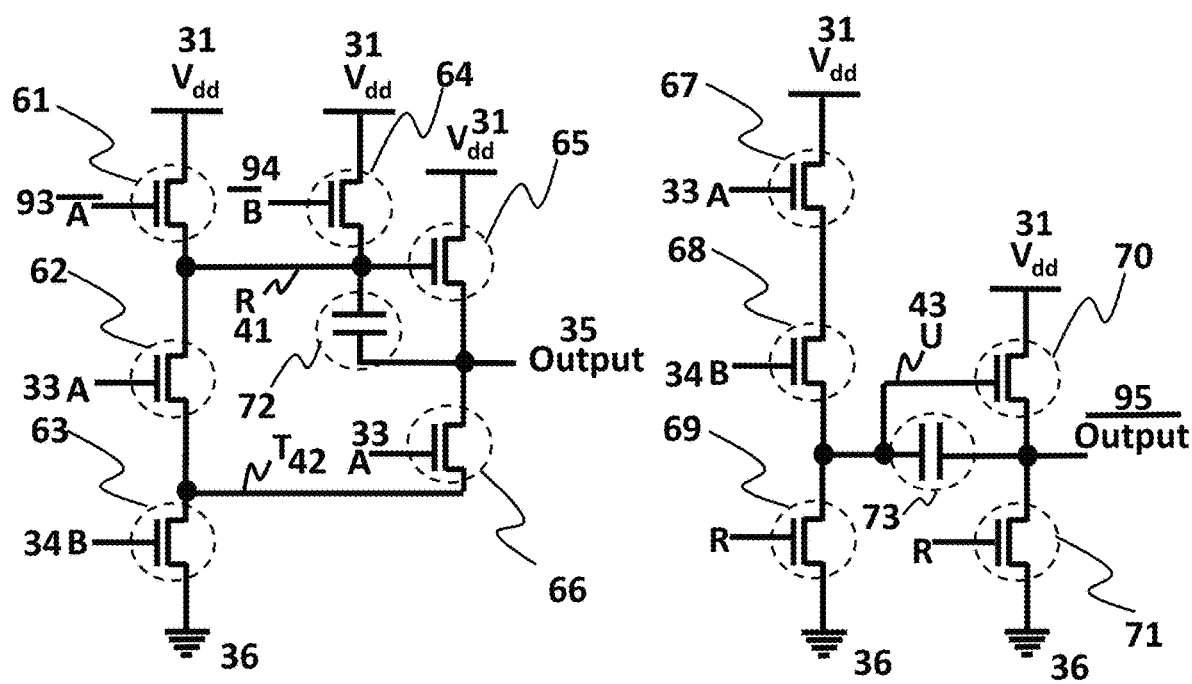

FIG. 7 is a schematic diagram of a Unipolar Bootstrap NAND Gate Circuit according to an embodiment of the present invention. Transistors (61, 62, 63 and 64) together represent a standard unipolar NAND gate. The problem with standard a unipolar NAND gate is that the output of the gate only goes to one threshold voltage (Vt) below the input voltage. After a few gates of propagation the signal will completely degrade. To solve this, transistor (65) and capacitor (72) are added to the circuit. Transistor (65) starts to turn on when node R (41) goes to the threshold voltage (Vt). Output (35) will not rise until transistor (65) has started to turn on. Therefore, output (35) will be one threshold voltage (Vt) below the voltage on R (41) when output (35) begins to rise. As Output (35) rises, the threshold voltage (Vt) will be manifested across capacitor (72). Therefore, capacitor (72) will cause the voltage on R (41) to ultimately rise to one Vt above the output. Transistor (66) isolates the pull down from R (41). Similarly, transistors (67, 68, 69, 70 and 71) and capacitor (73) implement the inverse operation to provide the AND Output (95).

Figure 8A:
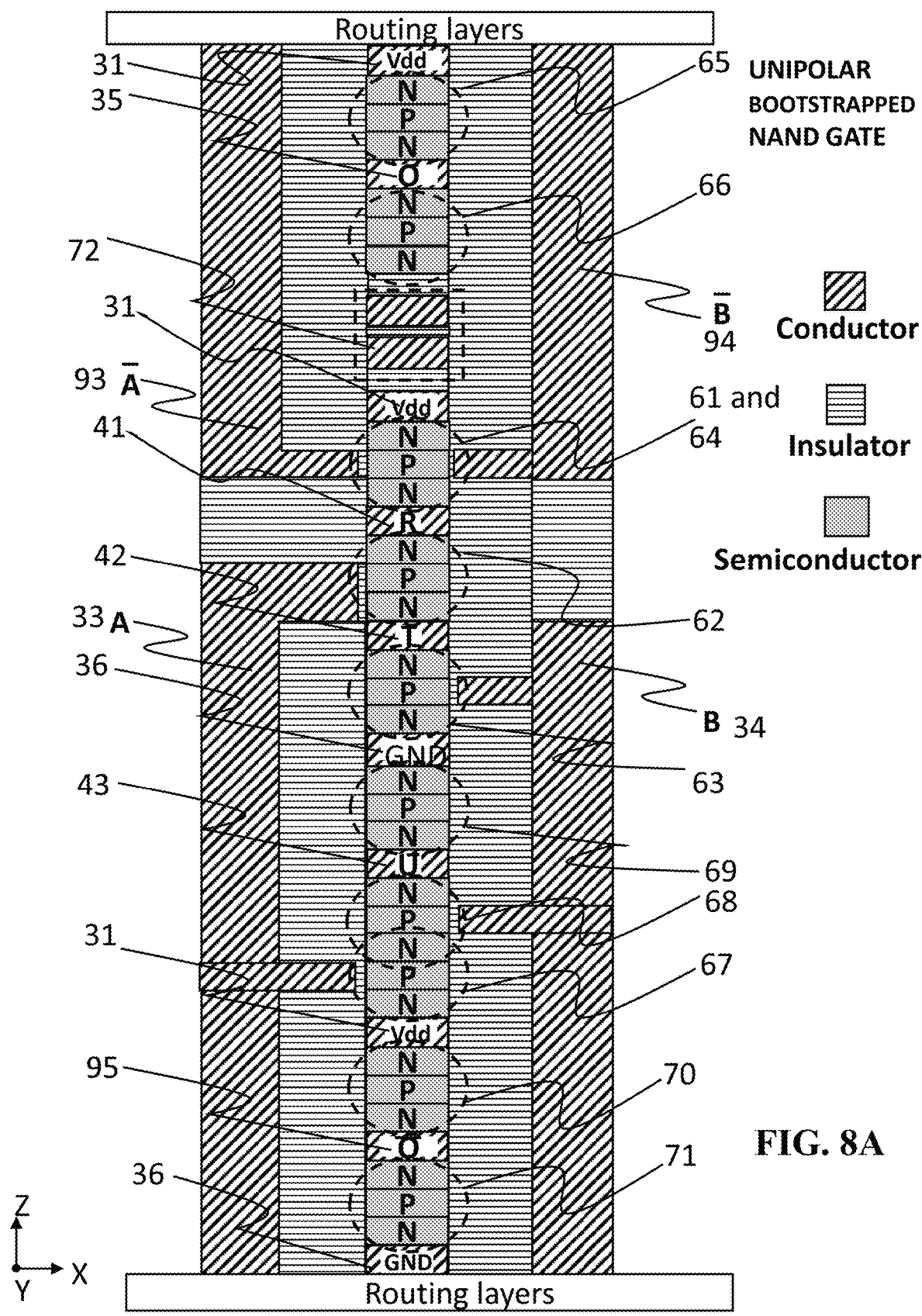
Figure 8B:
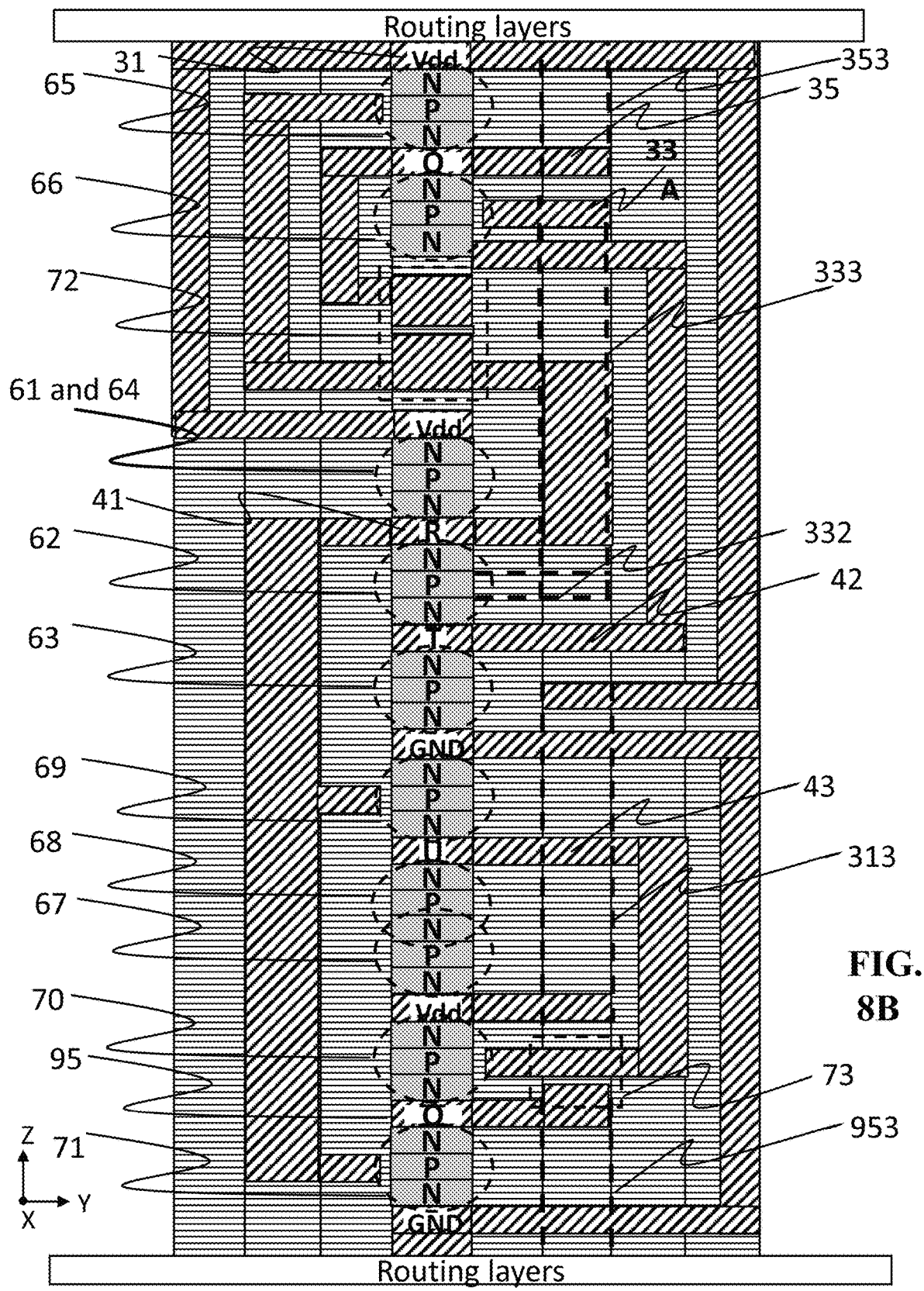

FIG. 8A and FIG. 8B are cross section views of a Vertical Structure of a Unipolar Bootstrapped NAND Gate according to an embodiment of the present invention. Vertical logic gates as described in applications 62/252,522 filed, Nov. 8, 2015 and PCT/US2016/24173, filed Mar. 25, 2016, may be employed to fabricate the logic gates of the present invention. FIGS. 8A and 8B are cross-sectioned in quadrature planes (planes whose normal vectors are orthogonal to one another). Both FIGS. 8A and 8B section through an active column (e.g., a column of semiconductor material in which active devices can be fabricated). The semiconductor layers of transistors (61, 62, 63, 64, 65, 66, 67, 68, 69, 70, and 71) and capacitor (72) of FIG. 7 are all fabricated in a single stack. The transistor channel lengths are determined by deposition and not by lithography. This allows very high density circuitry and very high speed. The manufacturing methodology for fabricating the structure shown in FIG. 8A and FIG. 8B is similar to methods employed by the NAND flash industry for making 3D NAND devices. The gates of the transistors may be of the surround gate type thereby allowing better performance. Transistors (67) and (68) are shown to have a common N-type layer in between the transistors; alternatively, one may separate the transistors and connect them with a metal interconnect. Transistors (61 and 64) are represented as one transistor stack with dual gate inputs for $\overline{\text{A}}$ (93) and $\overline{\text{B}}$ (94).

Figure 8C:
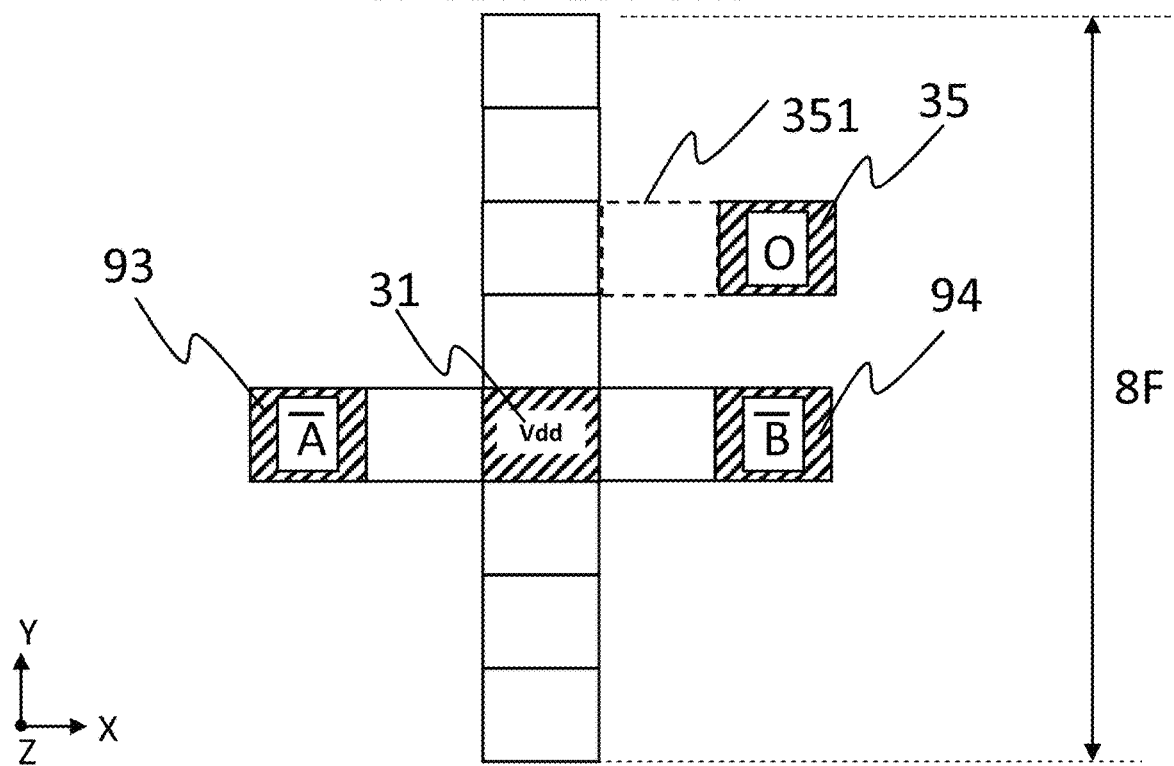
Figure 8D:
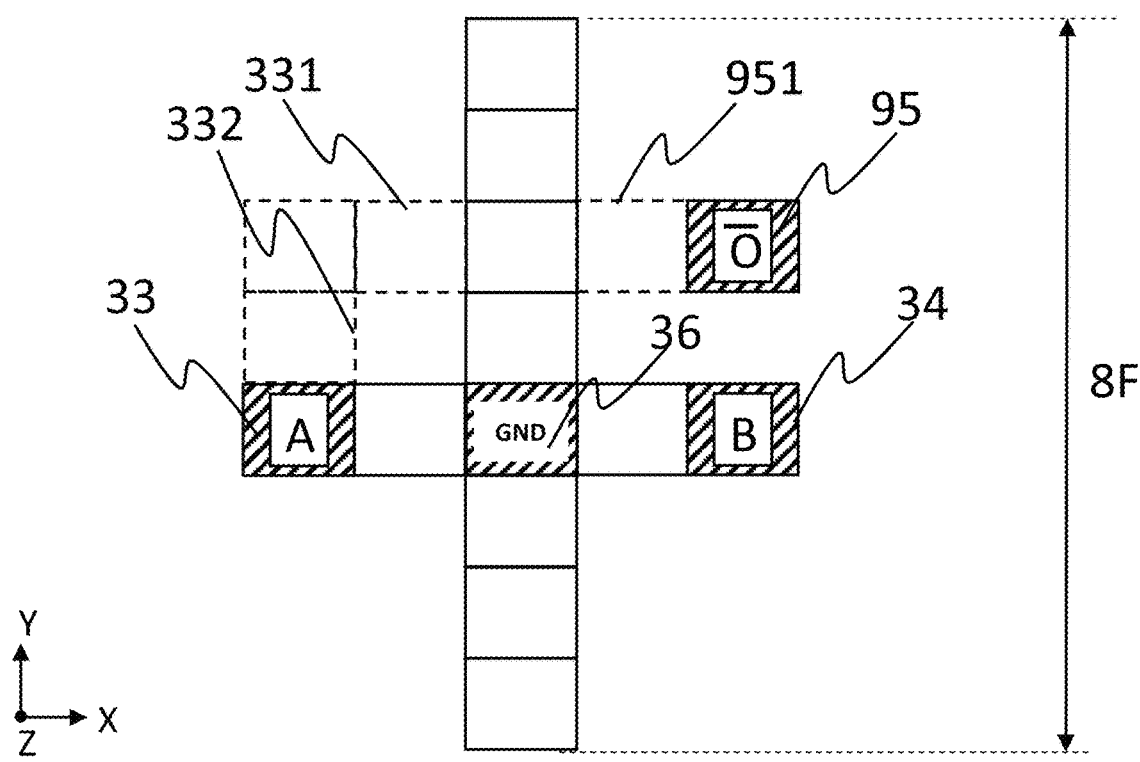
Figure 8E:
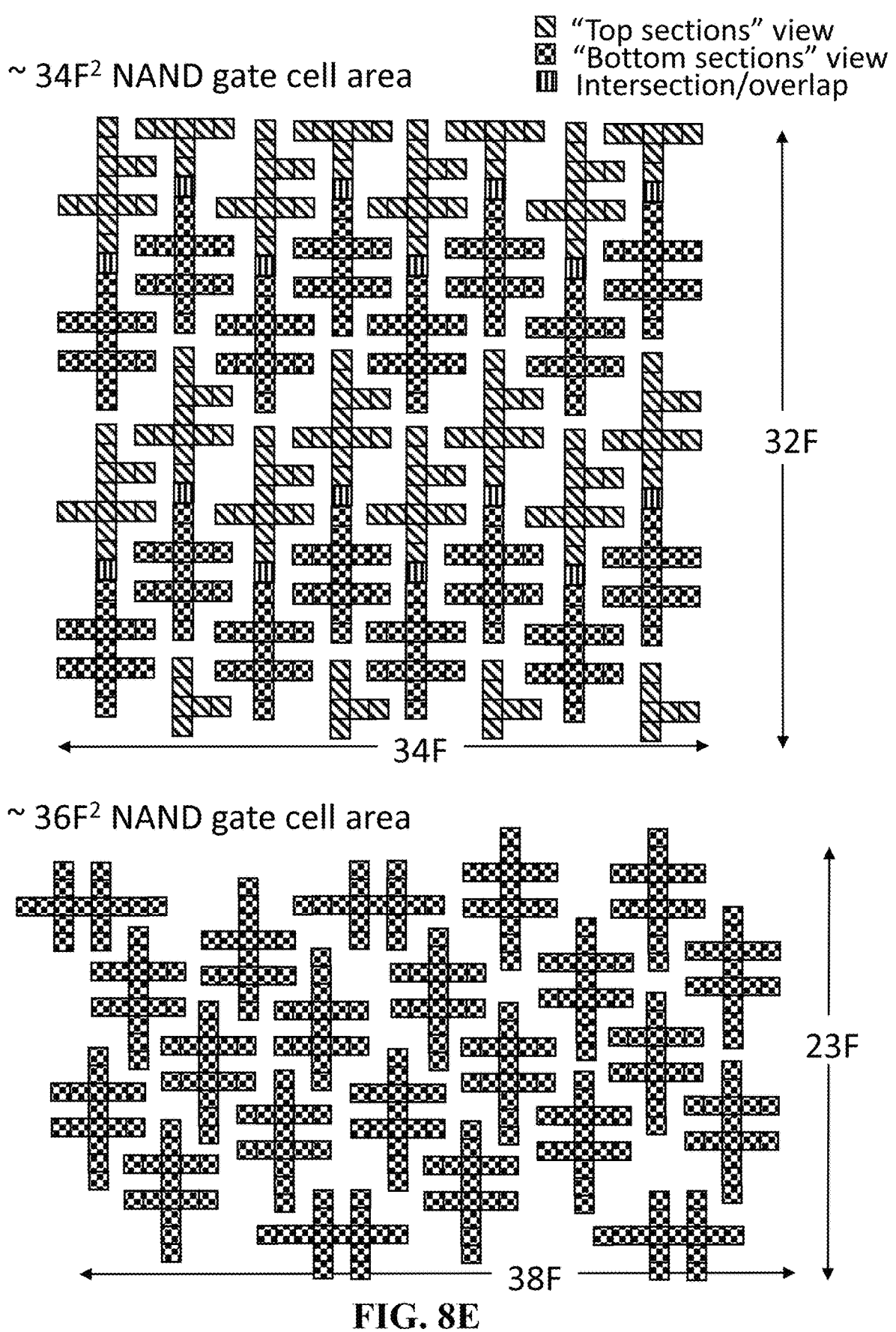

FIG. 8C is a top view of the Top Layer Connections of a Vertical Unipolar Bootstrapped NAND Gate according to an embodiment of the present invention and FIG. 8D is a top view of the Bottom Layer Connections of a Vertical Unipolar Bootstrapped NAND Gate according to an embodiment of the present invention. FIGS. 8C and 8D depict the top and bottom views, respectively, of the vertical structure of a unipolar bootstrapped NAND gate depicted in FIGS. 8A-8B. Connections for gate routing may be made to the vertical gates either from above or below the structure. Other arrangements of connections may also be made without departing from the spirit of the invention. FIG. 8E is an illustration of one method of creating an array of Vertical Unipolar Bootstrapped NAND Gates with average cell sizes ranging from approximately 34 $F^2$ to 36 $F^2$ according to an embodiment of the present invention. Other orientations than shown in FIG. 8E may be designed including flipping a portion or all of the gates in the X, Y, or Z direction. This is a factor of about 3 times smaller compared to conventional planar CMOS logic. In addition to a large increase in density, the short interconnect between logic gates provides for much faster speed of operation.

Figure 9A:
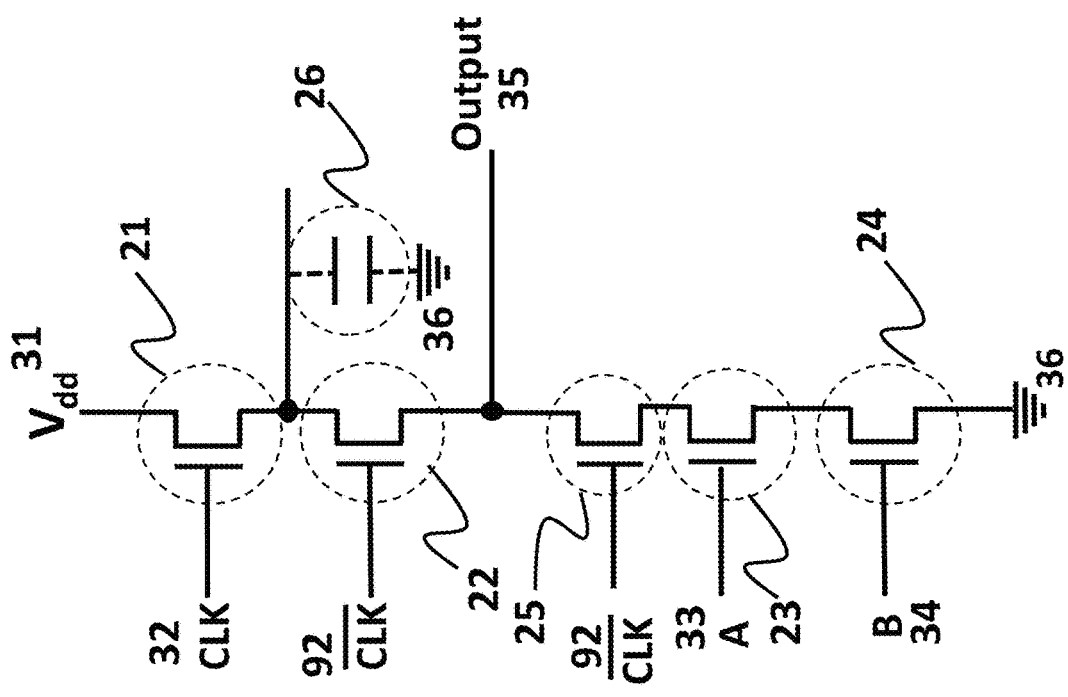
Figure 9B:
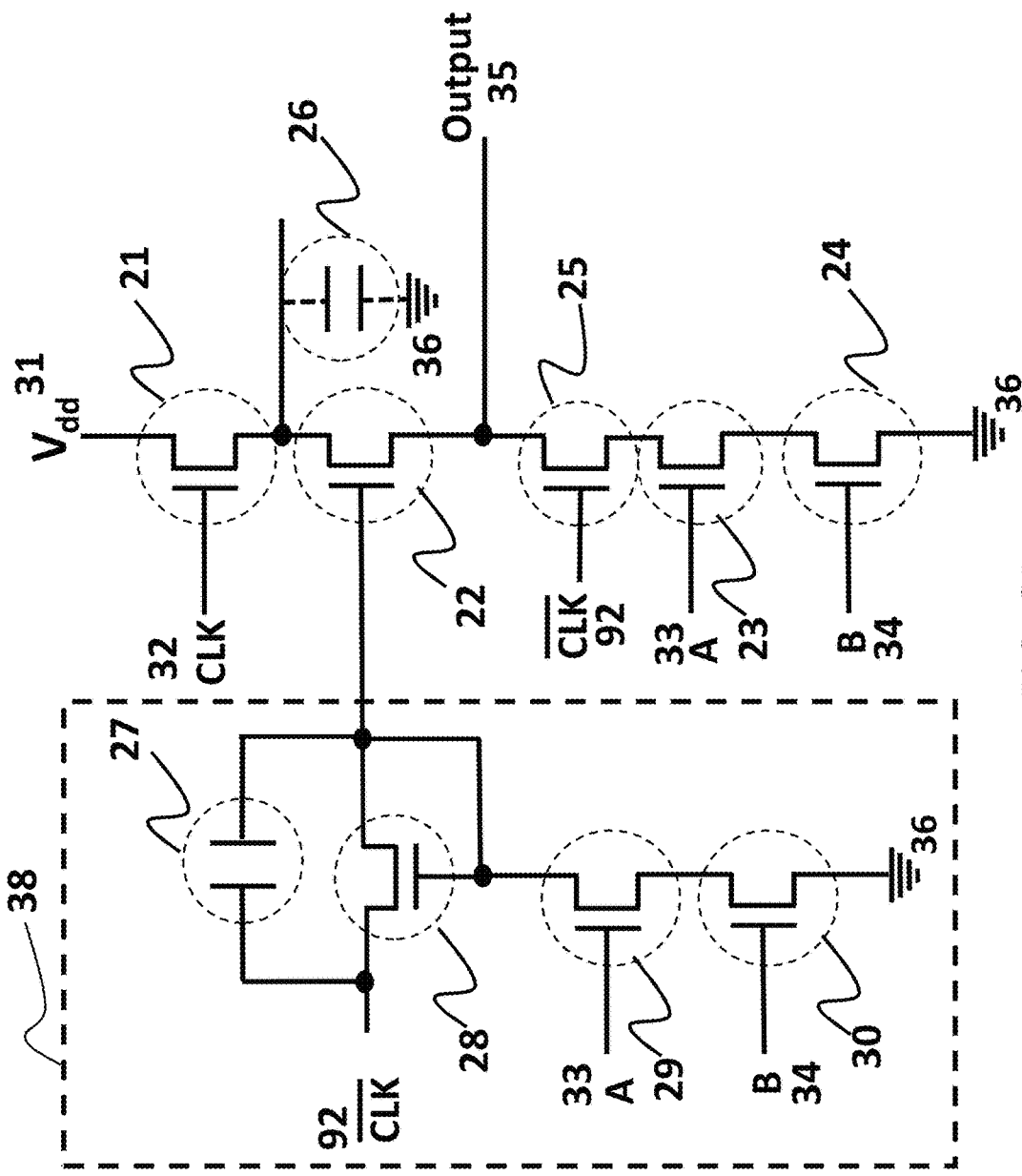
Figure 9C:
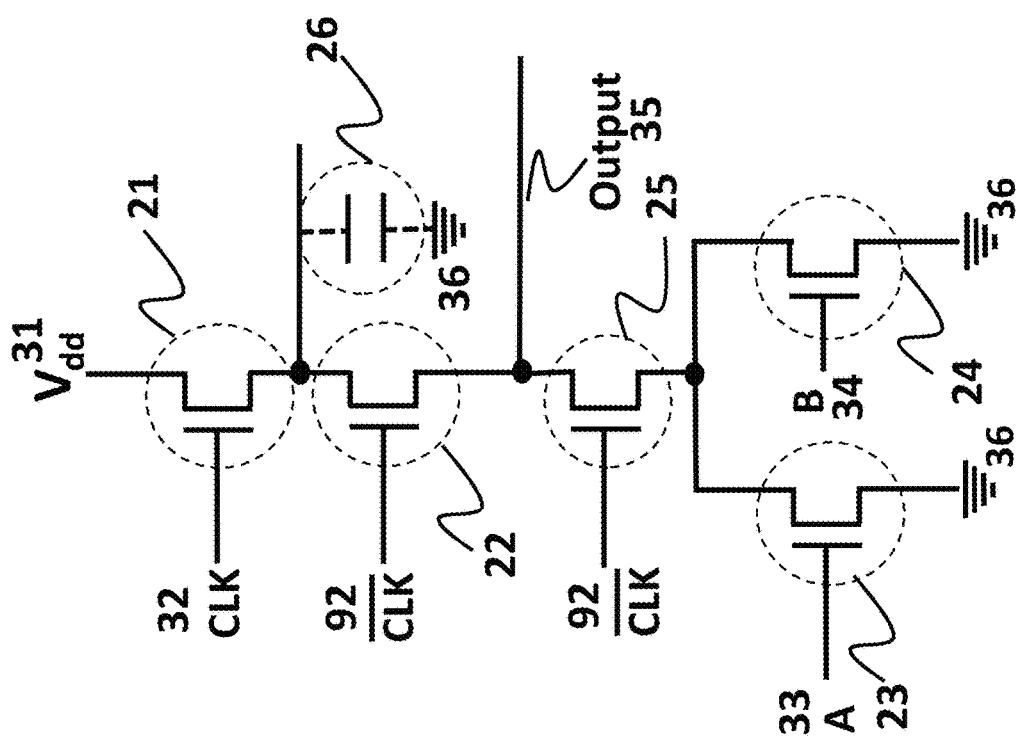
Figure 9D:
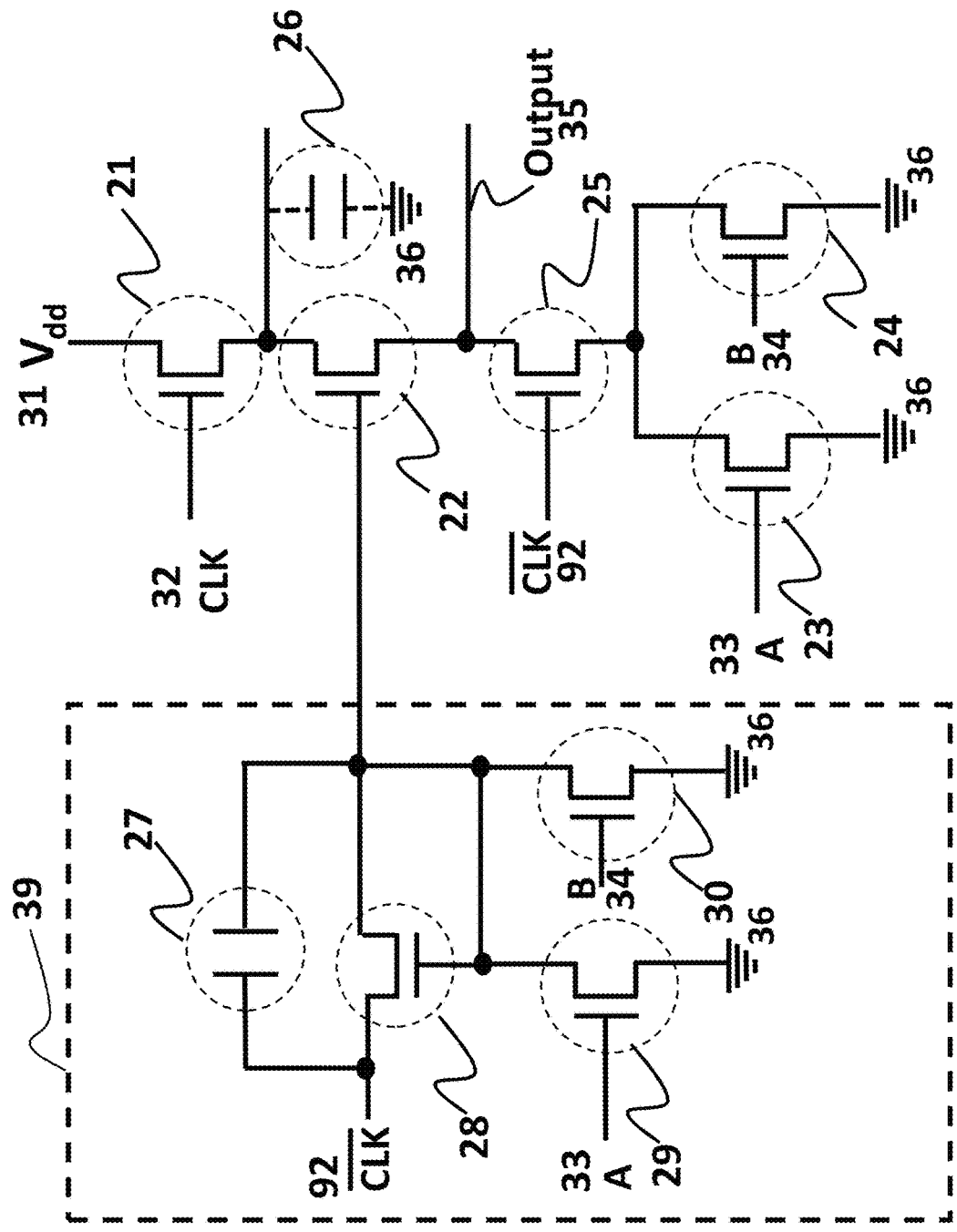
Figure 9E:
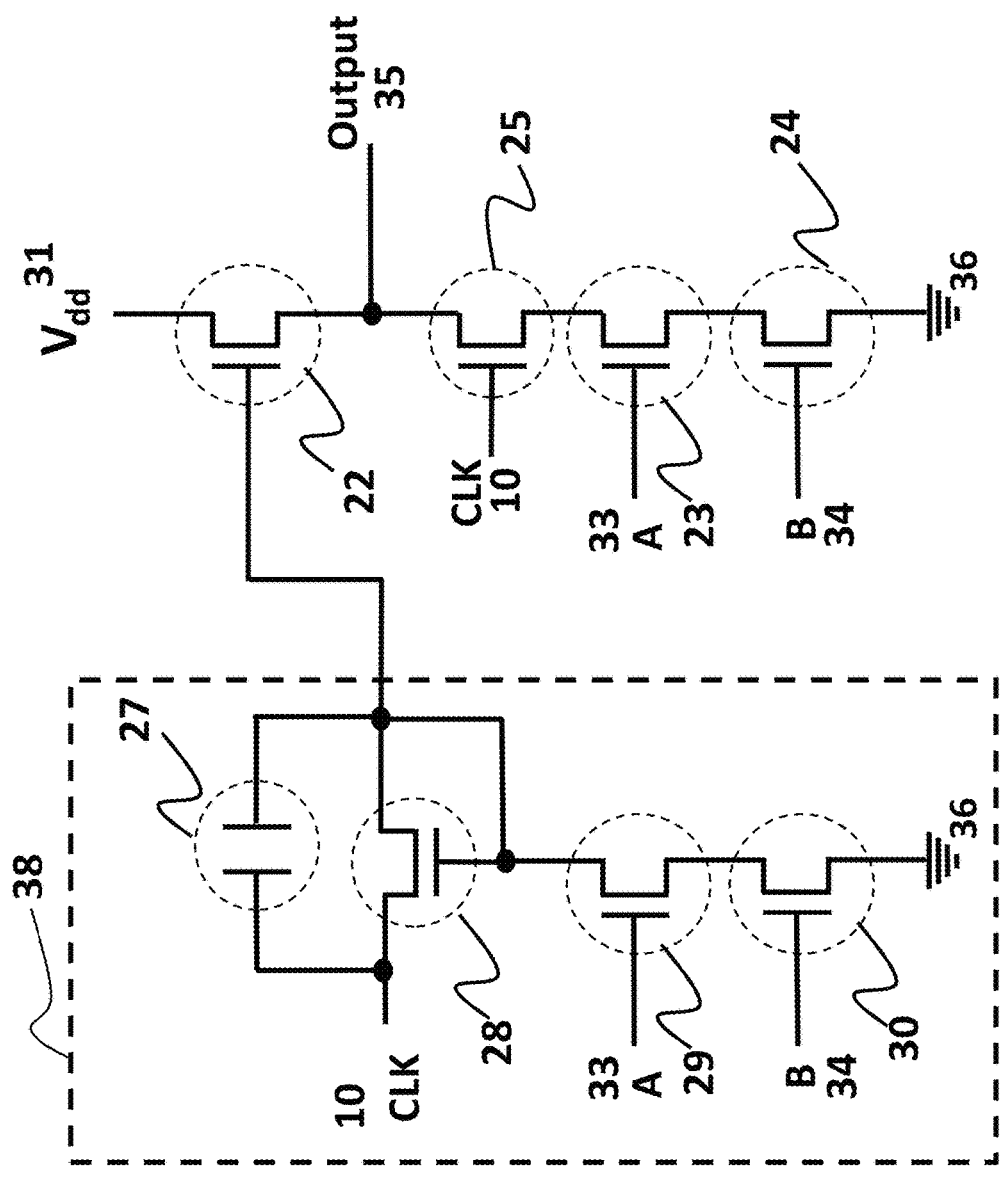
Figure 9F:
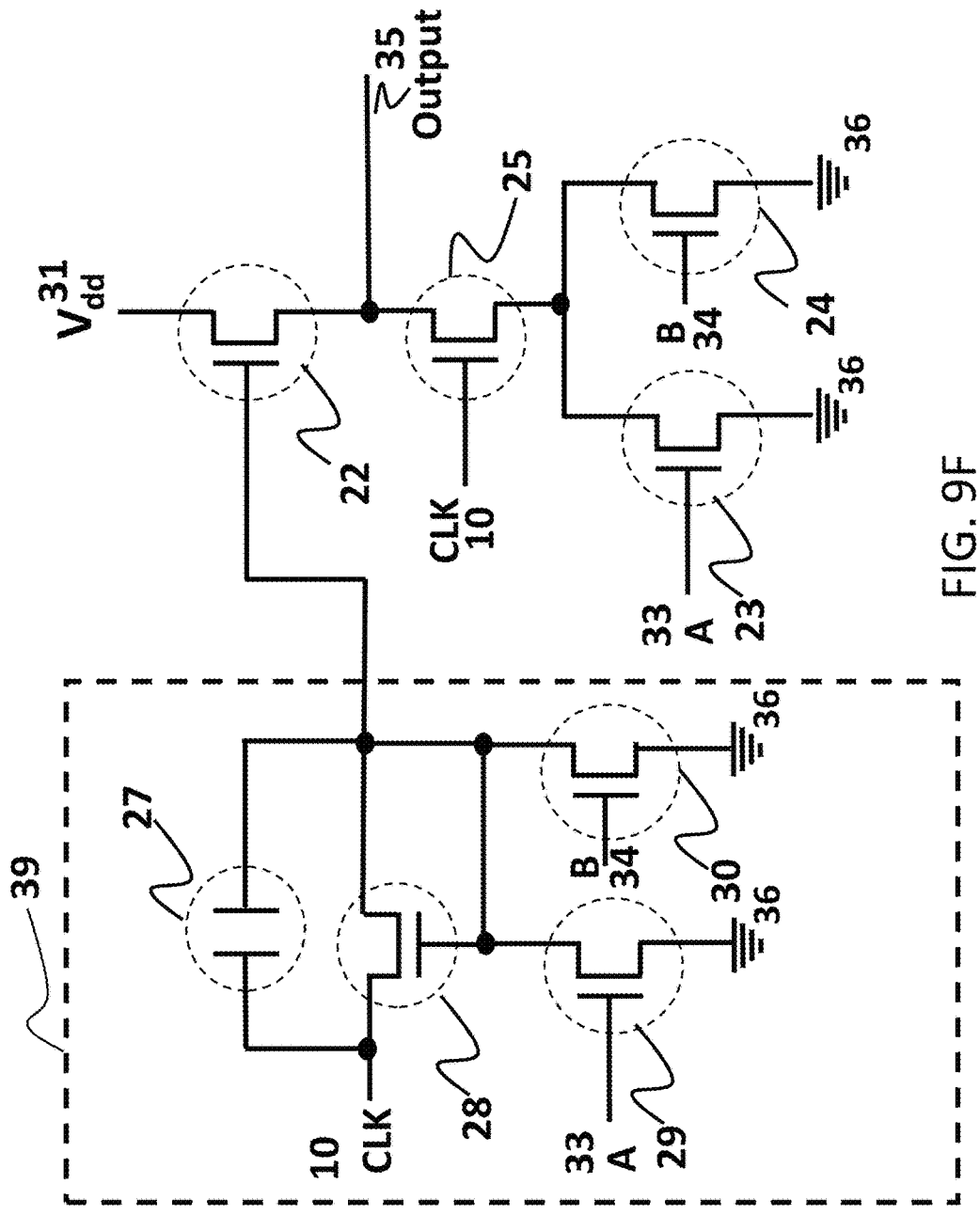
Figure 9G:
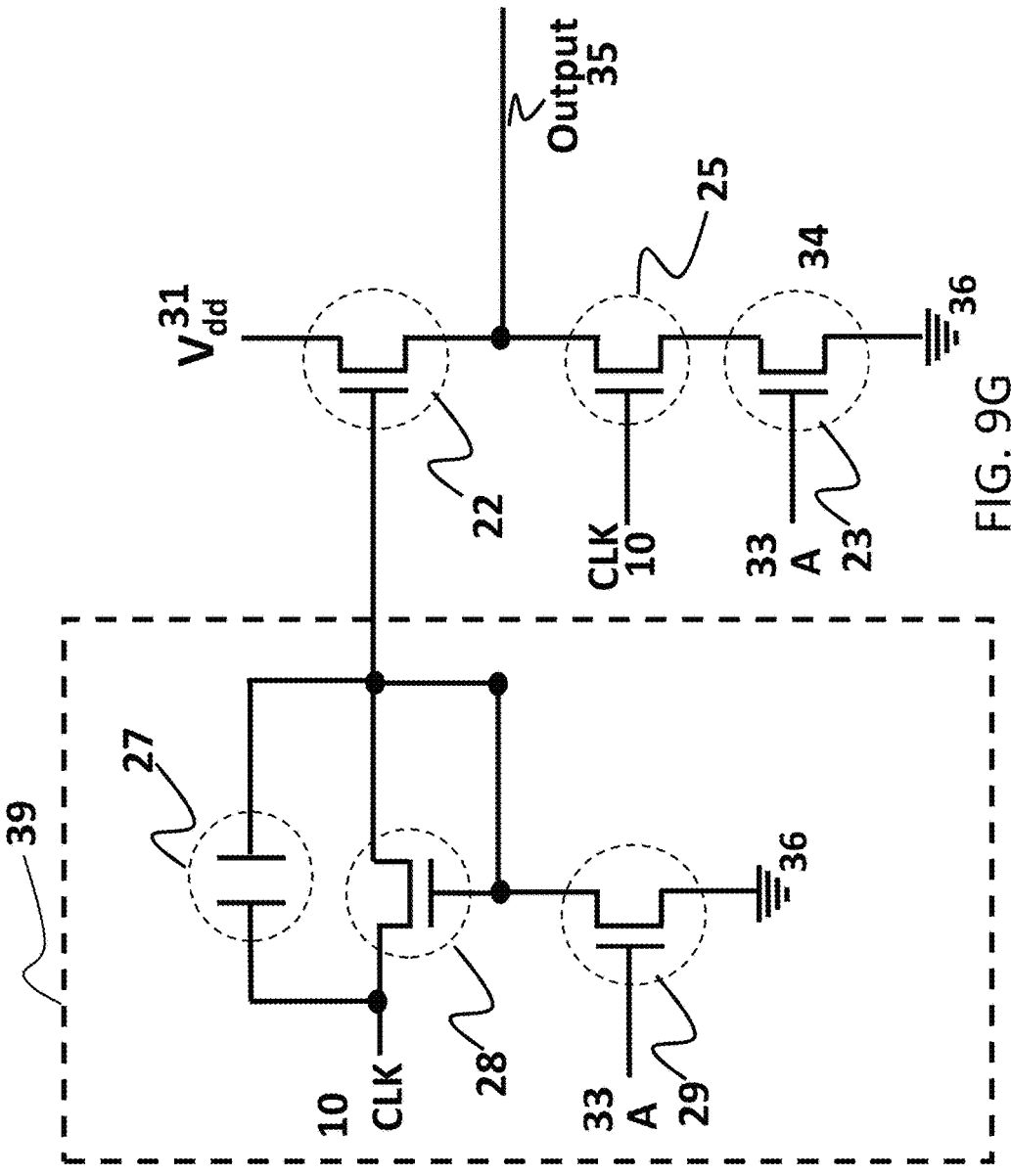
Figure 9H:
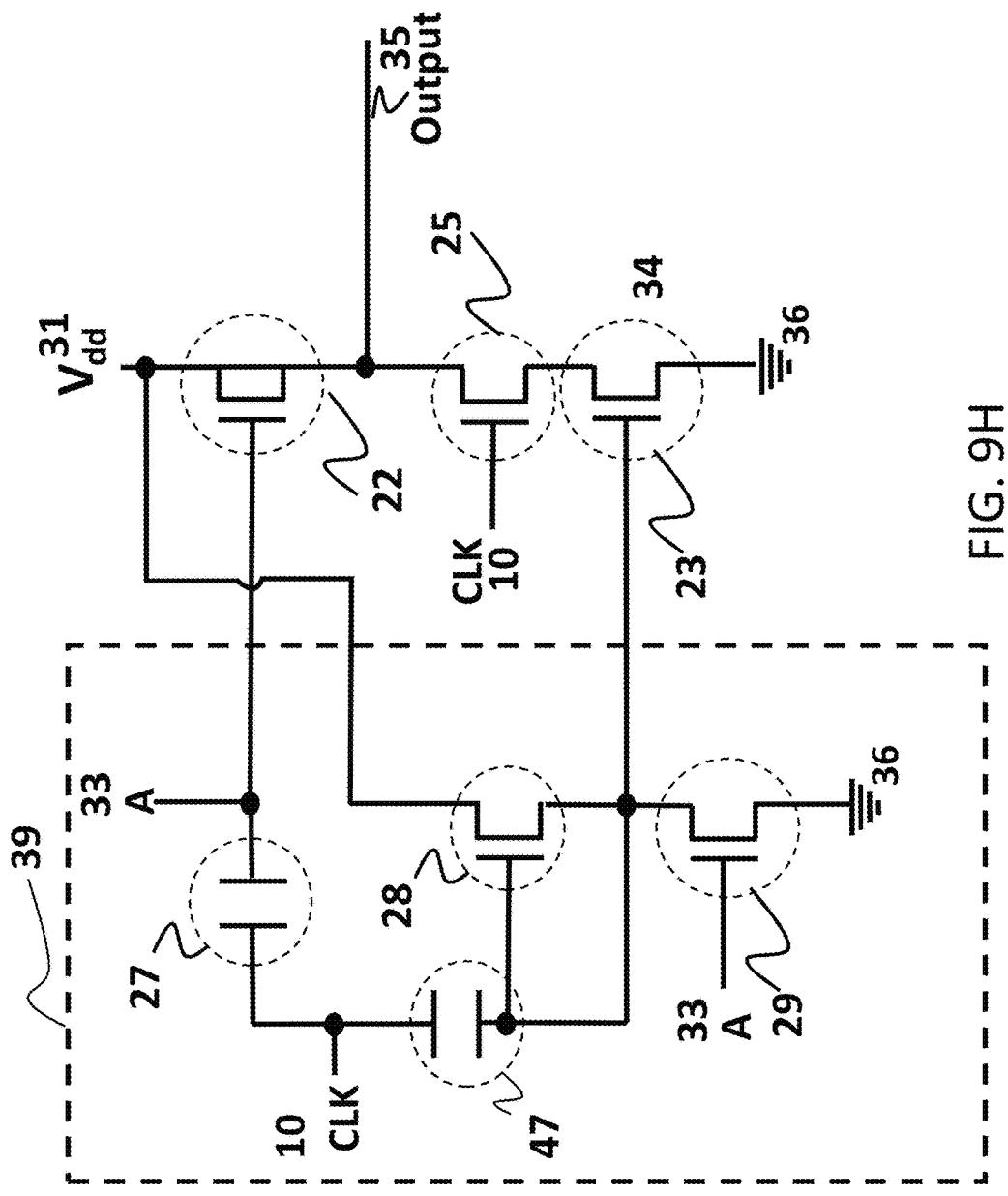
Figure 9I:
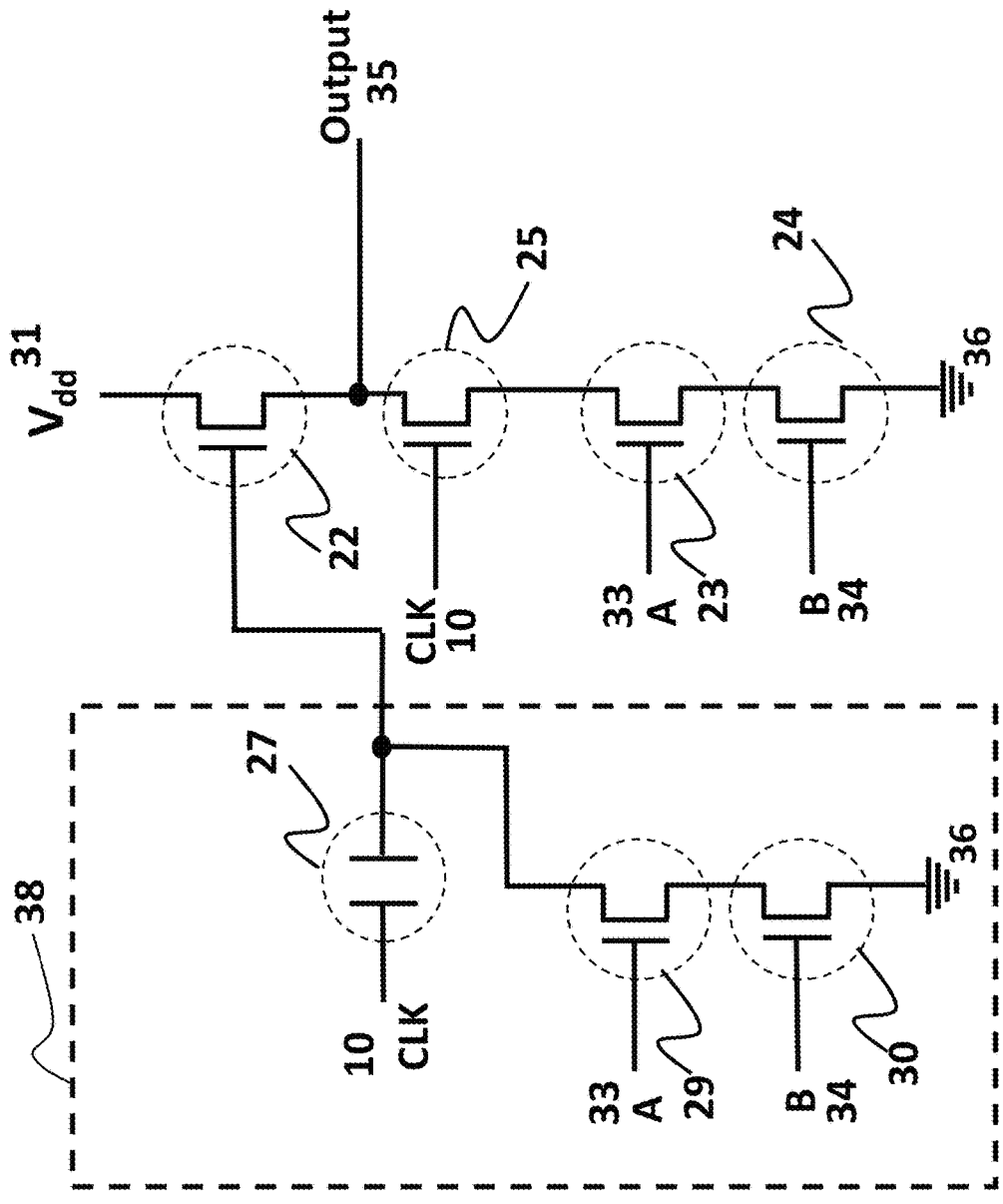
Figure 9K:
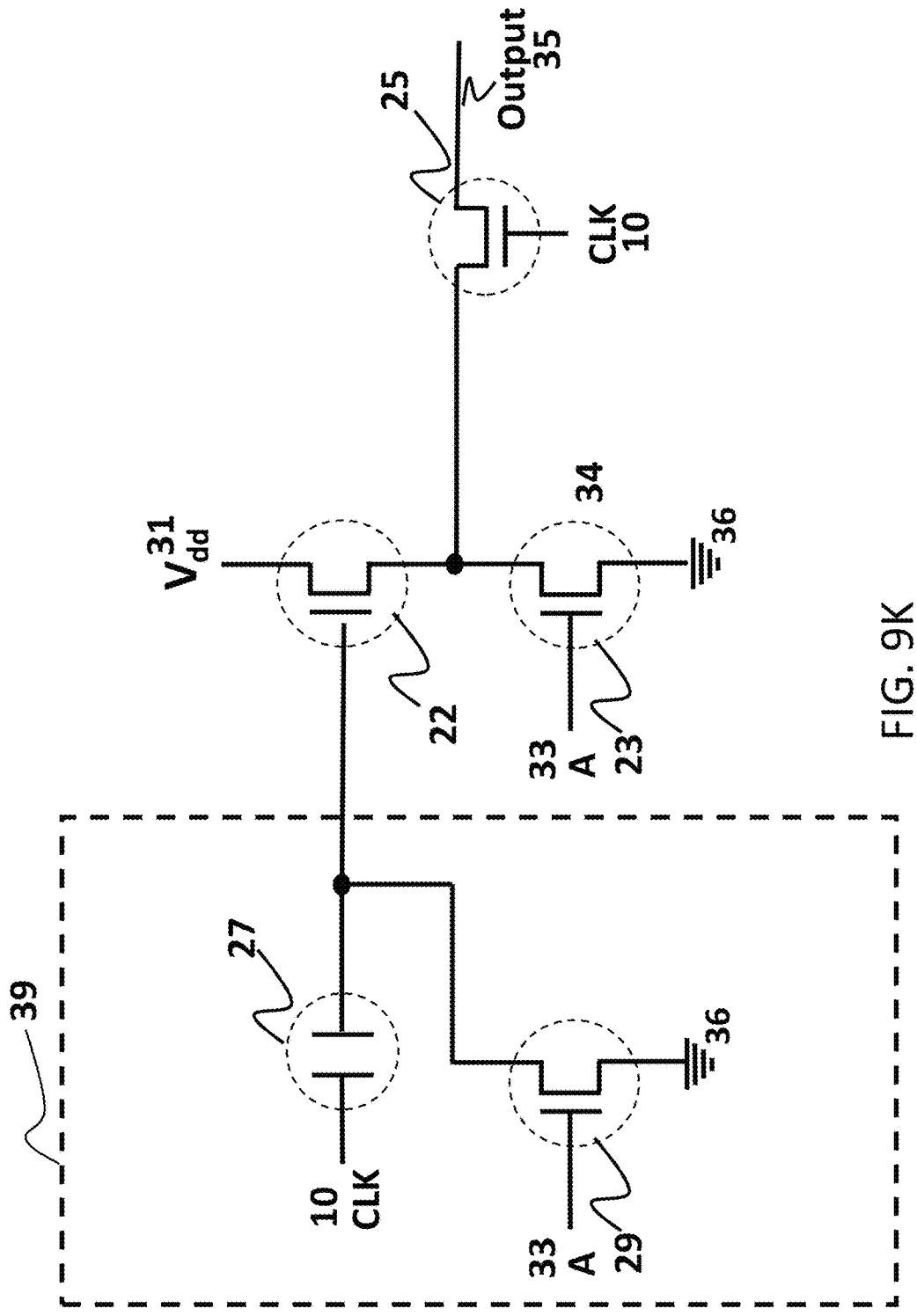
Figure 9L:
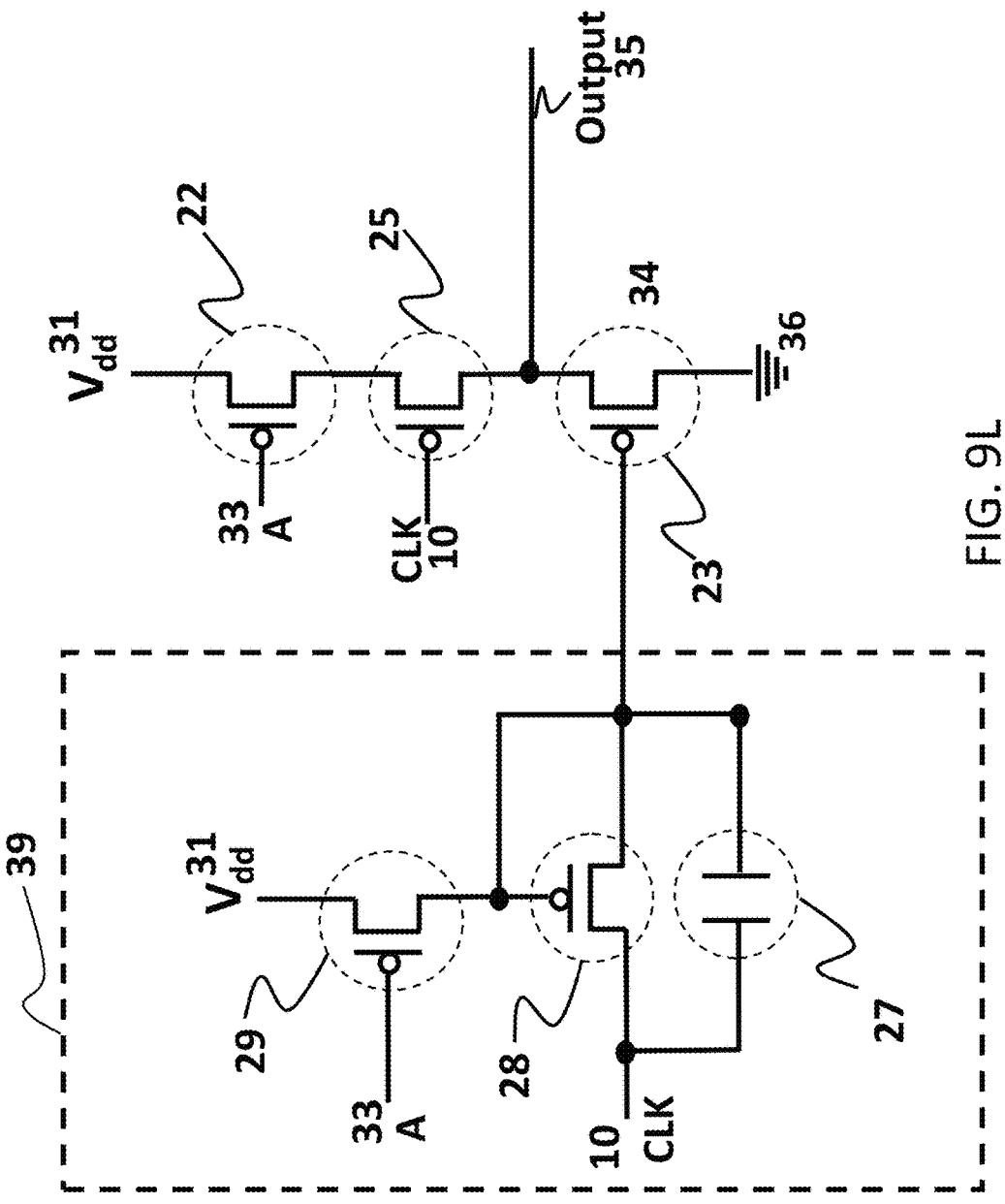
Figure 10:
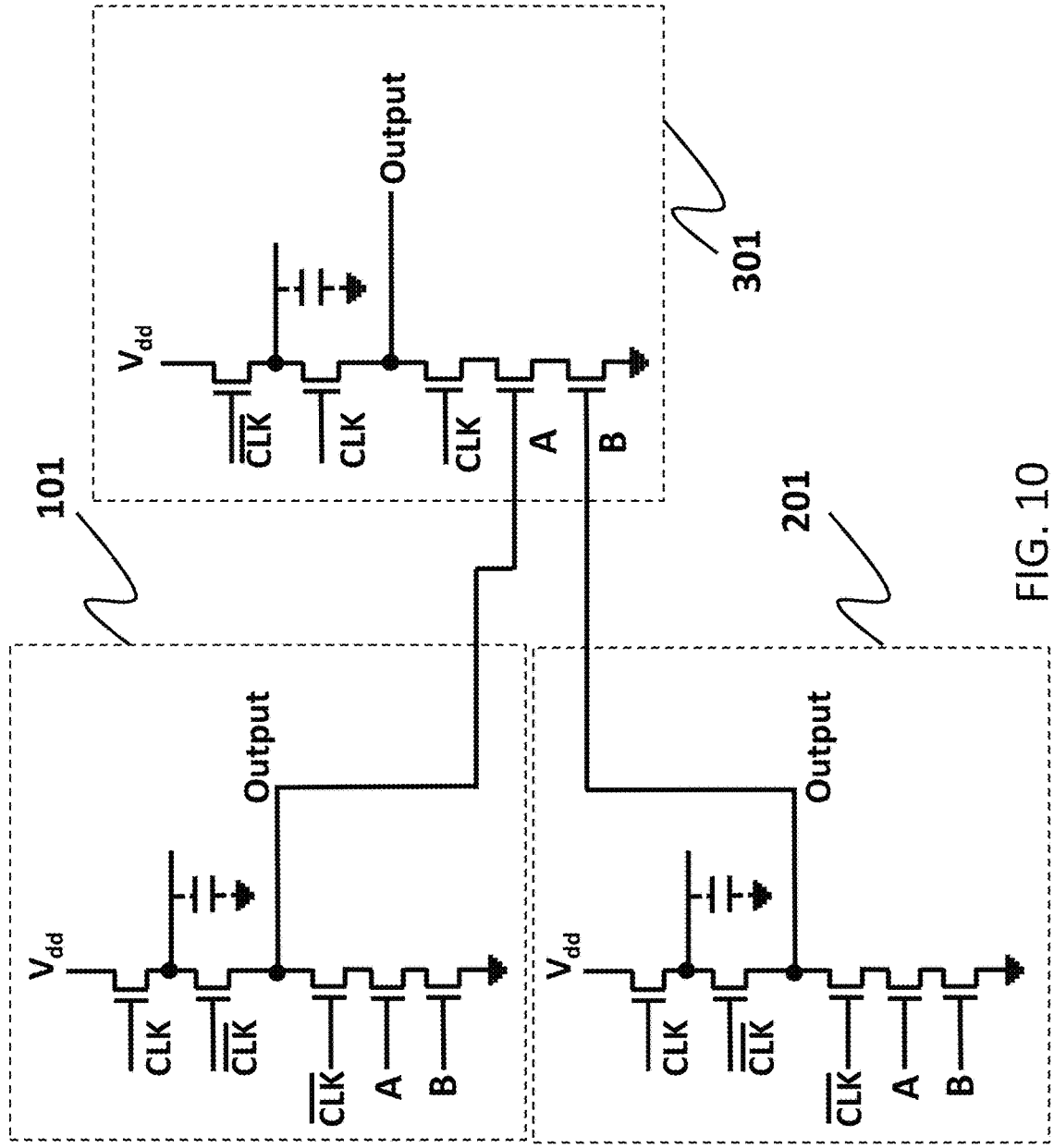
Figure 11A:
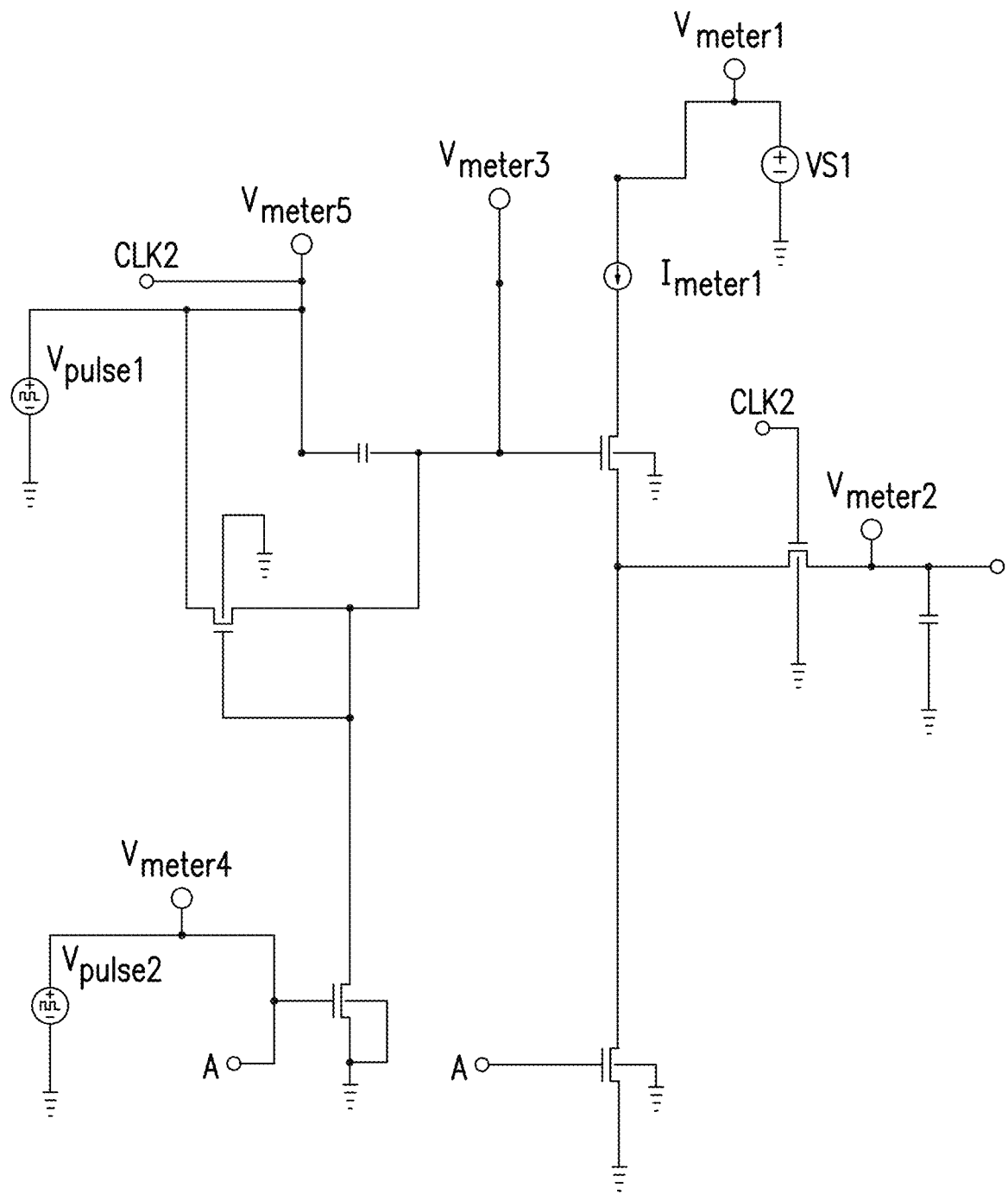
Figure 11B:
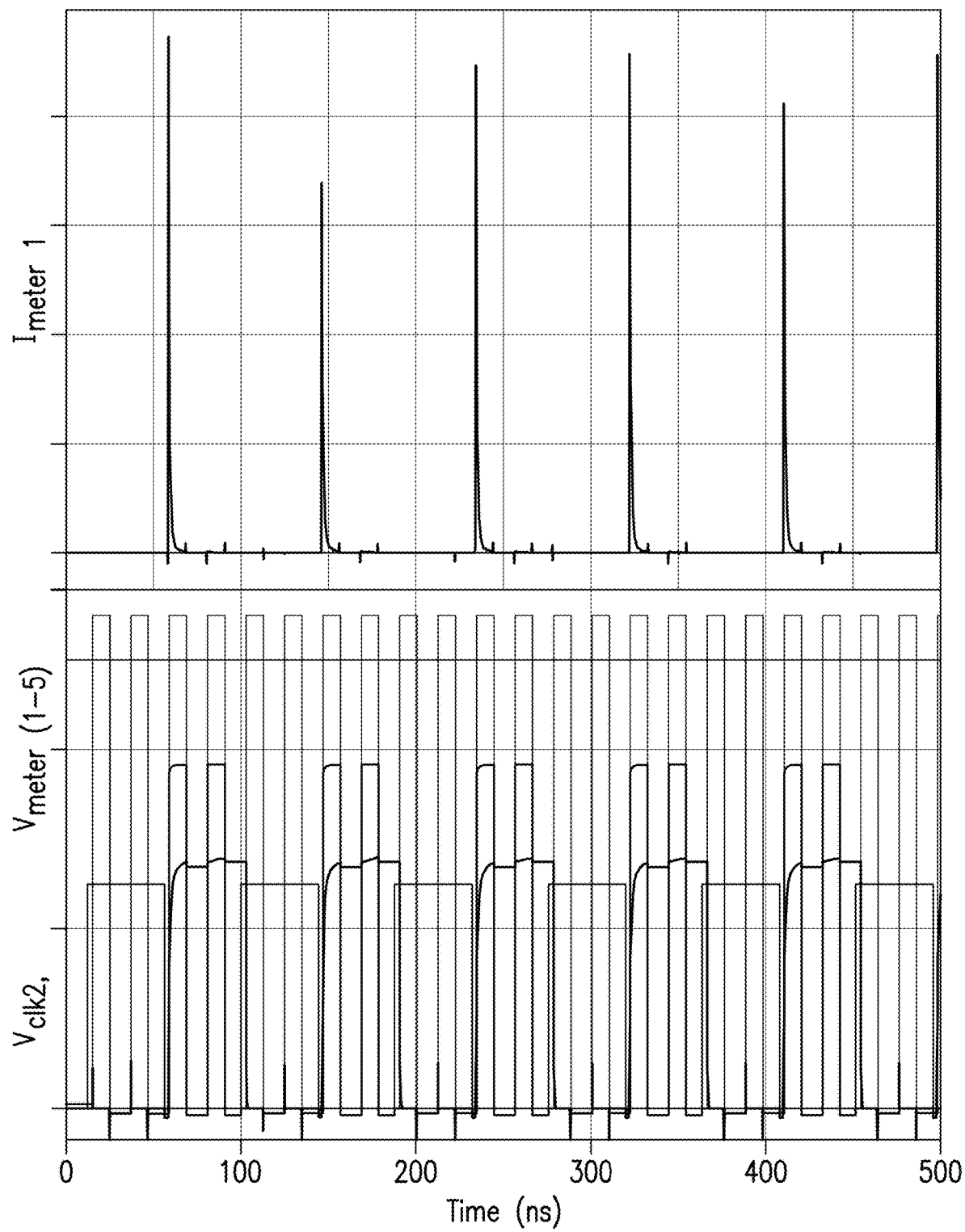
Figure 12A:
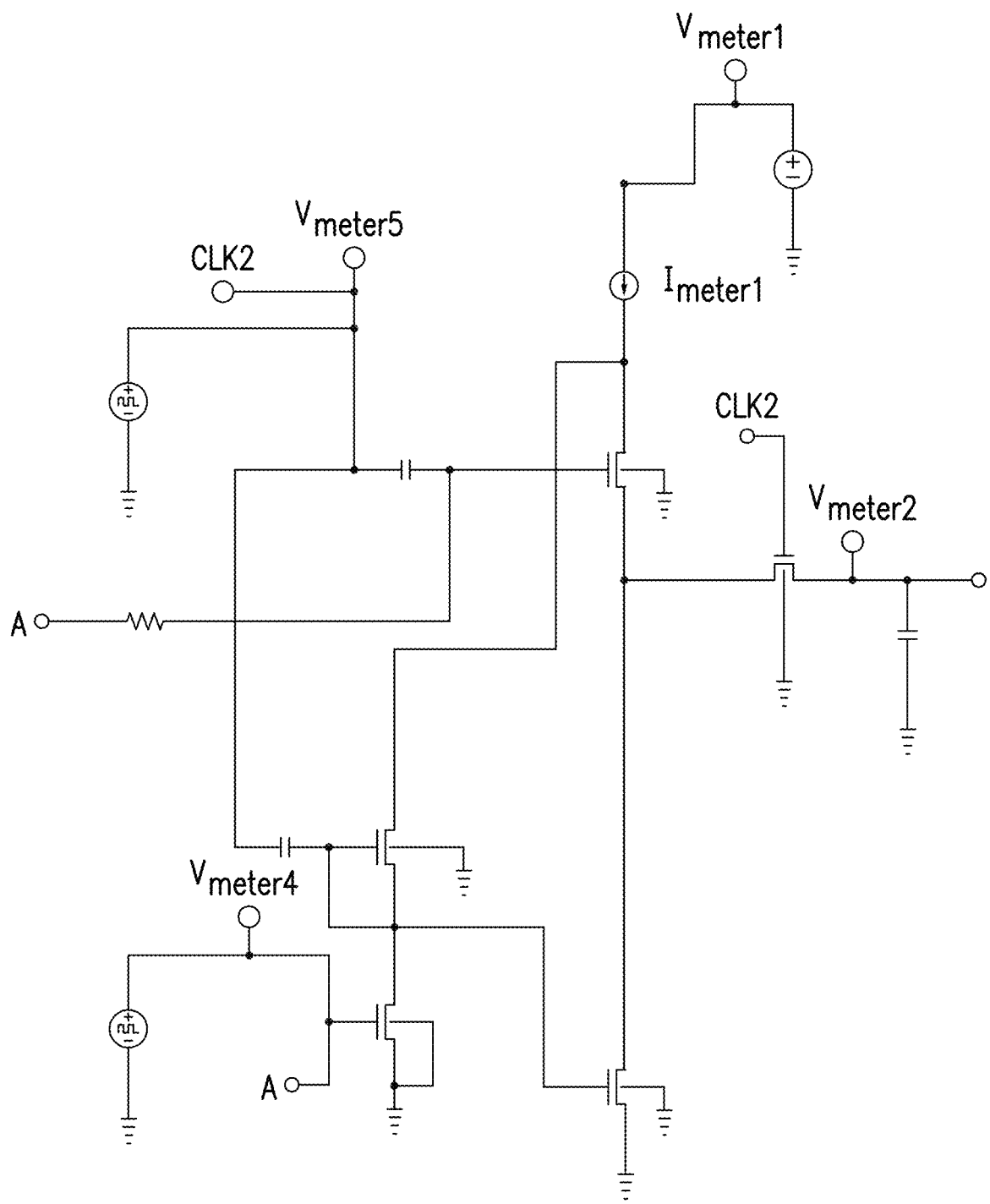
Figure 12B:
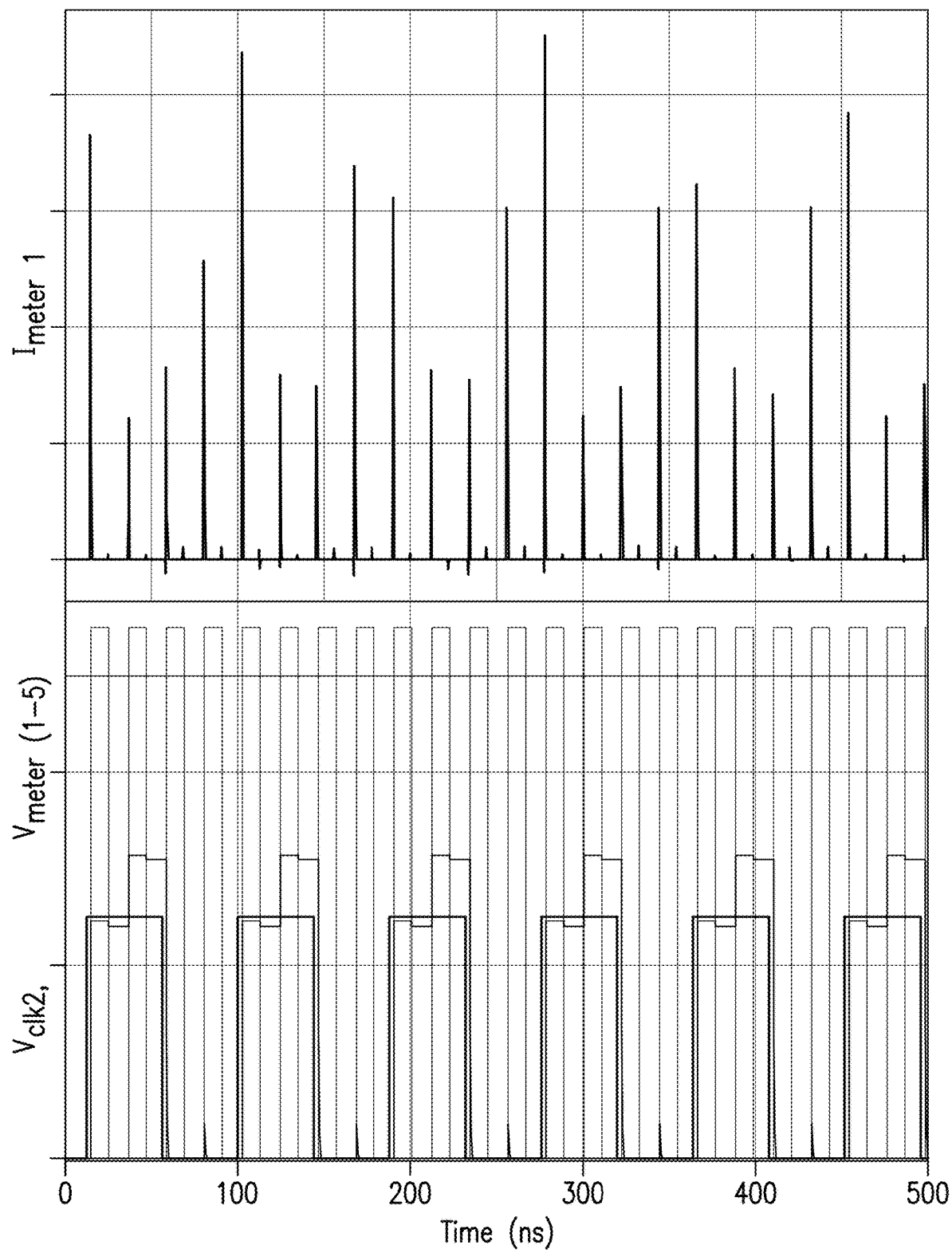
Figure 13A:
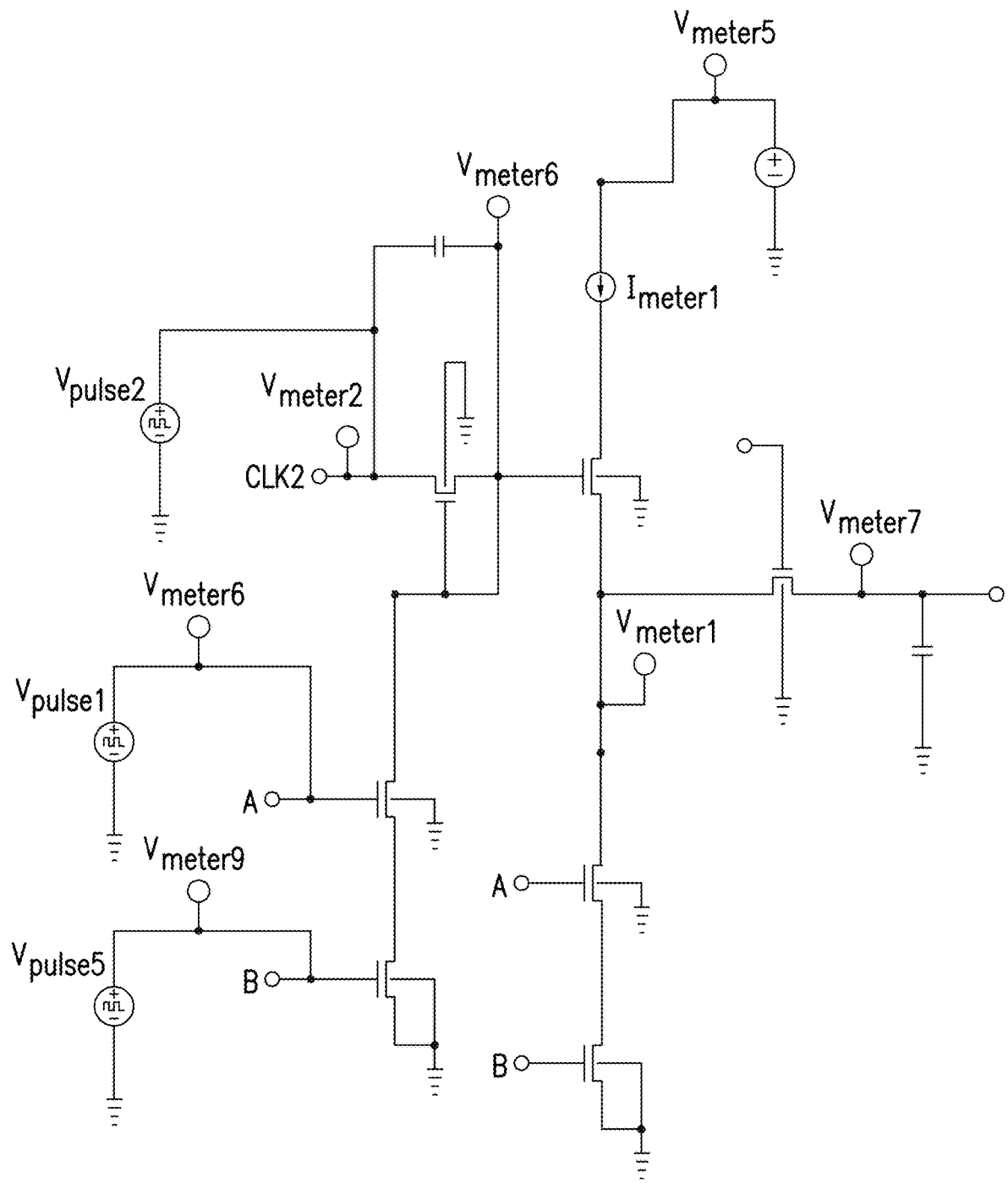
Figure 13B:
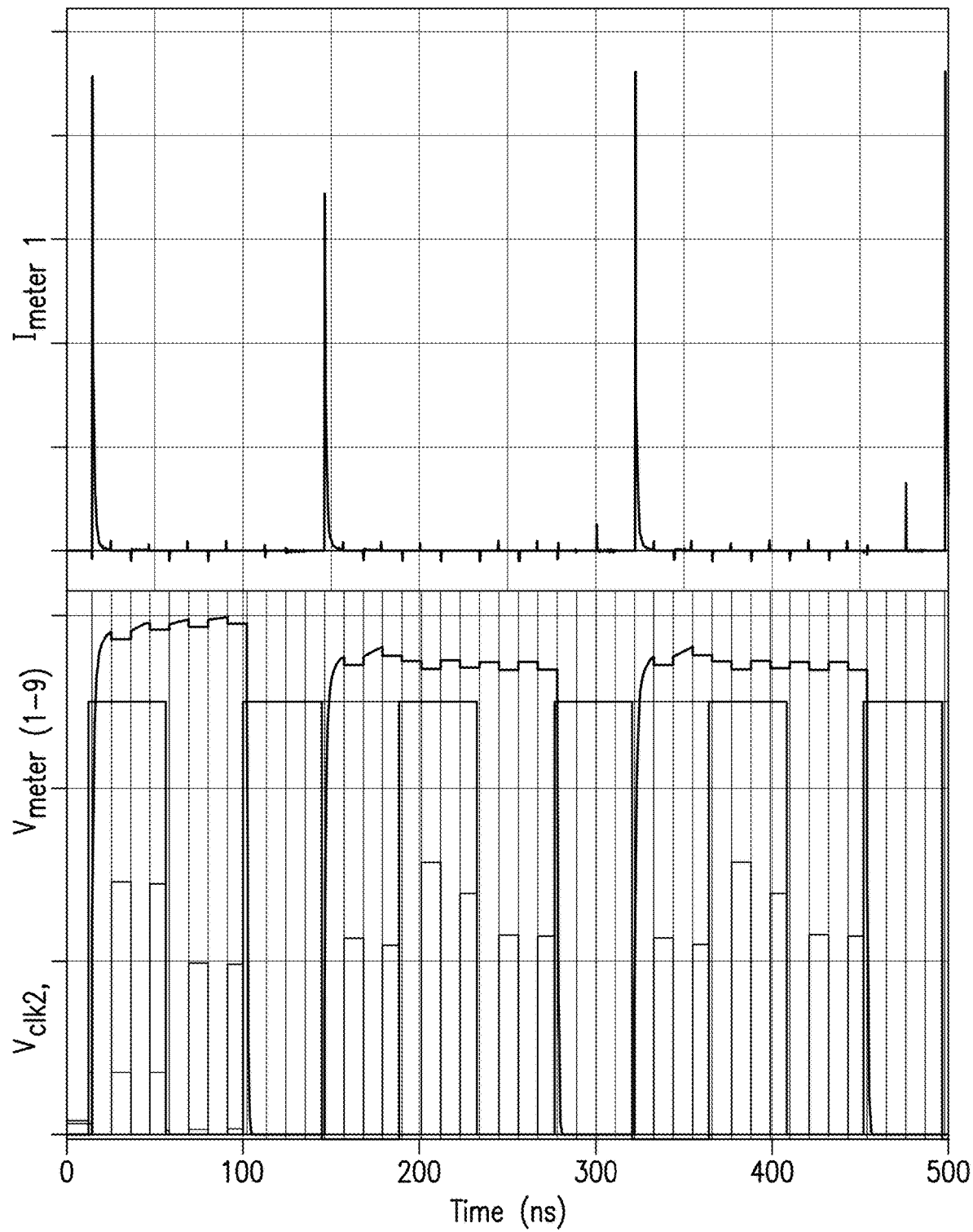
Figure 14A:
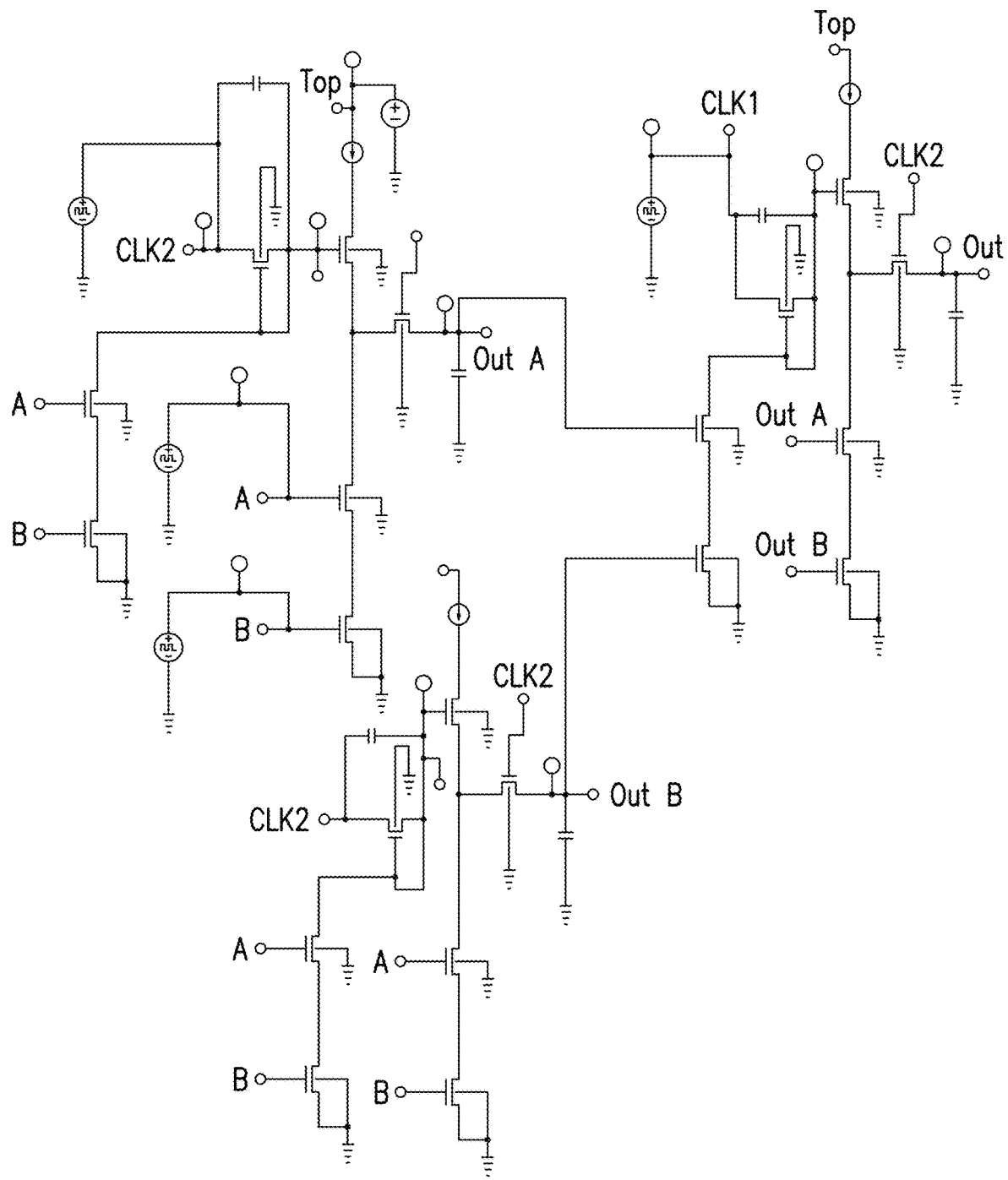
Figure 14B:
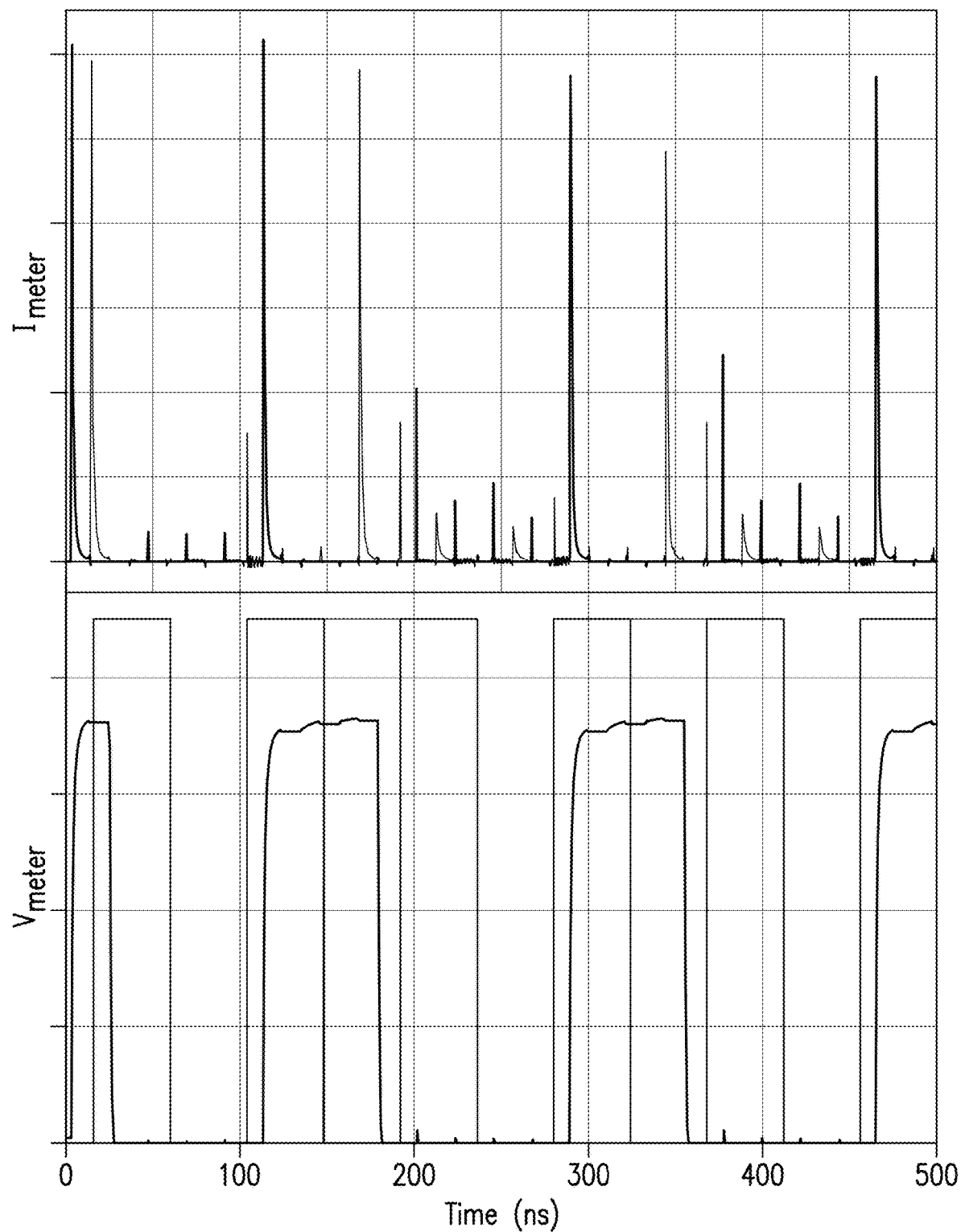

FIGS. 9A-10 depict an embodiment of unipolar logic circuitry identical to the embodiment depicted in FIGS. 1A-2, except that the clocked pass gate is transposed in location so as to be in the pull-down network. For example, in FIG. 9A is identical to FIG. 1A, except that clocked pass gate 25 has been transposed, from its location depicted in FIG. 1A, where it connects output terminal 35 to a net shared by logic transistor 23 and clocking device 92, to its location depicted in FIG. 9A, where it connects logic transistor 23 to output terminal 35, which is also coupled to clocking device 92. In the FIG. 1A configuration clocked pass gate 25 is part of a conductive pull up path between Vdd and output terminal 35, and is part of the conductive pull down path between Vss and output terminal 35. The conducive pull up path between Vdd and output terminal 35 has another device—clocked pass gate 22—that performs substantially the same function as clocked pass gate 25. Therefore clocked pass gate 25 need only provide selective conduction in the pull down path between Vss and output terminal 35. In each of FIGS. 9B-10, clocked pass gate 25 has similarly been transposed from its location depicted in FIGS. 1B-10.

Operation of the logic families depicted in FIGS. 1A-10 embodiments can be described with reference to the NOR gate depicted in FIG. 1C. The NOR depicted in FIG. 1C has complementary first and second clock terminals 32 and 92, logic input terminals 33 and 34, logic output terminal 35, a logic network, a pre-charge network, and a logic clocking network. The logic network includes switching devices 23 and 24. The pre-charge network includes switching device 21 and charge-storage capacitor 26. The logic clocking network includes switching devices 22 and 25. Each of switching devices 21, 22, 23, 24 and 25 are of the same unipolar type. For example, all of switching devices 21, 22, 23, 24 and 25 could be N-type MOSFETS in one embodiment. In another embodiment, all of switching devices 21, 22, 23, 24 and 25 could be P-type MOSFETS, for example.

The logic network in the FIG. 1C embodiment is configured to perform a NOR logic function. Switching devices 23 and 24 of the logic network have control terminals (e.g., gates) coupled to logic input terminals 33 and 34, respectively. The logic network is configured to modulate conductivity, based on logic input signals A and B received on logic input terminals 33 and 34, respectively, and on the NOR logic function that the logic network is configured to perform, between a first supply net (e.g., ground) and a pre-evaluation net, which connects logic network to the logic clocking network.

The pre-charge network is configured to provide an electrical charge to charge-storage capacitor 26 during a first phase of first and second clock signals CLK and $\overline{\text{CLK}}$. Switching device 21 of the pre-charge network has a control terminal coupled to the clock input terminal 32. Switching device 21 is configured to modulate conductivity, based on clock signal CLK received on clock input terminal 32, between a second supply net (e.g., Vdd) and a first terminal (e.g., top plate) of charge-storage capacitor 26. For example, when clock signal CLK is of a voltage that causes conductivity of switching device 21 to be high, then the first terminal of charge-storage capacitor 26 will be charge to a voltage approximately equal to the voltage of the second supply net (e.g., Vdd). When clock signal CLK is of a voltage that causes conductivity of switching device 21 to be low (e.g., off), then little or no electrical conduction will occur between the second supply net and the first terminal of charge-storage capacitor 26.

The logic clocking network is configured to couple output terminal 35 to both the pre-charge net and to the first terminal of charge-storage capacitor 26. Each of switching devices 22 and 25 of the logic clocking network has a control terminal coupled to second clock input terminal 92. The logic clocking network is configured to modulate conductivity, based on second clock signal $\overline{\text{CLK}}$ received on second clock input terminal 92, between logic output terminal 35 and both the first terminal of charge-storage capacitor 26 and the pre-evaluation net.

If input logic signals A and B are of voltages that causes conductivity of either of switching devices 23 or 24 to be high, then charge-storage capacitor 26 will be discharged to first supply net (e.g., GND) via the logic network when clock signal CLK has a phase that causes conductivity of switching devices 22 and 25 to be high. In such a situation, the voltage provided to output logic terminal 35 will be substantially equal to the voltage of the first supply net (e.g., GND).

If, however, input logic signals A and B are of voltages that causes conductivity of either of switching devices 23 or 24 to be low, then charge-storage capacitor 26 will not be discharged to first supply net (e.g., GND) via the logic network when clock signal CLK has a phase that causes conductivity of switching devices 22 and 25 to be high. In such a situation, the voltage provided to output logic terminal 35 will be substantially equal to the voltage of the first supply net (e.g., GND). In such a situation, the voltage provided to output logic terminal 35 will be a voltage determined by the charge stored on charge-storage capacitor 26 conductively shared, via logic clocking network with any capacitances coupled to logic output net 35.

The clocking scheme describe with reference to FIG. 9C results in a NOR logic gate that has a resolving phase and a holding phase. For example, if the complementary first and second clock signals CLK and $\overline{\text{CLK}}$ have voltages that cause switching devices 22 and 25 of the logic clocking network to have relatively-high conductivities, then the NOR gate is in the resolving phase of operation. In the resolving phase of operation, any changes in the state of input logic signals A and B can cause a change in the logic output signal to appear on logic output terminal 35. If, however, the complementary first and second clock signals CLK and $\overline{\text{CLK}}$ have voltages that cause switching devices 22 and 25 of the logic clocking network to have relatively-low conductivities, then the NOR gate is in the holding phase of operation. In the holding phase of operation, any changes in the state of input logic signals A and B do not cause a change in the logic output signal to appear on logic output terminal 35.

The various other logic gates depicted in FIGS. 9A-9B and 9D-10 operate in similar fashion to the NOR gate described above with reference to FIG. 9C. In some embodiments, complementary clock signals CLK and $\overline{\text{CLK}}$ have first and second phases. Because clock signals CLK and $\overline{\text{CLK}}$ are complementary, during each of first and second phases, clock signals CLK and $\overline{\text{CLK}}$ are complementary. For example, clock signal CLK might have a relatively-high voltage during the first phase of complementary clock signals CLK and $\overline{\text{CLK}}$, and a relatively-low voltage during the second phase of complementary clock signals CLK and $\overline{\text{CLK}}$. Then, clock signal CLK might have a relatively-low voltage during the second phase of complementary clock signals CLK and $\overline{\text{CLK}}$, and a relatively-high voltage during the second phase of complementary clock signals CLK and $\overline{\text{CLK}}$.

The relatively-high voltage can be approximately equal to the voltage of the second supply net (e.g., Vdd). In some embodiments, the relatively-high voltage can exceed the voltage of the second supply net (e.g., >Vdd). A voltage that exceeds the supply can be generated, for example, by using a supply for a clocking network that is different from (e.g., greater than) the supply for the logic gates.

In some embodiments, evaluation phase 57a of clock signal/time relation 57 can have a voltage level that exceeds a supply voltage. Such a clock-signal/time relation can provide increased conductivity of logic-complement clocking device 113 (depicted in FIG. 7). This can ensure that the output signal on logic output terminal 135 is with a predetermined logic level specification, for example. Various capacitive techniques can provide such a clock signal/time relation 57 that exceeds a supply voltage.

The unipolar logic circuitry and vertical structures shown herein may be utilized with thin film transistors (TFTs) on insulative substrates such as glass or plastic. Alternatively, the unipolar logic circuitry may be utilized on a variety of semiconductor substrates which may be made of any appropriate semiconductor materials, such as silicon, polysilicon, germanium on insulator (GOI), silicon germanium, carborundum, indium antimonite, indium nitride, lead telluride, indium arsenide, indium phosphide, gallium arsenide, indium gallium arsenide, gallium antimonite, gallium nitride, alloy semiconductor, or a combination thereof. In yet another embodiment, unipolar logic circuitry may be fabricated with TFTs either in 2D planar or 3D vertical structures above unipolar logic circuitry embedded in a semiconductor substrate. This enables hybrid structures with ultra-high performance, density and speed. For example, InAs exhibits high electron mobility of 30,000-40,000 $cm^2/Vs$, and is a promising candidate along with other compound semiconductors for the semiconductor technology to replace silicon. However, vertical logic gates fabricated with compound semiconductors may not be feasible as it is with TFTs which can be fabricated at low process temperatures (<400 C). Hence, to maximize overall speed, density, power and cost, a hybrid device may be fabricated for example utilizing unipolar logic circuitry on an InAs substrate with additional unipolar logic circuitry comprised of TFT-based vertical logic gates fabricated above the core InAs logic circuitry.

In the description herein, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

As used herein the terms "source" and "drain" refer to the two terminals of a transistor and one skilled in the art understands that depending on the operation of the transistor, the terms "source" and "drain" are interchangeable. As used herein the terms "anode" and "cathode" refer to the two plates of a capacitor and one skilled in the art understands that depending on the operation of the capacitor, the terms "anode" and "cathode" are interchangeable. These interchangeable terms are not intended to impose limitations on the claimed invention herein.

The drawings herein show columnar logic gate structure relative to the plane of a substrate which may be silicon, glass or other material. Structures are drawn in the "X", "Y", and "Z" axis direction. The "Z" direction is perpendicular to the plane of the substrate. "X" and "Y" directions are 90 degrees relative to each other and are along the same plane of the substrate. "X" and "Y" may be interchanged and not intended to impose limitations on the structures described herein.

The present discloser is related to monolithic 3D integrated circuits comprised of columnar logic gates (CLGs) constructed in a vertical fashion and comprising a semiconductor column and conductive columns which may be equidistant from the semiconductor column for routing the inputs and outputs whereby the inputs and outputs are accessible for connection from either above or below the columnar logic gate or both. The pin connections at interconnection layers above or below the columnar logic gate may be minimally spaced from the semiconductor column and from pins of adjacent columnar logic gates at a distance of 1 F thereby enabling much higher density circuitry compared to conventional planar circuit designs and related routing. Pins at the interconnection layers are only for input (e.g., A, B, Clock, Vdd, Gnd, Vp, Vn) and output signals. Intragate routing and transistor gate contacts are all positioned within the vertical (z-axis) distance of the semiconductor column and not at an interconnection layer. Employing TFTs enables low cost manufacturing and high density circuits by enabling multiple stacks of columnar logic gates and interconnection layers.

The columnar logic gates are preferably constructed with a core vertical stack of source, body and drain layers—or semiconductor column. Such a construction is analogous to the methods employed in fabrication of 3D NAND flash devices which allows for low cost manufacturing through reduction in masks and processing steps. The fabrication of the transistors via sequential deposition of source, body, and drain layers allows for very thin (short) transistor channel lengths without the need for lithography equipment capable of such channel lengths. For example, a semiconductor fab may be used to construct columnar logic gates which have transistor channel lengths of 10 nm or even less regardless of the minimum feature size of the lithography equipment employed at the facility which could be greater than 100 nm.

The semiconductor column is preferably made with thin film transistors (TFTs) which may be fabricated at back end of line (BEOL) temperatures of less than 450 F, thereby allowing for low cost manufacturing and high density by enabling multiple stacks of CLGs and interconnection layers.

The high density CLGs described herein enable circuit devices with high density, low power and high speed due to drastically reduced interconnect distances which may be fabricated at reduced costs compared to current methods employed in the semiconductor field.

Figure 15A:
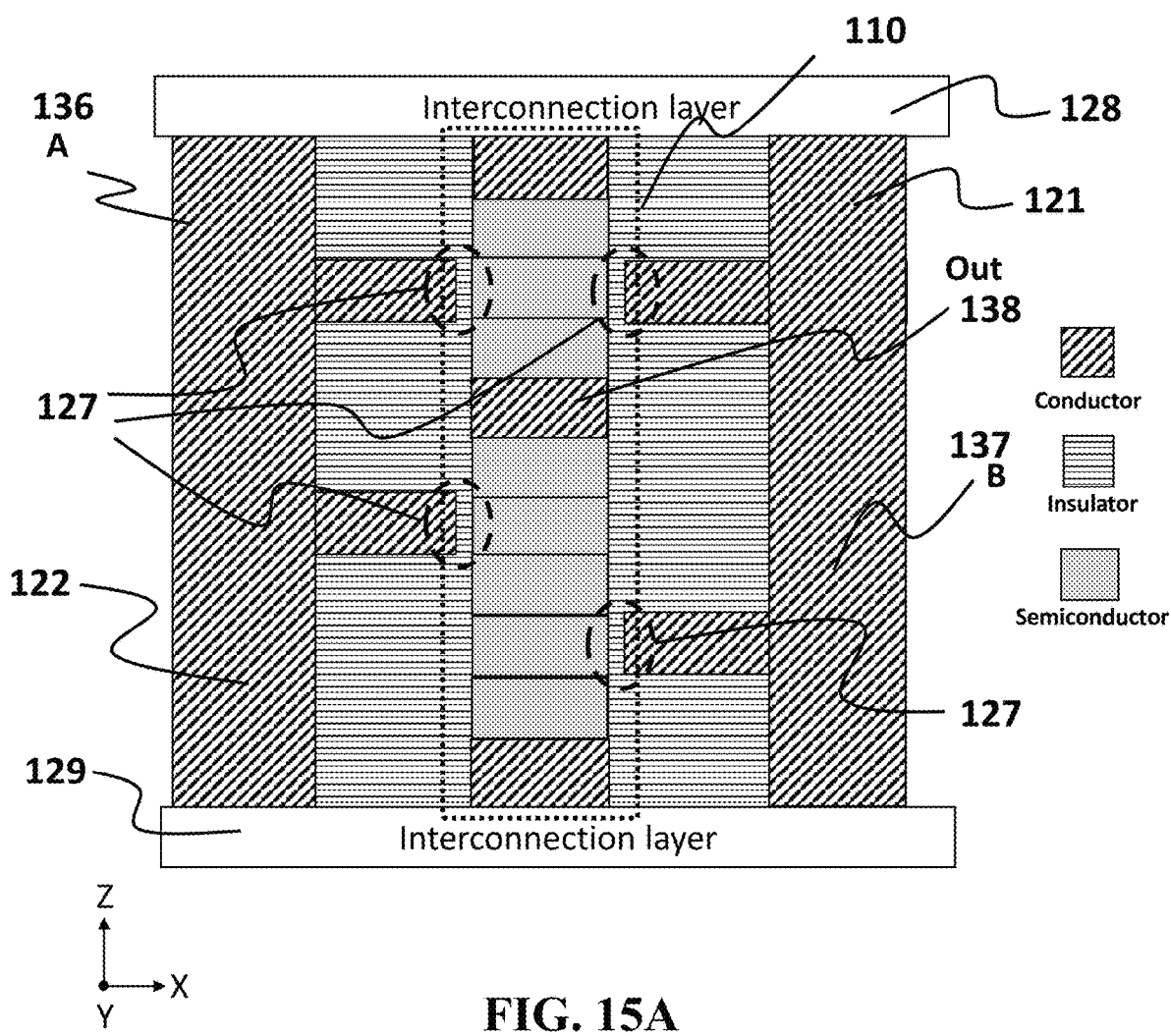
FIG. 15A is a cross-sectional view of a columnar logic gate according to an embodiment of the present invention.
Figure 15B:
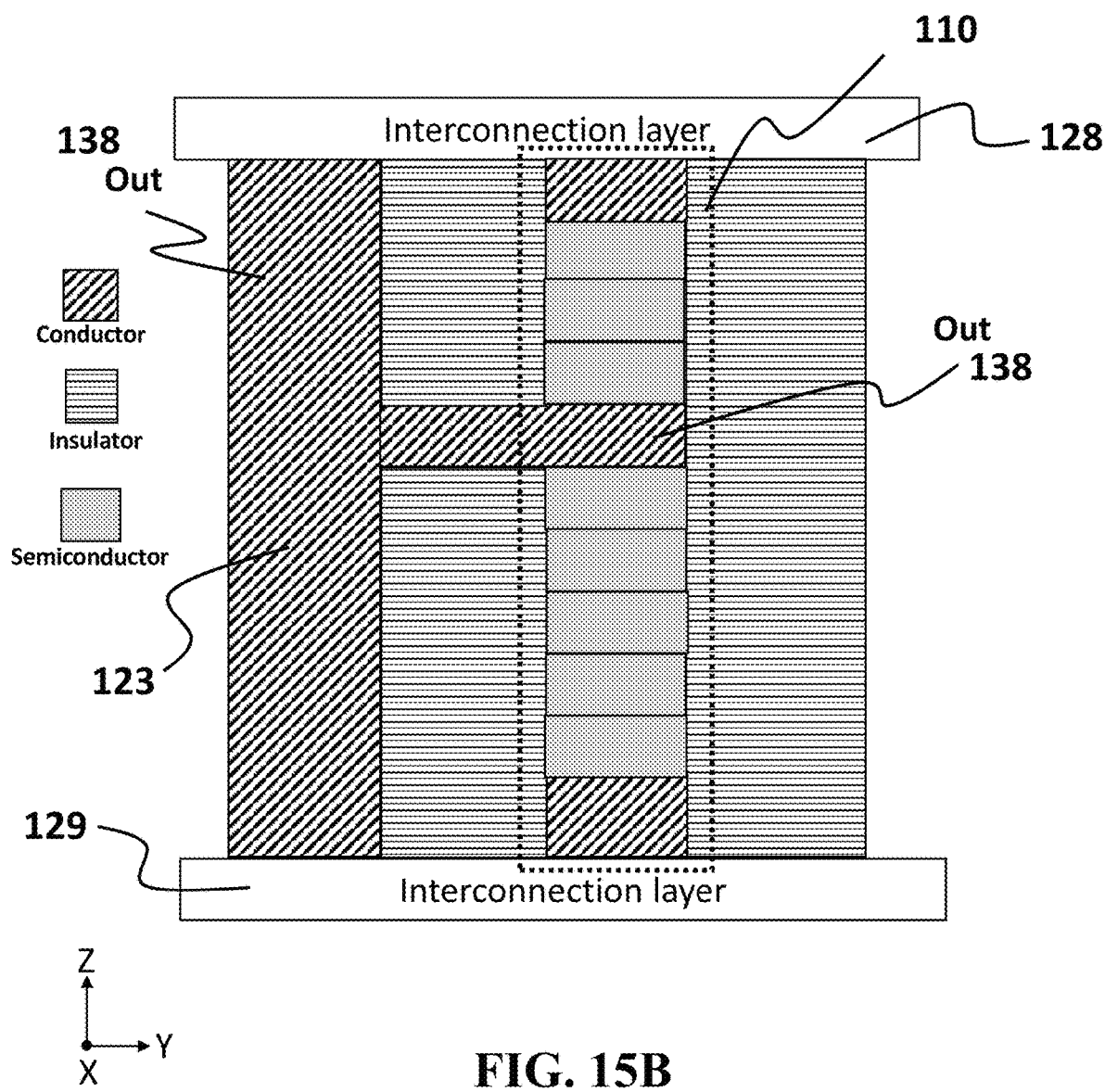
FIG. 15B is a cross-sectional view of a columnar logic gate according to an embodiment of the present invention.

FIG. 15A and FIG. 15B are a cross-sectional views of a columnar logic gate according to an embodiment of the present invention. A columnar logic gate includes a semiconductor column (110) which is comprised of the source, drain, and body of each of the transistors in the gate, vertically aligned. The column may include other conductive and insulative layers; the conductive layers in the semiconductor column may be connections to ground (Vss) or power (Vdd) or intragate connections connecting a source or drain of one transistor to the source or drain of another transistor. The columnar logic gate also includes two or more conductive columns (121, 122 and 123) adjacent to the semiconductor column coupling the inputs and outputs of the logic gate to an interconnection layer above (128) or below (129) the semiconductor column (110) or both; wherein the intragate routing and transistor gate contacts (127) of the logic gate are positioned within the vertical distance of the semiconductor column (110) and not at an interconnection layer. The term "vertical distance of the semiconductor column" in this specification refers to the region between the top of the logic gate and bottom of the logic gate (or in the case of stacked logic gates, the region between the top of the top logic gate and the bottom of the bottom logic gate) and specifically excludes the region at an interconnection layer. The term "interconnection layer" in this specification refers to what are commonly referred to in the semiconductor industry as routing layers which serve the purpose of connecting input and output pins of one logic gate to another. One interconnection layer may be comprised of several routing layers as allowed by the manufacturing process.

Figure 15C:
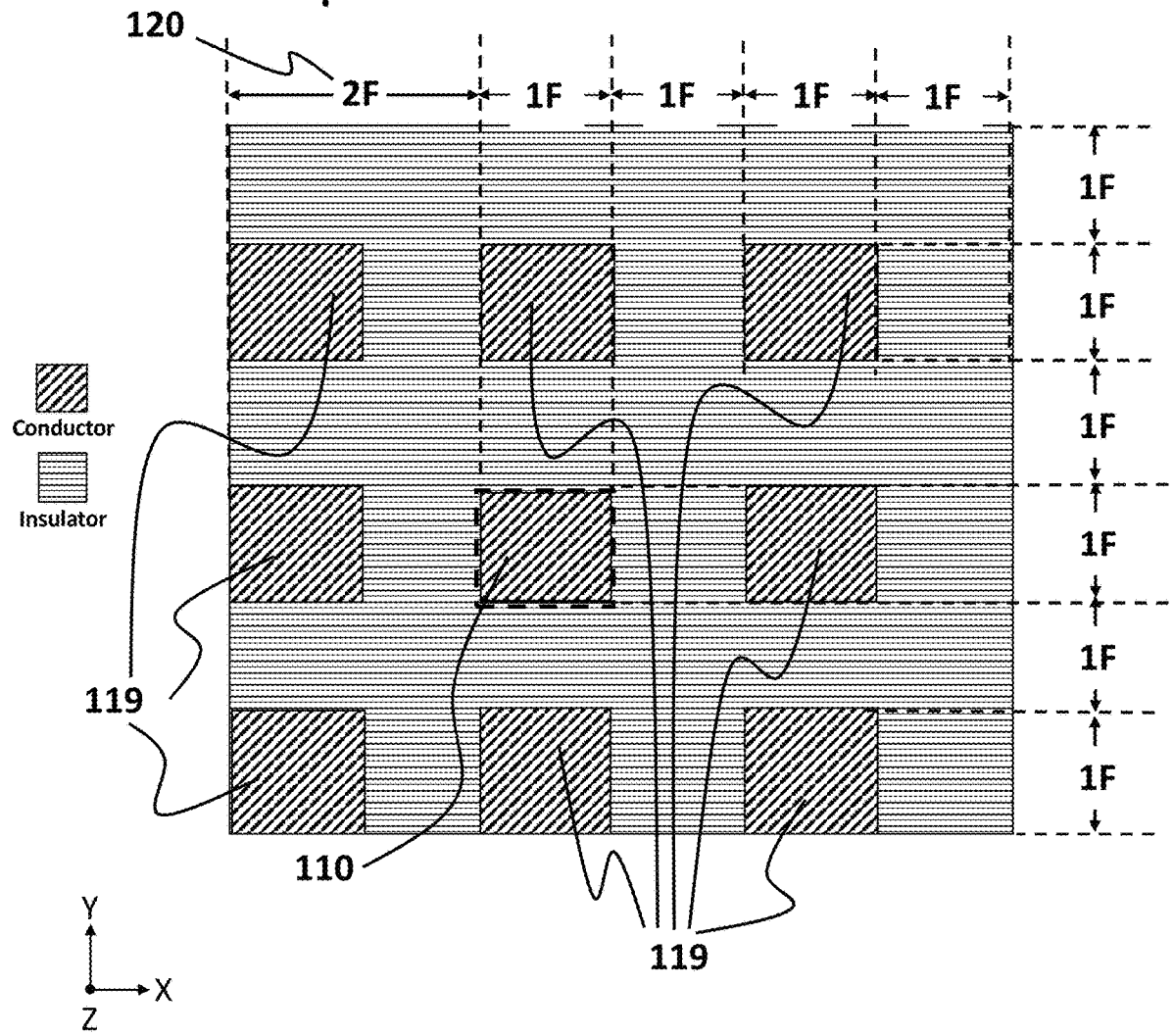
FIG. 15C is a top plan view of a columnar logic gate with minimally spaced pins according to an embodiment to the present invention.

FIG. 15C is a top plan view of a columnar logic gate representing one of the key aspects of the invention described herein—minimally spaced input and output pins (119) at a pitch distance of 2 F between each other or from the semiconductor column (110) or pins of an adjacent columnar logic gate or spaced at a distance of 1 F from each other or from the semiconductor column (110) or pins of an adjacent columnar logic gate. The pins are formed at an interconnection layer either above (128) or below (129) the semiconductor column (110).

Figure 15D:
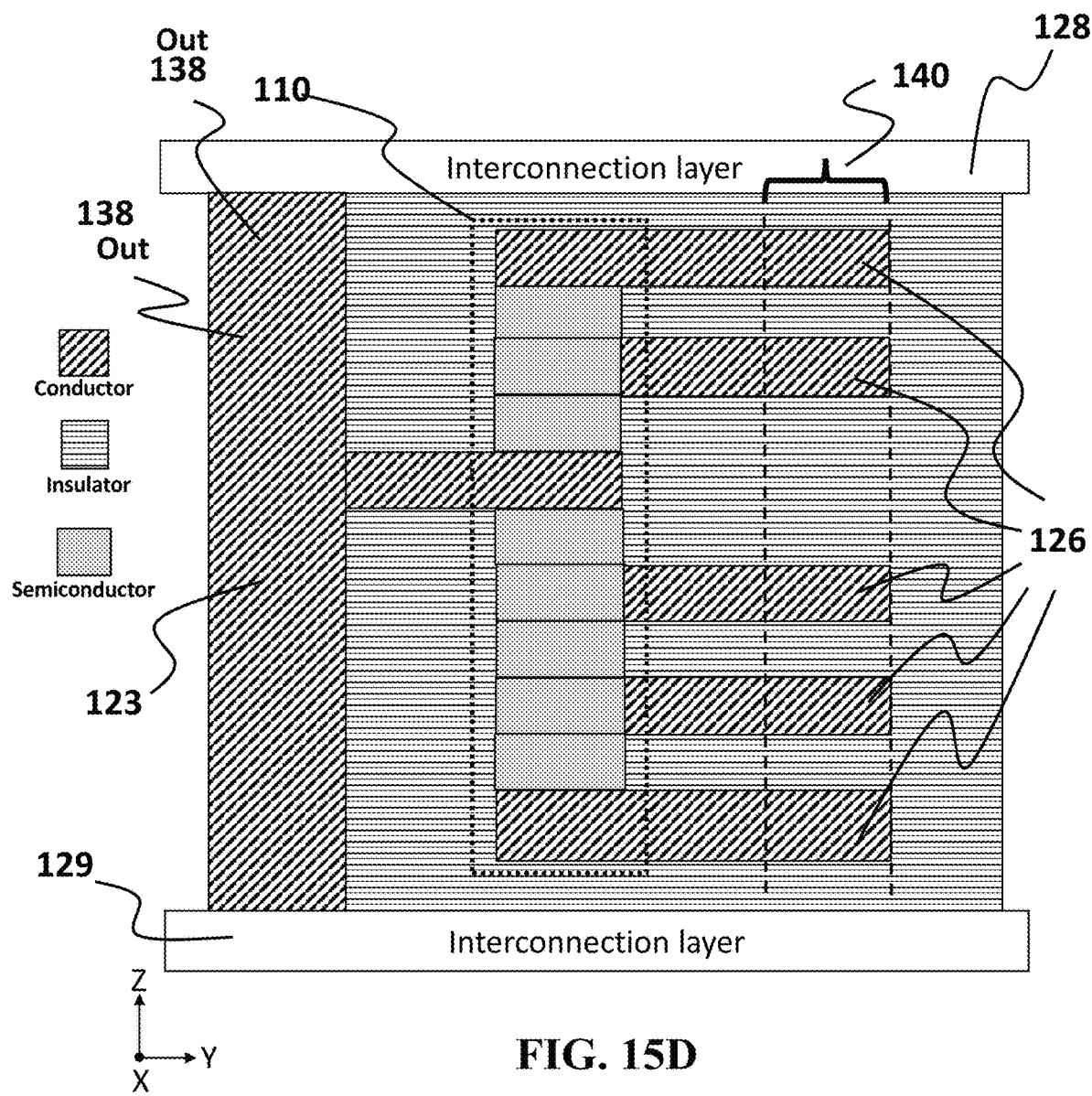
FIG. 15D is a cross-sectional view of a columnar logic gate according to an embodiment of the present invention.

FIG. 15D is a cross-sectional view of a columnar logic gate according to an embodiment of the present invention. This modified structure from that shown in FIG. 15B routes common electrodes (126) along the X-axis in a common lane area (140) in multiple layers (in the vertical z-axis) of routing electrodes. These common electrodes (126) are common to other columnar logic gates in an array and therefore are more efficiently routed in this manner whereby interconnection at an interconnection layer is done at the edge of array (not shown)—one connection per common electrode (126) for multiple columnar logic gates. Common electrodes (126) include power (Vdd), Ground (Vss), body-bias voltages (Vp, Vn), and clock signals.

Figure 15E:
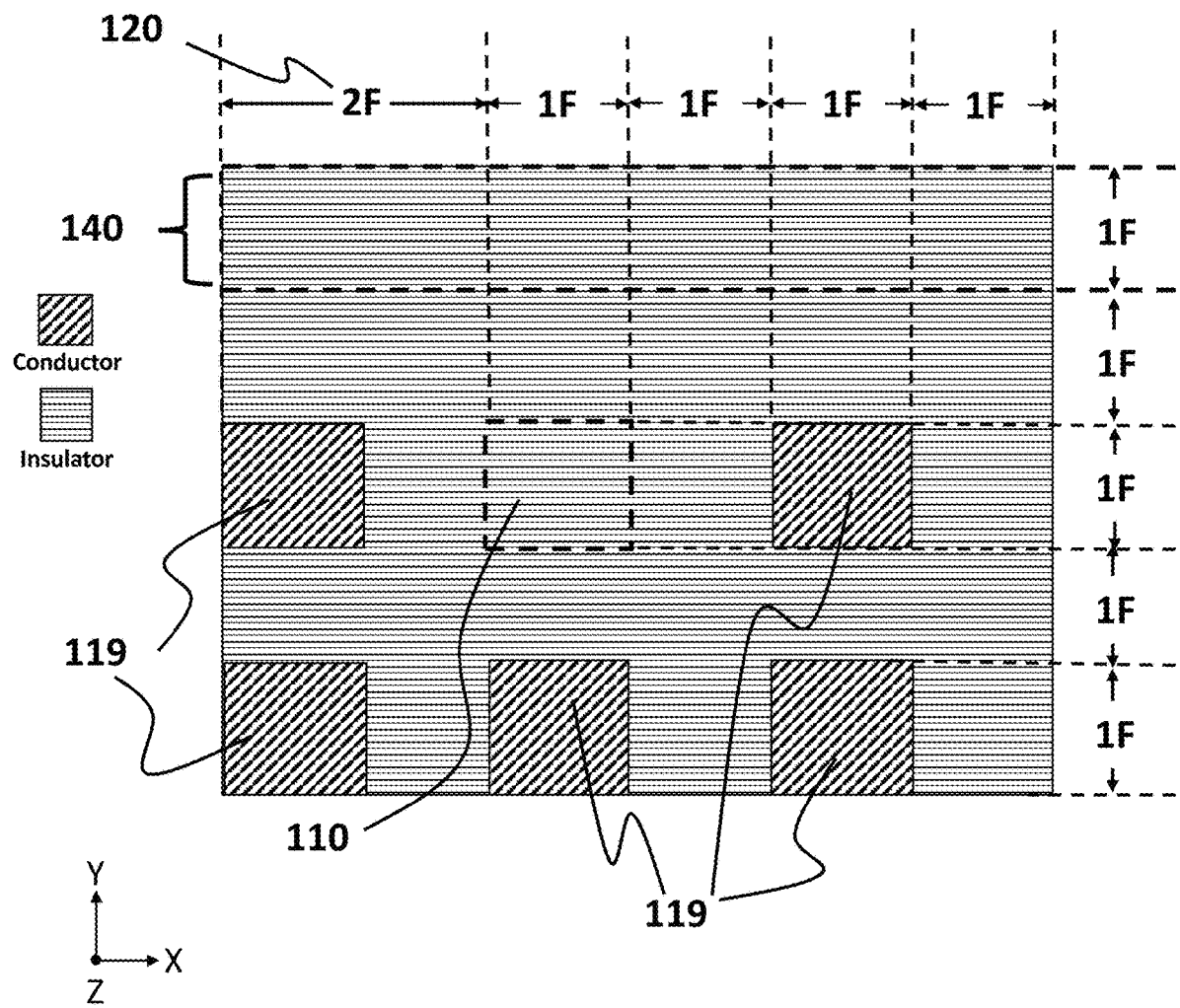
FIG. 15E is a top plan view of a columnar logic gate with minimally spaced pins according to an embodiment to the present invention.

FIG. 15E is a top plan view of a columnar logic gate that has implemented the configuration shown in FIG. 15D whereby the common electrodes (126) are routed in the X-axis direction to the edge of an array of columnar logic gates (not shown). Routing of the common input electrodes (GND/Vss 131, Vdd 130, Vp 134, Vn 135, CLK 133) is efficiently done in a common lane area (140) in multiple layers (in vertical z-axis) of routing electrodes between the top and bottom of the gate and are routed to the edge of an array of gates (not shown) for connection at interconnection layers above (128) or below (129) the semiconductor column (110) of the CLG.

FIGS. 15A, 15B, 15C, 15D and 15E describe a columnar logic gate comprising a semiconductor column comprising: one or more transistors each having a drain, body, and source, vertically aligned; two or more conductive columns adjacent to the semiconductor column coupling the inputs and outputs of the logic gate to an interconnection layer above or below the semiconductor column or both; wherein the transistor gate contacts of the logic gate are positioned within the vertical distance of the semiconductor column and not at an interconnection layer.

The insulator thickness for the gate of each transistor in the semiconductor column (110) may be less than 1 F in thickness due to its placement via a deposition process such as atomic layer deposition (ALD).

Further details are described in the embodiments described below. Embodiments described herein include 2-input NAND and NOR gates with a single output. However, the invention described herein is not limited to any particular gate or number of inputs or outputs.

One skilled in the art would recognize that a host of columnar logic gates may be fabricated under the principle described herein, comprising of a semiconductor column (110) and conductive columns which route the inputs and outputs of the gate to interconnection layers either above or below the gate or both, whereby the pin connections—as viewed from above or below—are minimally spaced at a pitch distance of 2 F between each other or from the semiconductor column (110) or pins of an adjacent columnar logic gate or spaced at a distance of 1 F from each other or from the semiconductor column (110) or pins of an adjacent columnar logic gate.

The term minimum feature size (F) used within this specification is to be defined as the minimum feature size which is determined by lithography means or by layout design rule limitations (provided by the foundry) and not by deposition means.

The CLG structures described herein provide for efficient inter-gate routing at interconnection layers above (128) or below (129) the CLGs. A key aspect of the invention is that all intra-gate routing of the CLG and transistor gate contacts are positioned between the interconnection layers (128 and 129) or within the vertical distance of the semiconductor column (110); that is, there are no pin connections at an interconnection layer for transistor gate contacts or for routing within a gate—such as connecting of a drain of one transistor to the source of another transistor.

First Embodiment of CLG (Columnar NAND or NOR Gate)

Figure 16A:
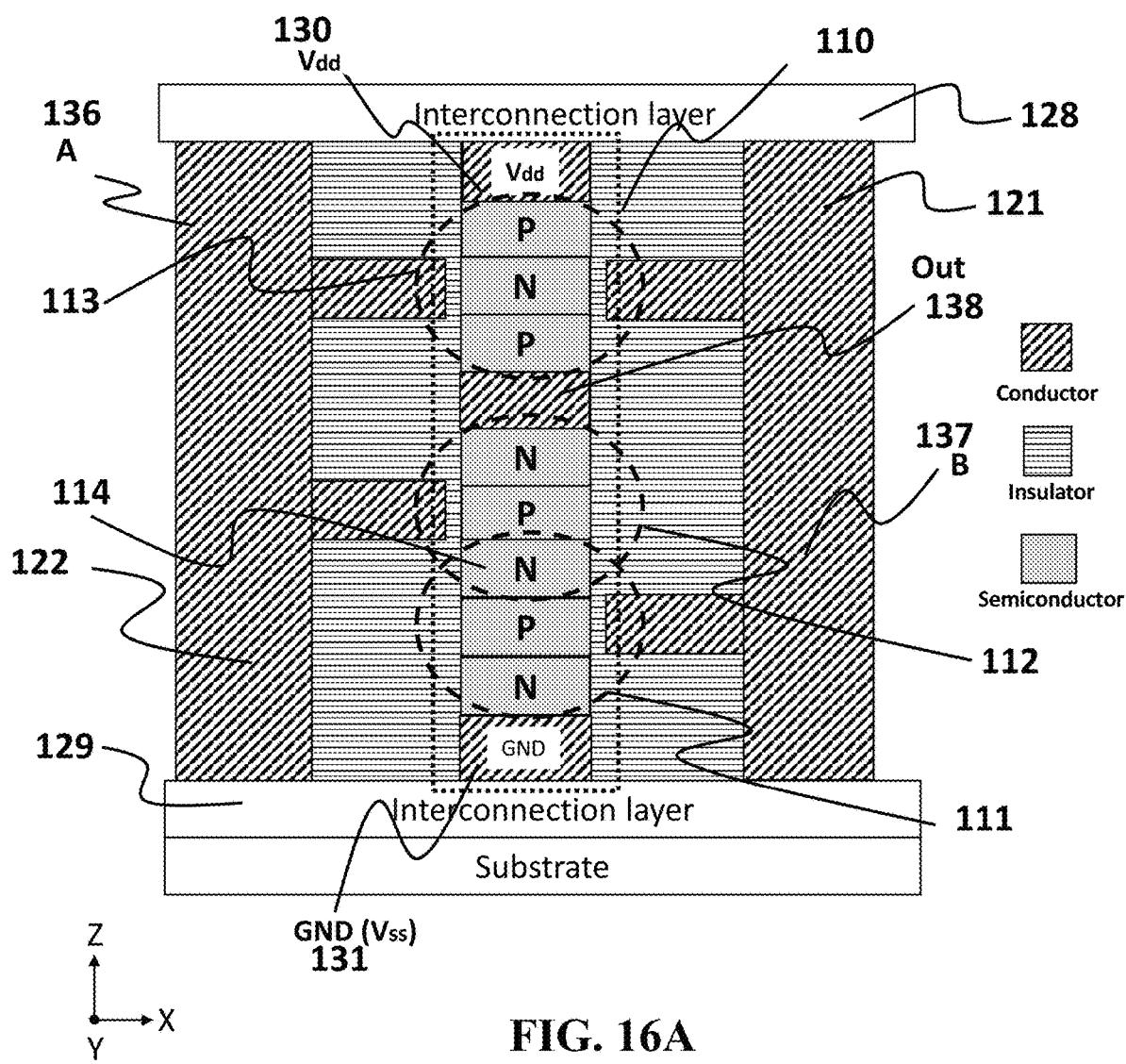
FIG. 16A is a cross-sectional view of a columnar NAND gate according to an embodiment of the present invention.
Figure 16B:
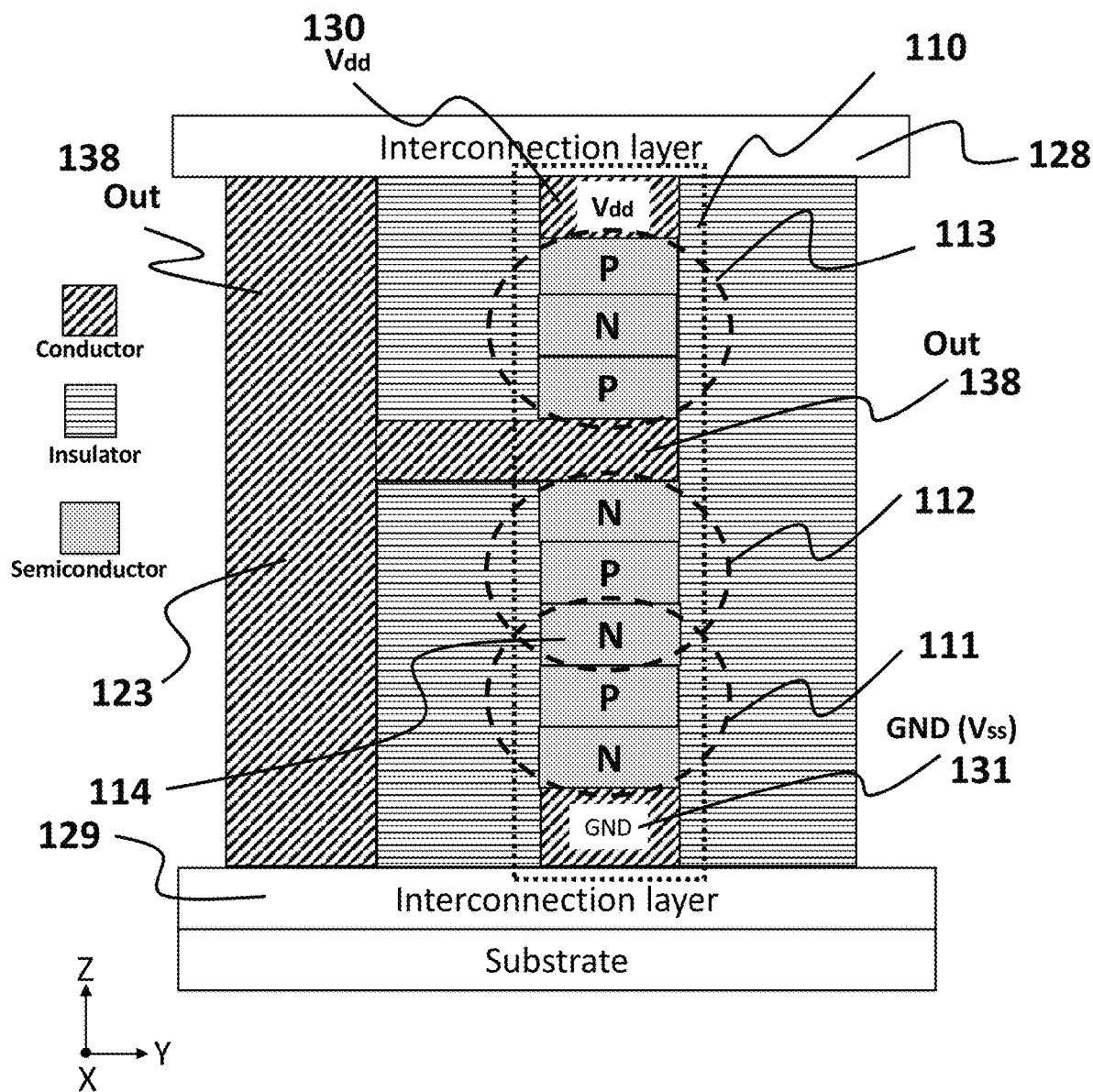
FIG. 16B is a cross-sectional view of a columnar NAND gate according to an embodiment of the present invention.
Figure 17:
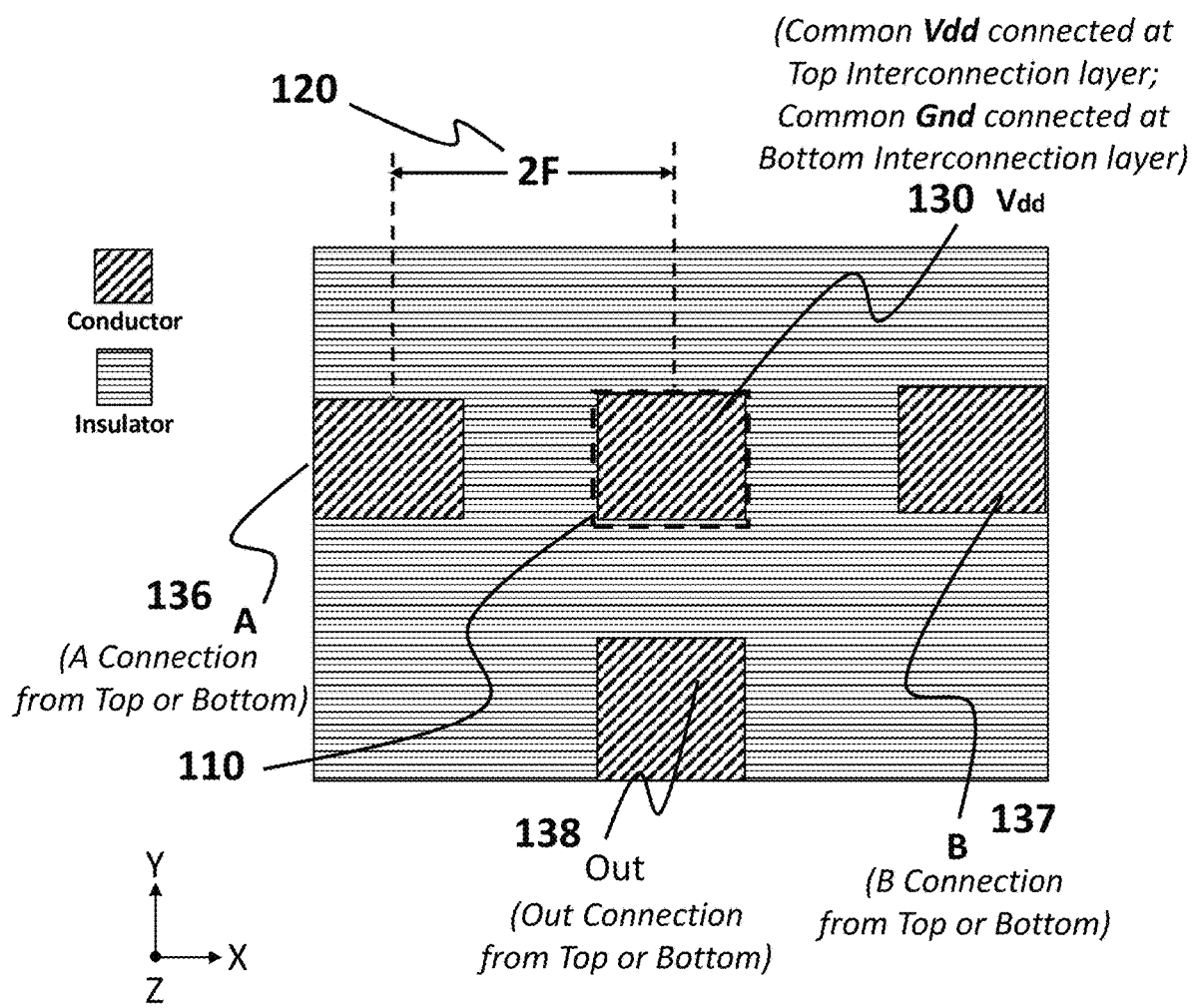
FIG. 17 is a top plan view of the routing pins of a columnar NAND or NOR gate according to an embodiment of the present invention.
Figure 18:
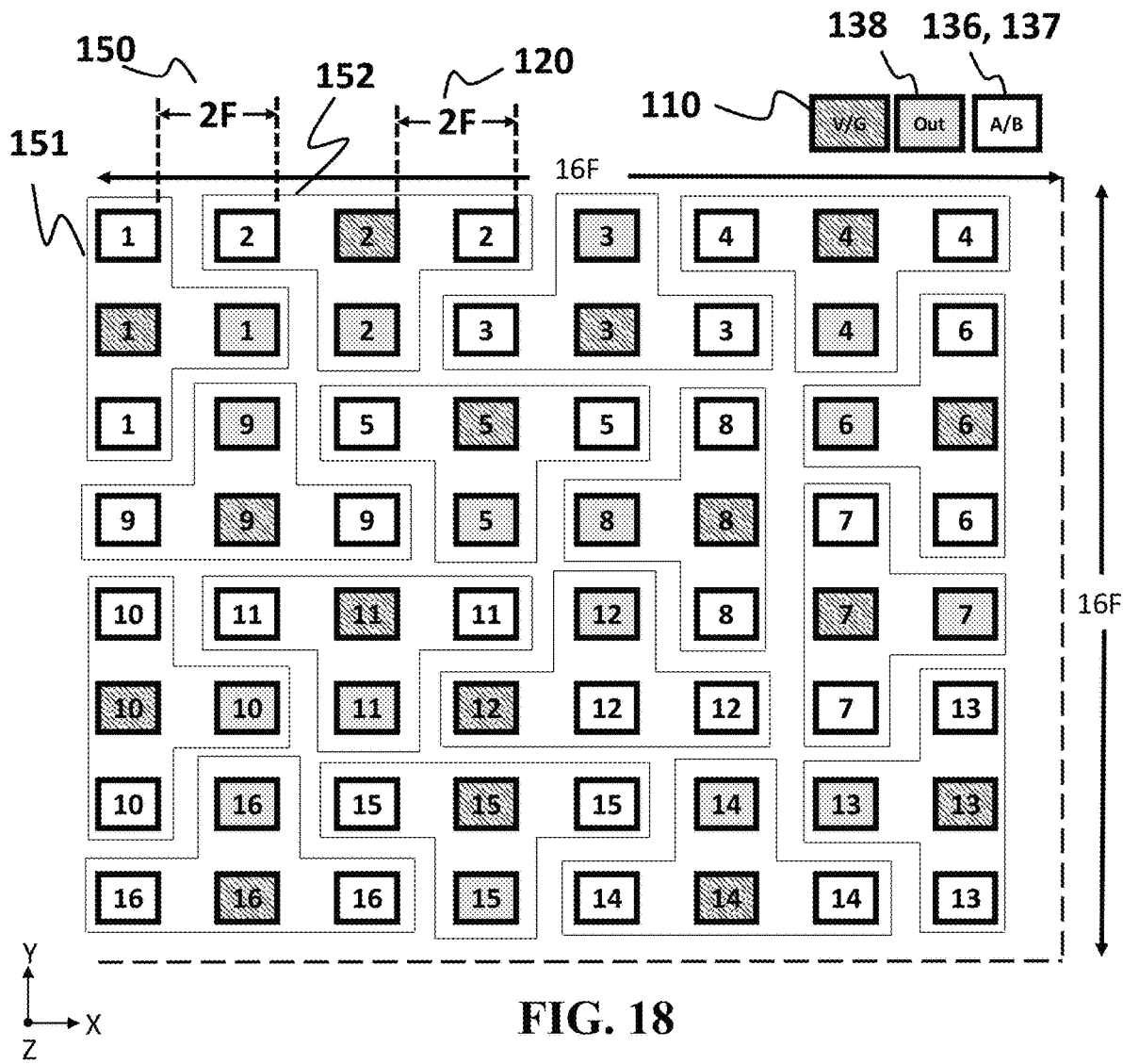
FIG. 18 is a top plan view of an array of columnar NAND or NOR logic gates according to an embodiment of the present invention.

FIG. 16A and FIG. 16B are cross-sectional views of a columnar NAND gate according to an embodiment of the present invention. The columnar NAND gate is comprising: a semiconductor column (110) comprising a first NMOS transistor (111) having a drain, body, and source vertically aligned; a second NMOS transistor (112) having a drain, body, and source vertically aligned with and directly above the drain, body, and source of the first NMOS transistor (111), the source of the second NMOS transistor (112) and the drain of the first NMOS transistor (111) comprising a unified semiconductor region (114); a pullup transistor (113) having a drain, body, and source vertically aligned with and directly above the drains, bodies, and sources of the first (111) and second (112) transistors, the source or drain of the pullup transistor (113) conductively coupled to the drain of the second NMOS transistor (112) thereby forming an output node (138) of the columnar NAND gate; an interconnection layer either above (128) or below (129) the semiconductor column or both; a first conductive column (121) adjacent to the semiconductor column (110) and conductively coupled to the gate of the first NMOS transistor (111) and the gate of the pullup transistor (113), which vertically extends adjacent to the semiconductor column (110) to an interconnection layer (128 or 129); a second conductive column (122) adjacent to the semiconductor column (110) and conductively coupled to the gate of the second NMOS transistor (112) and the gate of the pullup transistor (113), which vertically extends adjacent to the semiconductor column (110) to an interconnection layer (128 or 129); and a third conductive column (123) adjacent to the semiconductor column (110) and conductively coupling an interconnection layer (128 or 129), which is located either above the pullup transistor (113) or below the first NMOS transistor (111), to the source or drain of the pullup transistor (113) and to the drain of the second NMOS transistor (112) thereby forming an output node (138) of the columnar NAND gate, wherein the pins for the inputs (136 and 137) and output (138) at an interconnection layer (128 or 129) may be minimally spaced at a pitch distance of 2 F (120) as illustrated in FIG. 17 and FIG. 18.

Figure 16C:
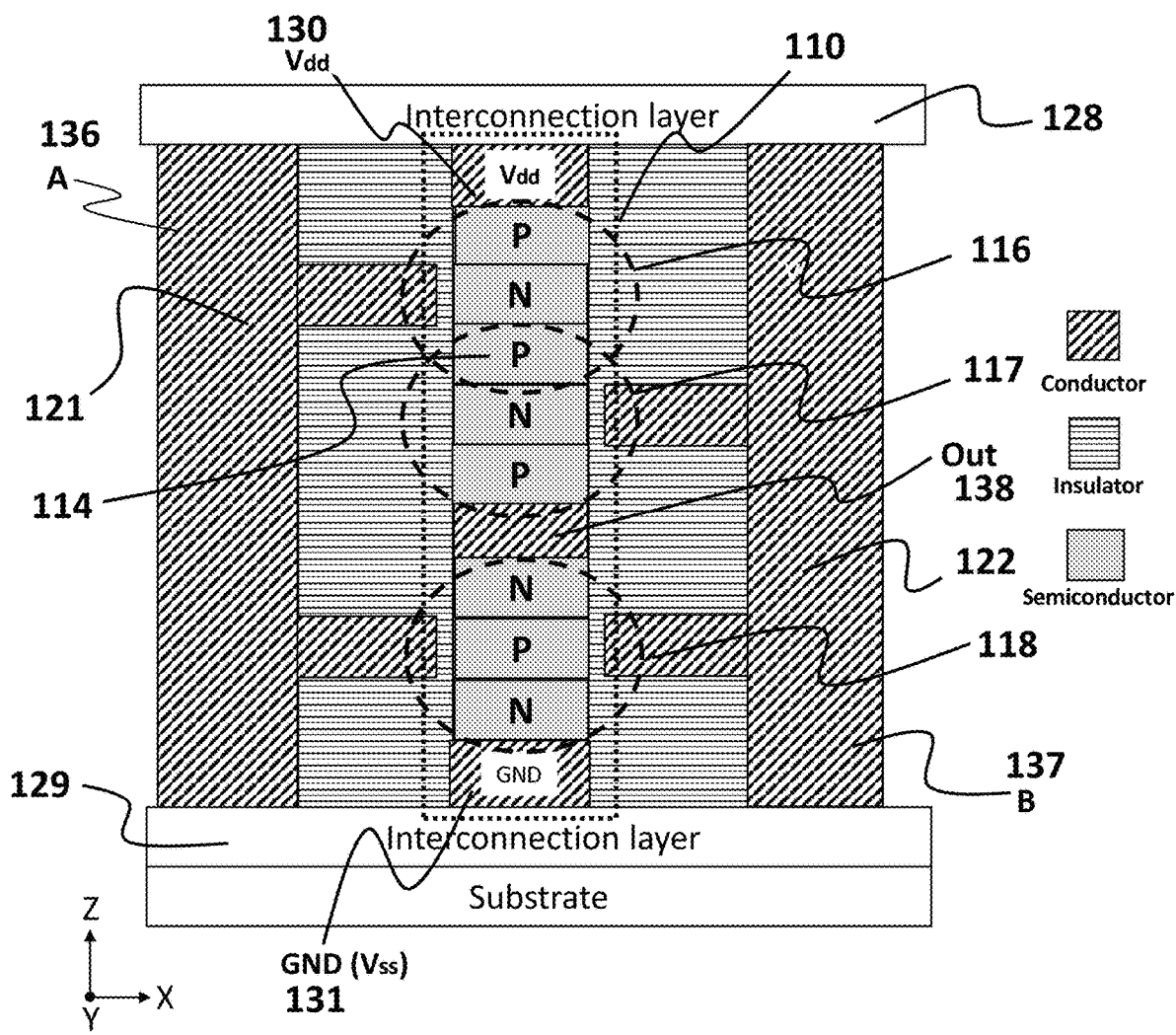
FIG. 16C is a cross-sectional view of a columnar NOR gate according to an embodiment of the present invention.
Figure 16D:
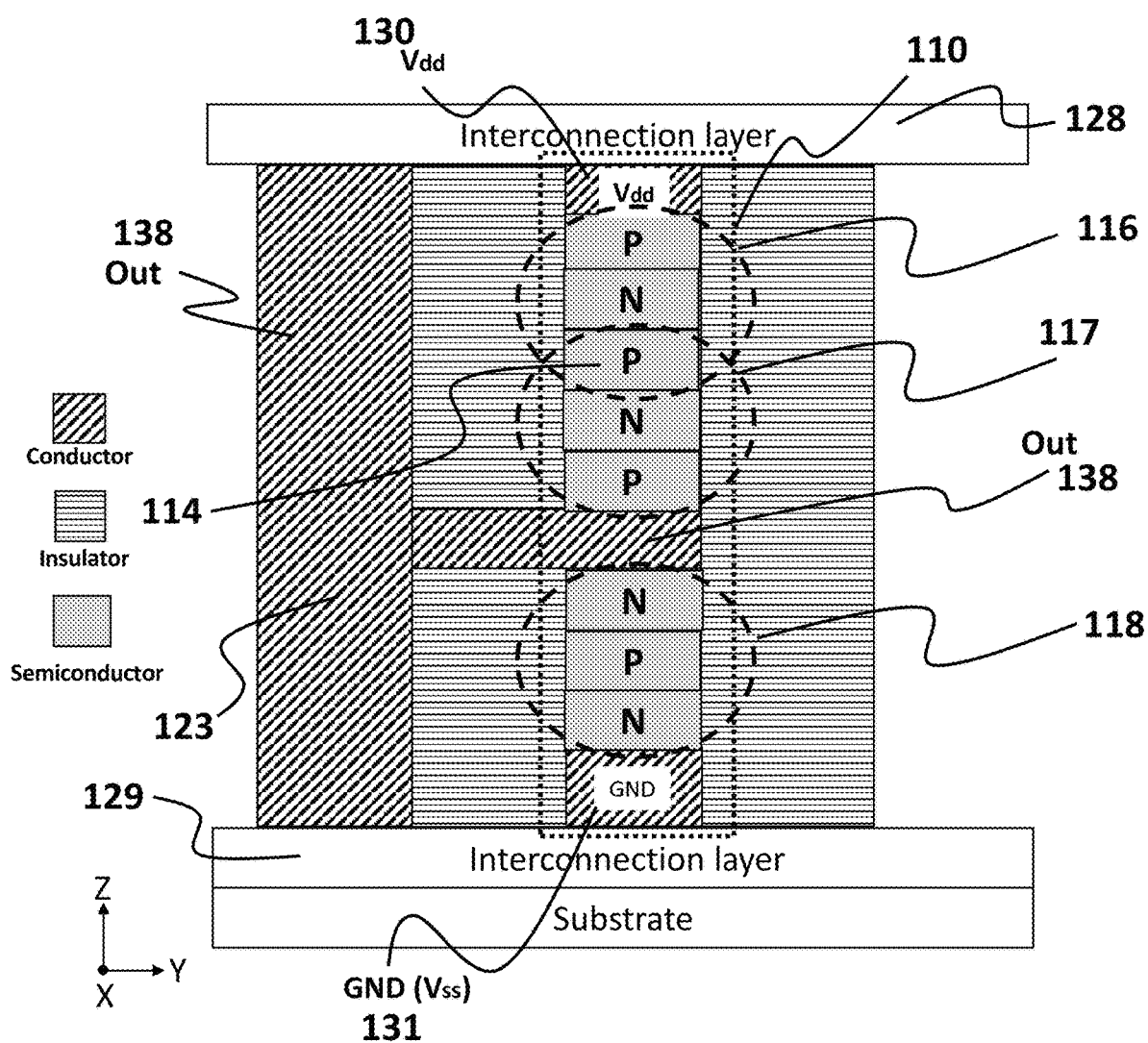
FIG. 16D is a cross-sectional view of a columnar NOR gate according to an embodiment of the present invention.

FIG. 16C and FIG. 16D are cross-sectional views of a columnar NOR gate according to an embodiment of the present invention. The columnar NOR gate is comprising: a semiconductor column (110) comprising a first PMOS transistor (116) having a drain, body, and source vertically aligned; a second PMOS transistor (117) having a drain, body, and source vertically aligned with and directly below the drain, body, and source of the first PMOS transistor (116), the source of the second PMOS transistor (117) and the drain of the first PMOS transistor (116) comprising a unified semiconductor region (114); a pulldown transistor (118) having a drain, body, and source vertically aligned with and directly below the drains, bodies, and sources of the first (116) and second (117) transistors, the source or drain of the pulldown transistor (118) conductively coupled to the drain of the second PMOS transistor (117) thereby forming an output node (138) of the columnar NOR gate; an interconnection layer either above (128) or below (129) the semiconductor column (110) or both; a first conductive column (121) adjacent to the semiconductor column (110) and conductively coupled to the gate of the first PMOS transistor (116) and the gate of the pulldown transistor (118), which vertically extends adjacent to the semiconductor column (110) to an interconnection layer (128 or 129); a second conductive column (122) adjacent to the semiconductor column and conductively coupled to the gate of the second PMOS transistor (117) and the gate of the pulldown transistor (118), which vertically extends adjacent to the semiconductor column (110) to an interconnection layer (128 or 129) and a third conductive column (123) adjacent to the semiconductor column (110) and conductively coupling an interconnection layer (128 or 129), which is located either below the pulldown transistor (118) or above the first PMOS transistor (116), to the source or drain of the pulldown transistor (118) and to the drain of the second PMOS transistor (117) thereby forming an output node (138) of the columnar NOR gate, wherein the pins for the inputs (136 and 137) and output (138) at an interconnection layer (128 or 129) may be minimally spaced from the semiconductor column (110) at a pitch distance of 2 F (120) as illustrated in the top plan view of the routing pins for a columnar NAND or NOR gate shown in FIG. 17 and the top plan view of an array of columnar NAND or NOR logic gates shown FIG. 18. A first CLG (151) is shown in FIG. 18 perpendicular and adjacent to a second CLG (152). This orientation of the CLGs enables the minimal spacing of all pins to be at a 2 F pitch, whether they are pins on adjacent CLGs (151 and 152) at a 2 F pitch distance (150) between pins or an input pin on a CLG (151) at a 2 F pitch distance (120) from the semiconductor column (110) or Vdd and Gnd pins. A total of 16 CLGs are shown in the array with an average gate area of 16 $F^2$ representing a significant reduction in gate area compared to conventional planar gate layouts. The minimal spacing of connection pins at the interconnection layer (128 or 129) is enabled by the routing of the first (121), second (122) and third (123) conductive columns which are minimally spaced equidistant from the core semiconductor column (110) which may be at a pitch distance of 2 F or at a minimum distance of 1 F from the semiconductor column (110). With this design and variations thereof, the output conductive column of a columnar logic gate is adjacent to one or more input conductive columns of other columnar logic gates in the array of columnar logic gates.

Second Embodiment of CLG (Stacked Columnar NAND or NOR Gates)

Figure 19A:
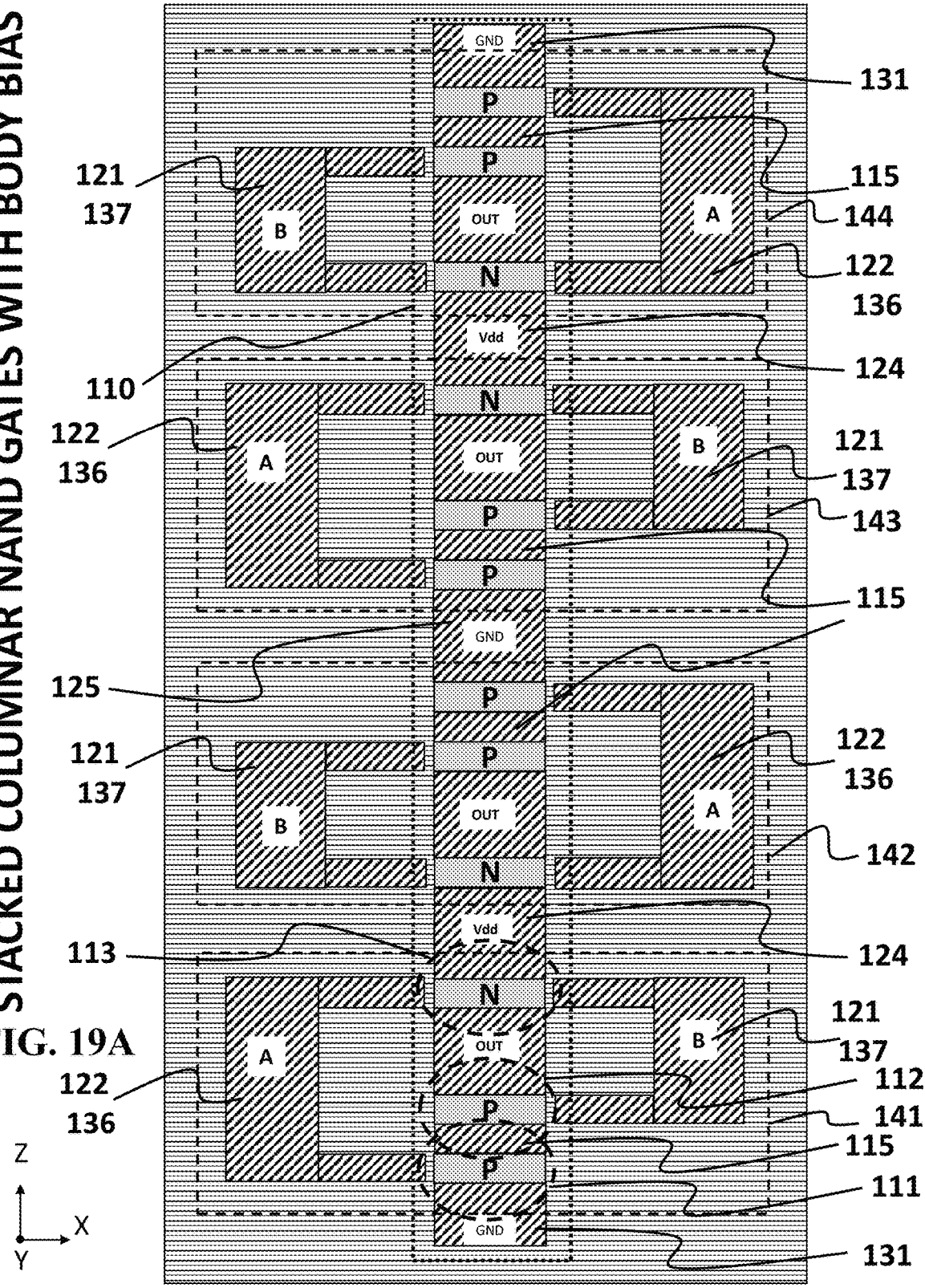
FIG. 19A is a cross-sectional view of stacked columnar NAND gates with body bias according to an embodiment of the present invention.
Figure 19B:
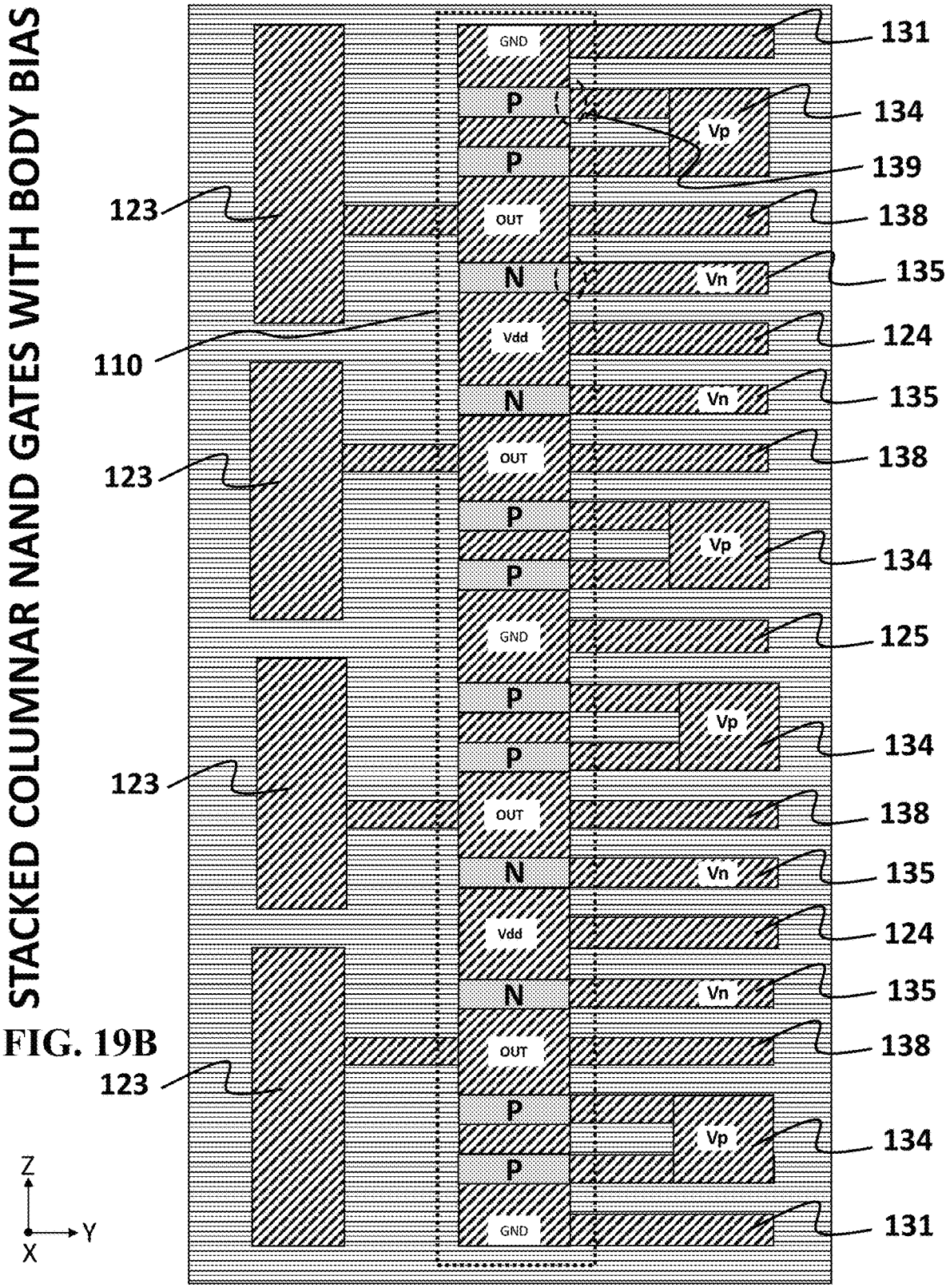
FIG. 19B is a cross-sectional view of stacked columnar NAND gates with body bias according to an embodiment of the present invention.
Figure 20:
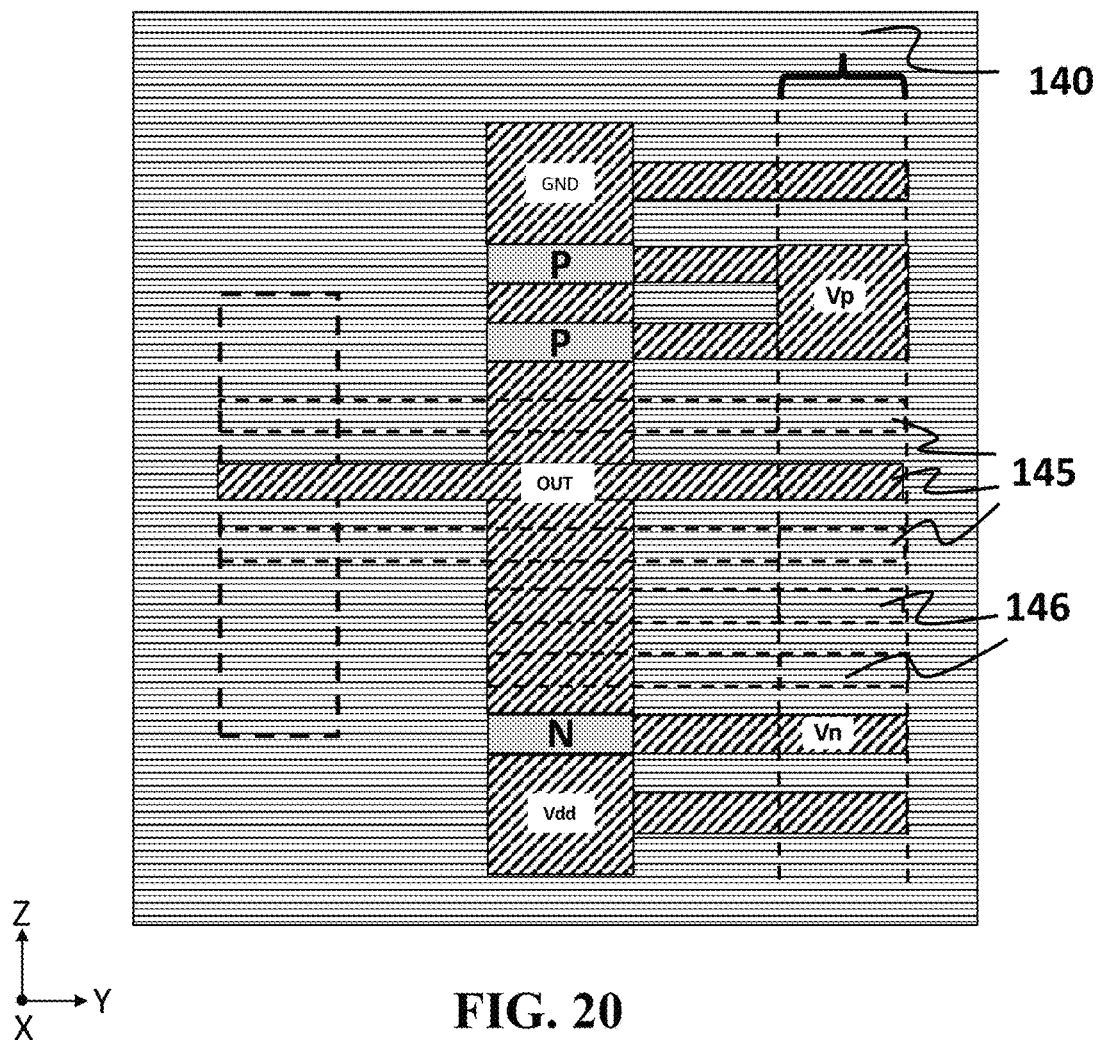
FIG. 20 is a cross-sectional view of a columnar NAND gate with body bias and multiple lanes adjacent to gate for routing input or output signals according to an embodiment of the present invention.
Figure 21A:
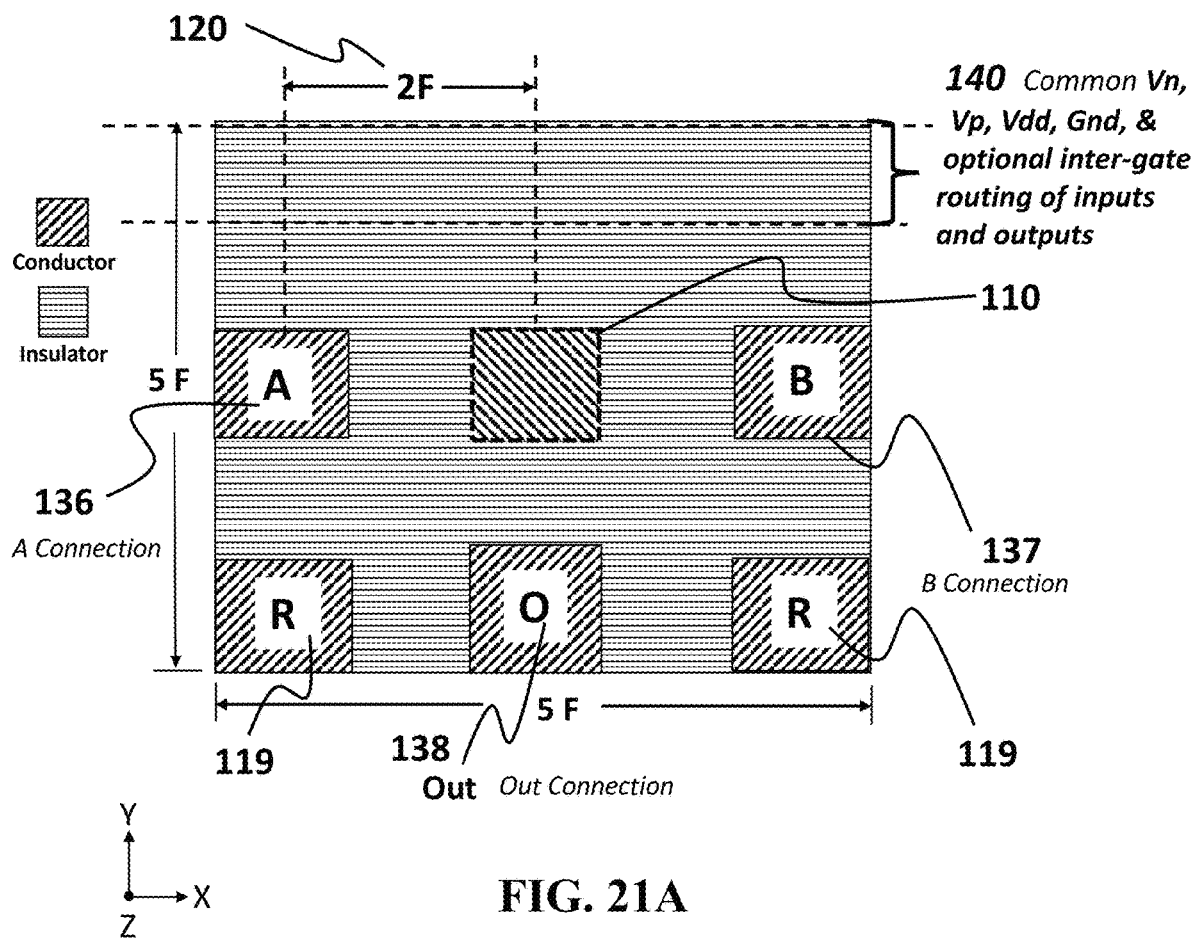
FIG. 21A is a top plan view of the routing pins of stacked columnar NAND or NOR gates with body bias according to an embodiment of the present invention.
Figure 21B:
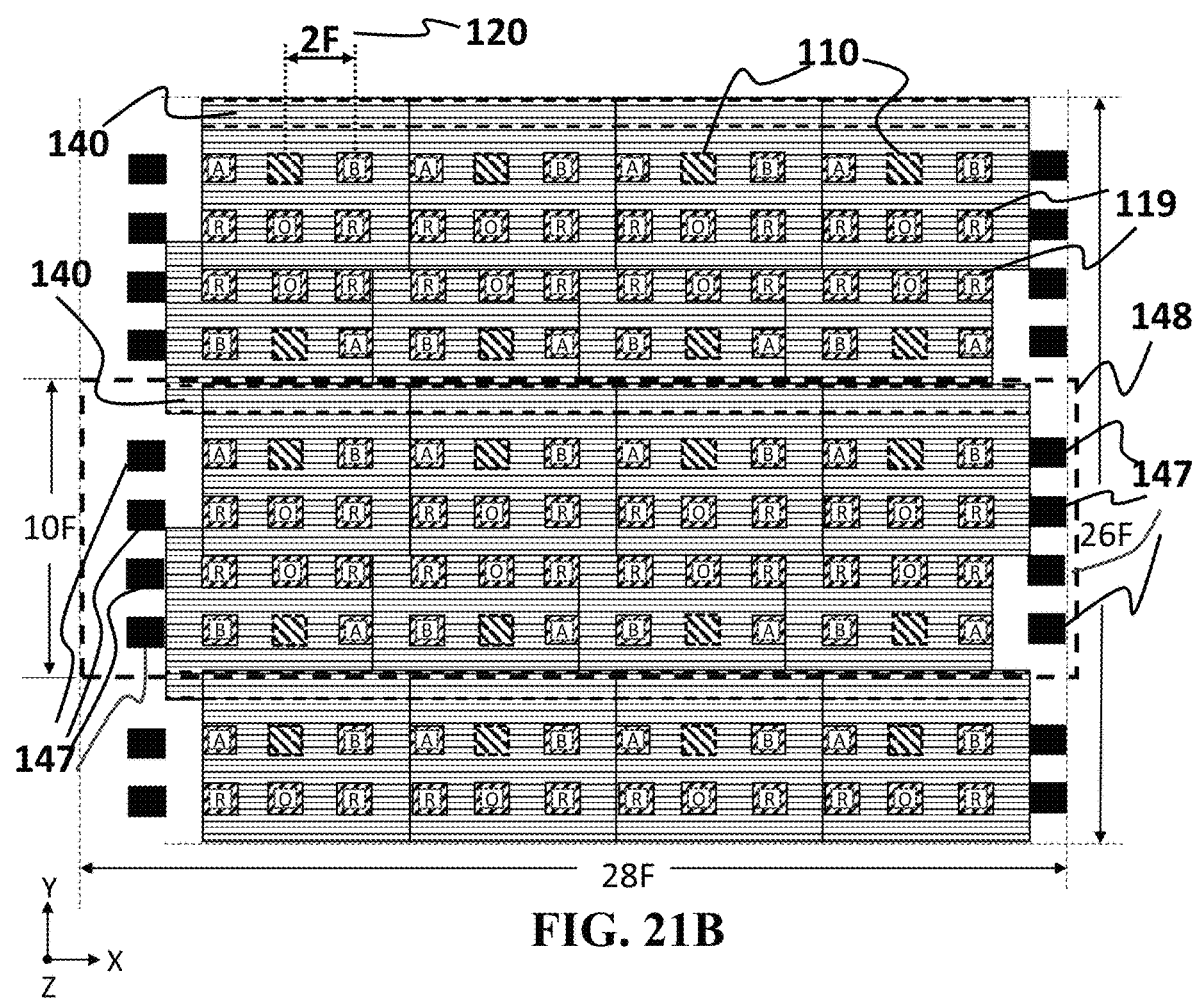
FIG. 21B is a top plan view of an array of a stacked columnar NAND or NOR logic gates with body bias according to an embodiment of the present invention.

FIG. 19A and FIG. 19B are cross-sectional views of stacked columnar NAND logic gates with body bias according to an embodiment of the present invention. The number of gates stacked is shown to be four but may be less or more. The number of columnar logic gates stacked refers to the number of columnar logic gates between an upper/top interconnection layer (above the highest columnar logic gate in the stack) and a lower/bottom interconnection layer (below the lowest columnar logic gate in the stack). In FIG. 19A and FIG. 19B a first columnar logic gate (CLG) (141) is shown with a second CLG (142) above the first CLG (141); a third CLG (143) is above the second CLG (142); finally a fourth CLG (144) is above the third CLG (143). A lower/bottom interconnection layer (not shown) resides below the first CLG (141) and an upper/top interconnection layer (not shown) resides above the fourth CLG (144). The semiconductor column (110) comprises the sources, bodies, and drains of all of the transistors, vertically aligned, of each of the logic gates in the stack. The semiconductor column (110) may be comprised of thin film transistors (TFTs) in which the source and drains may be metal conductors. Such a structure allows for low cost of fabrication due to the reduced processing steps and reduced materials required for fabrication of unified metal regions (115). Each of the four CLGs (141, 142, 143, 144) are comprised of first (121), second (122) and third (123) conductive columns as described in the first embodiment above. The orientation of alternating CLGs may be arranged such that 1) a unified Vdd region (124) in the semiconductor column (110) is shared for two CLGs, such as for the first CLG (141) and the second CLG (142), 2) another unified Vdd region (124) in the semiconductor column (110) is shared for CLG (143) and CLG (144) and 3) a unified Gnd region (125) in the semiconductor column (110) is shared for CLG (141) and CLG (142). All the common electrodes including Vdd (124), Gnd (125 and 131), Vp (134), and Vn (135) are routed in the X-axis direction in routing lanes (140) parallel to each other in the Z-axis, as shown in FIG. 20. The routing lanes (140) may be shared by two adjacent columnar logic gates enabling high density layout of the gates (see FIG. 21B). The contact interface region (139) of each body bias and semiconductor channel material may be a direct contact of the body bias electrode (134 or 135) with the semiconductor channel material or there may be an insulator layer between the body bias electrode (134 or 135) and the semiconductor channel material. The output node (138) of a CLG may optionally be routed in the X-direction and in particular, for the second CLG (142) and third CLG (143), the output node (138) may be preferably routed in the X-direction along the routing lanes of the common electrodes (140) and Y-direction to the edge of an array of CLGs for connection to an interconnect layer above or below the array of gates via a conductive column (147)—see FIG. 21B. Similarly, A (136) and B (137) inputs for the second CLG (142) and third CLG (143) may be routed in the X and Y direction to a conductive column (119) which routes to pins either above or below the stacked columnar logic gates. FIG. 21A is a top plan view of the routing pins of the stacked columnar NAND or NOR gates with body bias. This top plan view shows the pin connections for the interconnection layers above (128) and below (129) the stack of columnar logic gates. At each of the two interconnection layers there are four pins (136, 137, and 119) for the inputs, for a total of 8 pins, representing the A and B inputs for the four stacked columnar logic gates. FIG. 21B shows an array of 20 stacked columnar NAND or NOR gates with body bias. The area measures about 728 $F^2$ (28 F×26 F). In the example show, four (4) CLGs are stacked between an upper and lower interconnection layer. The average area of each stack of 4 gates is about 35 $F^2$; the average per gate is about 8.75 $F^2$ representing a significant reduction in gate area compared to conventional planar gate layouts. To further illustrate the optimized layout of the CLGs in FIG. 21B for density, it is evident that all of the pins in the columnar logic array (148) are routed to an interconnection layer above or below the columnar logic array (148) and are minimally spaced from the semiconductor column or other pins at a pitch distance of 2 F. The minimal spacing of connection pins at the interconnection layer (128 or 129) is enabled by the routing of the first (121), second (122) and third (123) conductive columns which are minimally spaced equidistant from the core semiconductor column (110) which may be at a pitch distance of 2 F or at a minimum distance of 1 F from the semiconductor column (110). The CLG array (148) consists of an array of 4×2 multiple stacked CLGs (4 stack) for a total of 32 CLGs. The area of the CLG array (148) measures 280 $F^2$ which is an effective 8.75 $F^2$ per CLG. There are a total of 8 conductive columns (147), 4 each on opposite edges of the CLG array (148) in the X-direction. These columns may be used for routing the outputs of the second (142) and third (143) CLG of the respective CLG stacks. Eight (8) outputs would be routed to an interconnection layer above the CLG array (147) and eight (8) outputs would be routed to an interconnection layer below the CLG array (147). All intra-gate routing of the stacked CLGs and transistor gate contacts are positioned between the interconnection layers (128 and 129) or within the vertical distance of the semiconductor column (110); that is, there are no pin connections at an interconnection layer for transistor gate contacts or for intra-gate routing such as connecting of a drain of one transistor to the source of another transistor. FIGS. 19A, 19B, 20, 21A and 21B describe a stacked columnar logic gate comprising a semiconductor column comprising: one or more transistors each having a drain, body, and source, vertically aligned; two or more conductive columns adjacent to the semiconductor column coupling the inputs and outputs of the logic gate to an interconnection layer above or below the semiconductor column or both; wherein the transistor gate contacts of the logic gate are positioned within the vertical distance of the semiconductor column and not at an interconnection layer.

Third Embodiment of CLG (Columnar NAND or NOR Gate)

Figure 22A:
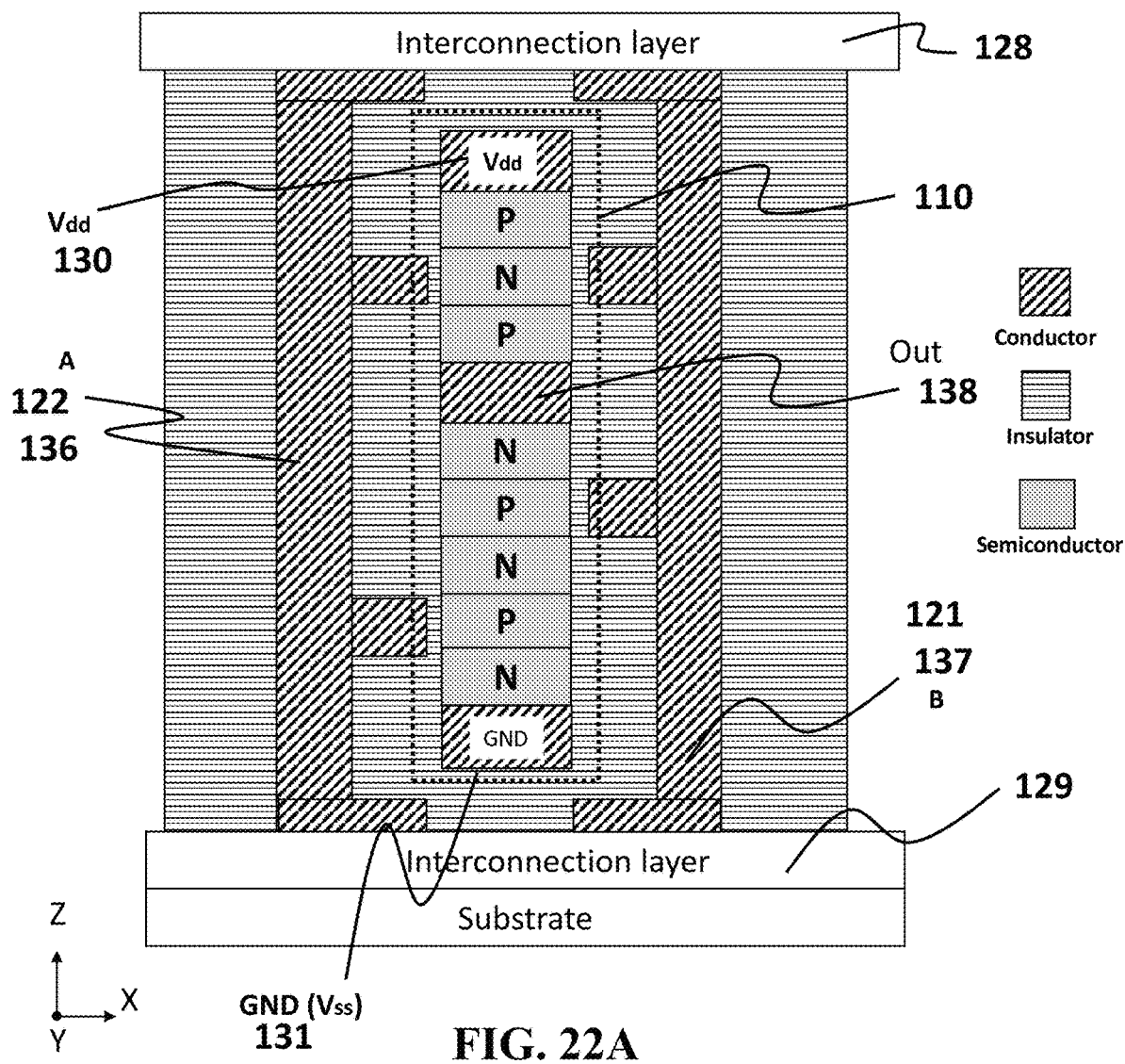
FIG. 22A is a cross-sectional view of a columnar NAND gate with body bias according to an embodiment of the present invention.
Figure 22B:
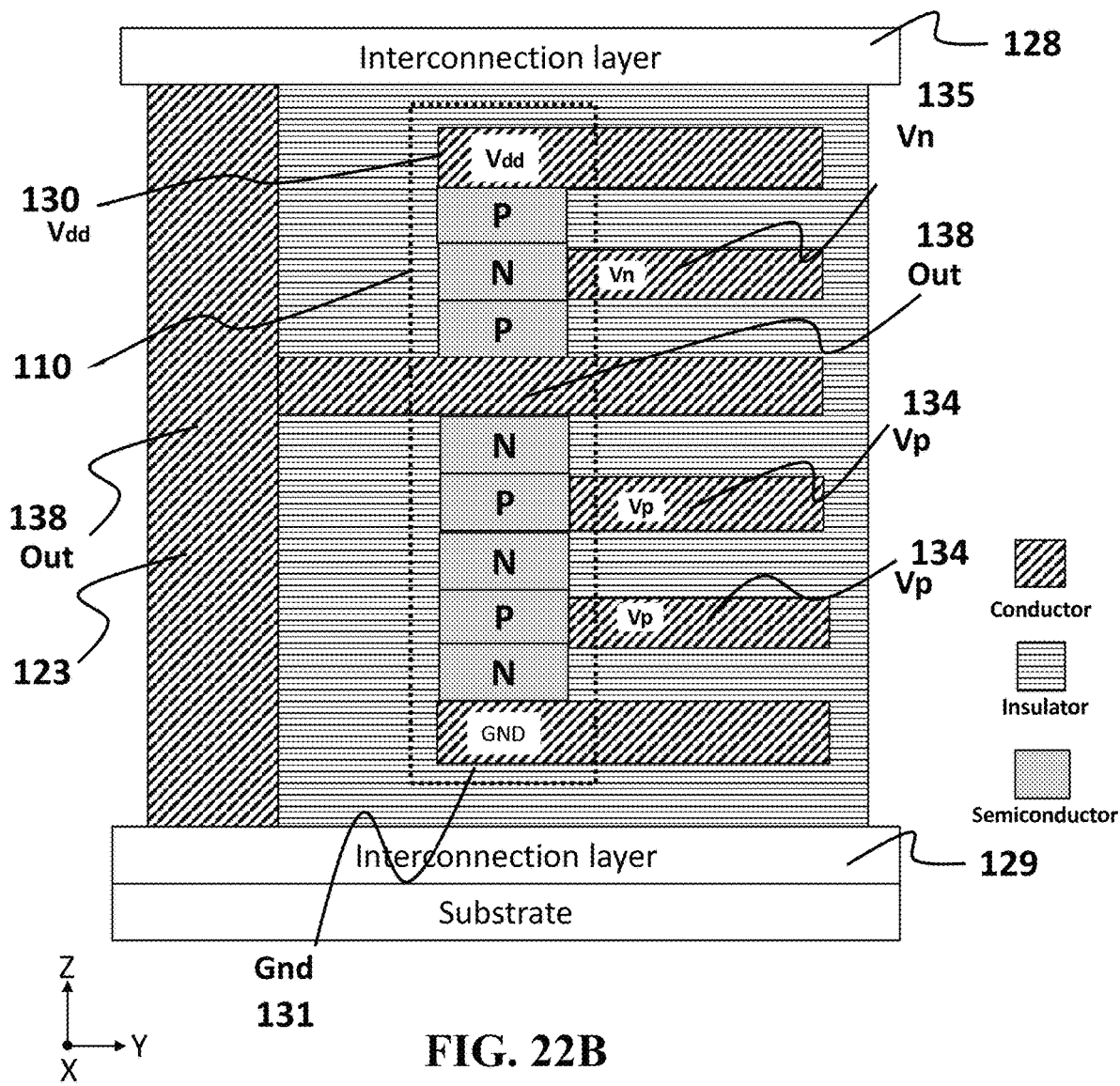
FIG. 22B is a cross-sectional view of a columnar NAND gate with body bias according to an embodiment of the present invention.
Figure 23:
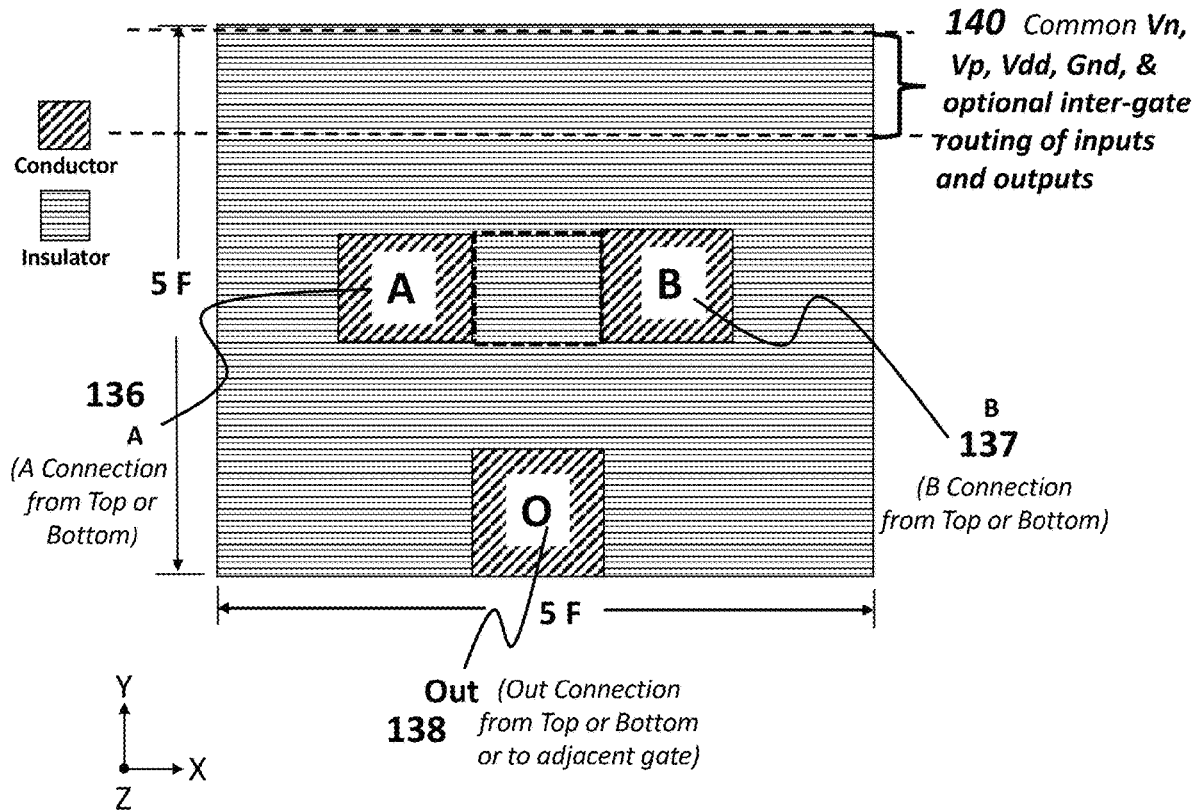
FIG. 23 is a top plan view of the routing pins of a columnar NAND or NOR gate with body bias according to an embodiment of the present invention.
Figure 24:
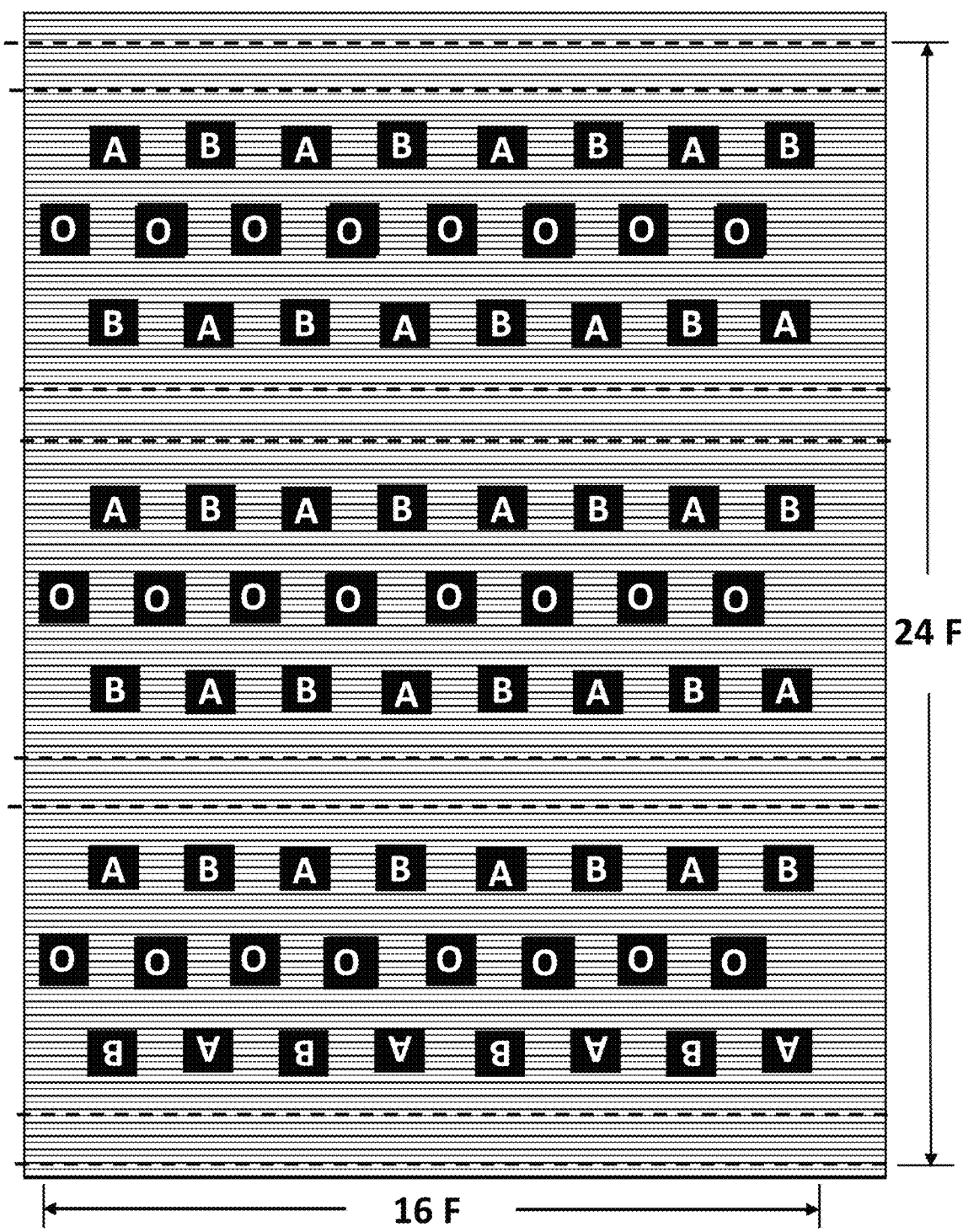
FIG. 24 is a top plan view of an array of columnar NAND or NOR logic gates with body bias according to an embodiment of the present invention.

FIG. 22A and FIG. 22B are cross-sectional views of a columnar NAND gate with body bias according to an embodiment of the present invention. This embodiment differs from the first and second embodiments whereby the fabrication of the conductive columns (121 and 122) employ techniques used in the columnar NAND flash memory industry to allow for less than 1 F feature sizes in conductive electrodes through use of conformal deposition processes such as atomic layer deposition (ALD). This arrangement allows for an average area of 16 $F^2$ for an array of columnar NAND or NOR gates with body bias connections as shown in FIG. 23 and FIG. 24.

Fourth Embodiment of CLG (Columnar NAND Gate)

Figure 25A:
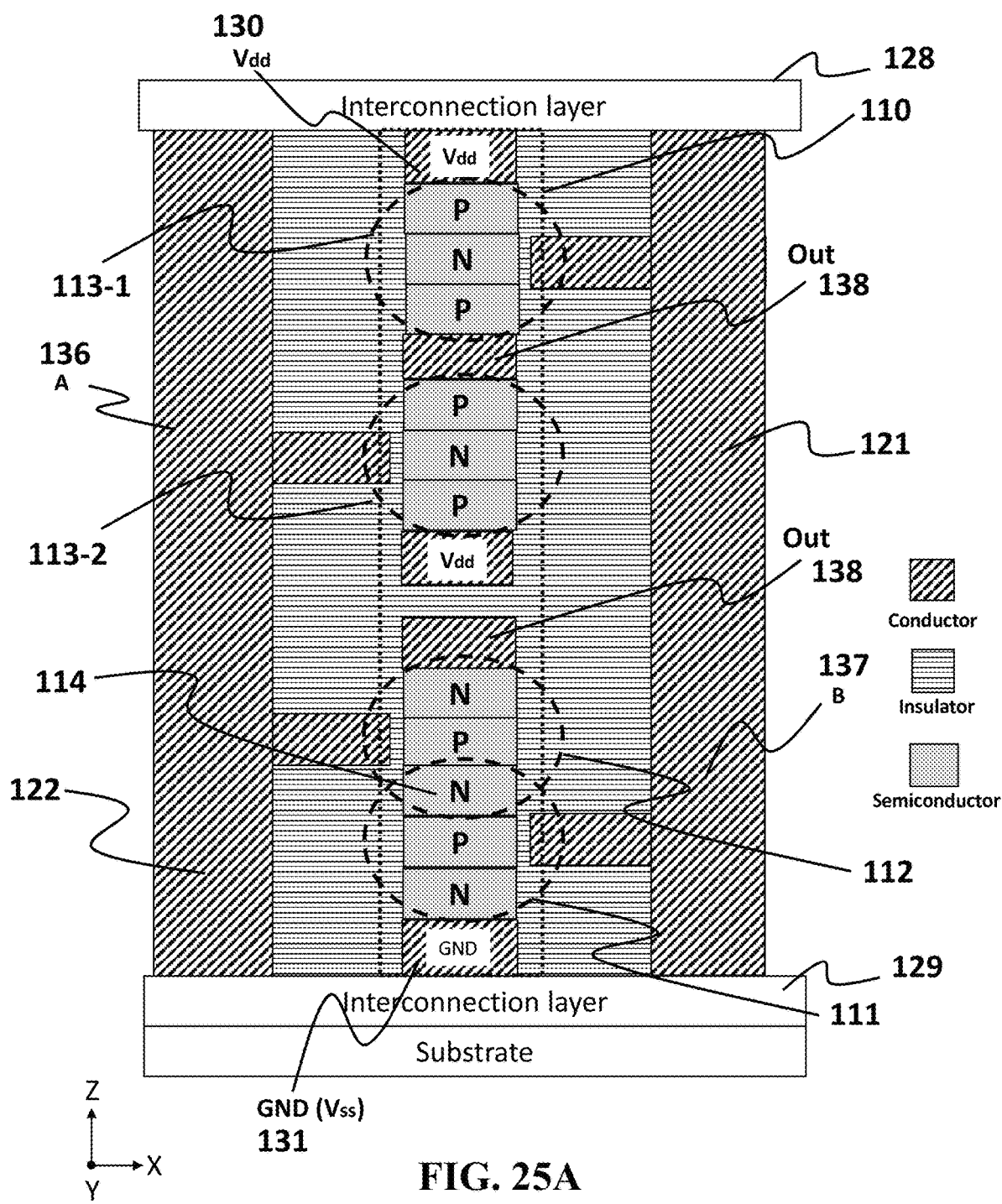
FIG. 25A is a cross-sectional view of a columnar NAND gate according to an embodiment of the present invention.
Figure 25B:
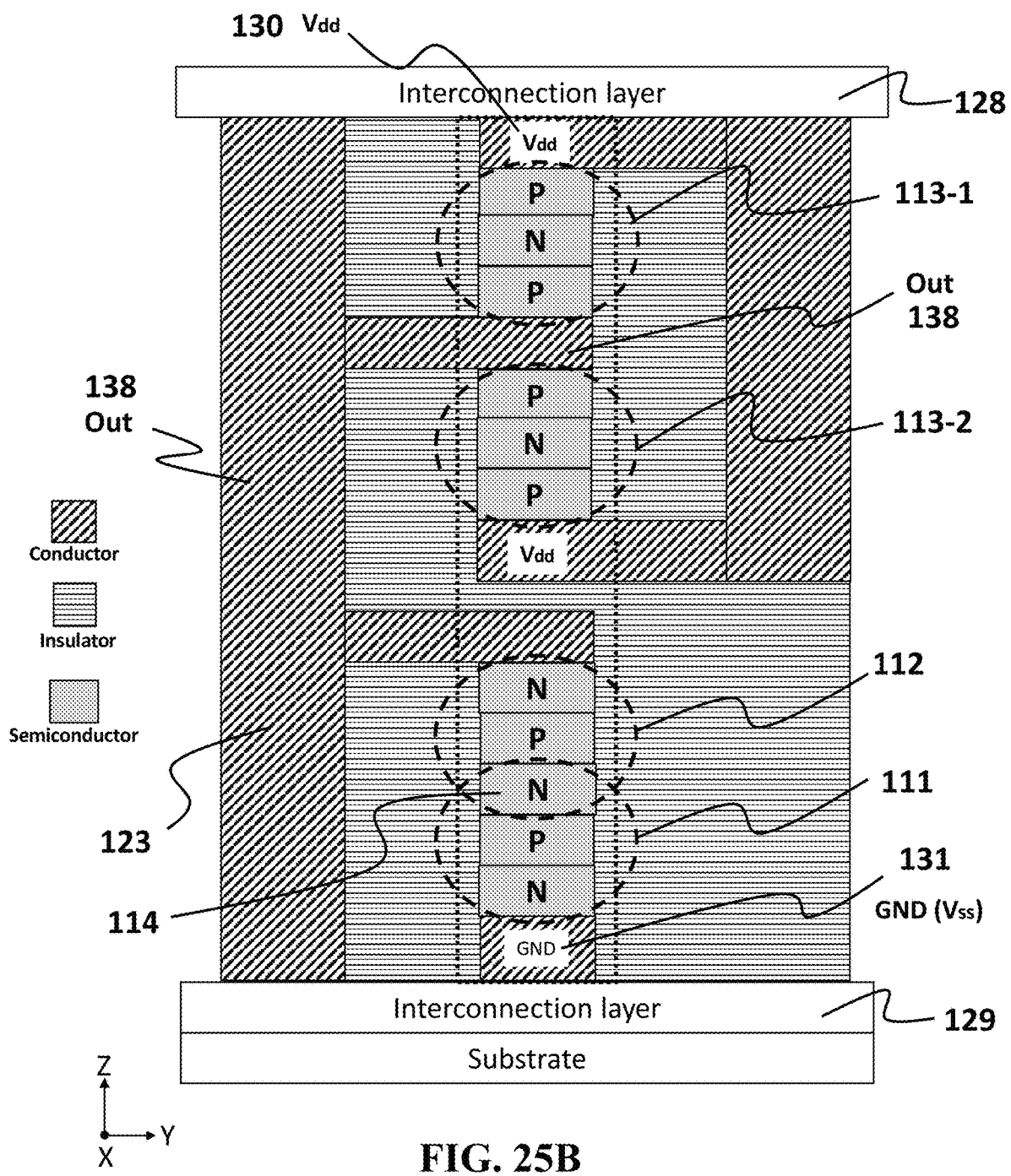
FIG. 25B is a cross-sectional view of a columnar NAND gate according to an embodiment of the present invention.
Figure 26A:
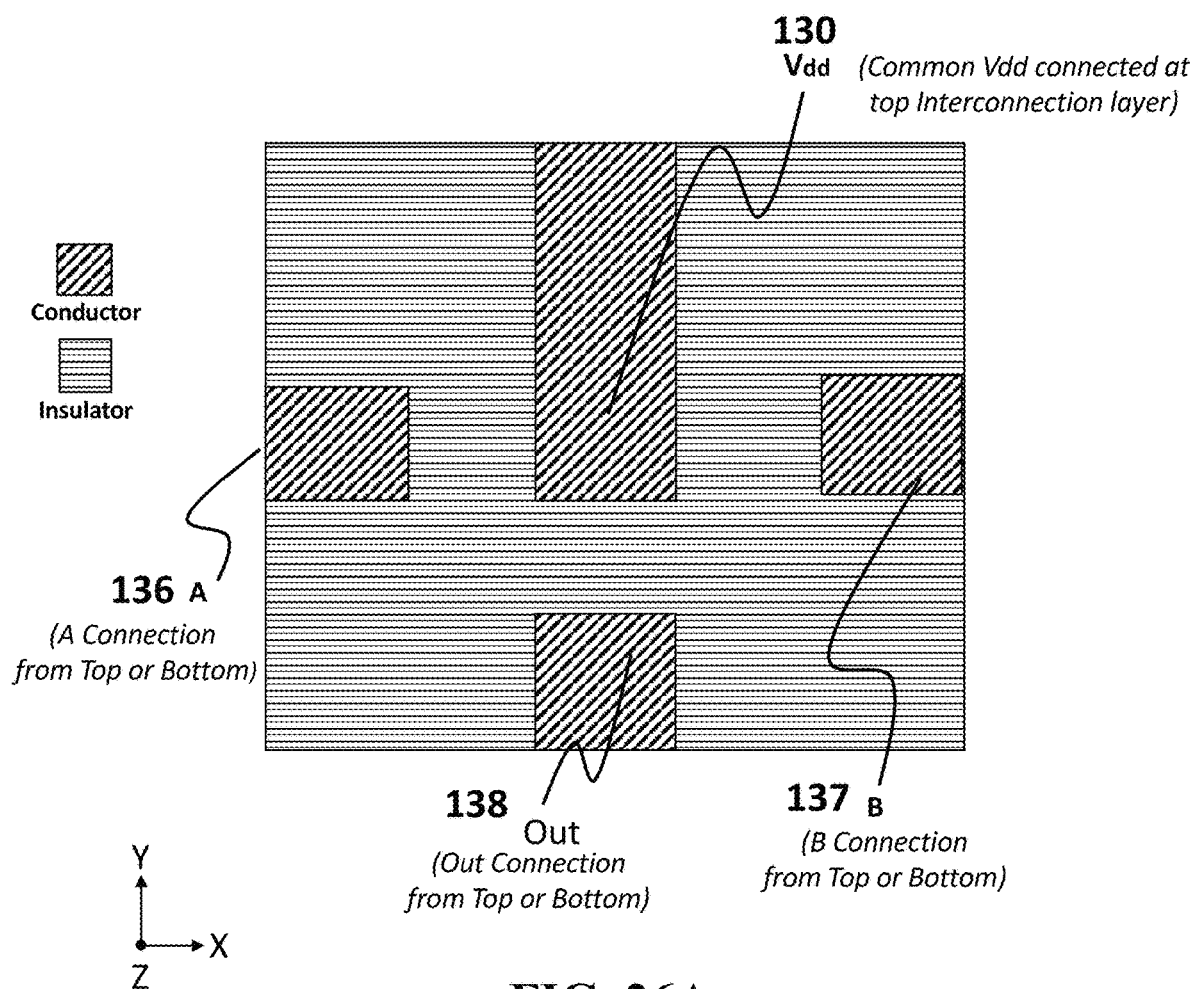
FIG. 26A is a top plan view of the routing pins of a columnar NAND gate according to an embodiment of the present invention.
Figure 26B:
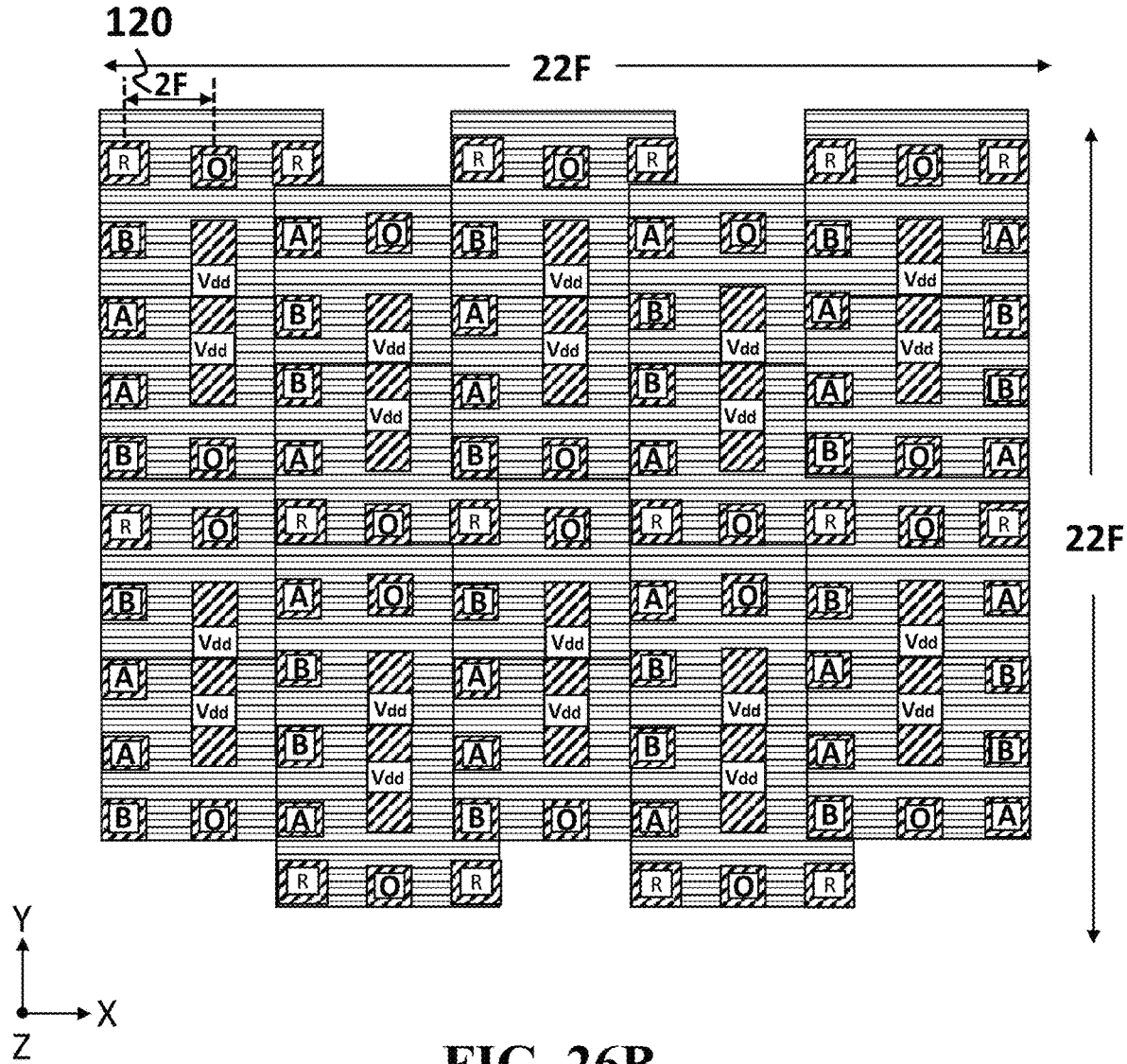
FIG. 26B is a top plan view of an array of columnar NAND logic gates according to an embodiment of the present invention.

FIG. 25A and FIG. 25B are cross-sectional views of a columnar NAND gate according to an embodiment of the present invention. This embodiment differs from the first and second embodiments whereby rather than one pullup transistor (113) having gate inputs from opposite sides of the same semiconductor channel material, there are two separate pullup transistors (113-1 and 113-2). In the case where Vdd (130) and Gnd (131) are respectively connected at an interconnection layer above (128) and below (129) the semiconductor column (110), and no body bias is implemented, the average gate area in an array of columnar NAND gates necessarily increases in size to 22 $F^2$ as shown in FIG. 26A and FIG. 26B from 16 $F^2$ in the first embodiment due to the fact that Vdd (130) must be connected for both pullup transistors (113-1 and 113-2) which occupies additional space.

Fifth Embodiment of CLG (Columnar Unipolar Latched NOR Gate—N-type)

Figure 27A:
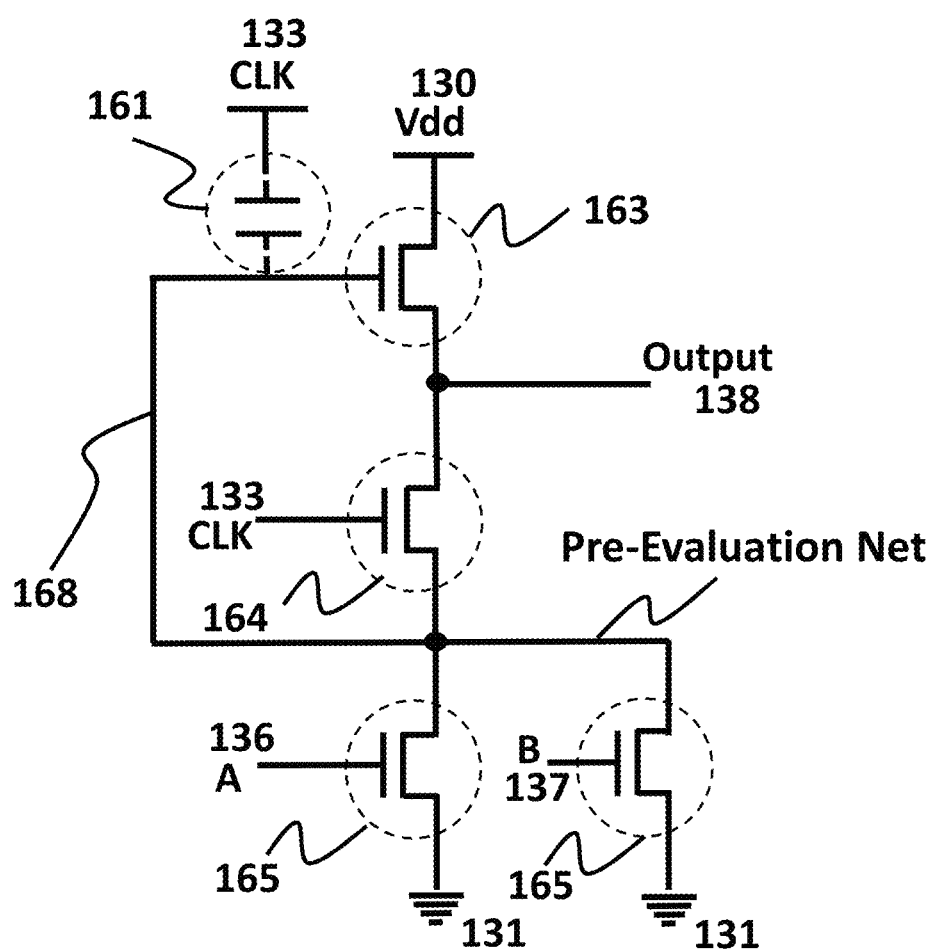
FIG. 27A is a schematic diagram of a unipolar latched NOR gate (N-type).
Figure 27B:
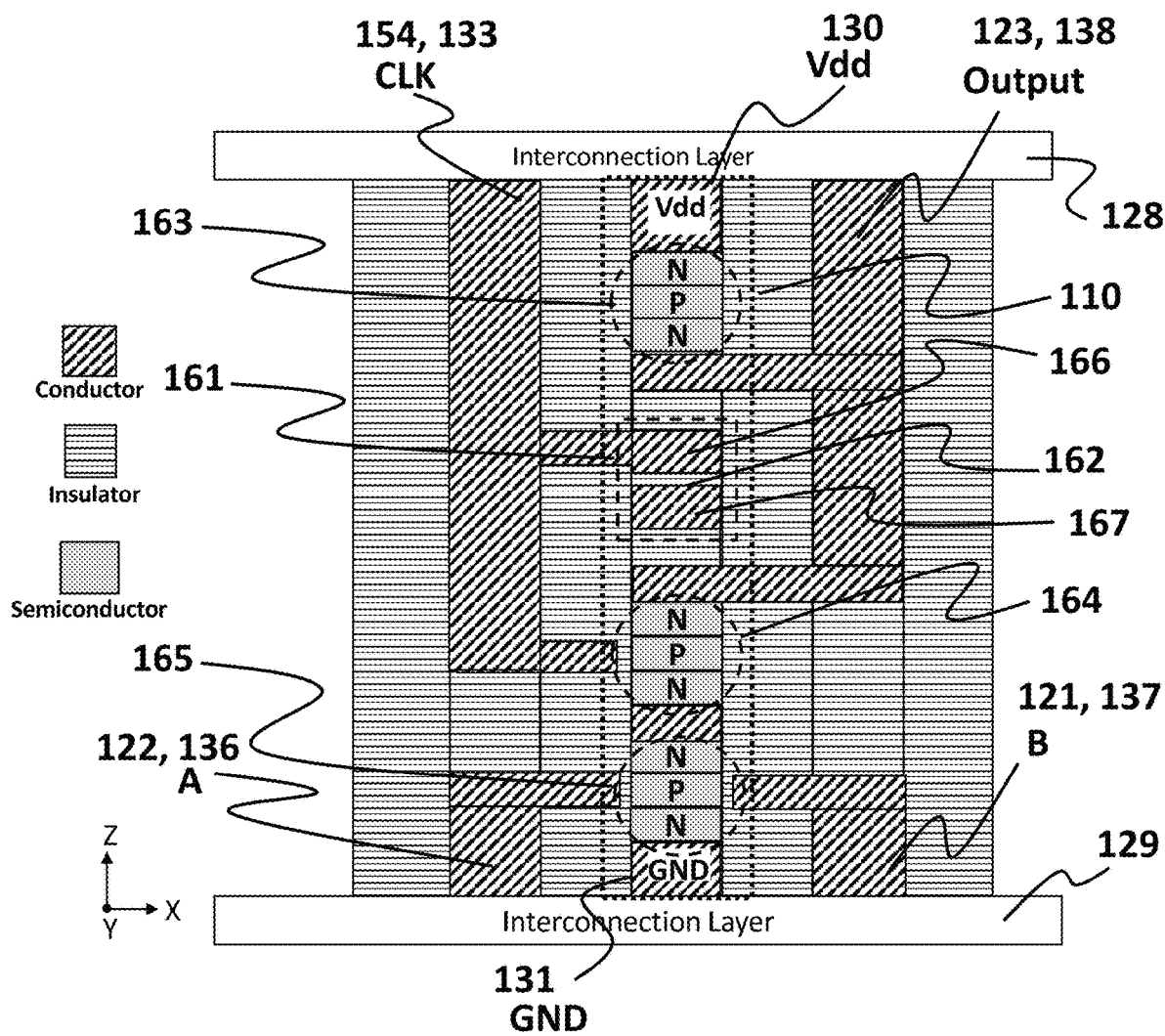
FIG. 27B is a cross-sectional view of a columnar unipolar latched NOR gate (N-type) according to an embodiment of the present invention.
Figure 27C:
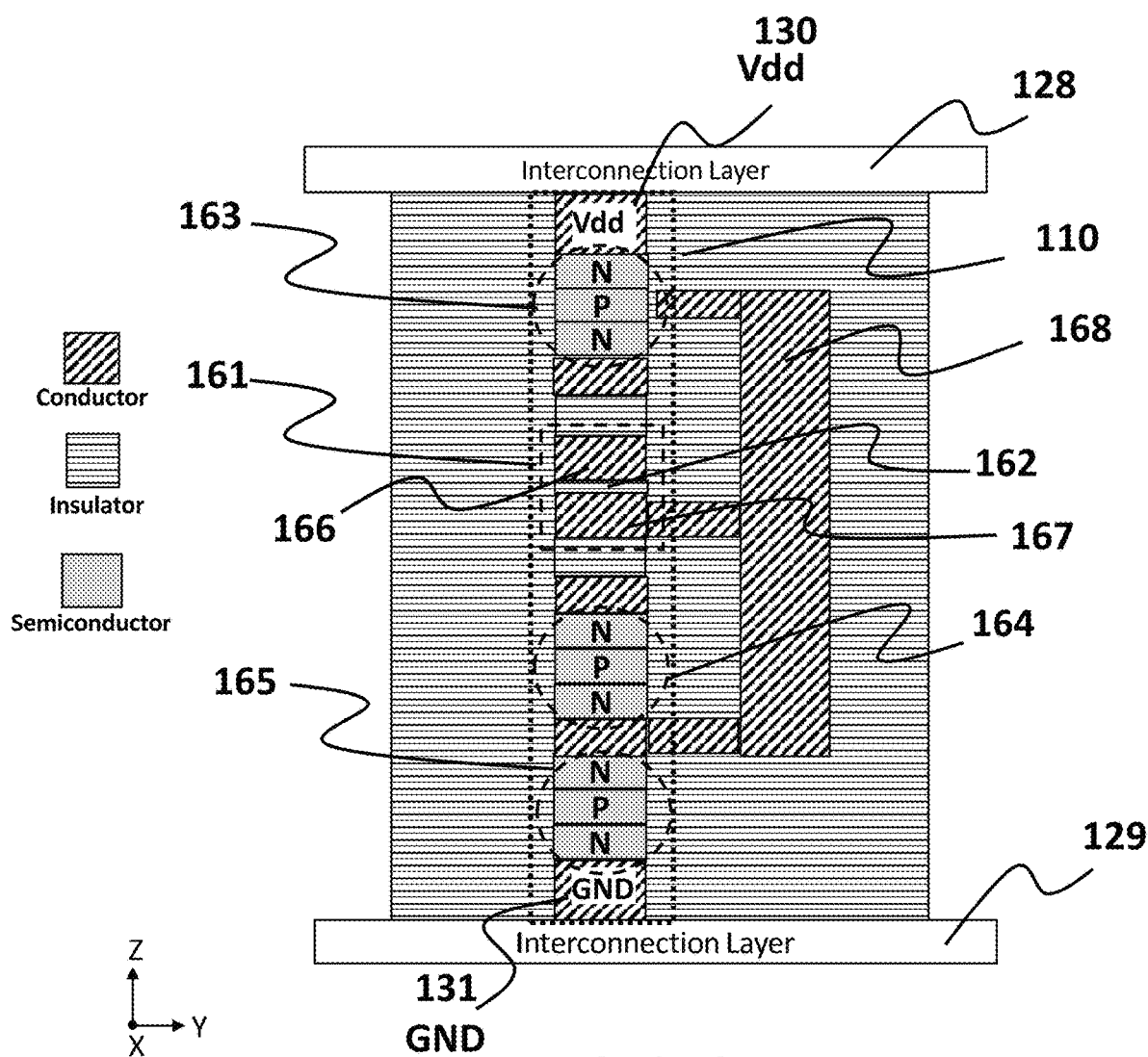
FIG. 27C is a cross-sectional view of a columnar unipolar latched NOR gate (N-type) according to an embodiment of the present invention.

FIG. 27A is a schematic diagram of a unipolar latched NOR gate (N-type), the operation of which is described in U.S. Pat. No. 10,079,602 (Agan et. al) Unipolar Latched Logic Circuits. FIG. 27B and FIG. 27C are cross-sectional views of a columnar unipolar latched NOR gate (N-type) according to an embodiment of the present invention comprising: a semiconductor column (110) comprising: a first NMOS transistor (163) having a drain, body, and source vertically aligned; a capacitor (161) having an anode and cathode vertically aligned with and directly below the drain, body and source of the first NMOS transistor (163), with an insulator immediately above and below the capacitor (161); a second NMOS transistor (164) having a drain, body, and source vertically aligned with and directly below the capacitor (161); a pulldown transistor (165) having a drain, body, and source vertically aligned with and directly below the drains, bodies, and sources of the first (163) and second (164) transistors, the source or drain of the pulldown transistor (165) conductively coupled to the drain of the second NMOS transistor (164); an interconnection layer either above (128) or below (129) the semiconductor column (110) or both; a first conductive column (121) adjacent to the semiconductor column (110) and conductively coupled to a first gate of the pulldown transistor (165), which vertically extends adjacent to the semiconductor column (110) to an interconnection layer (129) which is located below the semiconductor column (110); a second conductive column (122) adjacent to the semiconductor column (110) and conductively coupled to a second gate of the pulldown transistor (165), which vertically extends adjacent to the semiconductor column (110) to an interconnection layer (129) which is located below the semiconductor column (110); a third conductive column (123) adjacent to the semiconductor column (110) and conductively coupling an interconnection layer (128), which is located above the semiconductor column (110), to the drain of the first NMOS transistor (163) and to the source of the second NMOS transistor (164) thereby forming an output node (138) of the columnar unipolar latched NOR gate; a fourth conductive column (154) adjacent to the semiconductor column (110) and conductively coupling an interconnection layer (128), which is located above the semiconductor column (110), to the anode of the capacitor (161) and to the gate of the second NMOS transistor (164) thereby forming a clock input node (133) of the columnar unipolar latched NOR gate; and a fifth conductive column (168) adjacent to the semiconductor column (110) and conductively coupling the source or drain of the pulldown transistor (165), the drain of the second NMOS transistor (164), the cathode of the capacitor (161) and the gate of the first NMOS transistor (163); wherein the first, second, third, fourth and fifth conductive columns (121, 122, 123, 154, and 168) are equidistant from the semiconductor column (110).

Sixth Embodiment of CLG (Columnar Unipolar Latched NOR Gate—P-type)

Figure 27E:
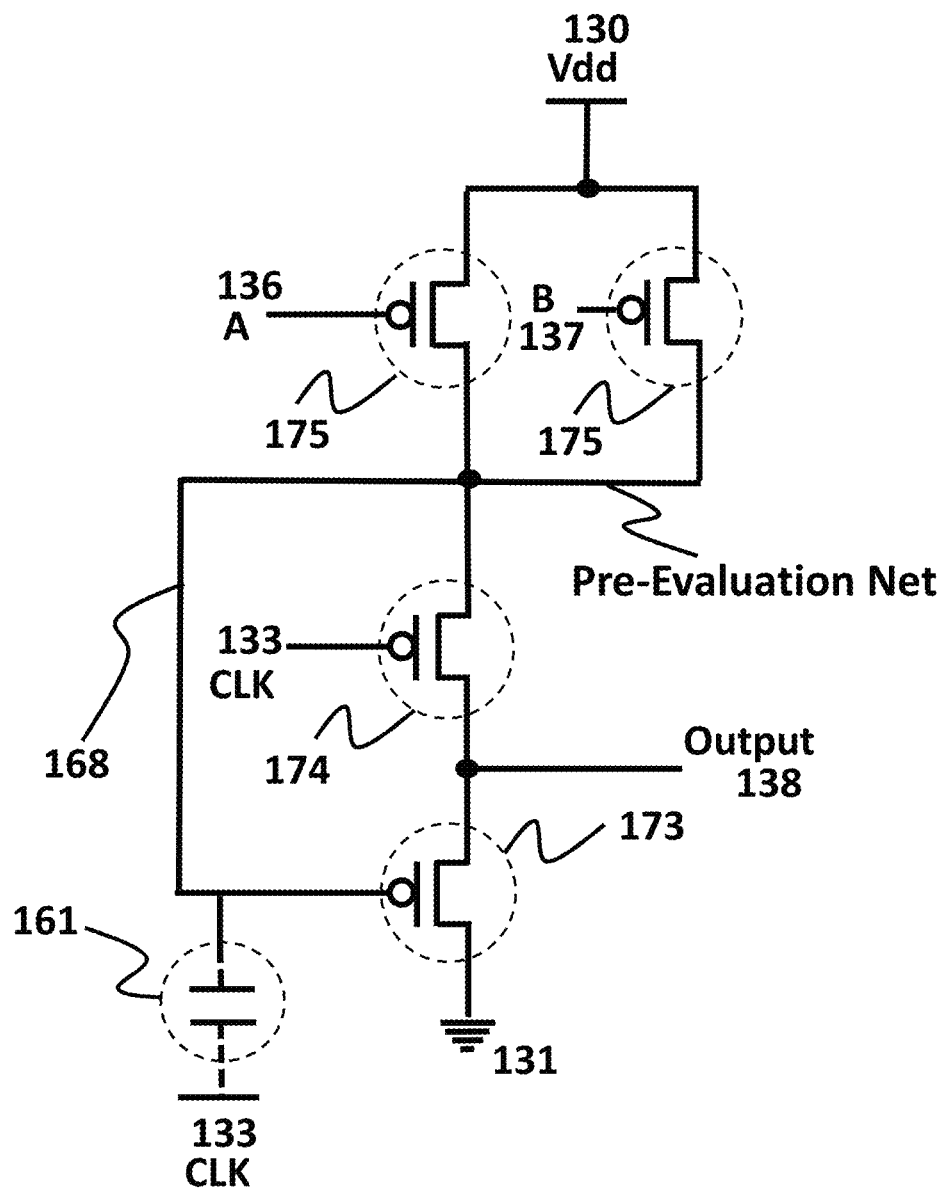
FIG. 27E is a schematic diagram of a unipolar latched NOR gate (P-type).
Figure 27F:
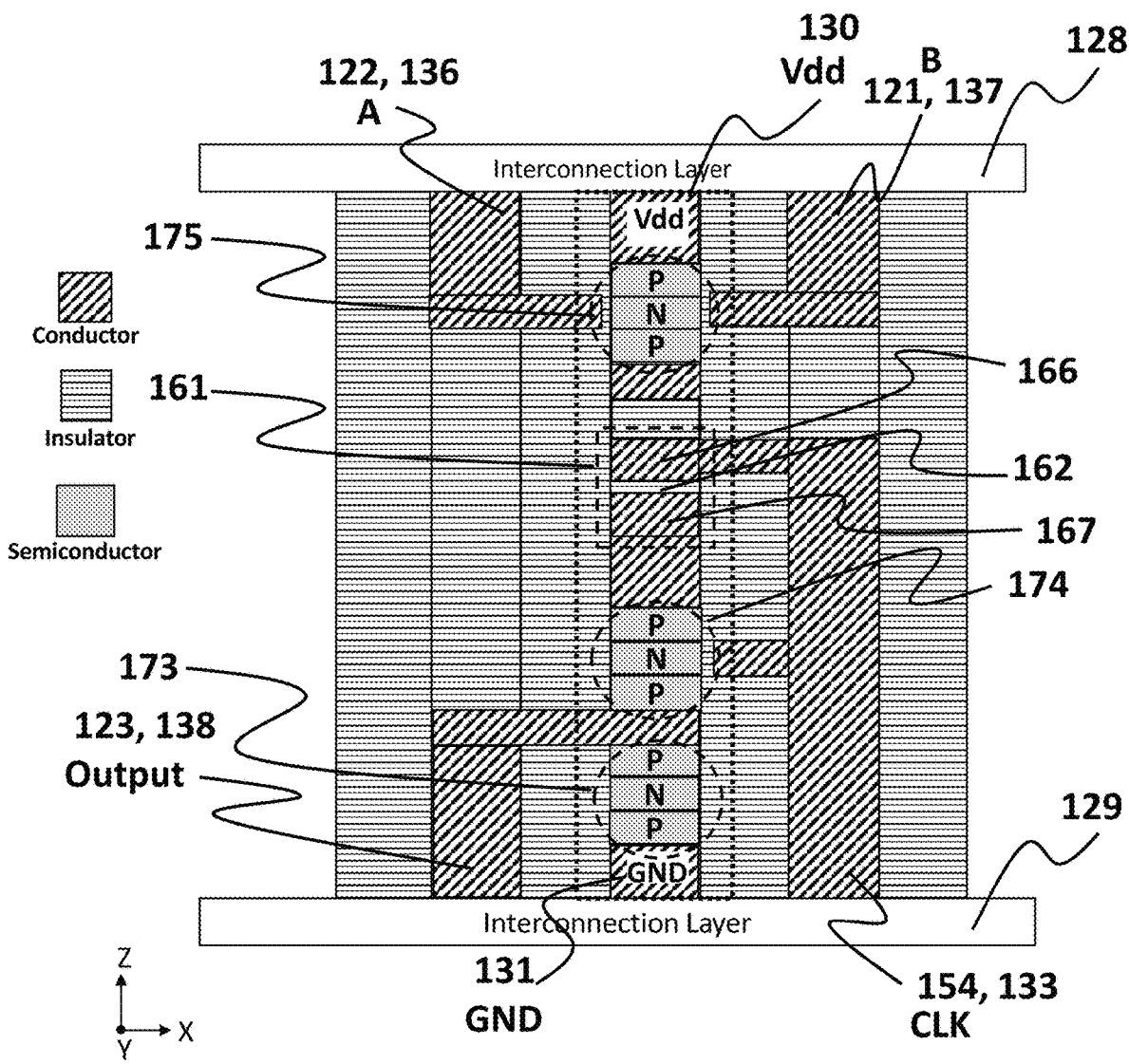
FIG. 27F is a cross-sectional view of a columnar unipolar latched NOR gate (P-type) according to an embodiment of the present invention.
Figure 27G:
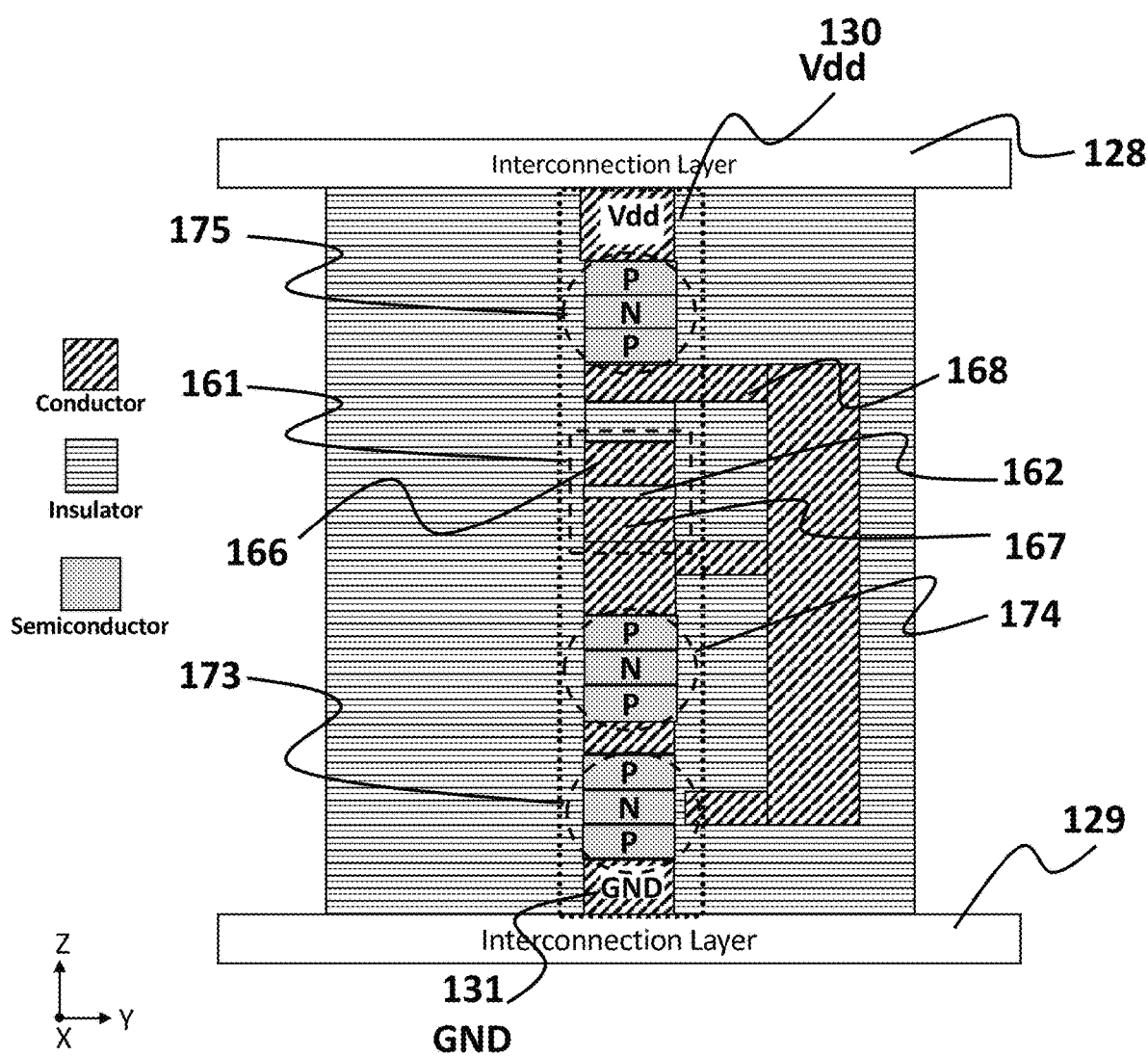
FIG. 27G is a cross-sectional view of a columnar unipolar latched NOR gate (P-type) according to an embodiment of the present invention.

FIG. 27E is a schematic diagram of a unipolar latched NOR gate (P-type), the operation of which is described in U.S. Pat. No. 10,079,602 (Agan et. al) Unipolar Latched Logic Circuits. FIG. 27F and FIG. 27G are cross-sectional views of a columnar unipolar latched NOR gate (P-type) according to an embodiment of the present invention comprising: a semiconductor column (110) comprising: a first PMOS transistor (173) having a drain, body, and source vertically aligned; a second PMOS transistor (174) having a drain, body, and source vertically aligned with and directly above the drain, body and source of the first PMOS transistor (173), the source or drain of the first PMOS transistor (173) conductively coupled to the drain of the second PMOS transistor (174); a capacitor (161) having an anode and cathode vertically aligned with and directly above the drain, body and source of the second PMOS transistor (174), an insulator immediately above the anode and the cathode conductively coupled to the source of the second PMOS transistor (174); a pullup transistor (175) having a drain, body, and source vertically aligned with and directly above the capacitor (161); an interconnection layer either above (128) or below (129) the semiconductor column (110) or both; a first conductive column (121) adjacent to the semiconductor column (110) and conductively coupled to a first gate of the pullup transistor (175), which vertically extends adjacent to the semiconductor column (110) to an interconnection layer (128) which is located above the semiconductor column (110); a second conductive column (122) adjacent to the semiconductor column (110) and conductively coupled to a second gate of the pullup transistor (175), which vertically extends adjacent to the semiconductor column (110) to an interconnection layer (128) which is located above the semiconductor column (110); a third conductive column (123) adjacent to the semiconductor column (110) and conductively coupling an interconnection layer (129), which is located below the semiconductor column (110), to the drain of the second PMOS transistor (174) and to the source of the first PMOS transistor (173) thereby forming an output node (138) of the columnar unipolar latched NOR gate; a fourth conductive column (154) adjacent to the semiconductor column (110) and conductively coupling an interconnection layer (129), which is located below the semiconductor column (110), to the anode of the capacitor (161) and to the gate of the second PMOS transistor (174) thereby forming a clock input node (133) of the columnar unipolar latched NOR gate; and a fifth conductive column (168) adjacent to the semiconductor column (110) and conductively coupling the source or drain of the pullup transistor (175), the source of the second PMOS transistor (174), the cathode of the capacitor (161) and the gate of the first PMOS transistor (173); wherein the first, second, third, fourth and fifth conductive columns (121, 122, 123, 154 and 168) are equidistant from the semiconductor column (110).

Figure 28:
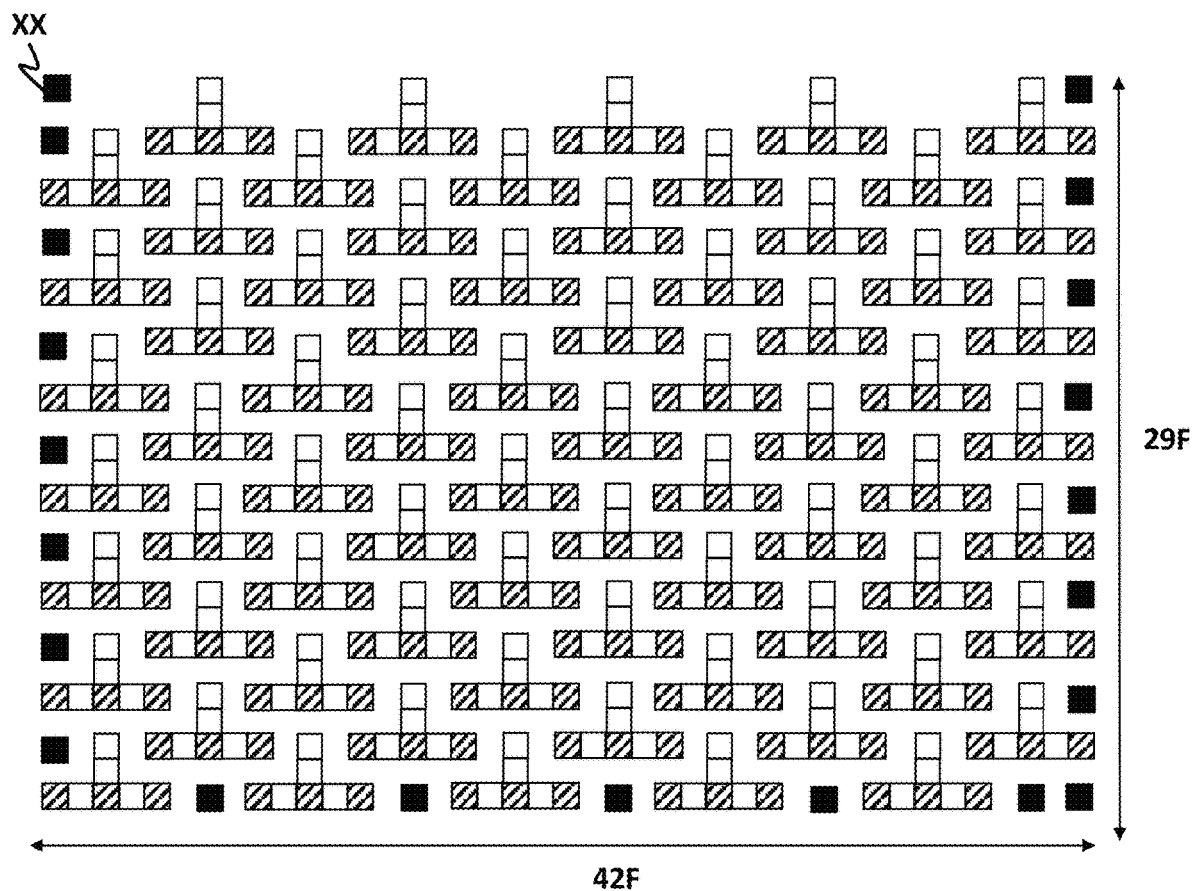
FIG. 28 is a top plan view of an array of columnar unipolar latched NOR logic gates (N or P type) according to an embodiment of the present invention.
Figure 29A:
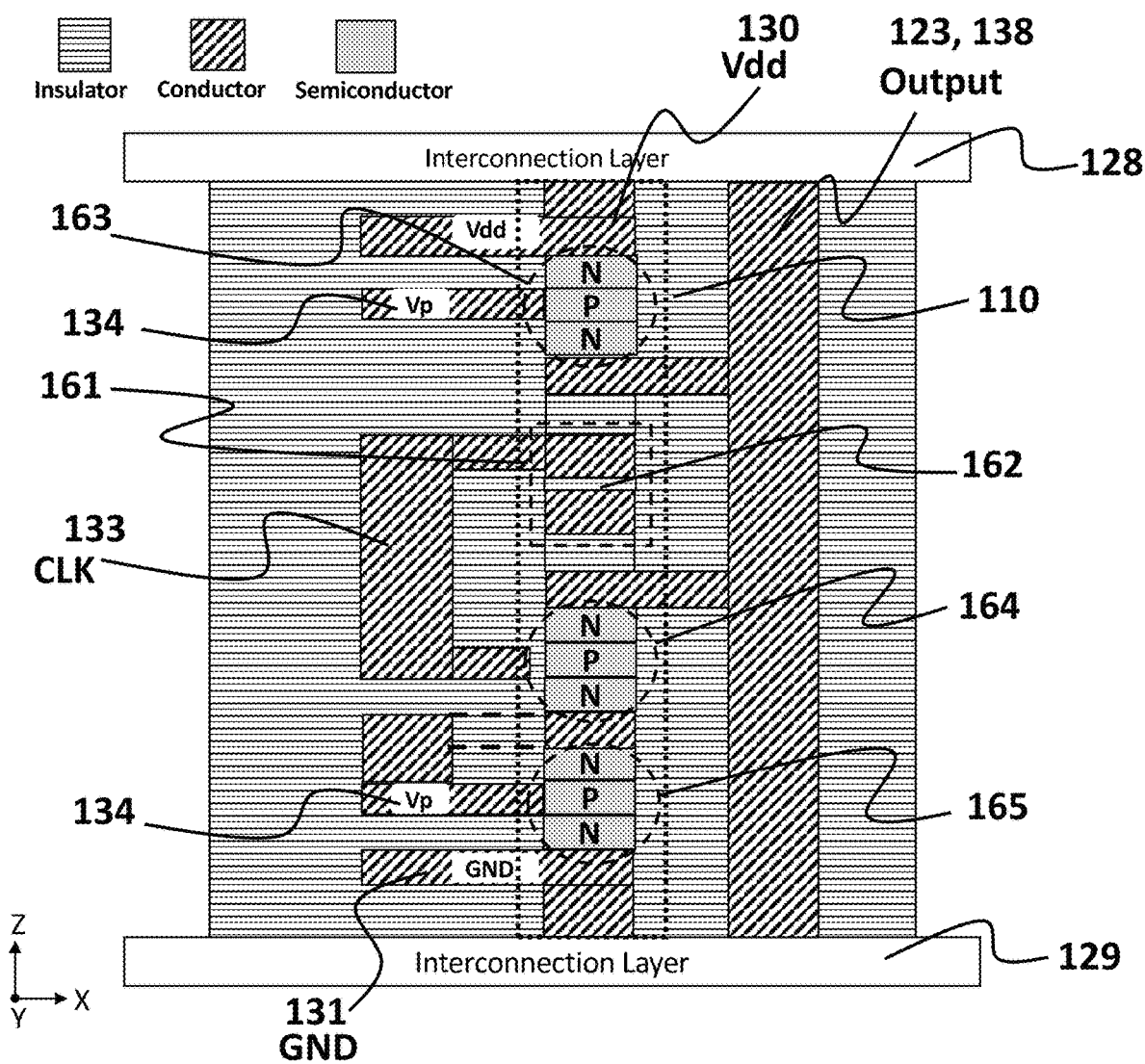
FIG. 29A is a cross-sectional view of a columnar unipolar latched NOR gate (N-type) with body bias according to an embodiment of the present invention.
Figure 29B:
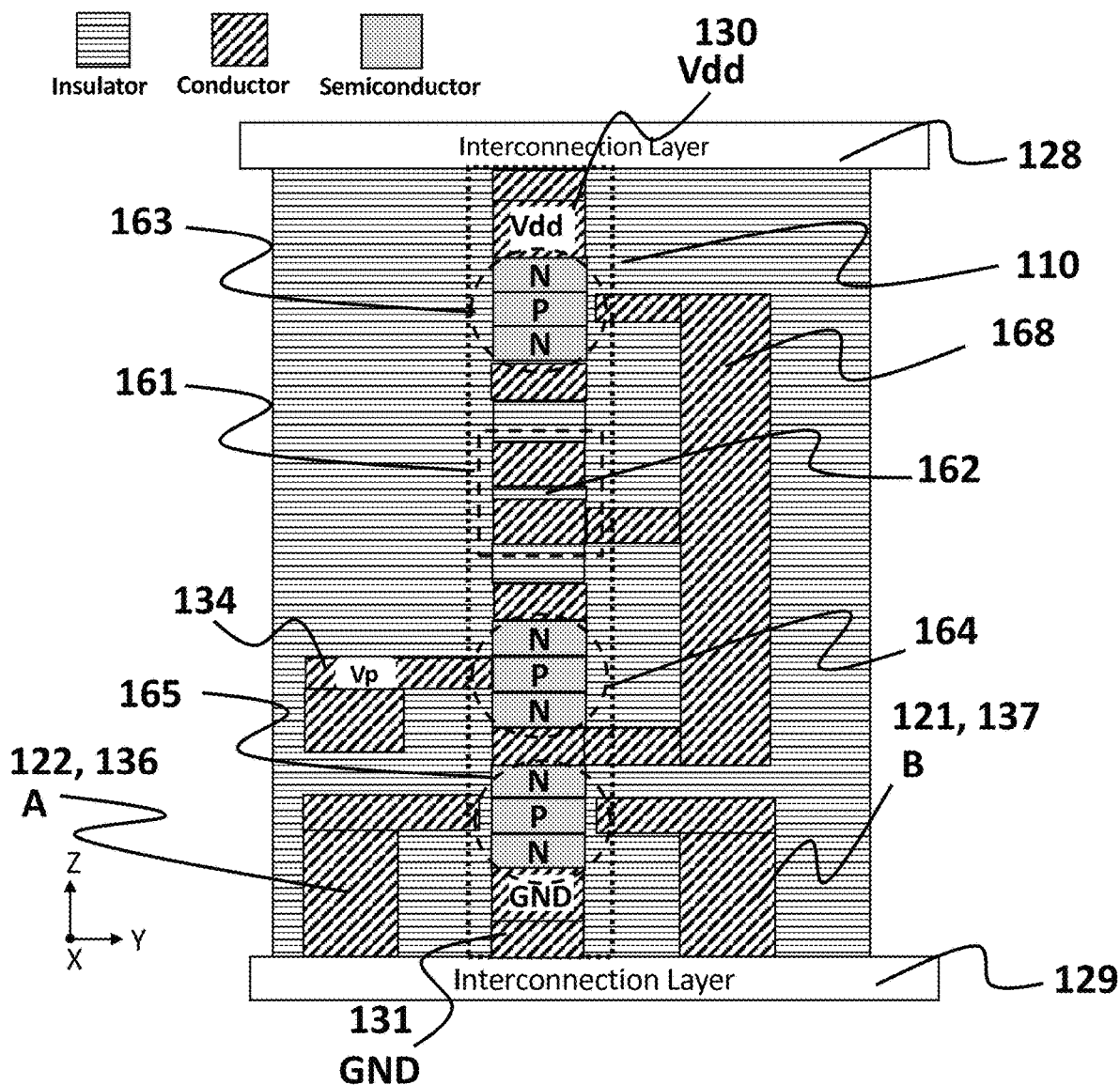
FIG. 29B is a cross-sectional view of a columnar unipolar latched NOR gate (N-type) with body bias according to an embodiment of the present invention.
Figure 29C:
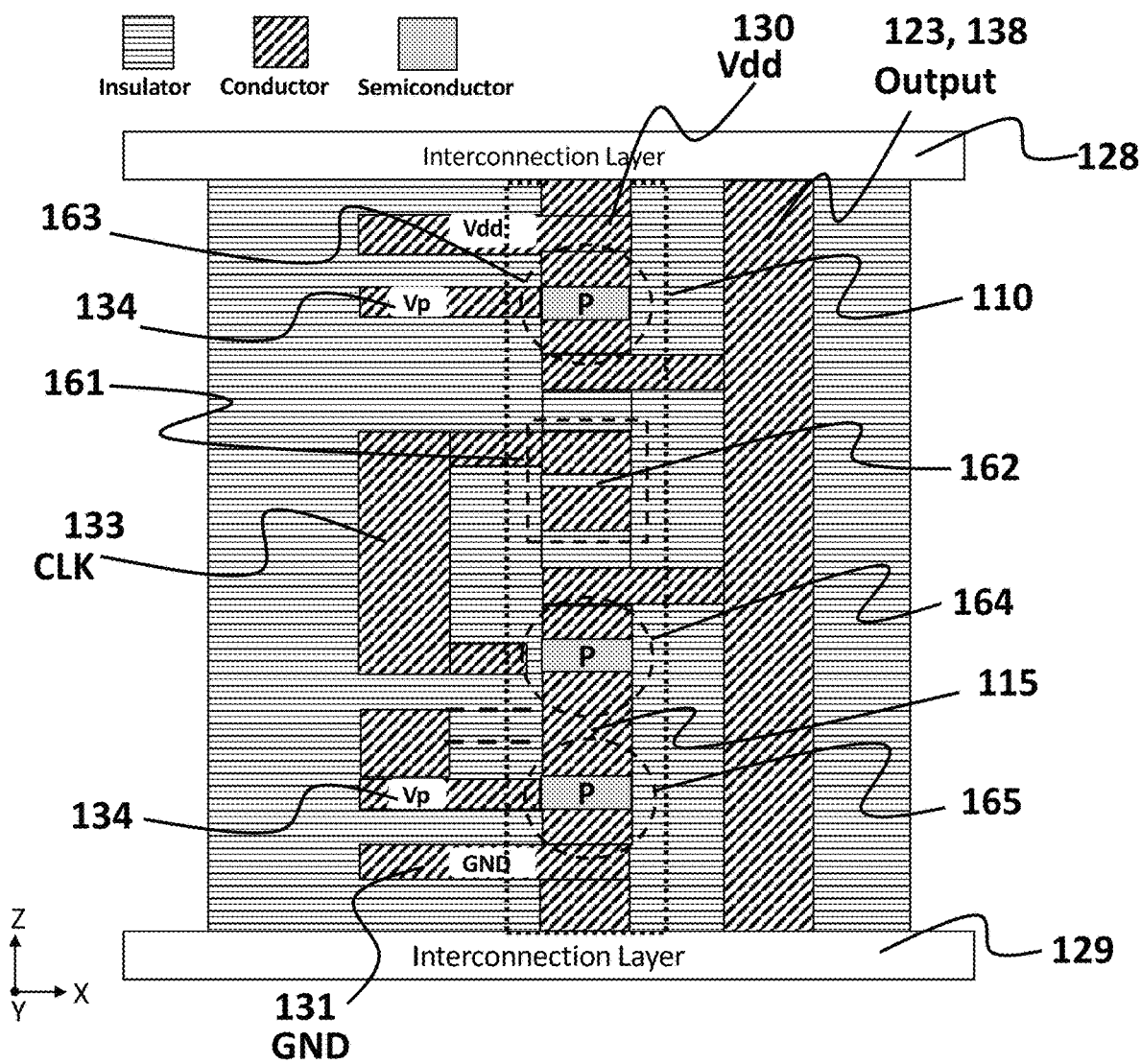
FIG. 29C is a cross-sectional view of a columnar unipolar latched NOR gate (N-type) with body bias according to an embodiment of the present invention.
Figure 29D:
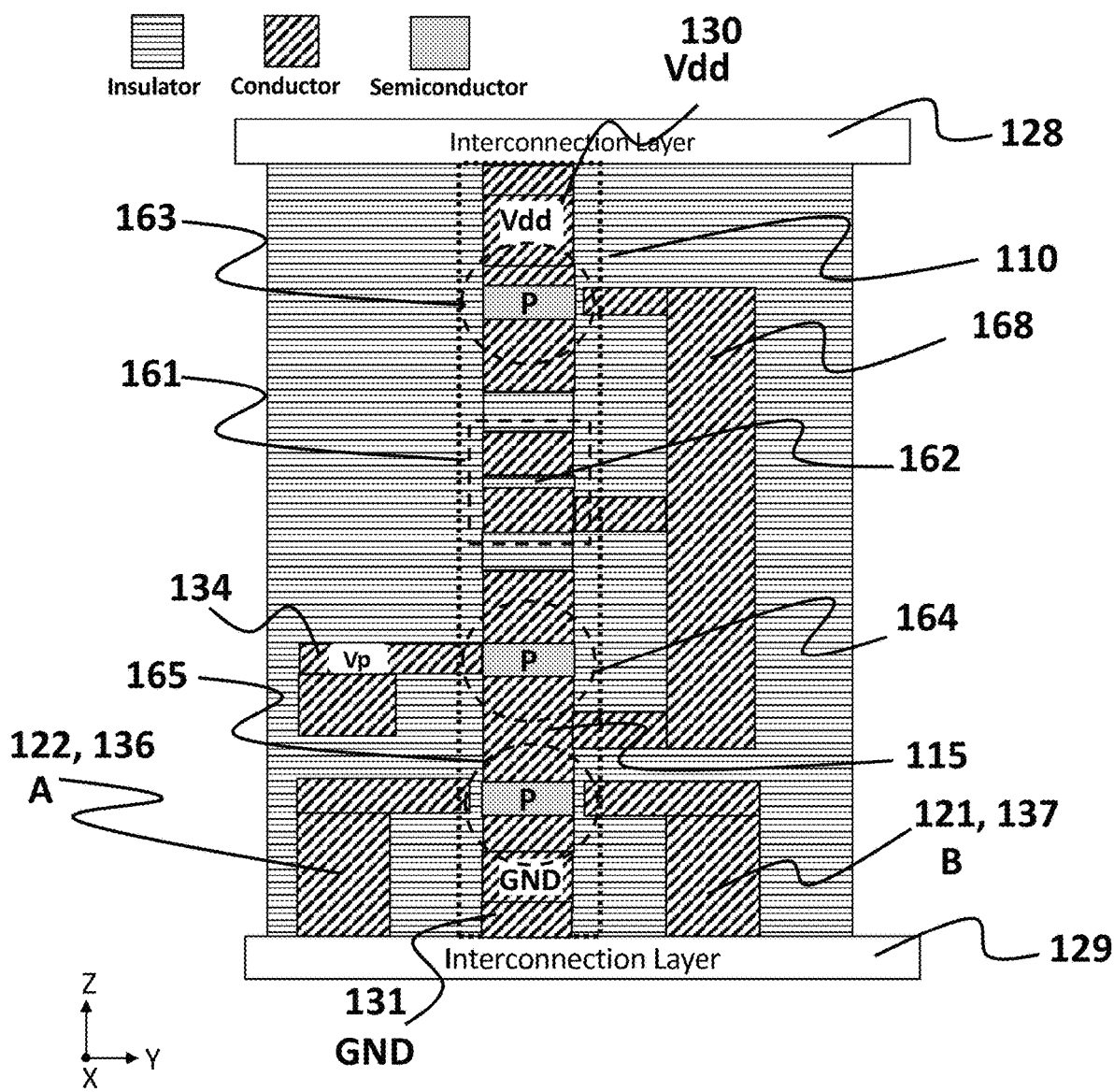
FIG. 29D is a cross-sectional view of a columnar unipolar latched NOR gate (N-type) with body bias according to an embodiment of the present invention.
Figure 29F:
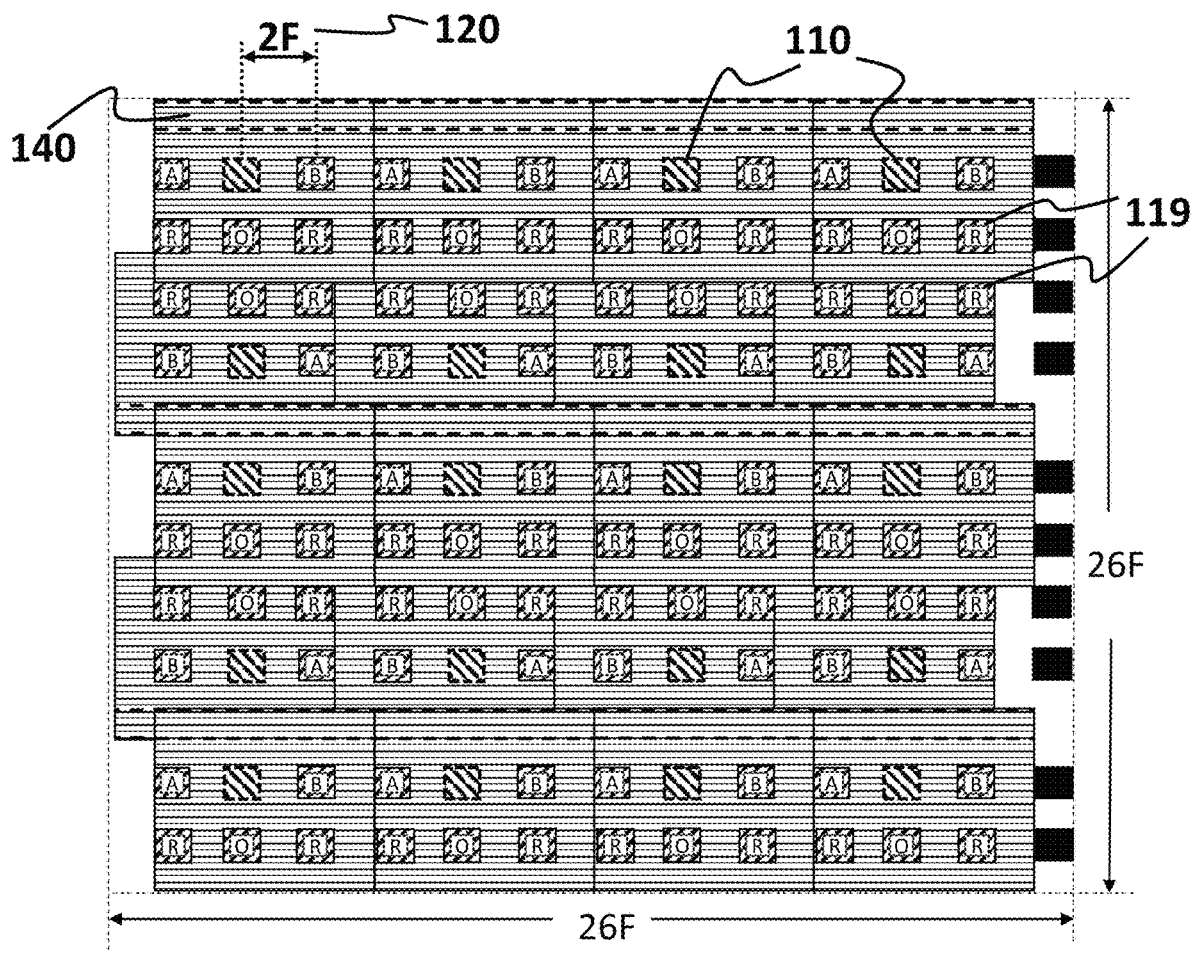
FIG. 29F is a top plan view of an array of columnar unipolar latched NOR logic gates (N-type) with body bias according to an embodiment of the present invention.

FIG. 27D, FIG. 27H, and FIG. 28 illustrate than array of columnar unipolar latched NOR gates of N-type or P-type may be arranged with a density approximating 17 $F^2$ in average cell size.

FIG. 29A through FIG. 29F illustrates that by adding the common body bias electrode Vp (134) for the columnar unipolar latched NOR gate (N-type), an average cell of 33 $F^2$ may be obtained. The similar case would be true for a P-type columnar unipolar latched NOR gate with body bias Vn added.

As noted in the drawings of the embodiments described above, the output conductive column of a columnar logic gate is adjacent to one or more input conductive columns of other columnar logic gates in the array of columnar logic gates. This provides for the highest density possible of configuring an array of logic gates in order to minimize the conductive routing paths between logic gates, and thereby provide for lower power, higher speed circuits.

One skilled in the art will recognize that a host of other logic gates may be designed employing the teachings of the inventions herein as well as those disclosed in the related applications and hence, the inventions shall not be limited to apply only to NAND and NOR gates and not limited to CMOS or Unipolar designs.

Seventh Embodiment of CLG (Multiple Levels of CLGs or S-CLGs and Interconnection Layers)

Figure 30:
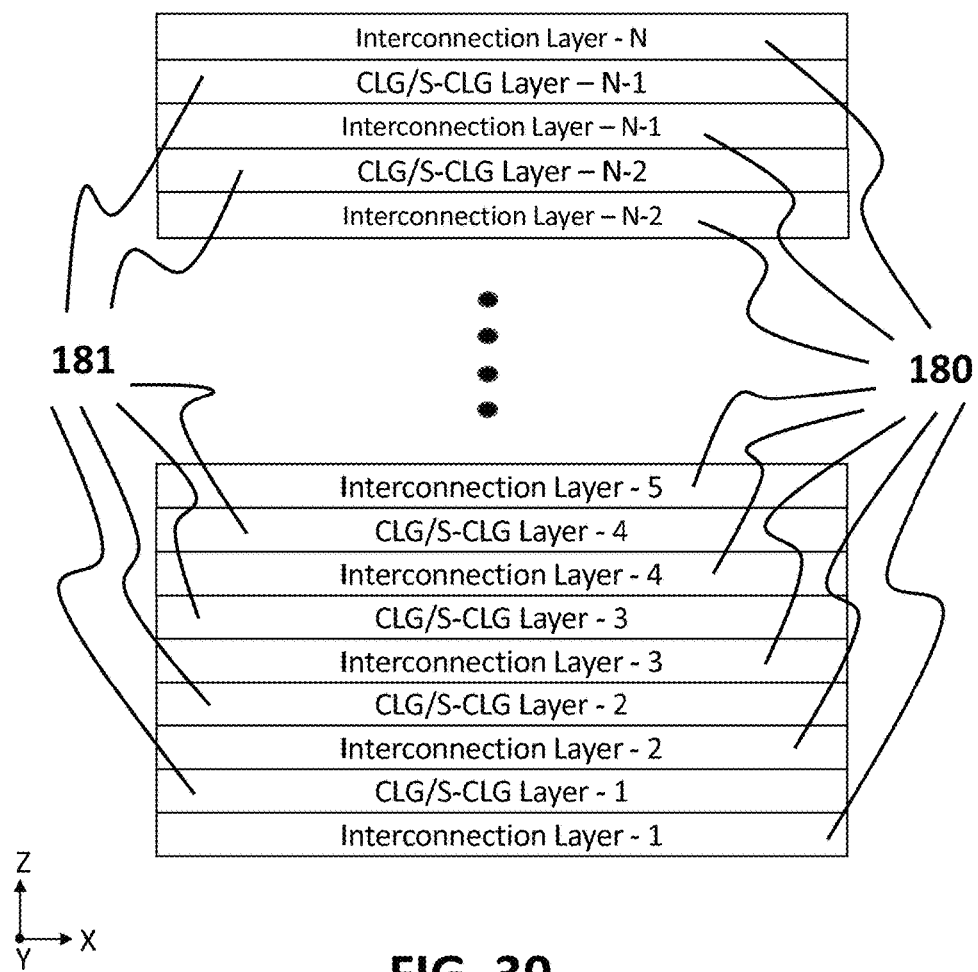
FIG. 30 is a schematic diagram of a 3D integrated circuit comprising multiple levels of CLGs or S-CLGs and related interconnection layers.

FIG. 30 is a schematic diagram of a 3D integrated circuit comprising multiple (2 or more) N-1 levels of columnar logic gates (CLGs) (181) or stacked columnar logic gates (S-CLGs) (181) and N levels (or N-1 levels) of interconnection layers (180), each columnar logic gate or stacked columnar logic gate comprising a semiconductor column comprising: one or more transistors each having a drain, body, and source, vertically aligned; two or more conductive columns adjacent to the semiconductor column coupling the inputs and outputs of the logic gate to an interconnection layer above or below the semiconductor column or both; wherein the transistor gate contacts of the logic gate are positioned within the vertical distance of the semiconductor column and not at an interconnection layer. The 3D circuit is preferably fabricated with thin film transistors processed at BEOL temperatures less than 450 C.

Semiconductor Materials

The columnar logic gates disclosed herein may be fabricated with existing crystalline silicon but may preferably be fabricated with thin film transistors (TFTs). All TFT technologies existing today or that may be developed in the future apply to this invention including but not limited to a-Si, poly-Si, LTPS—low temperature poly-silicon, CGSI, amorphous oxide semiconductors and doped amorphous oxide semiconductors (IGZO, ITZO, SnO, ZnON, LnIZO, vanadium-doped ZTO, and others), graphene-based TFTs, carbon nanotube (CNT) based TFTs, and all those stated in the prior art references and in U.S. Pat. No. 9,853,053 which is incorporated herein in its entirety by reference. In essence, any thin film transistor technology—which is not electrically coupled to the substrate body shall be included in the definition of thin film transistors for the purpose of this invention, regardless of processing temperature, albeit the preference is less than 450 C. These semiconductor materials may be used for the TFTs as well as the semiconductor channel in the memory cells. Substrates for use in the invention disclosed herein may be rigid or flexible, glass or plastic or any other substrate suitable for fabrication of integrated circuits. Some novel promising TFTs in development include the following:
1) "black phosphorus" reported by several universities including McGill University, Montreal, Canada, Université de Montréal, Montreal, Canada, Fudan University, Shanghai, Canada, and University of Science and Technology, Hefei, China; for example as reported in: Black Phosphorus Flexible Thin Film Transistors at GHz Frequencies, Weinan Zhu, Saungeun Park, et. al., March 2016, Nano Letters 16(4), DOI: 10.1021/acs.nanolett.5b04768 and Phosphorus oxide gate dielectric for black phosphorus field effect transistors, W. Dickerson, V. Tayari, et. al., Appl. Phys. Lett. 112, 173101 (April 2018); https://doi.org/10.1063/1.5011424.

2) Zinc oxynitride (ZnON) TFTs such as reported by BOE (China), Samsung (Korea) and others in the following prior art papers: High Mobility Zinc Oxynitride TFT for AMOLED, Meili Wang, Li Zhang, Dongfang Wang, Liangchen Yan, Guangcai Yuan, Gang Wang, SID 2014 Symposium Digest of Technical Papers, Vol. 45, Issue 1, pages 949-951, June 2014, ISSN 0097-966/14/4503-0949, DOI: 10.1002/j.2168-0159.2014.tb00246.x, The Development of High Mobility Zinc Oxynitride TFT for AMOLED, Liangchen Yan, Meili Wang, Li Zhang, Dongfang Wang, Fengjuan Liu, Guangcai Yuan, Gang Wang, SID 2015 Symposium Digest of Technical Papers, Vol. 46, Issue 1, pages 769-771, June 2015, ISSN 0097-966X/15/4502-0769, DOI: 10.1002/sdtp.10213, Development of High Mobility Zinc Oxynitride Thin Film Transistors, Yan Ye, Rodney Lim, Harvey You, Evelyn Scheer, Anshu Gaur, Hao-chien Hsu, Jian Liu, Dong Kil Yim, Aki Hosokawa, John M. White, SID 2013 Symposium Digest of Technical Papers, Vol. 44, Issue 1, pages 14-17, June 2013, ISSN 0097-966X/13/4401-0014, DOI: 10.1002/j.2168-0159.2013.tb06127.x, and High Performance Nanocrystalline ZnOxNy for Imaging and Display Applications, Eunha Lee, Taeho Shin, Anass Benayad, HyungIk Lee, Dong-Su Ko, HeeGoo Kim, Sanghun Jeon, and Gyeong-Su Park, SID 2015 Symposium Digest of Technical Papers, Vol. 46, Issue 1, pages 681-684, June 2015, ISSN 0097-966X/15/4502-0681, DOI: 10.1002/sdtp.10263, 3) Zinc Tin Oxide (ZTO) TFT and Indium Tin Zinc Oxide (ITZO) TFT, such as described in the following prior art papers: Fabrication of Zinc Tin Oxide TFTs by Self-Aligned Imprint Lithography (SAIL) on Flexible Substrates, Warren Jackson, Carl Taussig, Rich Elder, William M. Tong, Randy Hoffman, Tim Emery, Dan Smith, Tim Koch, SID 2009 Symposium Digest of Technical Papers, ISSN/009-0966X/09/3902-0873, DOI: 10.1889/1.3256934 and High Mobility ITZO BCE Type TFTs for AMOLED Applications, Fengjuan Liu, Dongfang Wang, Longbao Xin, Liangchen Yan, Meili Wang, Guangcai Yuan, and Gang Wang, SID 2015 Symposium Digest of Technical Papers, Vol. 46, Issue 1, pages 1180-1183, June 2015, ISSN 0097-966X/15/4503-1180, DOI: 10.1002/sdtp.10048, Nanocrystalline ZnON; High mobility and low band gap semiconductor material for high performance switch transistor and image sensor application, Eunha Lee, Anass Benayad, Taeho Shin, HyungIk Lee, Dong-Su Ko, Tae Sang Kim, Kyoung Seok Son, Myungkwan Ryu, Sanghun Jeon & Gyeong-Su Park, SCIENTIFIC REPORTS| 4: 4948 | DOI: 10.1038/srep04948, May 13, 2014, Anion control as a strategy to achieve high-mobility and high-stability oxide thin-film transistors, Hyun-Suk Kim, Sang Ho Jeon, Joon Seok Park, Tae Sang Kim, Kyoung Seok Son, Jong-Baek Seon, Seok-Jun Seo, Sun-Jae Kim, Eunha Lee, Jae Gwan Chung, Hyungik Lee, Seungwu Han, Myungkwan Ryu, Sang Yoon Lee & Kinam Kim, SCIENTIFIC REPORTS|3: 1459| DOI: 10.1038/srep01459, Mar. 15, 2013

4) a new wide-bandgap ultra-thin-film metal oxide nMOSFET developed at National Chiao Tung University, Taiwan (Albert Chin), reported to have a high ION/IOFF of >$10^7$ and high mobility of 0.54× SiO2/Si device operated at 1 MV/cm—the high mobility TFT is due to stronger overlapped orbitals as described in the following paper: Extremely High Mobility Ultra-Thin Metal-Oxide with $ns^2np^2$ Configuration, C. W. Shih, Albert Chin, Chun-Fu Lu, and S. H. Yi, Proceedings IEDM15-145, 978-1-4673-9894-7/15/©2015 IEEE 5) Carbon nanotubes (CNTs) have been developed by numerous universities and corporations for microelectronic applications as reported in U.S. Pat. No. 8,692,230, High Performance Field-Effect Transistors, issued to UCLA, and the following publications of Carbonics Inc., Marina del Rey, Calif., who is commercializing CNT technology developed by UCLA: U.S. Pat. No. 9,379,327, Photolithography based fabrication of 3D structures, U.S. patent application Ser. No. 15/409,897, CONTINUOUS, SCALABLE DEPOSITION OF ALIGNED CARBON NANOTUBES USING SPRAYS OF CARBON NANOTUBE SOLUTIONS, U.S. patent application Ser. No. 15/332,665, FIELD EFFECT TRANSISTOR WITH P-DOPED CARBON NANOTUBE CHANNEL REGION AND METHOD OF FABRICATION, and U.S. patent application Ser. No. 16/199,915, DEPOSITION OF CARBON NANOTUBES ON SUBSTRATES AND ELECTRICAL DEVICES MANUFACTURED THEREFROM. Carbonics, Stanford University, MIT and Skywater Technology Foundry are actively working on commercializing CNTs in VLSI applications through a DARPA grant. Furthermore, Nantero, Inc. of Woburn, Mass. has done substantial work with CNTs for memory and logic devices; for example as described in U.S. Pat. No. 9,362,390, Logic elements comprising carbon nanotube field effect transistor (CNTFET) devices and methods of making same. Nantero has licensed its CNT technology to Fujitsu and others for fabrication of CNT-based resistive RAM non-volatile memory devices (NRAM). Much other work is ongoing to implement CNT for thin film transistors in the semiconductor field given the promise of the high performance CNTs provide.

6) Lanthanide rare earth doped In—Zn—O (LnIZO) has been shown to exhibit high mobility and stability as reported in: Flexible AMOLED based on Oxide TFT with High Mobility, Lei Wang, Chongpeng Ruan, et. al., SID 2017 Symposium Digest of Technical Papers, May 2017, DOI: 10.1002/sdtp.11604, ISSN 0097-996X/17/4701-0342.

Eighth Embodiment of CLG (Multiple Levels of CLGs or S-CLGs and Interconnection Layers)

Figure 31:
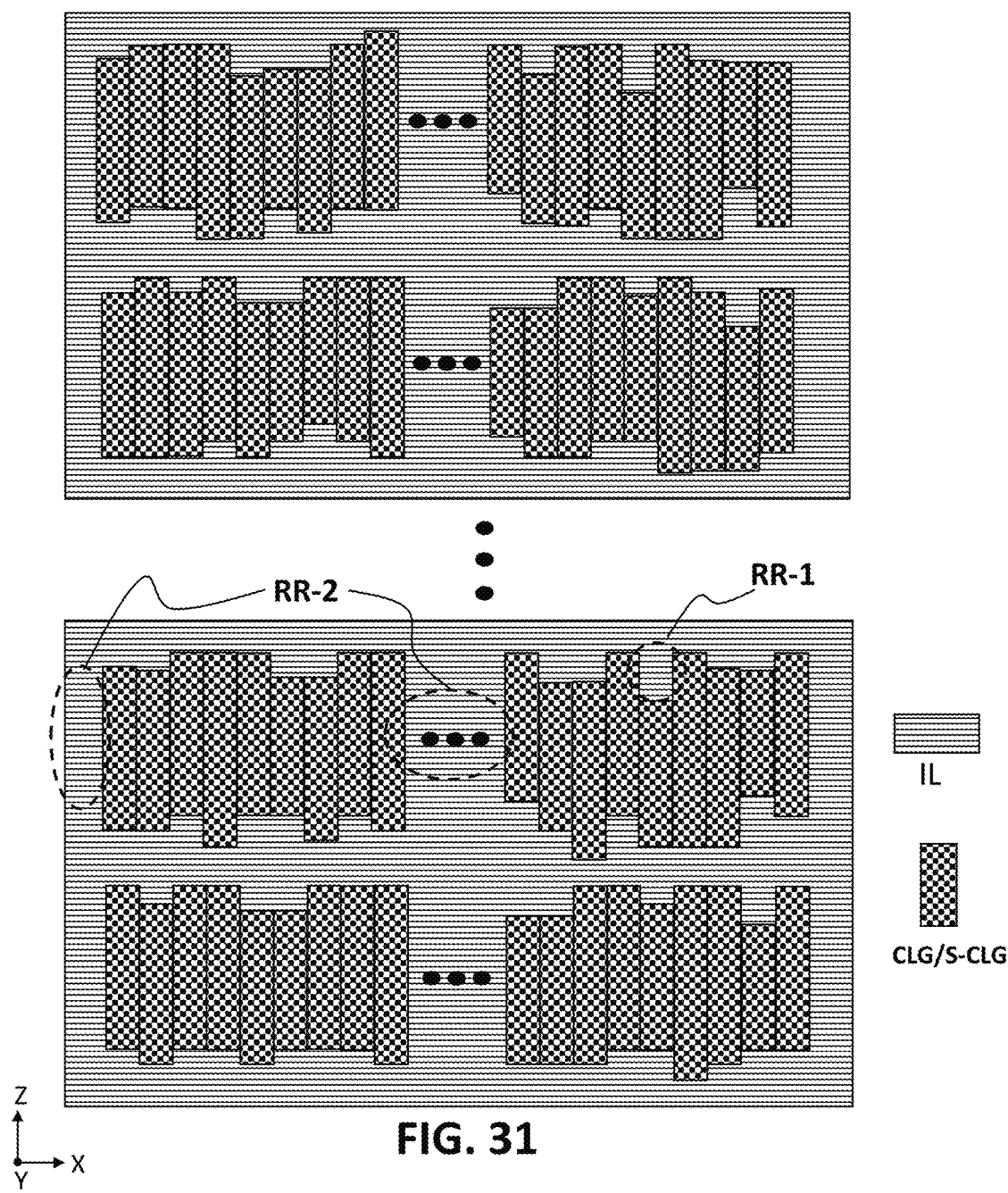
FIG. 31 is a schematic diagram of a 3D integrated circuit comprising multiple levels of CLGs or S-CLGs and related interconnection layers, whereby the heights of adjacent logic gates may be of different lengths

FIG. 31 is a schematic diagram of a 3D integrated circuit comprising multiple levels of columnar logic gates (CLGs) or stacked columnar logic gates (S-CLGs) and interconnection layers (IL), each columnar logic gate or stacked columnar logic gate having one or more input logic ports and one or more output logic ports, and each of the columnar logic gates including: a plurality of transistors vertically arranged along a semiconductor column extending from a bottom surface of a columnar logic region to a top surface of the columnar logic region, the plurality of transistors electrically interconnected so as to generate a logic output signal at the logic output port in response to one or more logic input signals received at the one or more logic input ports; one or more input conductive columns adjacent to the semiconductor column and in conductive communication with the one or more input logic ports of the columnar logic gate; and one or more output conductive columns adjacent to the semiconductor column and in conductive communication with the one or more output logic ports of the columnar logic gate; and one or more interconnection layers directly above and/or below the columnar logic region, the one or more interconnection layers conductively interconnecting input and output logic ports of the two-dimensional array of columnar logic gates so as to configure the three-dimensional logic gate to perform a logic operation. Furthermore, the vertical heights of the semiconductor columns extending from a bottom end of the semiconductor column to a top surface of the semiconductor of adjacent logic gates can be different from one another. For example, vertical locations of top surfaces, vertical locations of bottom surfaces, or vertical heights of adjacent semiconductor columns can be different from one another. In various embodiments, a ratio of vertical heights of a first subset of semiconductor columns to a second subset of semiconductor columns can be greater than 1.1., 1.25, 1.5, or 2, for example. In some embodiments, a ratio of vertical locations of top and/or bottom surfaces of semiconductor columns to an average vertical height of such semiconductor columns can be can be than 0.1, 0.2, 0.25 or 0.33, for example.

One skilled in the art will recognize that different vertical heights of columnar logic gates can be a consequence of different numbers of transistors and other devices (e.g., capacitors, resistors, diodes) in the gate, for example. For example, a full adder could be designed as a single gate in with one columnar semiconductor stack and as such, can be significantly taller than a NAND or NOR gate. The top surface of the columnar logic region and/or the bottom surface of the columnar region can have a three-dimensional topography as a result of different types of semiconductor columns therein.

Such three-dimensional integrated circuits are not limited to any specific logic gate and can include but are not limited to INVERTER, NAND, NOR, XOR, XNOR, FULL ADDER, MAJORITY, CONDITIONAL, MULTIPLEXER and a host of other COMPLEX GATES; and can be of the CMOS or Unipolar type or any other logic family type. The gates may or may not have body bias connections or other connections. Furthermore, a columnar logic gate can be constructed as a single columnar semiconductor stack or may include two or multiple adjacent columnar semiconductor stacks and as such, the dimensions of that construction of the gate in the X-Y-Z direction will differ from the construction of the gate in a single columnar semiconductor stack design.

As evident from the discussion above, there is a range of different designs of columnar logic gates which will yield different heights (z-dimension) and X-Y dimensions depending on the specific gate, logic family, input and output connections, body bias connections and whether constructed as a single columnar semiconductor stack or multiple columnar semiconductor stacks. The wide variety of such gate designs shall not depart from the spirit of the invention or the definition of columnar logic gates which shall include these variations in design which yield different X-Y-Z dimensions.

Ninth Embodiment of CLG (Routing of Output Signal of a CLG to a Nearby CLG without Required Routing to an Interconnection Layer Above or Below the Columnar Logic Region)

It is evident from the embodiments described above and herein that it need not be required for the logic output of a columnar logic gate to be routed to an interconnection layer directly above and/or below the logic gate, but rather may be routed in the x, y and z direction to nearby columnar logic gates. For example, in FIG. 31, there may be routing regions (RR-1) whereby the heights of nearby columnar logic gates are larger than the columnar logic gate(s) between them and thereby enabling a direct connection of the logic output of one gate to the logic input of the other nearby gate without a requirement to connect to an interconnection layer directly above and/or below either of the columnar logic regions. Therefore, it is evident that a subset of the plurality of logic interconnections do not include portions that use one or more of the interconnection layers directly above and/or below the columnar logic region. Another example would be the routing region (RR-2) between two two-dimensional arrays of columnar logic gates which would enable direct routing of the logic output of the columnar logic gate on the edge of the first two-dimensional array to connect to a logic input of the columnar logic gate on the edge of the second two-dimensional array without a requirement to be routed to an interconnection layer above and/or below either of the columnar logic regions. Therefore, it is evident that a subset of the plurality of logic interconnections do not include portions that use one or more of the interconnection layers directly above and/or below the columnar logic region. An additional example can be illustrated by referring to FIG. 19A, FIG. 19B and FIG. 20, whereby the logic outputs (138) of any of the four stacked columnar logic gates may be routed on a routing electrode (145) to a logic input of a nearby columnar logic gate along the region (140) routing lanes for common electrodes (Vdd, Gnd, Clk, Vn, Vp) and optional inter-gate routing of Input or Output signals; this may be done without a requirement for routing the logic output to an interconnection layer above and/or below any of the columnar logic regions. Therefore, it is evident that a subset of the plurality of logic interconnections do not include portions that use one or more of the interconnection layers directly above and/or below the columnar logic region. Yet another example may be illustrated by referring to FIG. 21A and FIG. 21B, whereby a logic output (138)—of the two middle gates of the four stacked columnar logic gates—may be routed in the X-direction and then Y-direction to connect directly to the neighboring columnar logic gate input A or B, without the requirement of routing to an interconnection layer above and/or below either of the columnar logic regions.

Figure 32:
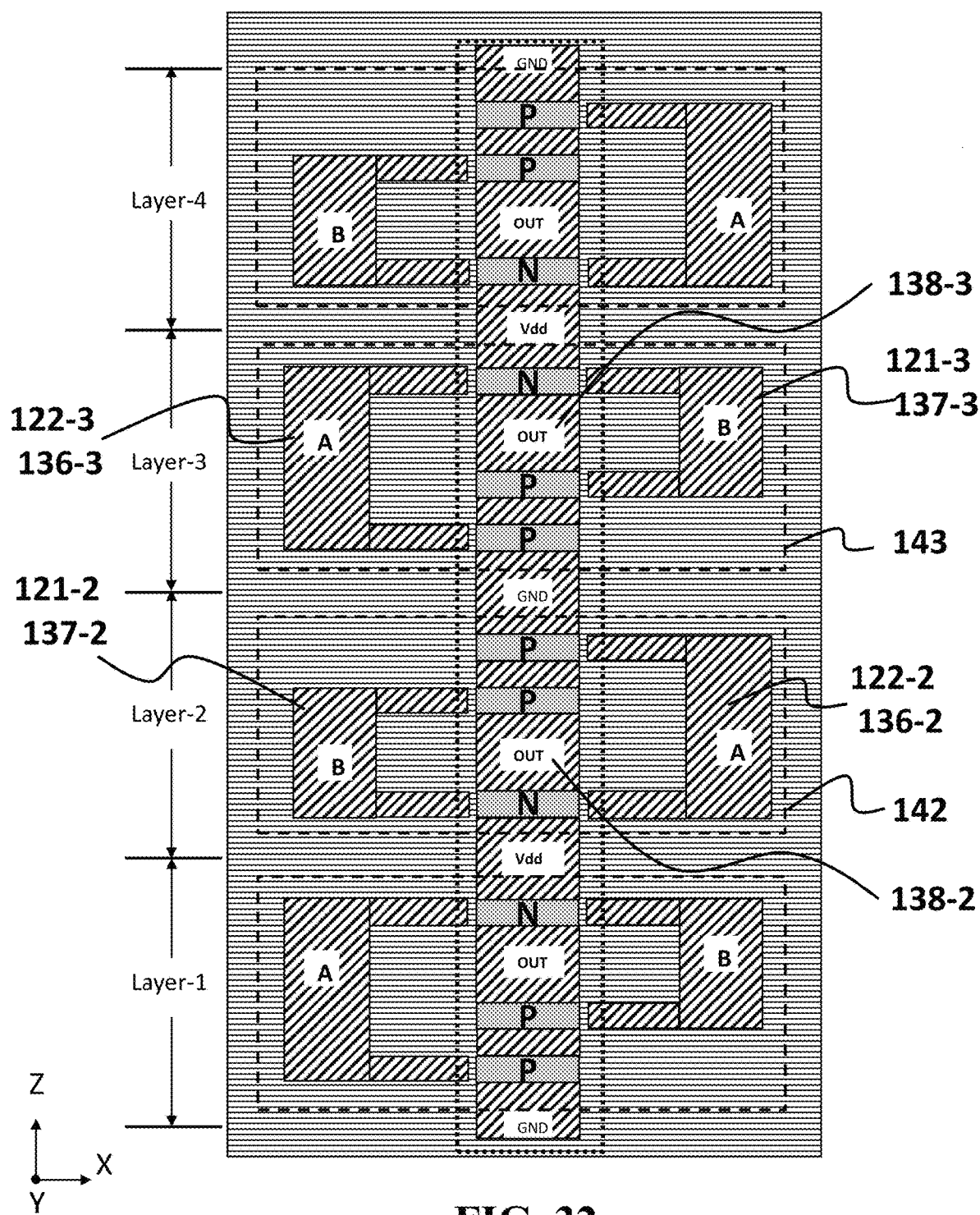
FIG. 32 is a cross-sectional view of stacked columnar NAND gates with body bias according to an embodiment of the present invention.
Figure 33:
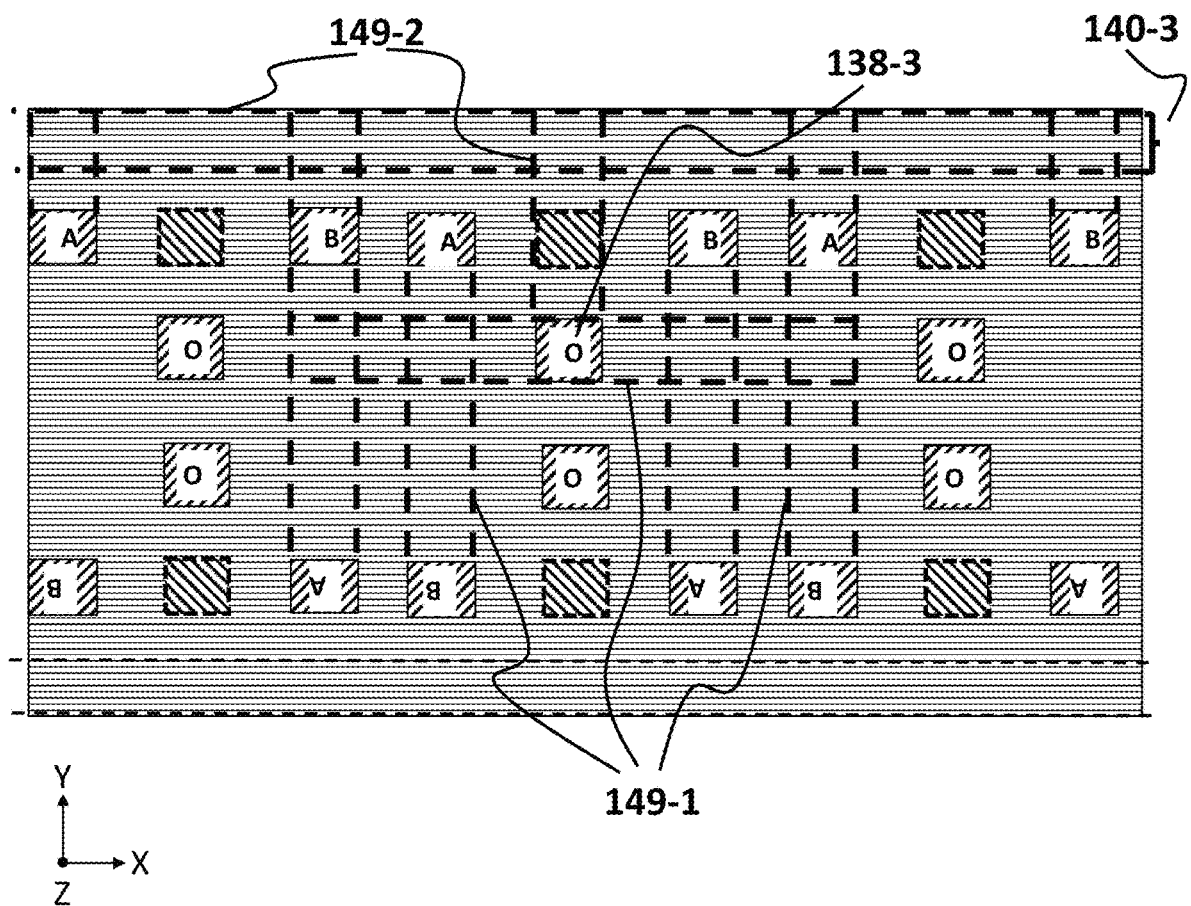
FIG. 33 is a top plan view of the routing pins of an array of stacked columnar NAND or NOR gates with body bias according to an embodiment of the present invention.

FIG. 32 is a cross-sectional view of stacked columnar NAND gates with body bias according to an embodiment of the present invention, as are the FIGS. 19A, 19B, 20, 21A and 21B. FIG. 21A shows routing pins 119 for routing input and output signals to the middle two gates 142 and 143 (see FIG. 19A). These routing pins 119 are accessible from the top surface of the columnar logic region and from the bottom surface of the columnar logic region. The top pins 119 are routed, first in the Z-direction and then Y-direction, to the gate on Layer-3, 143, to the inputs A 122-3 and B 121-3; this connection is made near to top of Layer-3. The bottom pins 119 are routed, first in the Z-direction and then Y-direction, to the gate on Layer-2, 142, to the inputs A 122-2 and B 121-2; this connection is made near to bottom of Layer-2. Therefore, the conductive regions in the Z-direction for routing the pins 119 to the inputs of gates 143 and 142 are occupied primarily in the Layer-4 and Layer-1 regions. The vertical column between the conductive regions of the pins 119, in Layer-3 and Layer-2, is available for routing of the output signals 138-3 and 138-2 of Gates 143 and 142 to the inputs of nearby gates without a required routing to an interconnection layer above or below the stacked columnar logic region. FIG. 33 is a top plan view of the routing pins of an array of stacked columnar NAND or NOR gates with body bias according to an embodiment of the present invention. In FIG. 33 an array of six columnar gates are shown on a Layer-3. A center gate has an output 138-3. Through various routing lane options, 149-1 and 149-2, the output 138-3 may be routed to the inputs of numerous nearby gates on the same Layer-3 or Layer-2.

Using a routing lane 149-1, output 138-3 may be routed to one or more of the following fourteen (14) inputs:
   (2) A and B of the gate 142 on Layer-2 which is directly below gate 143
   (4) A and B of the inputs of the gate directly adjacent to the center gate in the Y-direction and the one directly below that gate on Layer-2
   (8) A or B of the four adjacent gates in the X-direction, including the four gates directly below those gates on Layer-2

Using a routing lane 149-2, output 138-3 may be routed to one or more of the following ten (10) inputs:
   (4) A and B of the two adjacent gates in the X-direction on Layer-3 only
   (6) A and B of the three gates (not shown) located on other side of the common routing lanes (140-3) on Layer-3 only The output 138-3 may be routed to gates on the same Layer-3 further than an adjacent gate away. As shown in FIG. 20, depending on the height of the output conductive region in the semiconductor column, numerous layers of routing conductors 145 and 146 may be made available for the columnar logic gates which are adjacent to the common routing lane region 140 in order to route the output signal 138 to nearby inputs of other logic gates on the same layer on either side of the common routing lane region, without a required routing to an interconnection layer above or below the stacked columnar logic gate region. Furthermore, referring to FIG. 21B, a routing conductor 145 or 146 from Layer-3 (in a stack of 4 columnar logic gates) may be routed to the edge of an array and connect to a nearby conductive column 147 for connection to a routing conductor 145 or 146 on Layer-2, thereby enabling the output signal 138-3 to be routed to additional gates on Layer-2 without a need for routing to an interconnection layer above or below the stacked columnar logic region.

Another example of routing an output signal 138 to a nearby columnar logic gate input without routing to an interconnection layer above 128 or below 129 the columnar logic gate region is evident be referring to FIG. 27B and FIG. 27F. If the third conductive column 123 is extended in the Z-direction to close proximity of the input region for the A or B inputs, then a routing channel may be extended in the Y-direction in order to route the output signal 138 to an input A or B of a nearby columnar logic gate in the Y-direction without a requirement to route to an interconnection layer above or below the columnar logic gate region. Therefore, it is evident that a subset of the plurality of logic interconnections do not include portions that use one or more of the interconnection layers directly above and/or below the columnar logic region.

Another example of routing an output signal 138 to a nearby columnar logic gate input without routing to an interconnection layer above 128 or below 129 the columnar logic gate region is evident be referring to FIG. 29A through FIG. 29F. The conductive columns 119 are optional for routing signals for example from the interconnection layer above the columnar logic region to the inputs at the bottom of the columnar logic gate region. Without this optional conductive column 119, the output signal 138 may be routed in the Y-direction to a nearby columnar logic gate without a requirement to route to an interconnection layer above or below the columnar logic gate region. Therefore, it is evident that a subset of the plurality of logic interconnections do not include portions that use one or more of the interconnection layers directly above and/or below the columnar logic region.

Another example of routing an output signal 138 to a nearby columnar logic gate input without routing to an interconnection layer above 128 or below 129 the columnar logic gate region is evident be referring to FIG. 18. Each output is nearby one or two input regions of an adjacent or neighboring gate which enables a direct routing of the output signal 138 on the third conductive column 123 (FIG. 16D) in the X or Y direction to an input signal A or B of an adjacent gate without a requirement to route to an interconnection layer above or below the columnar logic gate region. Therefore, it is evident that a subset of the plurality of logic interconnections do not include portions that use one or more of the interconnection layers directly above and/or below the columnar logic region.

The examples above are all encompassing and not meant to limit the scope of the invention described herein.

Tenth Embodiment of CLG (Wired for Quasi-Adiabatic Logic)

A variation of the Columnar Logic Gate includes replacing the Vdd 31 and Gnd 36 connections with sinusoidal or trapezoid signals in opposite phase to each other. Such a connection enables so called Quasi-Adiabatic Logic operation and circuitry as described in PCT application PCT/US2019/031338, filed May 8, 2018, (publication WO 2019/217566 A1, 14 Nov. 2019) with the same inventors of this disclosure.

Eleventh Embodiment of CLG (Surround Gate)

A variation of the Columnar Logic Gate includes a surround gate whereby two, three or four sides of the semiconductor material in the semiconductor column are subjected to the applied gate voltage by virtue of having the gate electrode surround the semiconductor column. The benefits of this is to increase the current density of the transistor to enhance performance. On the other hand, the dimensions of the columnar logic gate in the X-Y direction—and perhaps Z direction—necessarily increases and hence circuit density is reduced.

The inventions described herein shall not be limited however to the TFTs mentioned herein or in the prior art references. Significant development is underway in the TFT area; the new TFT materials and devices that become available shall apply to the scope and spirit of the inventions disclosed herein, as one skilled in the art would understand and appreciate.

These semiconductor materials may be used for the TFTs as well as in the semiconductor channel in certain memory cells such as NAND or NOR flash. Substrates for use in the invention disclosed herein may be rigid or flexible, glass (e.g., soda lime, aluminosilicate, borasilicate or other compositions) or plastic or any other substrate used in fabrication of integrated circuits or flat panel displays.

Metal oxide TFTs fabricated with thin semiconductor layers (less than 50 nm and preferably less than 10 nm) are of particular use with the inventions described herein. TFTs with such thin layers are believed to have significant better mobility due to less domain irregularities associated with amorphous materials; hence, resistance is reduced and the materials behave more like poly-crystalline material.

Each embodiment presented above merely discloses a device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

Furthermore, it should be apparent to one skilled in the art that x-axis and y-axis can and may be interchangeable and certain descriptions should not be limited to just the x-axis or y-axis when such terms are used in describing the columnar logic gates and arrays thereof.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A three-dimensional logic circuit comprising:
    a two-dimensional array of columnar logic gates, each having one or more input logic ports and one or more output logic ports, and each of the columnar logic gates including:
        a plurality of transistors vertically arranged along a semiconductor column within a semiconductor logic region, the semiconductor column having a vertical height as measured from a bottom end of the semiconductor column to a top end of the semiconductor column, the plurality of transistors electrically interconnected so as to generate a logic output signal at the logic output port in response to one or more logic input signals received at the one or more logic input ports;
        one or more input conductive columns adjacent to the semiconductor column and in conductive communication with the one or more input logic ports of the columnar logic gate; and
        one or more output conductive columns adjacent to the semiconductor column and in conductive communication with the one or more output logic ports of the columnar logic gate;
    one or more interconnection layers directly above and/or below the columnar logic region; and
    a plurality of logic interconnections interconnecting input and output logic ports of the two-dimensional array of columnar logic gates so as to configure the three-dimensional logic gate to perform a logic operation.

2. The three-dimensional logic circuit of claim 1, wherein the semiconductor columns of the two-dimensional array of columnar logic gates include first and second subsets of semiconductor columns that have semiconductor columns of first and second vertical heights, respectively, respectively, wherein a ratio of the first and second vertical heights is greater than 1.1.

3. The three-dimensional logic circuit of claim 1, wherein the semiconductor columns of the two-dimensional array of columnar logic gates include first and second subsets of semiconductor columns that have semiconductor columns of first and second vertical heights, respectively, wherein a ratio of the first and second vertical heights is greater than 1.25.

4. The three-dimensional logic circuit of claim 1, wherein the semiconductor columns of the two-dimensional array of columnar logic gates include first and second subsets of semiconductor columns that top surfaces at first and second vertical height locations within the semiconductor logic region, respectively, wherein a ratio of a difference between vertical locations of the top surfaces of the first and second subset to an average vertical height of the first and second subsets is greater than 0.1.

5. The three-dimensional logic circuit of claim 1, wherein the semiconductor columns of the two-dimensional array of columnar logic gates include first and second subsets of semiconductor columns that bottom surfaces at first and second vertical locations within the semiconductor logic region, respectively, wherein a ratio of a difference between vertical locations of the bottom surfaces of the first and second subset to an average vertical height of the first and second subsets is greater than 0.1.

6. The three-dimensional logic circuit of claim 1, wherein a subset of the plurality of logic interconnections do not include portions that use one or more of the interconnection layers directly above and/or below the columnar logic region.

7. The three-dimensional logic circuit of claim 1, wherein a radial distance between each of the semiconductor columns and a first of the adjacent one or more input conductive columns is less than or equal to a distance between each of the semiconductor columns and others of the plurality of semiconductor columns nearest thereto.

8. The three-dimensional logic circuit of claim 1, further comprising:
a planar active region directly above or below the columnar logic region, the planar active region including a plurality of planar thin-film transistors.

9. The three-dimensional logic circuit of claim 1, further comprising:
a metallization layer between the top and bottom surfaces of the columnar logic region, the metallization layer conductively coupling a commonly biased node of each of the semiconductor columns of each of the plurality of the two-dimensional array of columnar logic gates.

10. The three-dimensional logic circuit of claim 1, wherein a first of the one or more output conductive columns of a first of the two-dimensional array of columnar logic gates is adjacent to a second of the one or more an input conductive column of a second of the two-dimensional array of columnar logic gates.

11. A three-dimensional logic circuit comprising:
a substrate;
a columnar active layer on top of the substrate, the columnar active layer including:
a plurality of semiconductor columns within a columnar active layer and separated from one another by dielectric material, each of the plurality of semiconductor columns extending a vertical height along a columnar axis from a bottom of the semiconductor column to a top of the semiconductor column, wherein a plurality of transistors are vertically arranged along each of the plurality of semiconductor columns; and
a plurality of conductive columns interspersed among the plurality of semiconductor columns, each of the plurality of conductive columns extending along a columnar axis to the top surface and/or the bottom surface of the columnar active layer, each of the plurality of conductive columns conductively coupled to a node of one of the plurality of transistors in an adjacent semiconductor column;
one or more interconnection layers directly above and/or below the columnar active layer; and
a plurality of logic interconnections interconnecting the plurality of conductive columns so as to configure the three-dimensional logic circuit to perform a logic operation.

12. The three-dimensional logic circuit of claim 11, wherein the plurality of semiconductor columns include first and second subsets of semiconductor columns that have semiconductor columns of first and second vertical heights, respectively, wherein a ratio of the first and second vertical heights is greater than 1.1.

13. The three-dimensional logic circuit of claim 11, wherein the plurality of semiconductor columns include first and second subsets of semiconductor columns that have semiconductor columns of first and second vertical heights, respectively, wherein a ratio of the first and second vertical heights is greater than 1.25.

14. The three-dimensional logic circuit of claim 11, wherein the plurality of semiconductor columns include first and second subsets of semiconductor columns that top surfaces at first and second vertical locations within the columnar active layer, respectively, wherein a ratio of a difference between vertical locations of the top surfaces of the first and second subset to an average vertical height of the first and second subsets is greater than 0.1.

15. The three-dimensional logic circuit of claim 11, wherein the plurality of semiconductor columns include first and second subsets of semiconductor columns that bottom surfaces at first and second vertical locations within the columnar active layer, respectively, wherein a ratio of a difference between vertical locations of the bottom surfaces of the first and second subset to an average vertical height of the first and second subsets is greater than 0.1.

16. The three-dimensional logic circuit of claim 11, wherein a subset of the plurality of logic interconnections do not include portions that use one or more of the interconnection layers directly above and/or below the columnar logic region.

17. The three-dimensional logic circuit of claim 11, wherein a radial distance between each of the semiconductor columns and the adjacent conductive column is less than or equal to a distance between the semiconductor column and another of the plurality of semiconductor columns nearest thereto.

18. The three-dimensional logic circuit of claim 11, wherein the logical function is a NAND function or a NOR function.

19. The three-dimensional logic circuit of claim 11, further comprising:
a planar active region directly above the columnar active layer, the planar active region including a plurality of planar thin-film transistors.

20. The three-dimensional logic circuit of claim 11, wherein the substrate includes a planer active layer that includes a plurality of planar transistors.

* * * * *